United States Patent
Kuwabara et al.

(10) Patent No.: US 11,889,752 B2
(45) Date of Patent: Jan. 30, 2024

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., LTD., Yongin-si (KR)

(72) Inventors: Hirokazu Kuwabara, Yokohama (JP); Nobutaka Akashi, Yokohama (JP); Ryuhei Furue, Yokohama (JP)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 690 days.

(21) Appl. No.: 17/089,268

(22) Filed: Nov. 4, 2020

(65) Prior Publication Data

US 2021/0273174 A1 Sep. 2, 2021

(30) Foreign Application Priority Data

Feb. 18, 2020 (KR) .................. 10-2020-0019642

(51) Int. Cl.
*H10K 85/60* (2023.01)
*C07F 5/02* (2006.01)
(Continued)

(52) U.S. Cl.
CPC ........... *H10K 85/631* (2023.02); *C07F 5/027* (2013.01); *C09K 11/06* (2013.01);
(Continued)

(58) Field of Classification Search
CPC .... H10K 85/631; H10K 50/11; H10K 101/10; H10K 2101/10; C07F 5/027; C09K 11/06; C09K 2211/1007
(Continued)

(56) References Cited

U.S. PATENT DOCUMENTS 10,374,166 B2 8/2019 Hatakeyama et al.
2018/0069182 A1* 3/2018 Hatakeyama ......... C07F 7/0816
(Continued)

FOREIGN PATENT DOCUMENTS

CA 3 017 010 3/2019
JP 5935199 6/2016
(Continued)

*Primary Examiner* — Michael M. Bernshteyn
(74) *Attorney, Agent, or Firm* — KILE PARK REED & HOUTTEMAN PLLC

(57) ABSTRACT

An organic electroluminescence device having high light emission efficiency is provided, which includes a first electrode, a second electrode facing the first electrode, and an emission layer disposed between the first electrode and the second electrode. The emission layer includes a polycyclic compound represented by Formula 1:

[Formula 1]

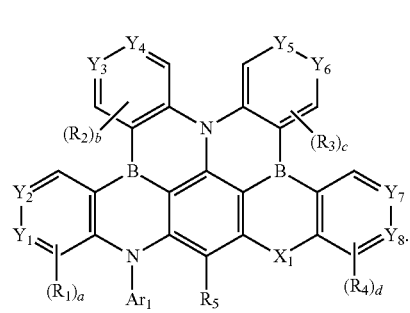

20 Claims, 2 Drawing Sheets

(51) Int. Cl.
*C09K 11/06* (2006.01)
*H10K 50/11* (2023.01)
*H10K 101/10* (2023.01)

(52) U.S. Cl.
CPC ...... *C09K 2211/1007* (2013.01); *H10K 50/11* (2023.02); *H10K 2101/10* (2023.02)

(58) Field of Classification Search
USPC .......................................................... 428/690
See application file for complete search history.

(56) References Cited

U.S. PATENT DOCUMENTS

| | | | |
|---|---|---|---|
| 2018/0094000 A1* | 4/2018 | Hatakeyama ........ | H10K 85/631 |
| 2018/0182981 A1* | 6/2018 | Chen .................... | C09K 11/025 |
| 2018/0337350 A1* | 11/2018 | Li ......................... | C07F 15/006 |
| 2019/0036042 A1* | 1/2019 | Kim ..................... | H10K 85/346 |
| 2019/0074455 A1* | 3/2019 | Chen ................... | C07F 15/0086 |
| 2019/0115538 A1* | 4/2019 | Lim .................... | H10K 85/6572 |
| 2019/0207112 A1* | 7/2019 | Hatakeyama .......... | C09K 11/02 |
| 2019/0319196 A1* | 10/2019 | Sim ...................... | C07D 403/10 |
| 2020/0058885 A1* | 2/2020 | Hong .................... | H10K 85/322 |
| 2020/0091431 A1 | 3/2020 | Hatakeyama et al. | |
| 2020/0185626 A1* | 6/2020 | Yuuki ................... | C07F 9/6596 |

FOREIGN PATENT DOCUMENTS

| | | |
|---|---|---|
| JP | 2018-43984 | 3/2018 |
| KR | 10-2017-0130435 | 11/2017 |
| KR | 10-1876763 | 7/2018 |
| KR | 10-1886773 | 8/2018 |
| KR | 10-2018-0122298 | 11/2018 |
| KR | 10-2018-0134850 | 12/2018 |
| KR | 10-1955647 | 3/2019 |
| KR | 10-2019-0042791 | 4/2019 |
| KR | 10-2020-0071192 | 6/2020 |
| WO | 2015/102118 | 7/2015 |
| WO | 2016/152544 | 9/2016 |
| WO | 2017/188111 | 11/2017 |
| WO | 2018/203666 | 11/2018 |

* cited by examiner

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION(S)

This application claims priority to and benefits of Korean Patent Application No. 10-2020-0019642 under 35 U.S.C. § 119, filed on Feb. 18, 2020 in the Korean Intellectual Property Office, the entire contents of which are incorporated herein by reference.

BACKGROUND

1. Technical Field

The disclosure herein relates to an organic electroluminescence device and a polycyclic compound used therein.

2. Description of the Related Art

Recently, the development of organic electroluminescence displays as an image display apparatus is being actively conducted. The organic electroluminescence displays are so-called self-luminescent display apparatuses in which holes and electrons injected from a first electrode and a second electrode recombine in an emission layer to generate excitons, and these generated excitons fall to the ground state to emit light, thereby implementing display.

In the application of an organic electroluminescence device to a display apparatus, there is a continuous demand for good color reproducibility by improving the light emission efficiency of the organic electroluminescence device, and for the development of materials for an organic electroluminescence device that is capable of stably attaining such characteristics.

In recent years, particularly in order to implement a highly efficient organic electroluminescence device, technology continues development pertaining to phosphorescence emission using triplet state energy or delayed fluorescence using triplet-triplet annihilation (TTA) in which singlet excitons are generated by collision of triplet excitons, and pertaining to thermally activated delayed fluorescence (TADF) materials using a delayed fluorescence phenomenon.

SUMMARY

The disclosure provides an organic electroluminescence device having excellent light emission efficiency.

The disclosure also provides a polycyclic compound, which is a material, for an organic electroluminescence device, having high color purity and high efficiency characteristics.

An embodiment of the inventive concept provides an organic electroluminescence device according to an embodiment that may include a first electrode, a second electrode facing the first electrode, and an emission layer disposed between the first electrode and the second electrode. The first electrode and the second electrode may each independently include at least one material selected from the group consisting of Ag, Mg Cu, Al, Pt, Pd, Au, Ni, Nd, Ir, Cr, Li, Ca, LiF/Ca, LiF/Al, Mo, Ti, an oxide thereof, a compound thereof, or a mixture thereof. The emission layer may include a polycyclic compound represented by Formula 1:

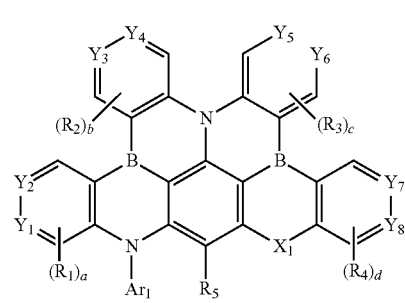

[Formula 1]

In Formula 1, $X_1$ may be $NAr_2$, O, or S, $Y_1$ to $Y_8$ may each independently be $CM_1$ or a carbon atom bonded to a group represented by Formula 2, each $M_1$ may independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or bonded to an adjacent group to form a ring, $Ar_1$ and $Ar_2$ may each independently be a substituted or unsubstituted aryl group having 6 to 30 ring-forming carbon atoms or a substituted or unsubstituted heteroaryl group having 2 to 30 ring-forming carbon atoms, $R_1$ to $R_5$ may each independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or bonded to an adjacent group to form a ring, a, b, c, and d may each independently be an integer from 0 to 2, at least one group represented by Formula 2 may be bonded to at least one pair of substituents, the at least one pair of substituents selected from the group consisting of $Y_1$ and $Y_2$, $Y_3$ and $Y_4$, $Y_5$ and $Y_6$, and $Y_7$ and $Y_8$:

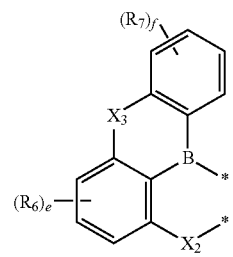

[Formula 2]

In Formula 2, each $X_2$ and each $X_3$ may independently be $NAr_3$, O, or S, each $Ar_3$ may independently be a substituted or unsubstituted aryl group having 6 to 30 ring-forming carbon atoms or a substituted or unsubstituted heteroaryl group having 2 to 30 ring-forming carbon atoms, each $R_6$ and each $R_7$ may independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or bonded to an adjacent group to form a ring, each e may independently be an integer from 0 to 3, each f may independently be an integer from 0 to 4, and * indicates a binding site to a neighboring atom.

In an embodiment, the polycyclic compound represented by Formula 1 may be represented by one of Formulas 1-1a to 1-1c:

[Formula 1-1a]

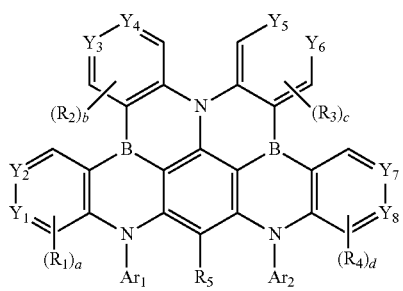

[Formula 1-1b]

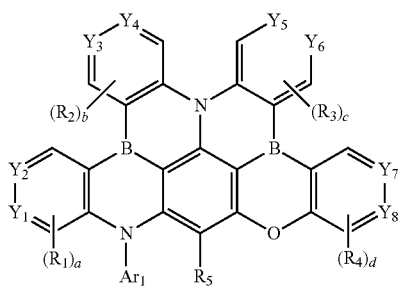

[Formula 1-1c]

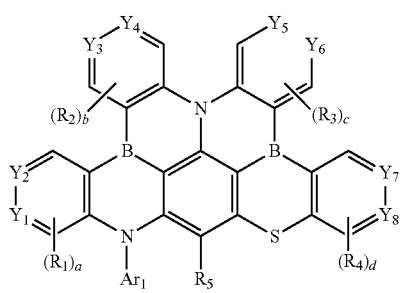

In Formulas 1-1a to 1-1c, $Y_1$ to $Y_8$, $Ar_1$, $Ar_2$, and $R_1$ to $R_5$ may be the same as defined in Formulas 1 and 2.

In an embodiment, the polycyclic compound represented by Formula 1 may be represented by Formula 3-1 or Formula 3-2:

[Formula 3-1]

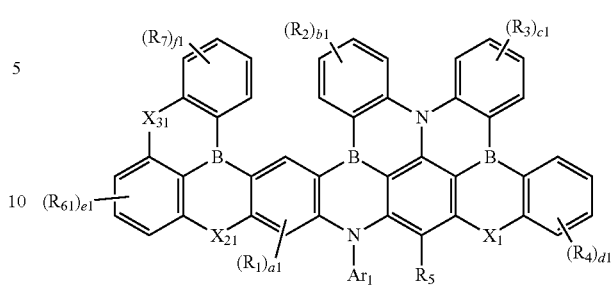

[Formula 3-2]

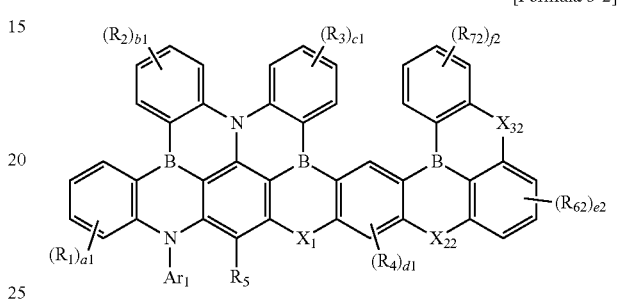

In Formulas 3-1 and 3-2, $X_{21}$, $X_{22}$, $X_{31}$, and $X_{32}$ may each independently be $NAr_4$, O, or S, each $Ar_4$ may independently be a substituted or unsubstituted aryl group having 6 to 30 ring-forming carbon atoms or a substituted or unsubstituted heteroaryl group having 2 to 30 ring-forming carbon atoms, $R_{61}$, $R_{62}$, $R_{71}$, and $R_{72}$ may each independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 carbon atoms, or bonded to an adjacent group to form a ring, a1 and d1 may each independently be an integer from 0 to 2, b1 and c1 may each independently be an integer from 0 to 4, e1 and e2 may each independently be an integer from 0 to 3, f1 and f2 may each independently be an integer of 0 to 4, and $X_1$, $Ar_1$, and $R_1$ to $R_5$ may be the same as defined in Formulas 1 and 2.

In an embodiment, the polycyclic compound represented by Formula 1 may be represented by one of Formulas 4-1a to 4-1d:

[Formula 4-1a]

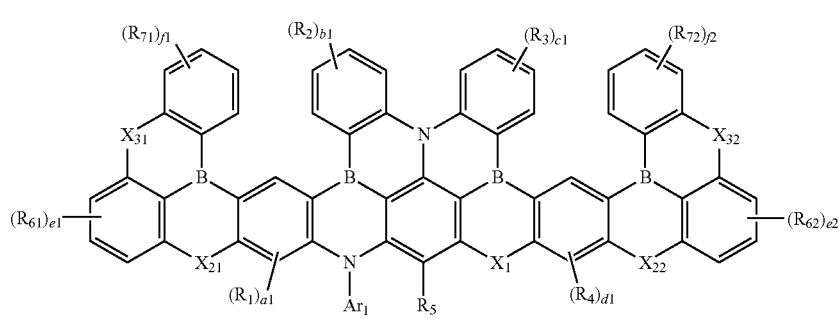

-continued

[Formula 4-1b]

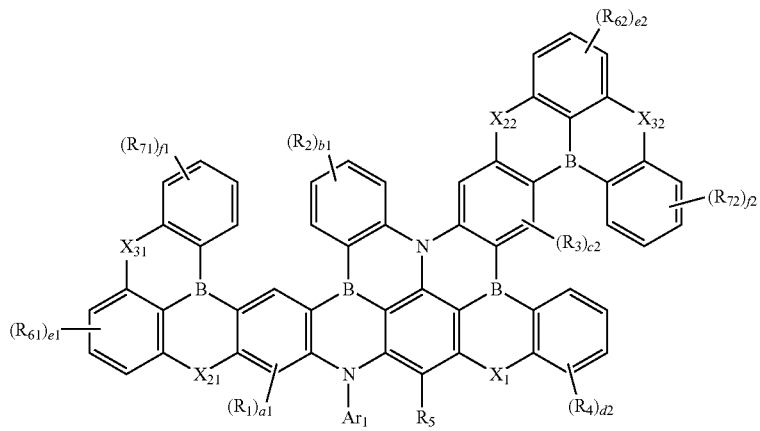

[Formula 4-1c]

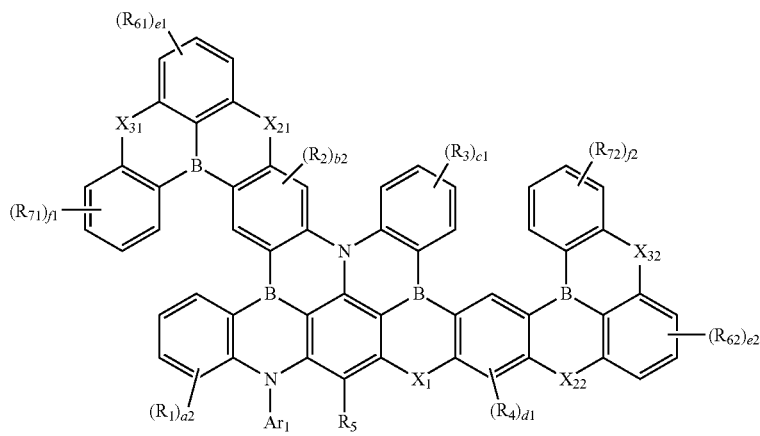

[Formula 4-1d]

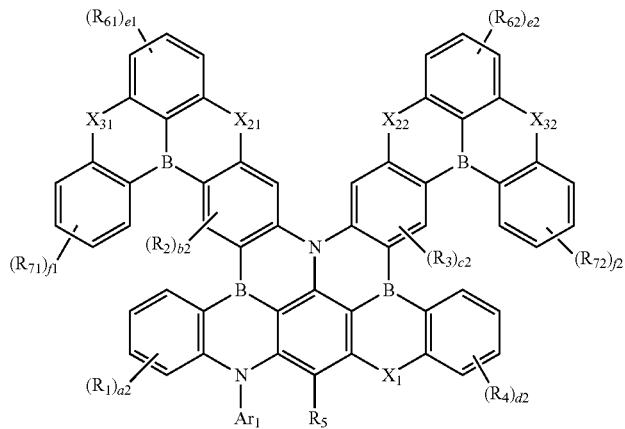

In Formulas 4-1a to 4-1d, $X_{21}$, $X_{22}$, $X_{31}$, and $X_{32}$ may each independently be $NAr_4$, O, or S, each $Ar_4$ may independently be a substituted or unsubstituted aryl group having 6 to 30 ring-forming carbon atoms or a substituted or unsubstituted heteroaryl group having 2 to 30 ring-forming carbon atoms, $R_{61}$, $R_{62}$, $R_{71}$, and $R_{72}$ may each independently be a hydrogen atom, a deuterium atom, a halogen atom, a substituted or unsubstituted amine group, a substituted or unsubstituted alkyl group having 1 to 20 carbon atoms, a substituted or unsubstituted aryl group having ring-forming 6 to 30 carbon atoms, or a substituted or unsubstituted heteroaryl group having 2 to 30 ring-forming carbon atoms, or bonded to an adjacent group to form a ring, a1, b2, c2, and d1 may each independently be an integer from 0 to 2, a2, b1, c1, and d2 may each independently be an integer from 0 to 4, e1 and e2 may each independently be an integer of 0 to 3, f1 and f2 may each independently be an integer of 0 to 4, and $X_1$, $Ar_1$, and $R_1$ to $R_5$ may be the same as defined in Formulas 1 and 2.

In an embodiment, the polycyclic compound represented by Formula 4-1a may have a line-symmetrical structure with respect to an imaginary line passing through a central nitrogen atom and $R_5$.

In an embodiment, the polycyclic compound represented by Formula 4-1d may have a line-symmetrical structure with respect to an imaginary line passing through a central nitrogen atom and $R_5$.

In an embodiment, the polycyclic compound represented by Formula 1 may be represented by one of Formulas 4-2a to 4-2d:

[Formula 4-2a]
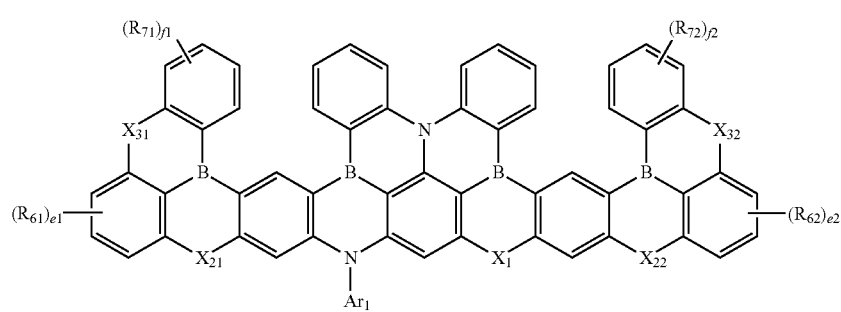
[Formula 4-2b]
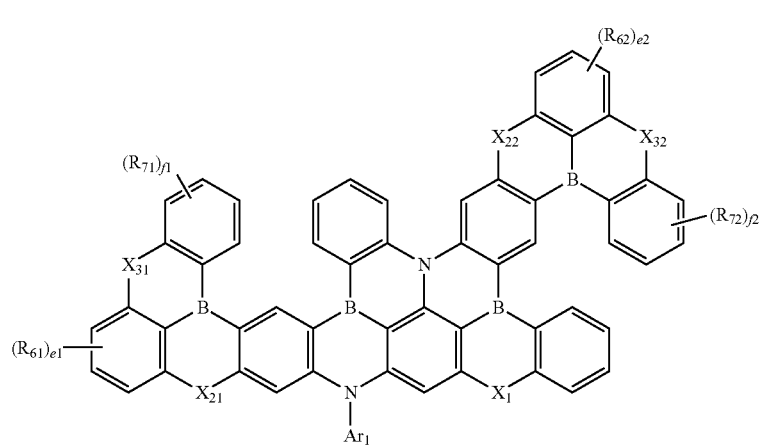
[Formula 4-2c]
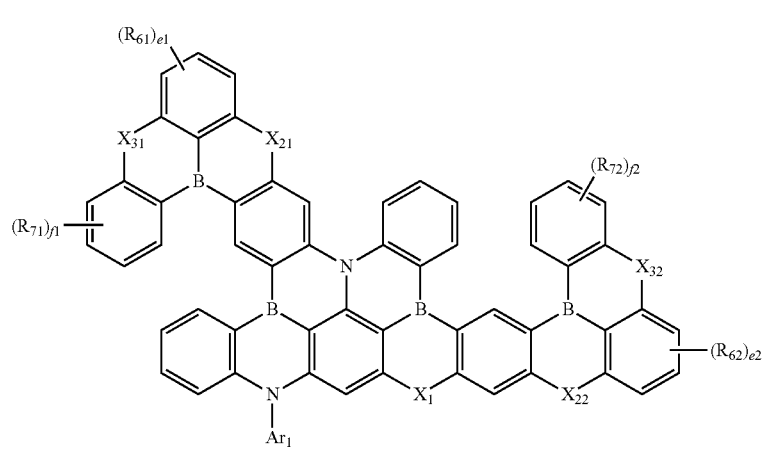
[Formula 4-2d]
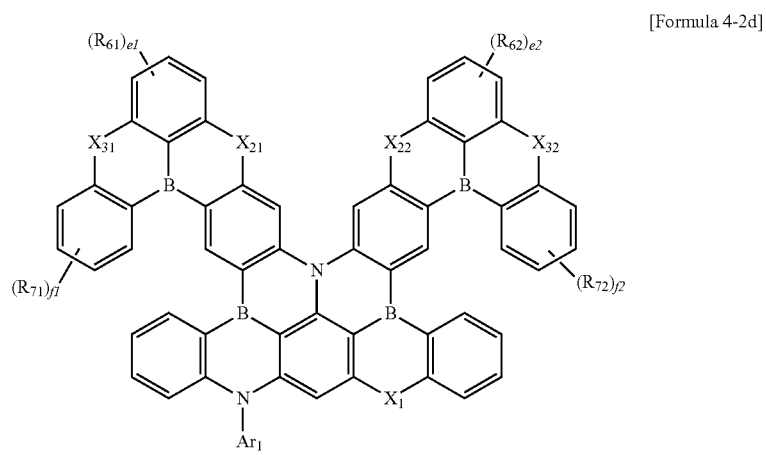

In Formulas 4-2a to 4-2d, $X_{21}$, $X_{22}$, $X_{31}$, and $X_{32}$ may each independently be $NAr_4$, O, or S, each $Ar_4$ may independently be a substituted or unsubstituted aryl group having 6 to 30 ring-forming carbon atoms or a substituted or unsubstituted heteroaryl group having 2 to 30 ring-forming carbon atoms, $R_{61}$, $R_{62}$, $R_{71}$, and $R_{72}$ may each independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or bonded to an adjacent group to form a ring, e1 and e2 may each independently be an integer from 0 to 3, f1 and f2 may each independently be an integer from 0 to 4, and $X_1$ and $Ar_1$ may be the same as defined in Formulas 1 and 2.

In an embodiment, the polycyclic compound represented by Formula 1 may be represented by Formula 5-1 or Formula 5-2:

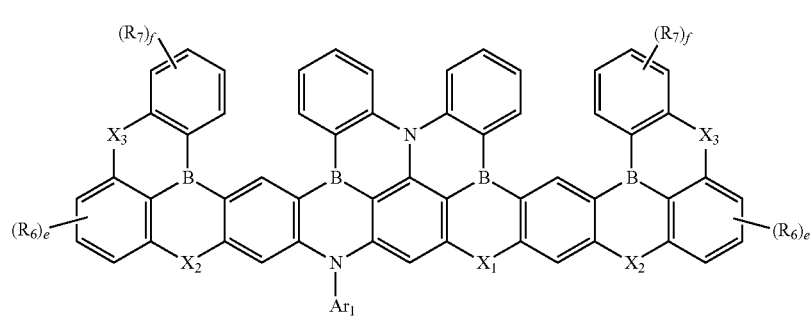

[Formula 5-1]

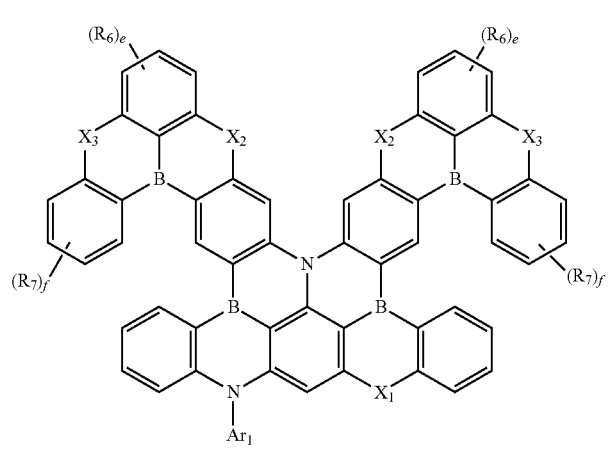

[Formula 5-2]

In Formulas 5-1 and 5-2 above, each of $X_1$, $X_2$, $X_3$, $Ar_1$, $R_6$, $R_7$, e, and f may independently be the same as defined in Formulas 1 and 2.

In an embodiment, $Ar_1$ and $Ar_2$ may be each independently a substituted or unsubstituted phenyl group.

In an embodiment, $R_6$ and $R_7$ may each independently be an unsubstituted methyl group, an unsubstituted isopropyl group, an unsubstituted t-butyl group, a substituted or unsubstituted biphenyl amine group, or an unsubstituted phenyl group.

In an embodiment, the emission layer may emit delayed fluorescence.

In an embodiment, the emission layer may emit light in a blue wavelength range.

In an embodiment, the emission layer may include a first compound and a second compound, and the first compound may include the polycyclic compound.

In an embodiment, the polycyclic compound represented by Formula 1 may be selected from one of the compounds represented by Compound Group 1:

[Compound Group 1]
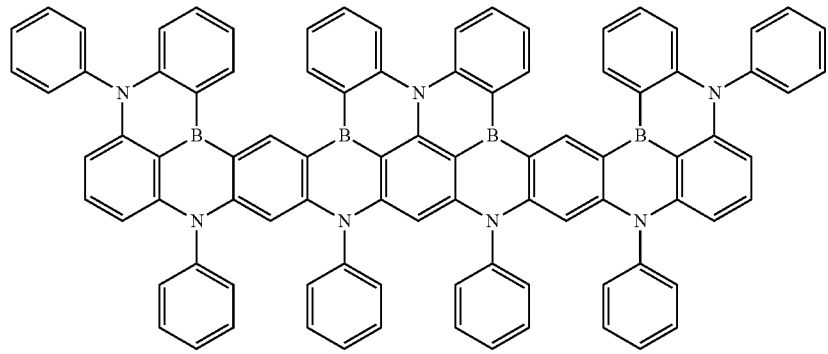
1
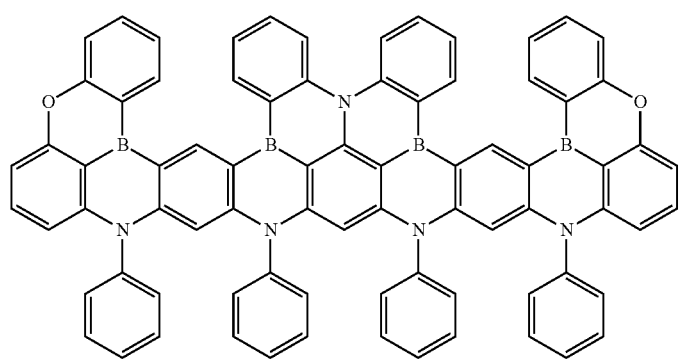
2
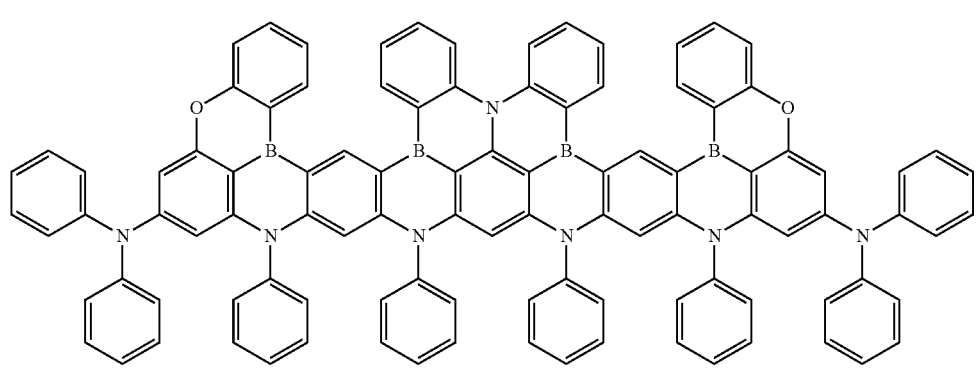
3
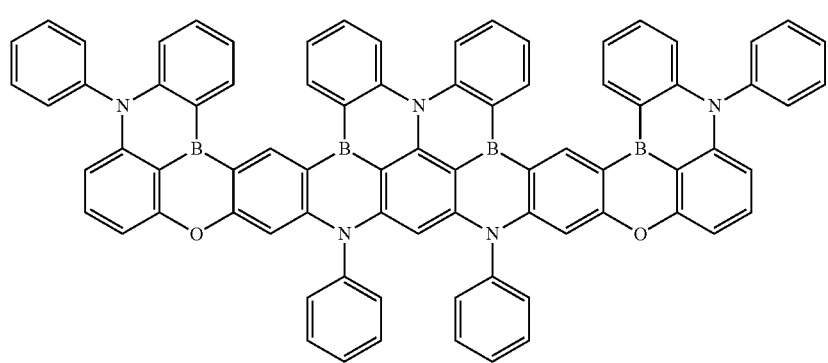
4

-continued
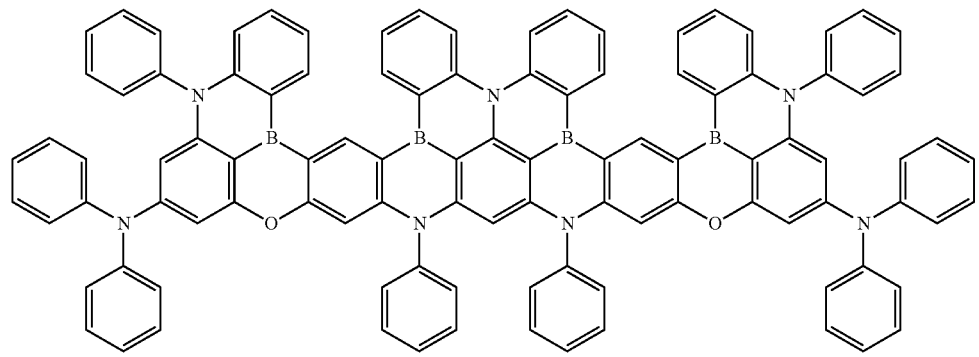
5
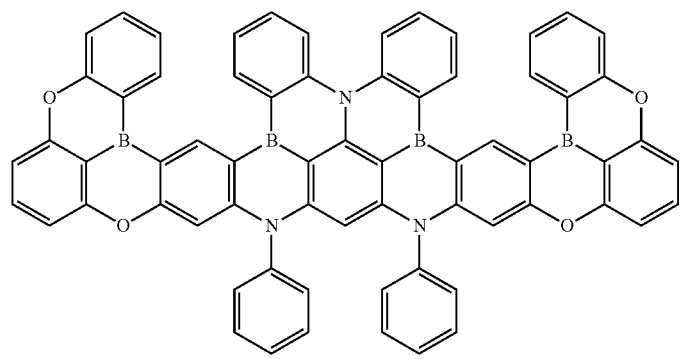
6
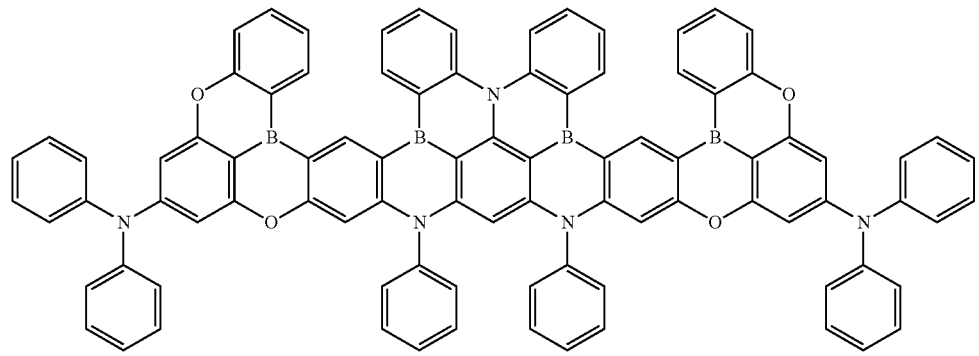
7
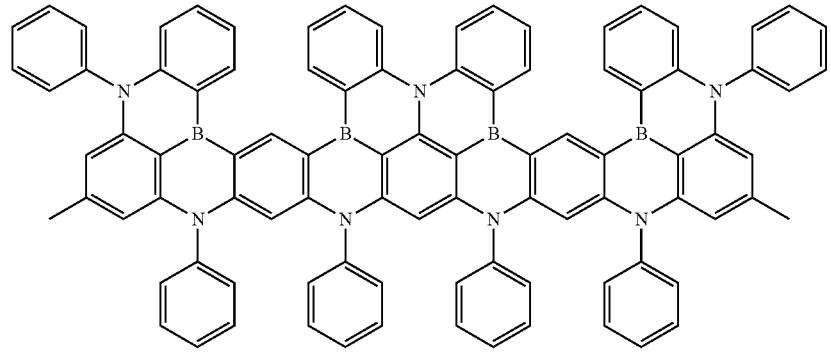
8

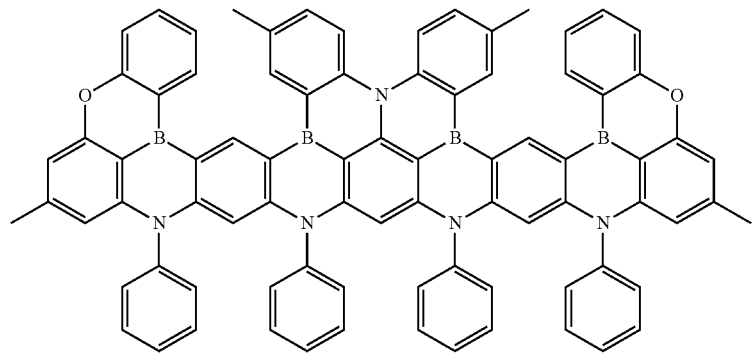
9
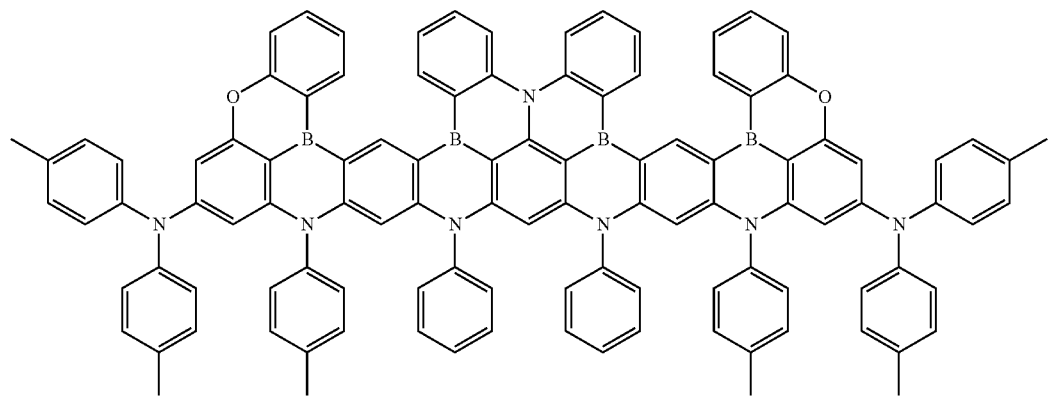
10
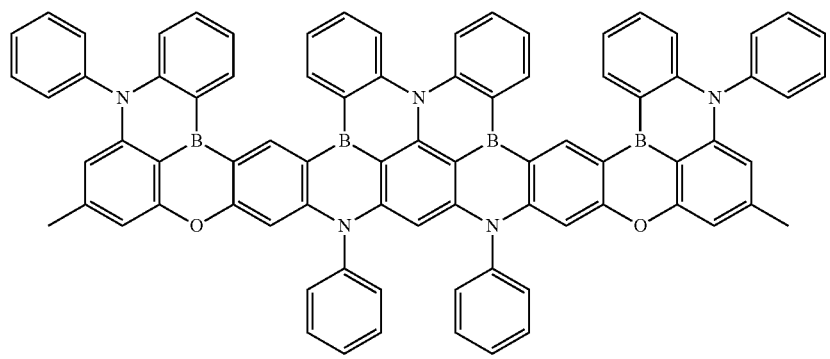
11
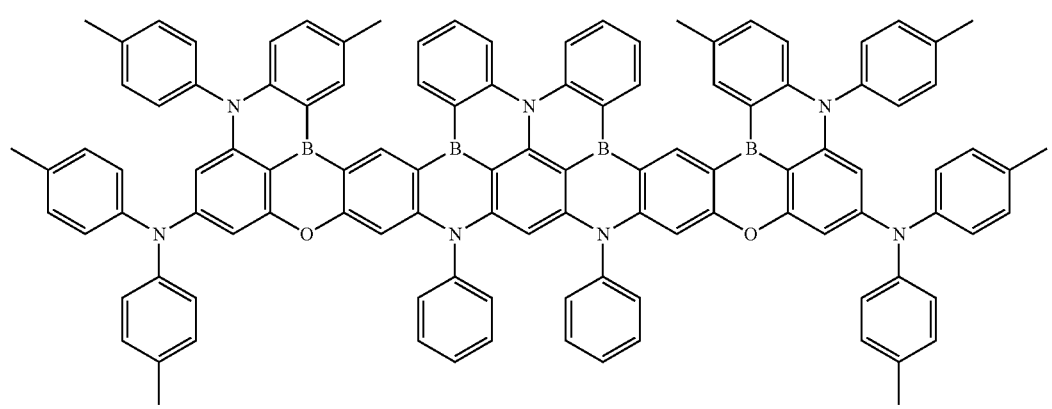
12

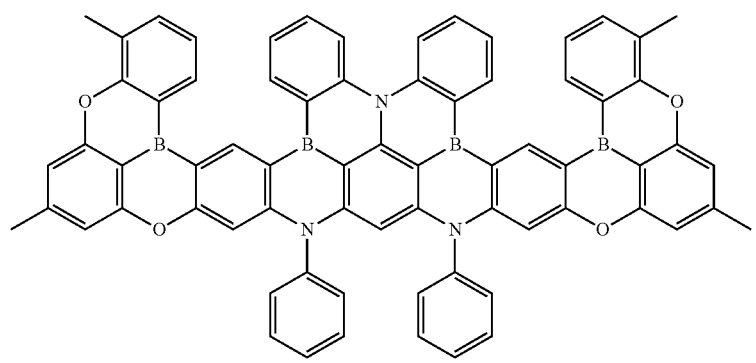
13
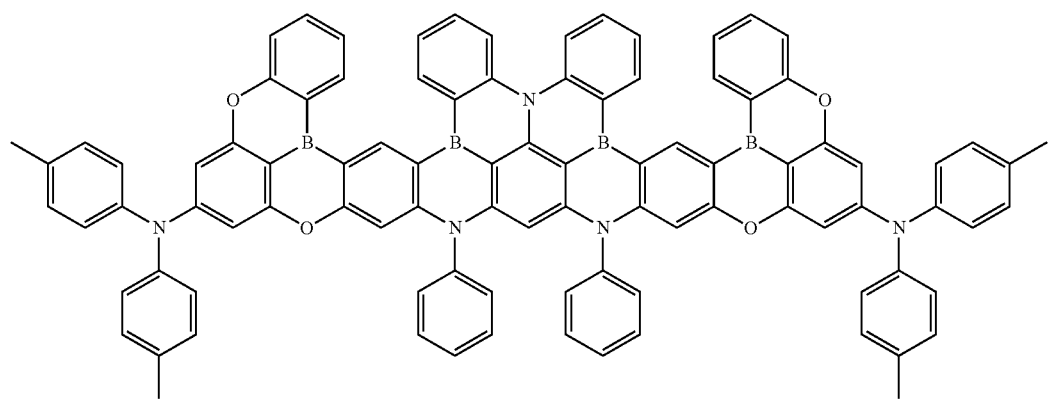
14
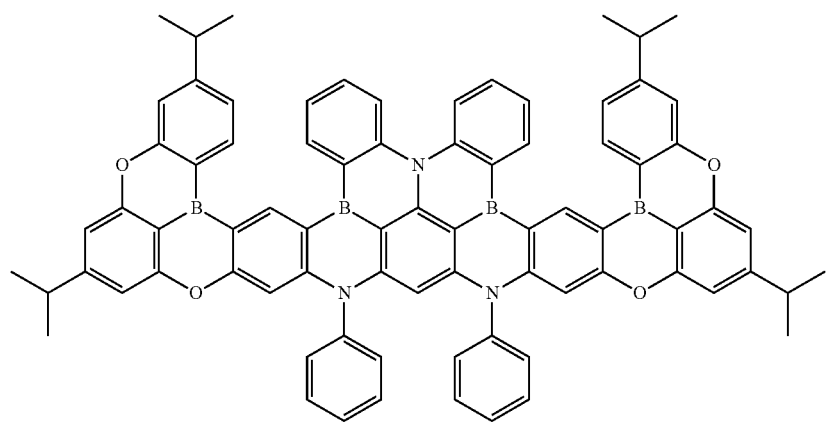
15
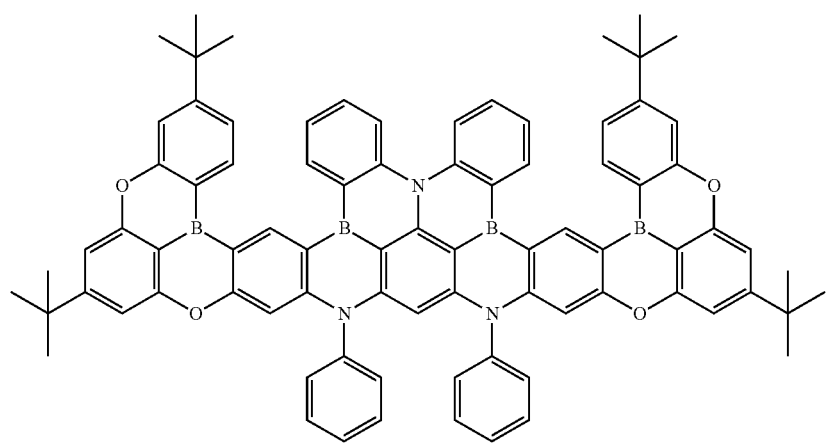
16

17
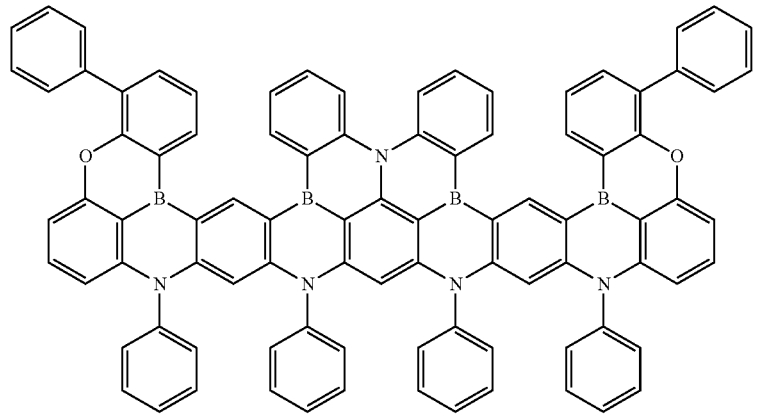
18
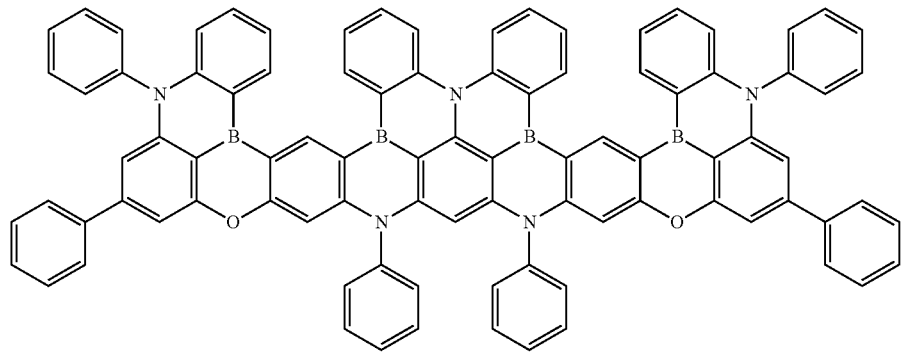
19
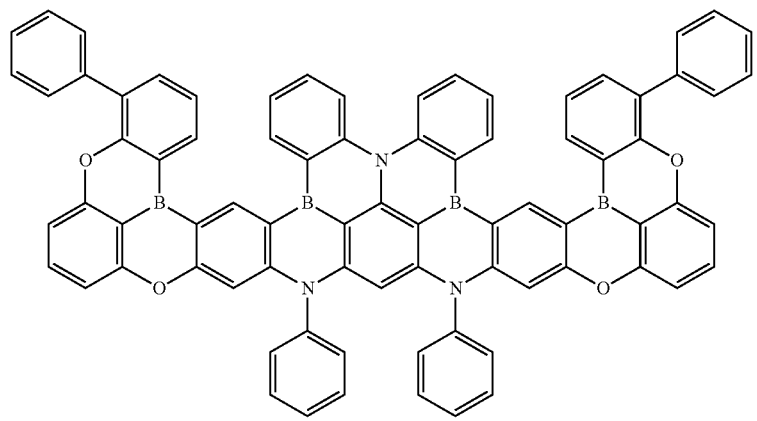
20
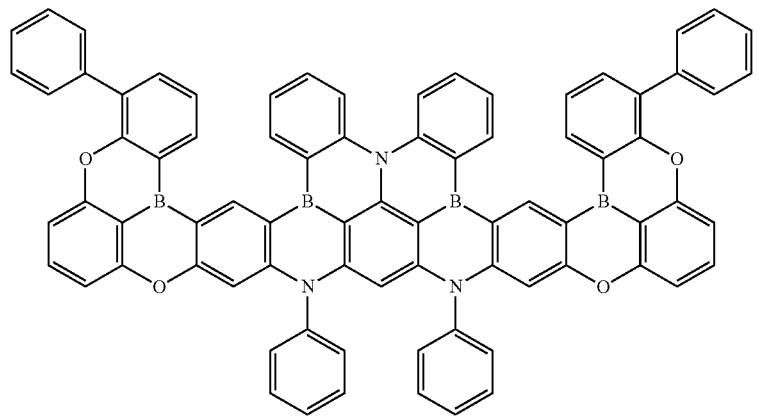

-continued
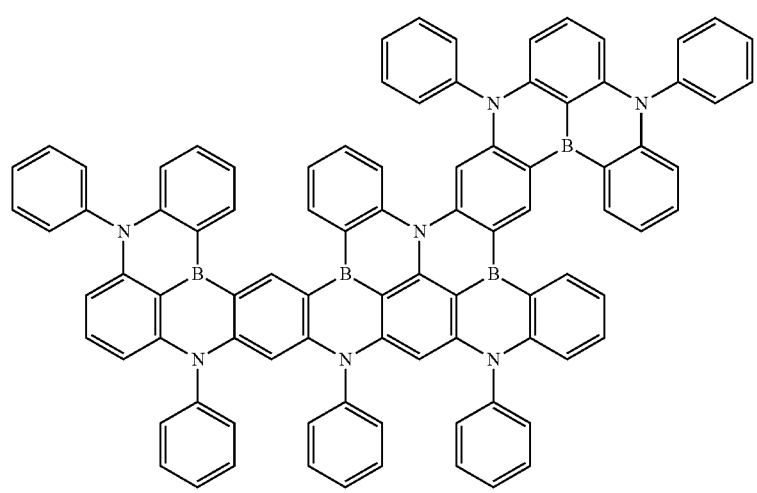
21
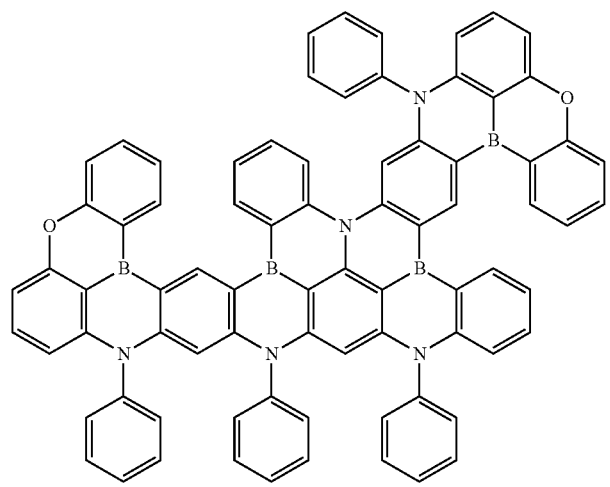
22
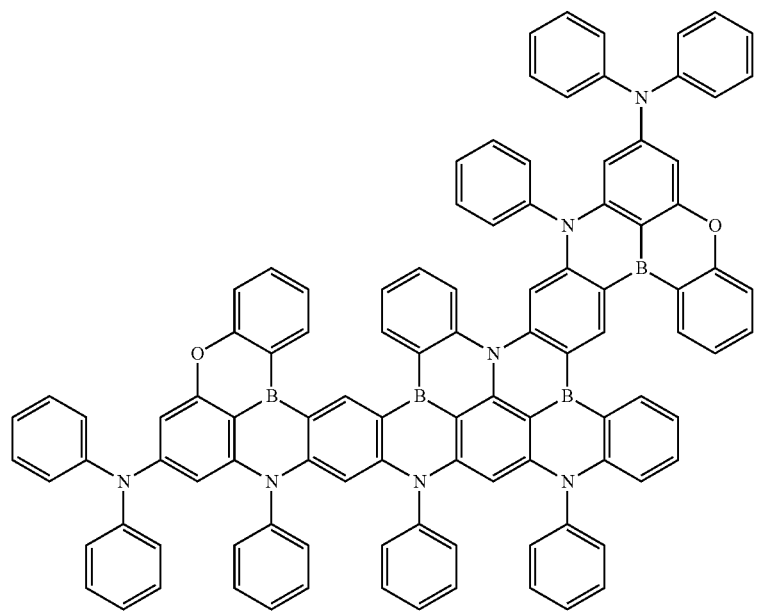
23

-continued
24
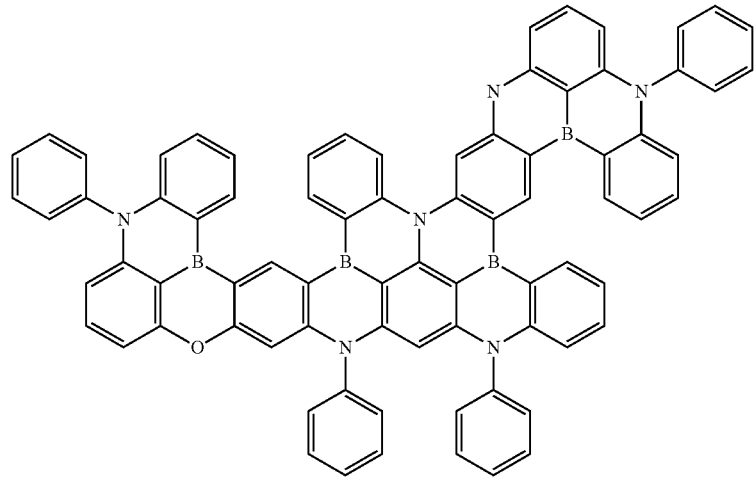
25
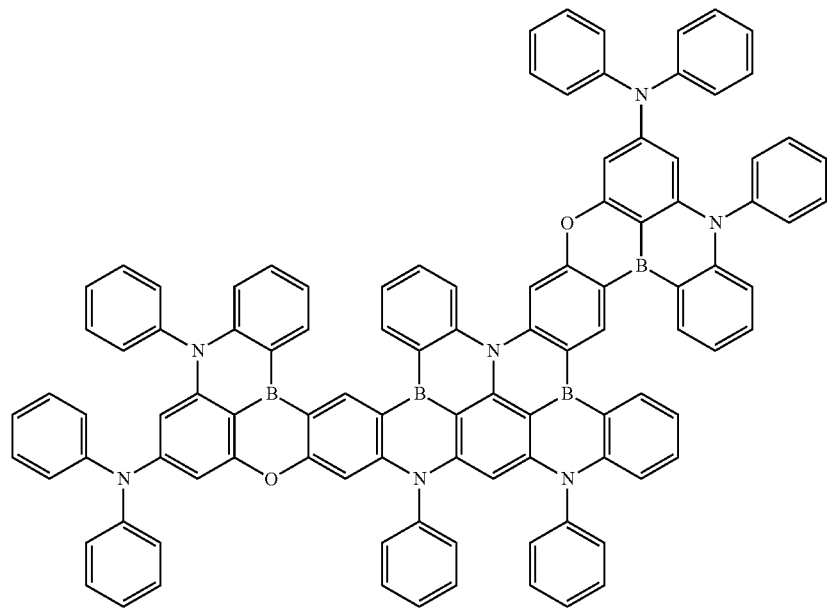
26
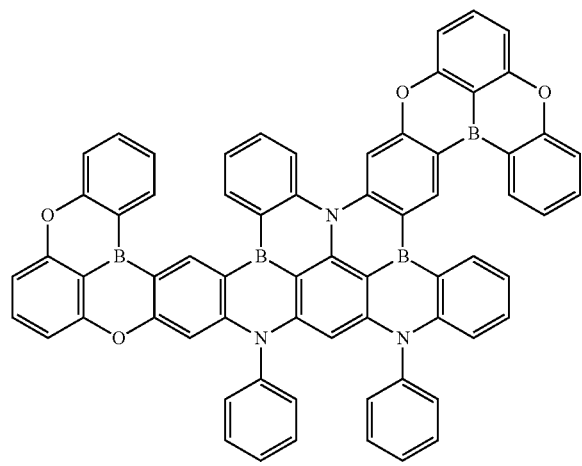
27
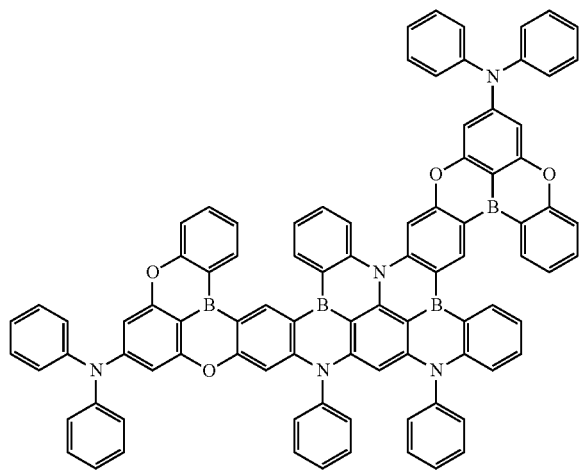

-continued
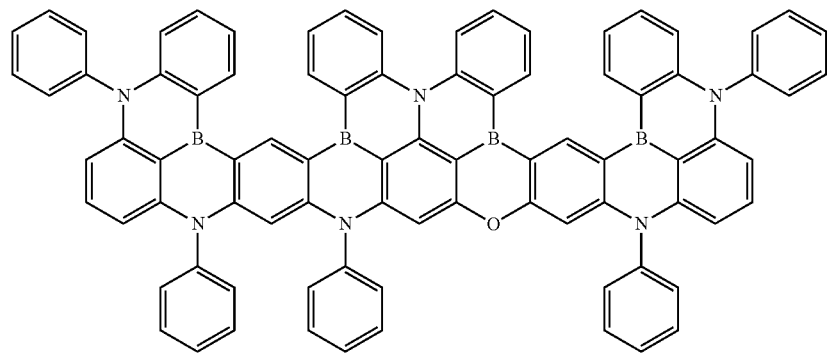
28
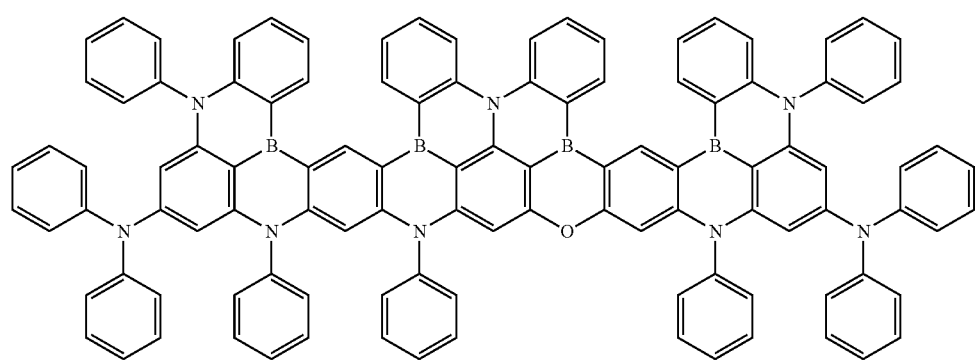
29
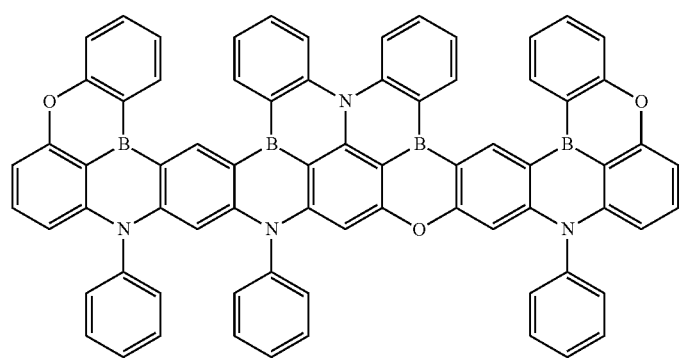
30
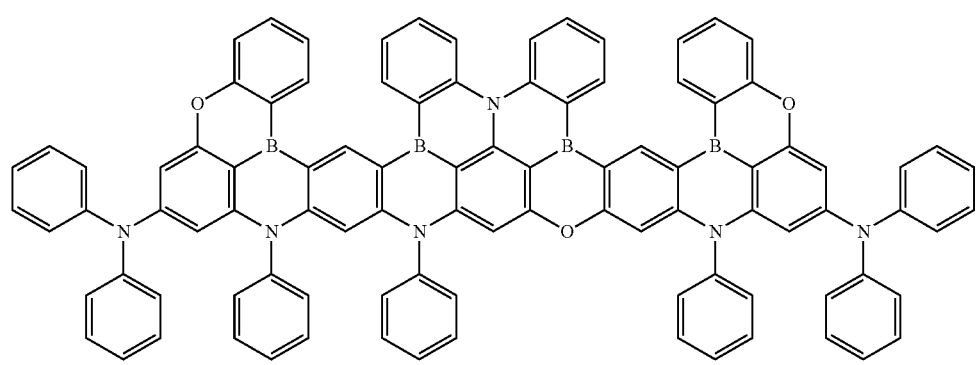
31

-continued
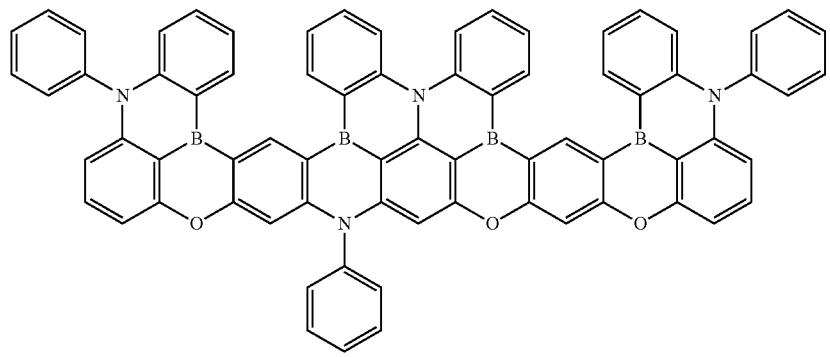
32
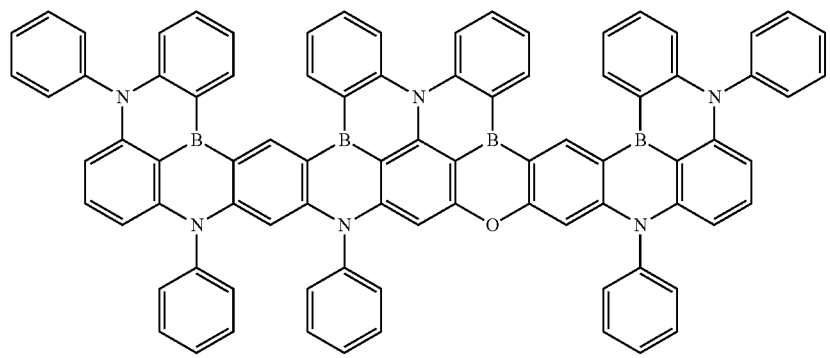
33
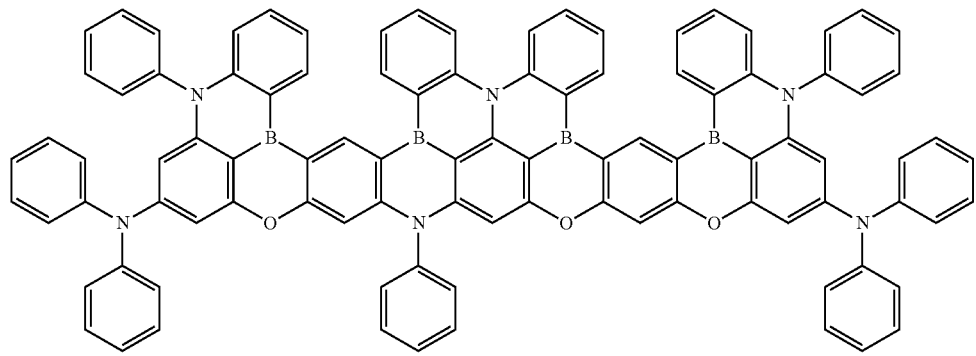
34
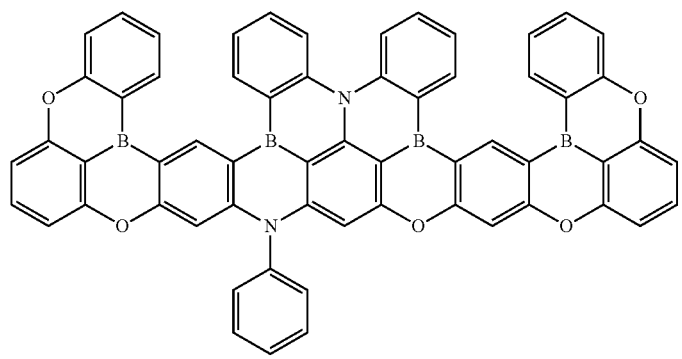
35

36
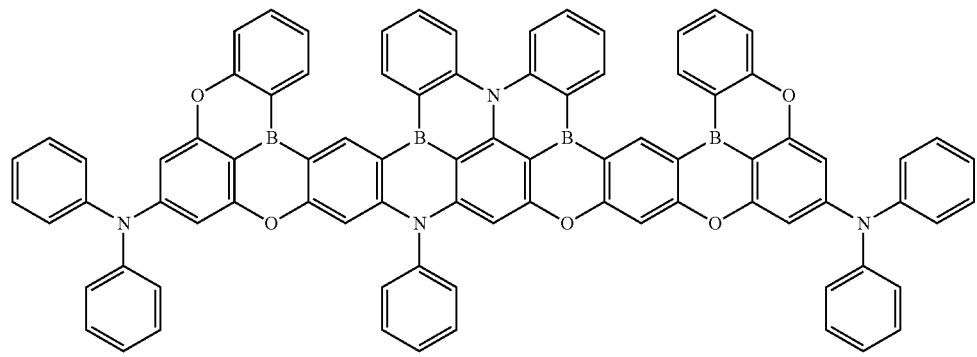
37
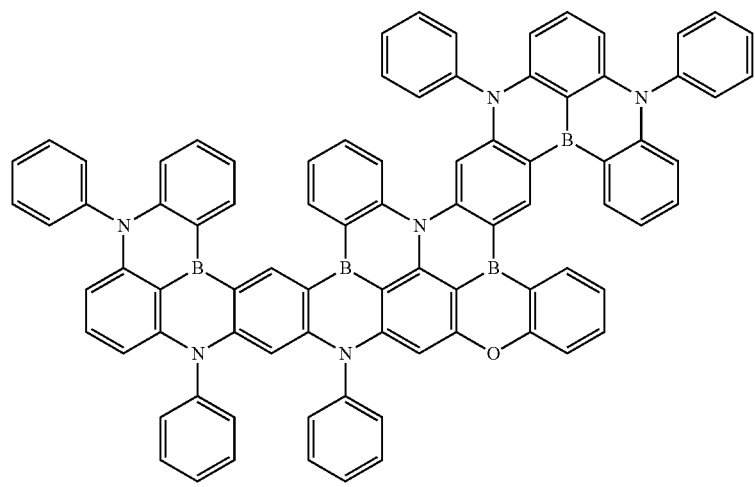
38
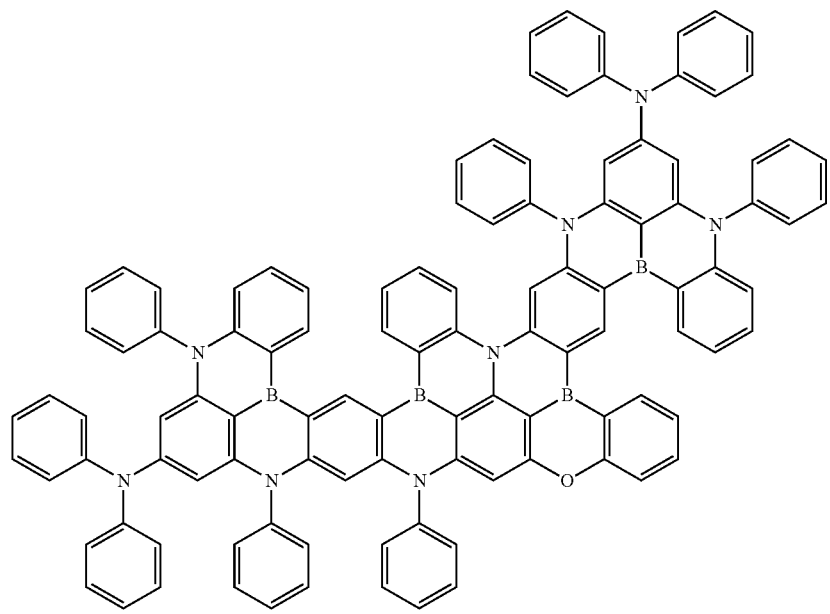

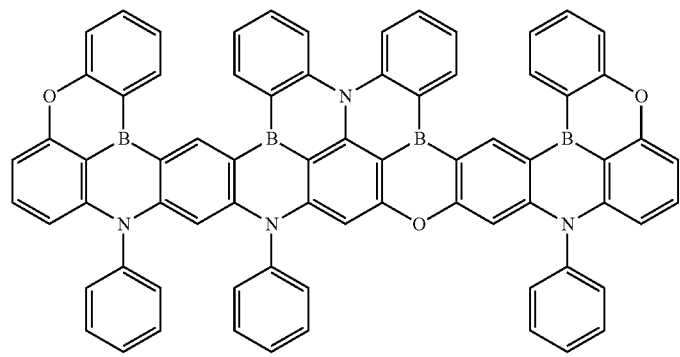
39
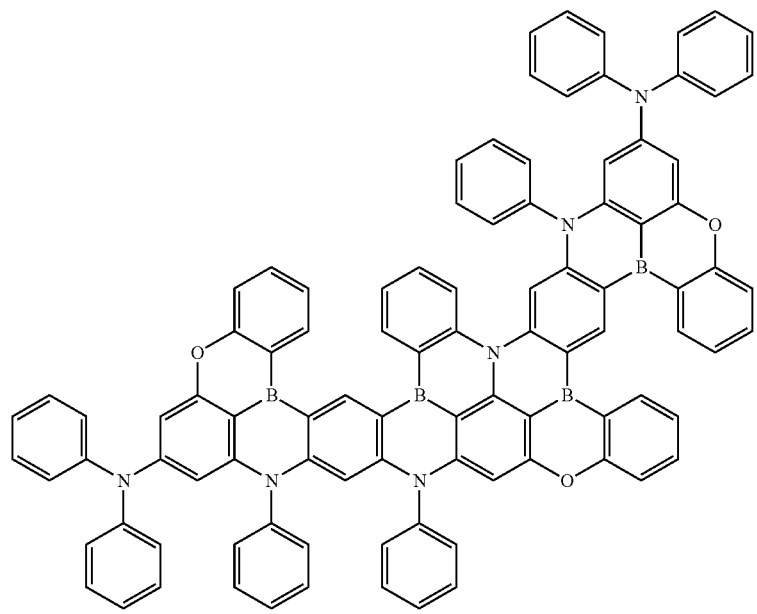
40
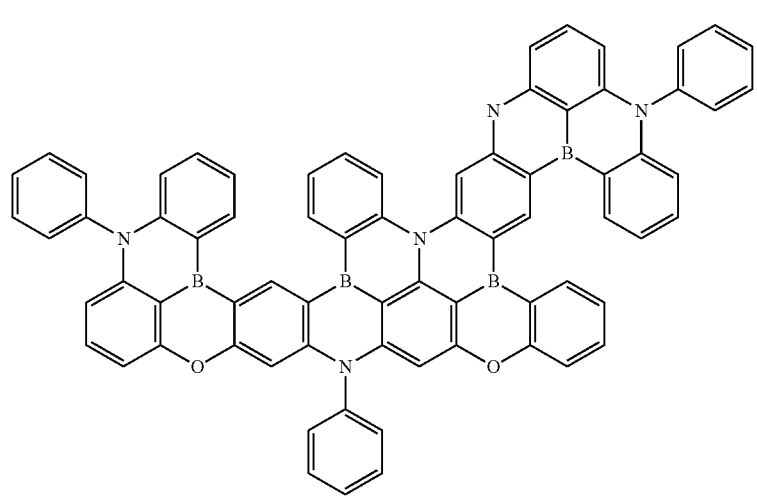
41

42
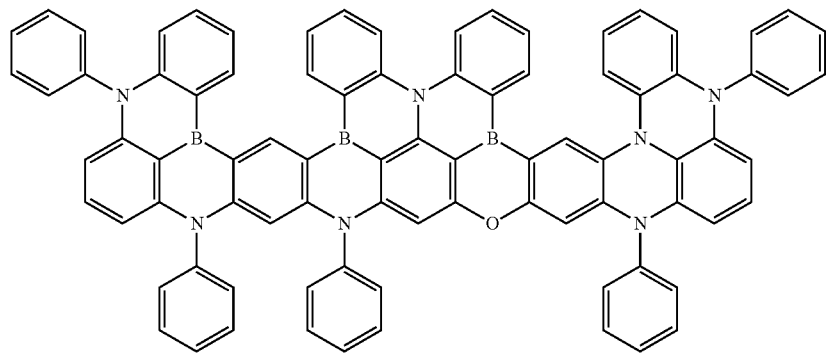
43
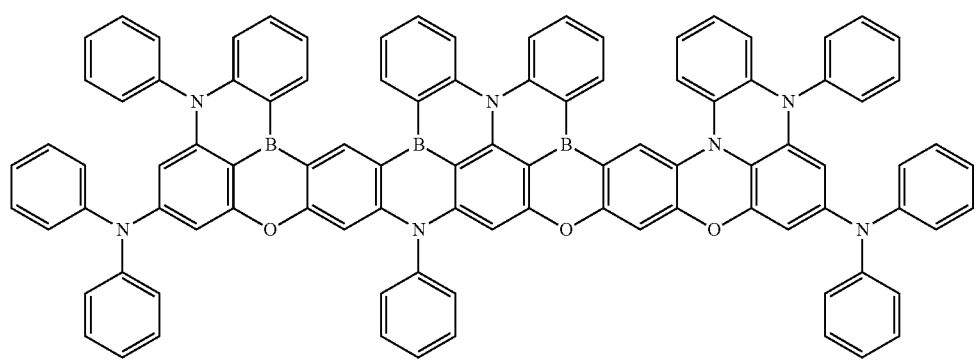
44
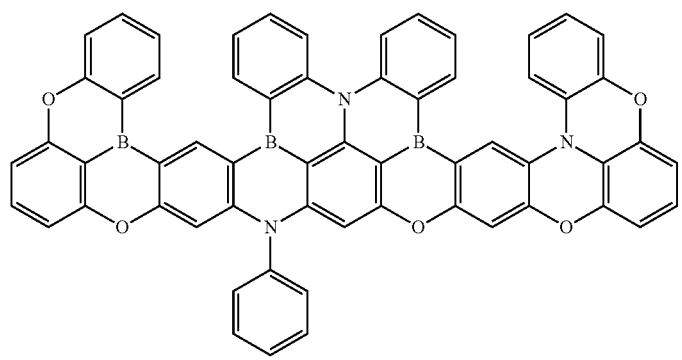
45
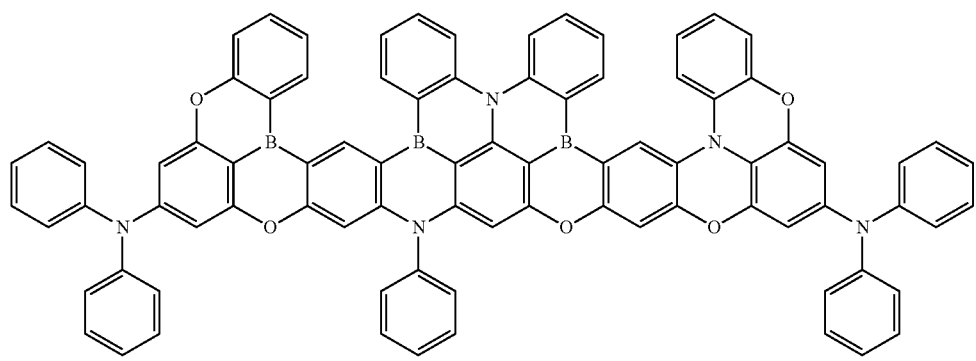

-continued
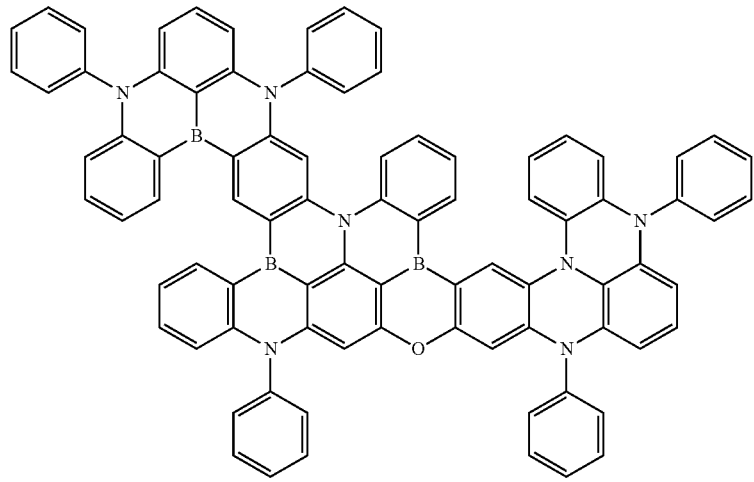
46
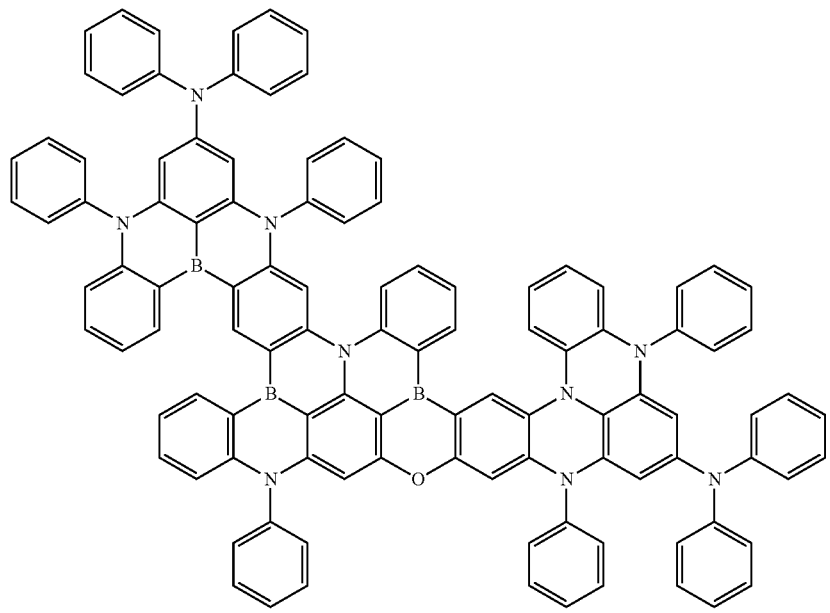
47
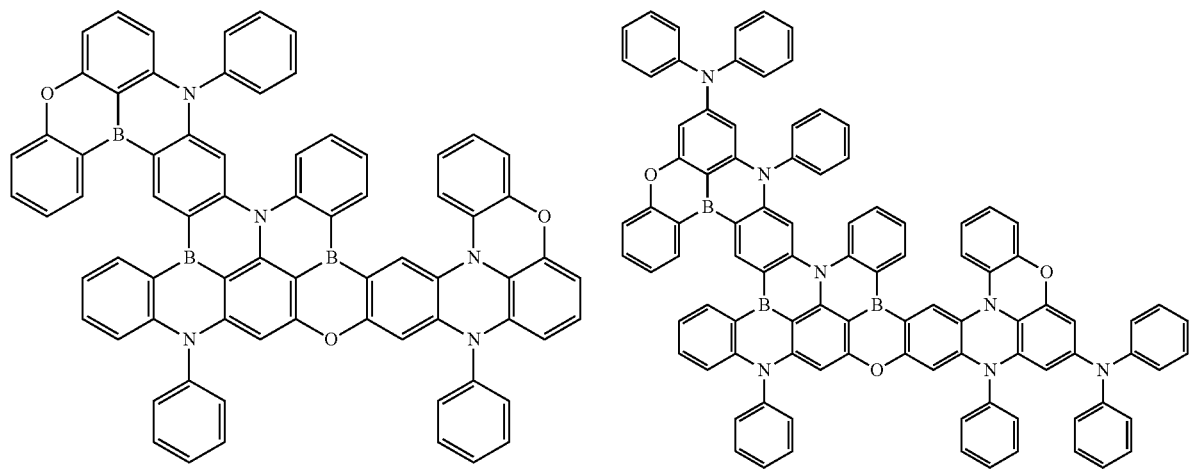
48 49

-continued
50
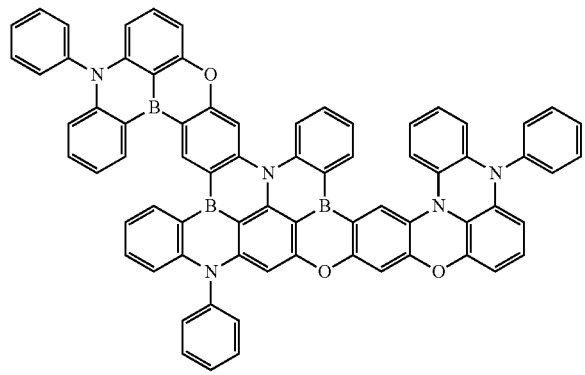
51
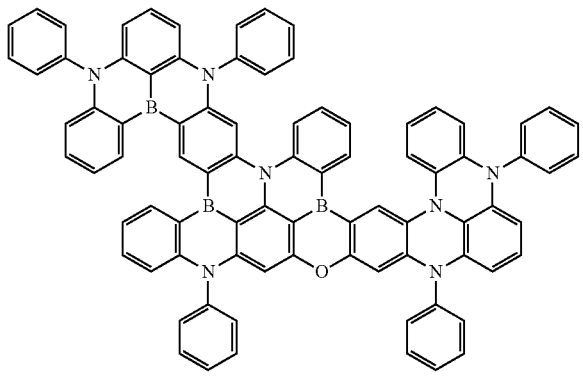
52
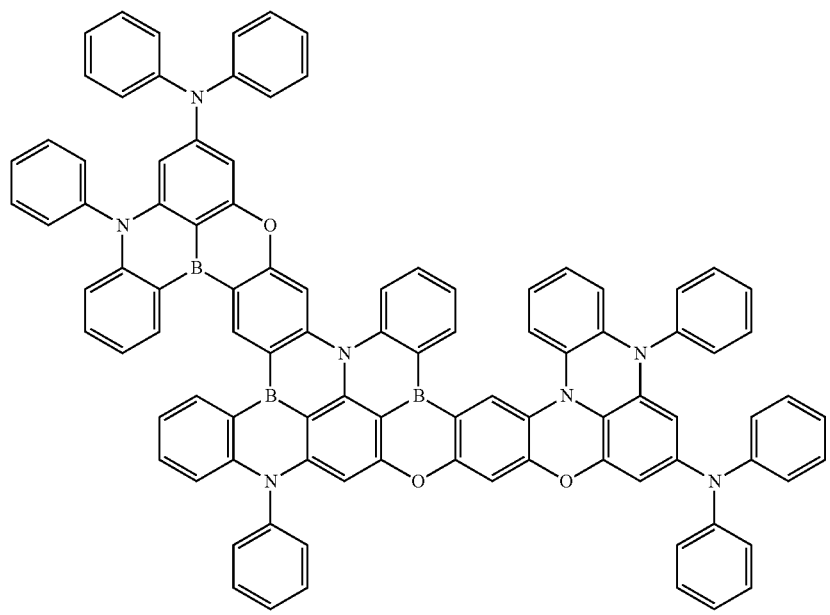
53
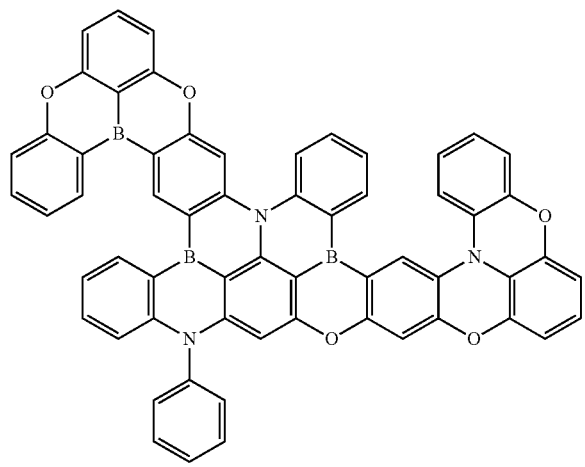
54
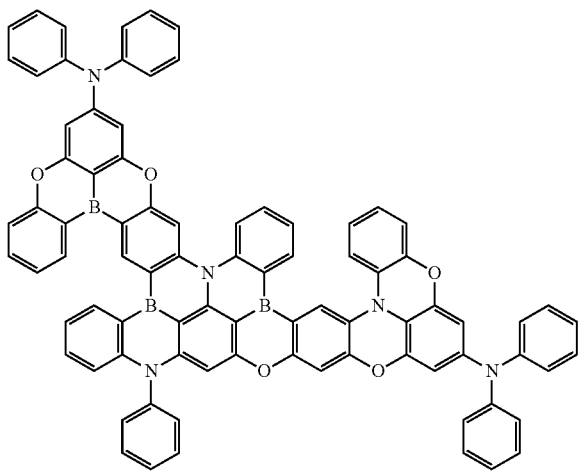

-continued
55
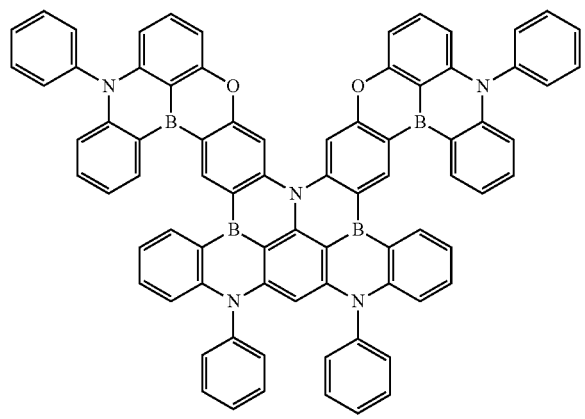
56
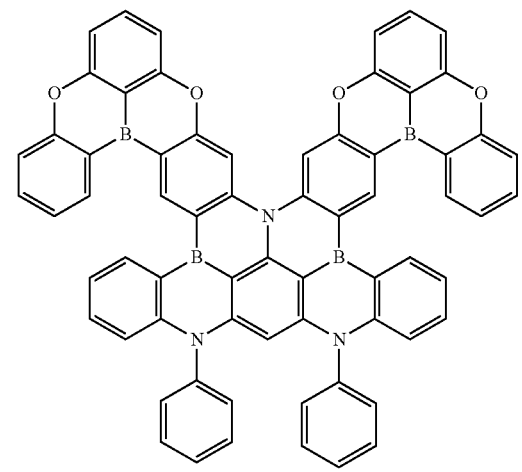
57
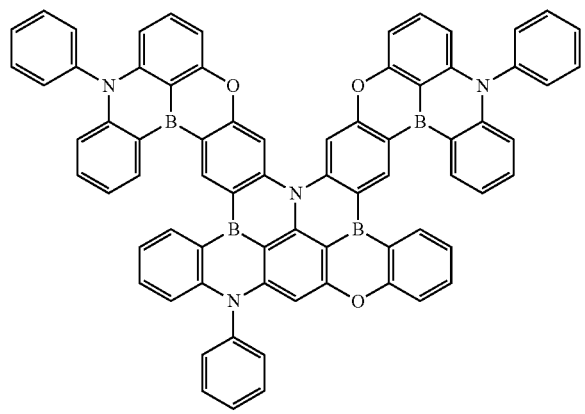
58
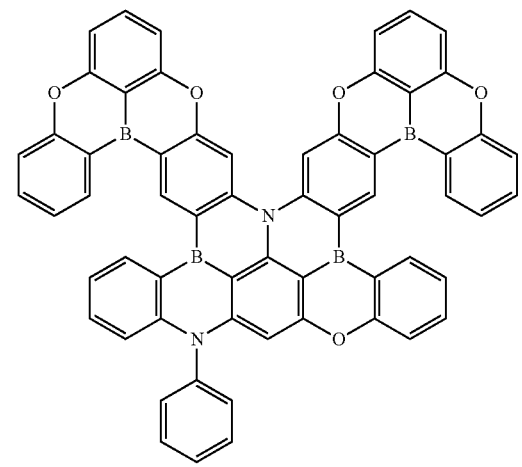
59
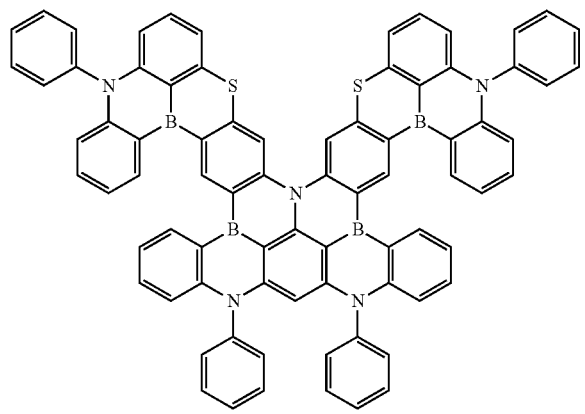
60
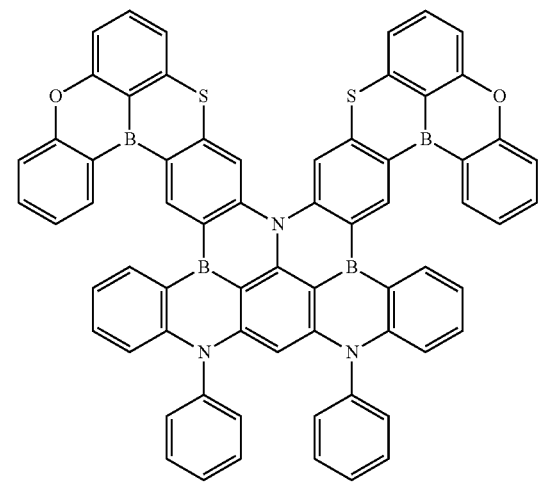

-continued
61
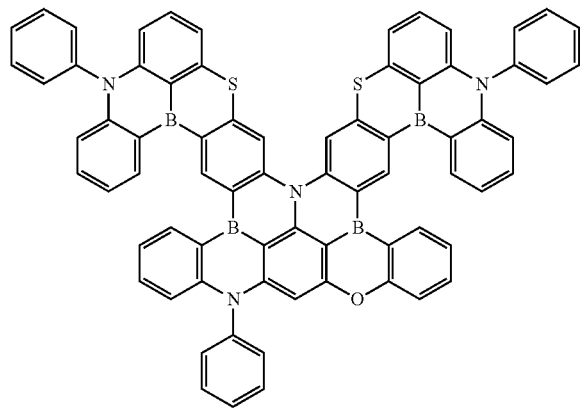
62
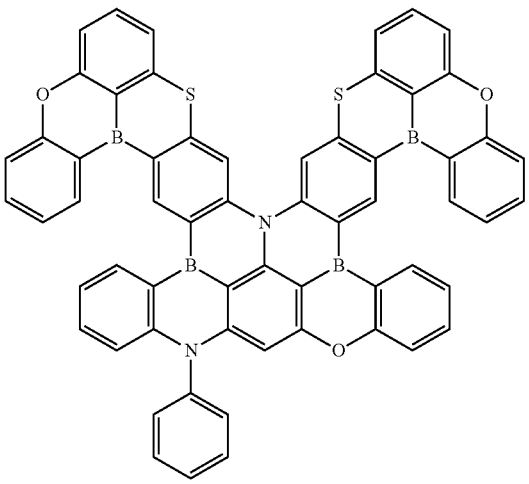
63
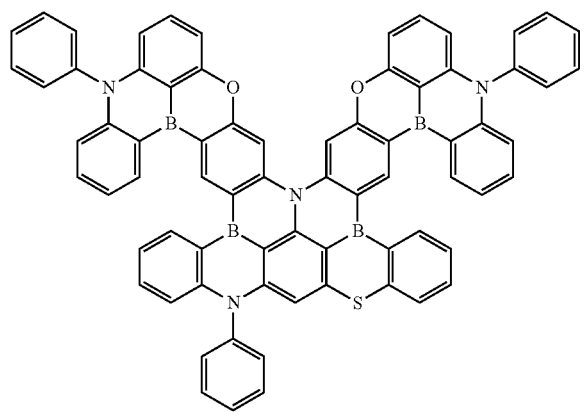
64
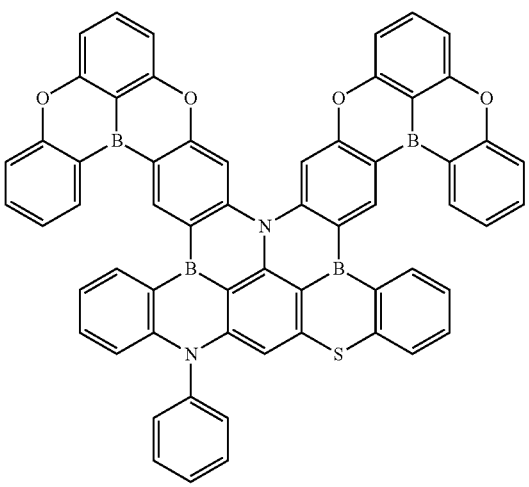
65
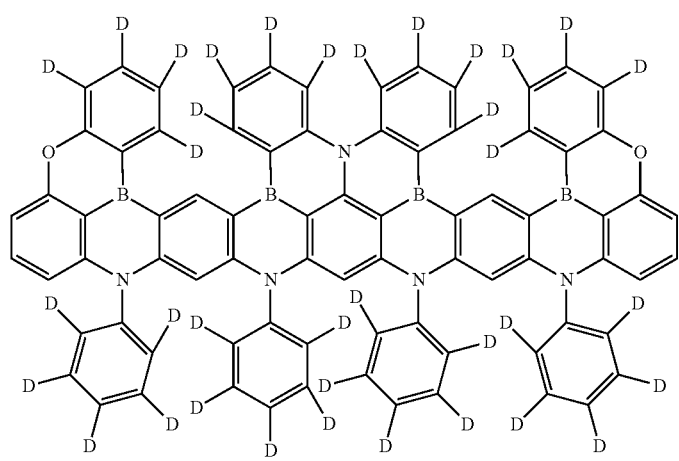

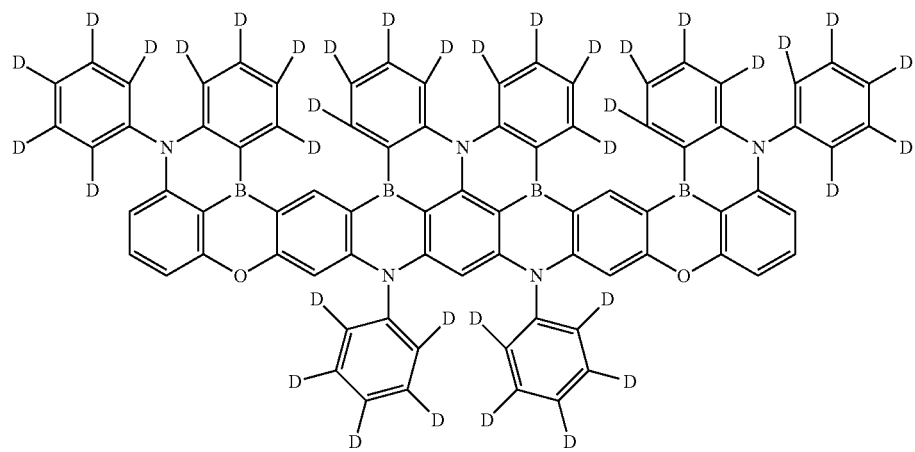
66
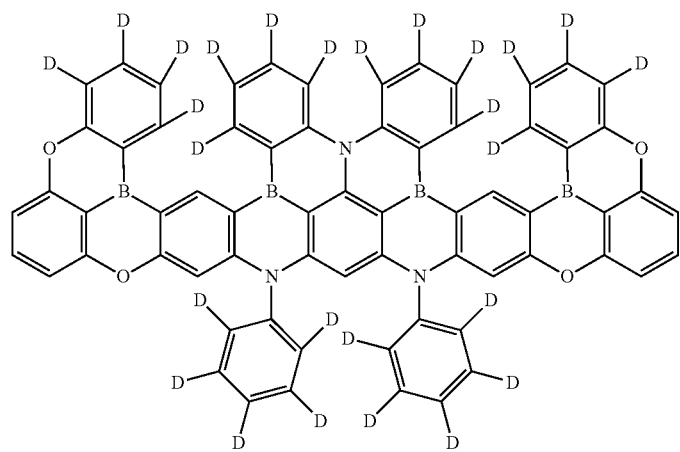
67
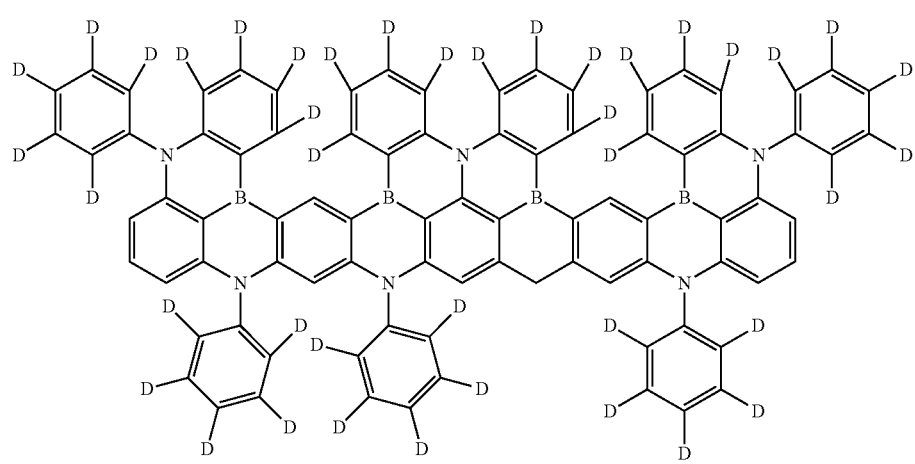
68

-continued
69
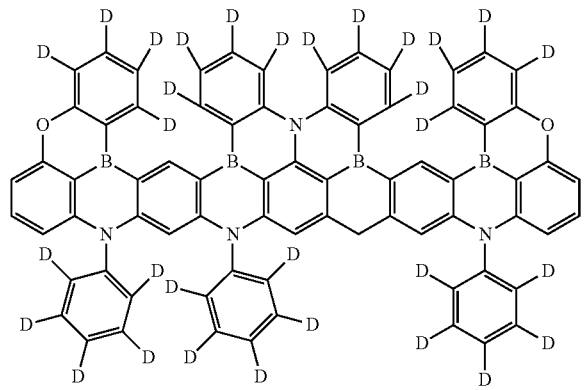
70
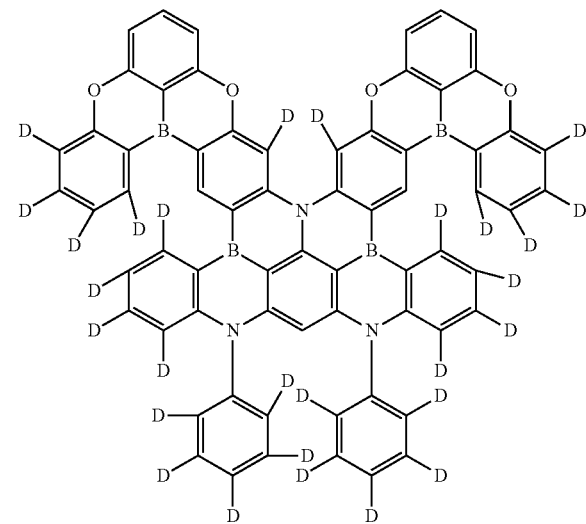
71
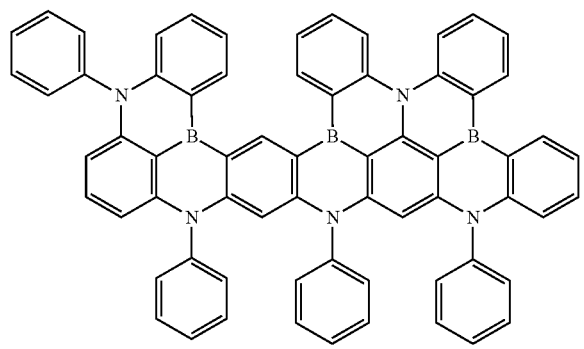
72
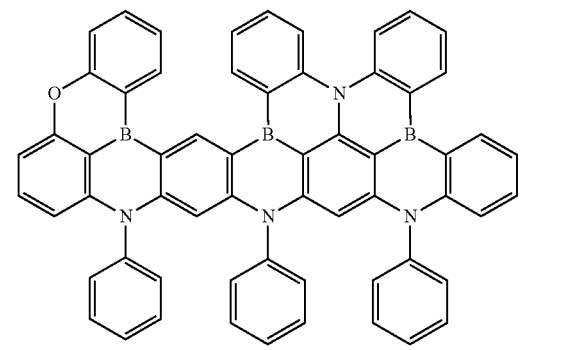
73
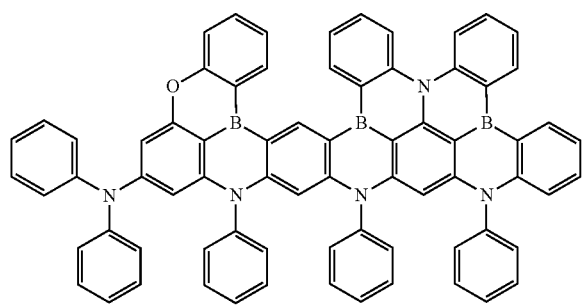
74
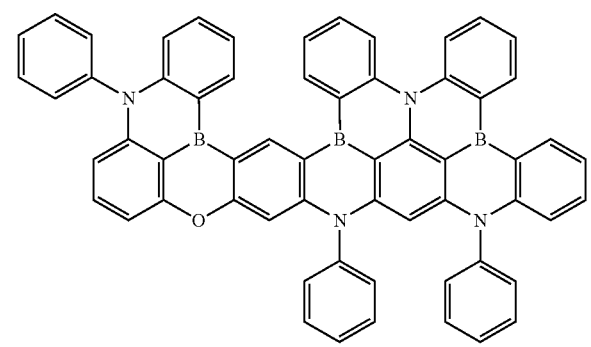
75
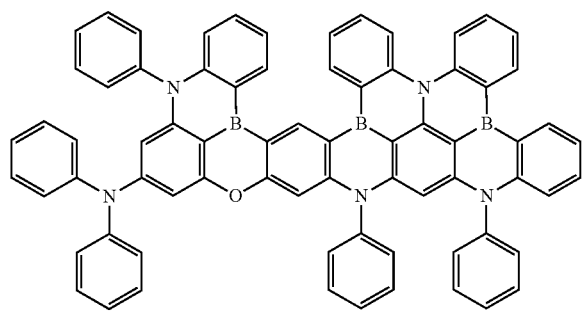
76
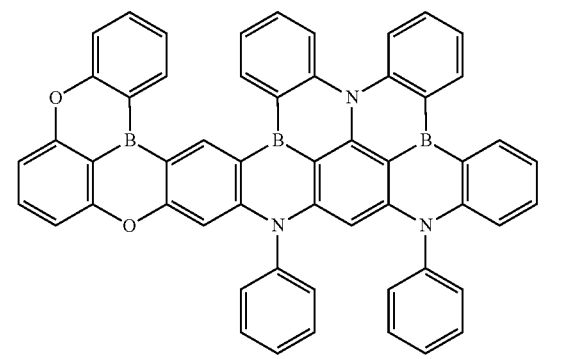

-continued
77
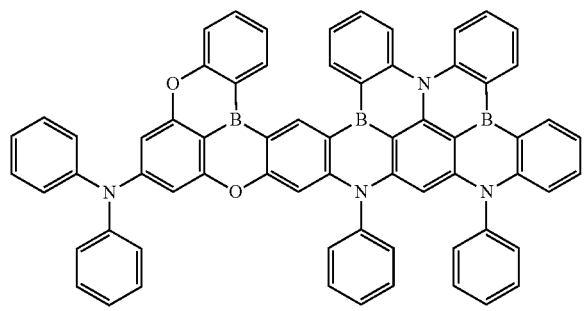
78
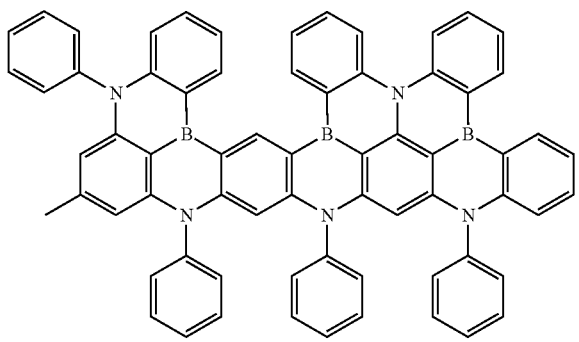
79
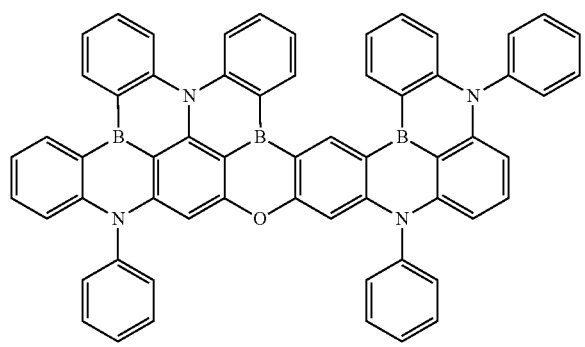
80
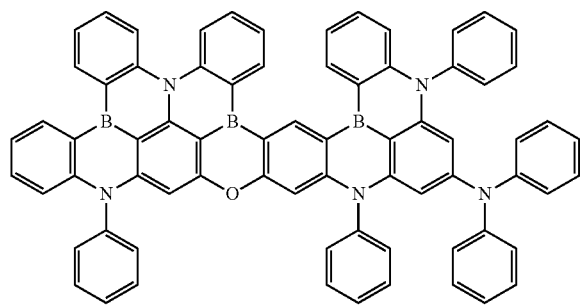
81
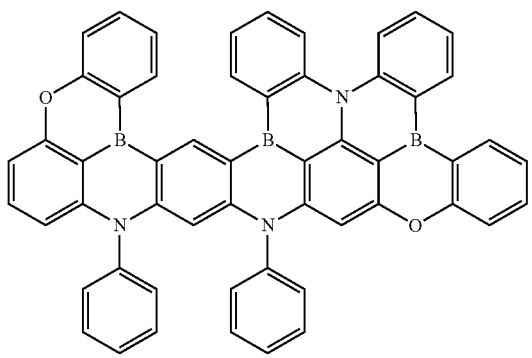
82
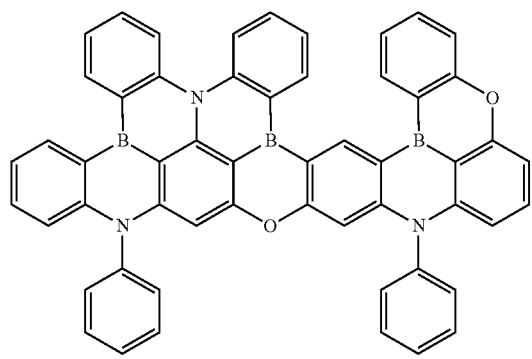
83
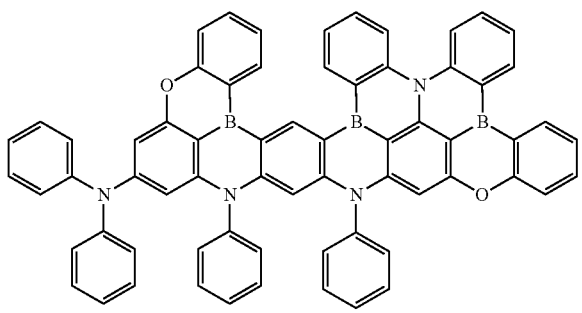
84

-continued
85
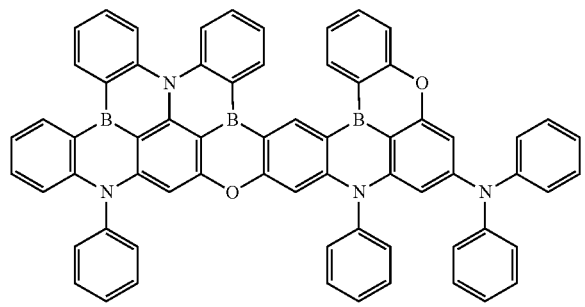
86
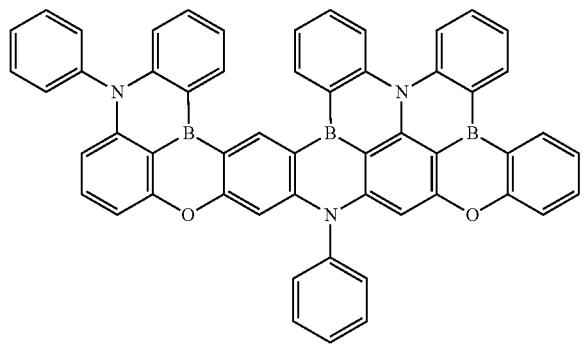
87
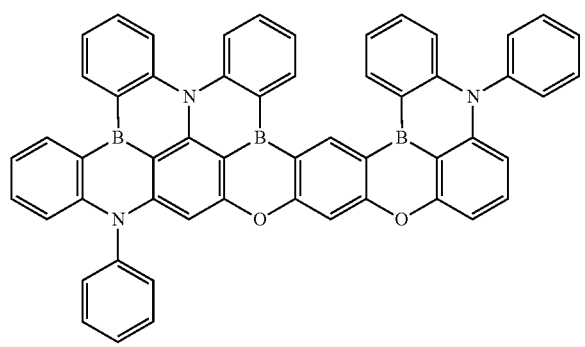
88
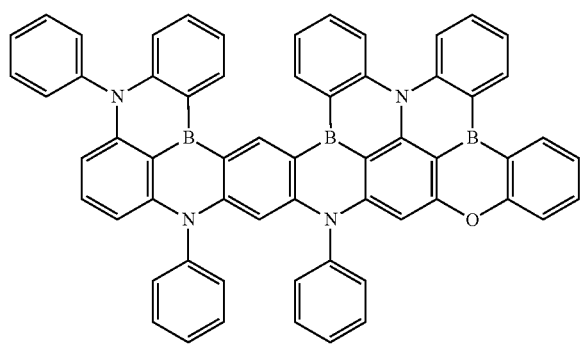
89
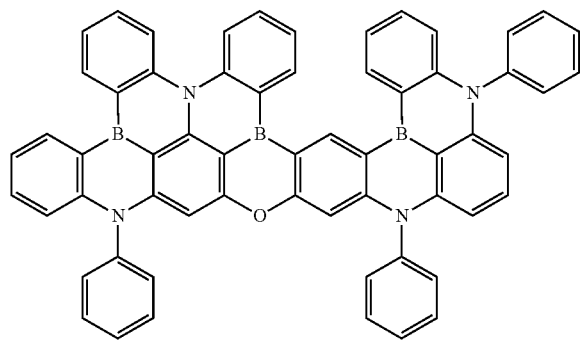
90
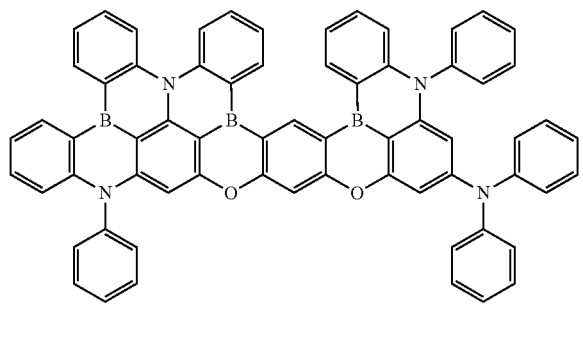
91
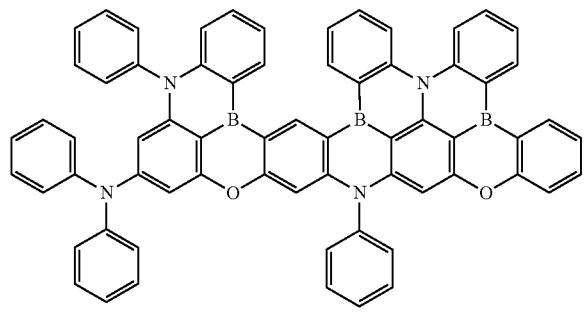
92
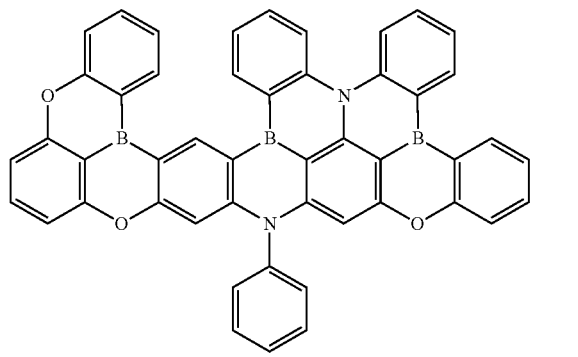

-continued

93

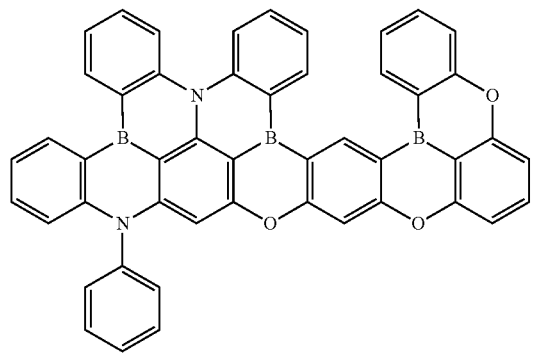

94

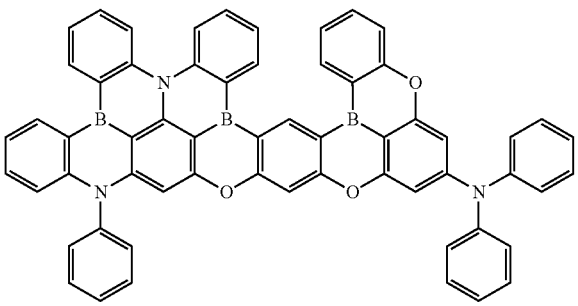

95

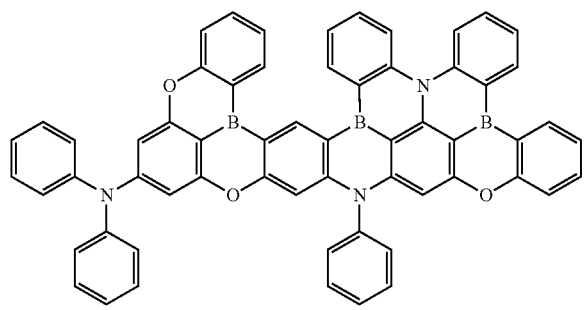

96

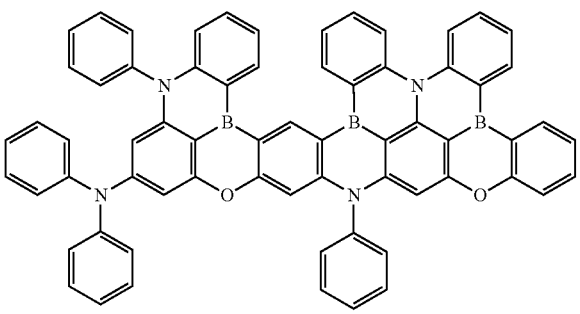

97

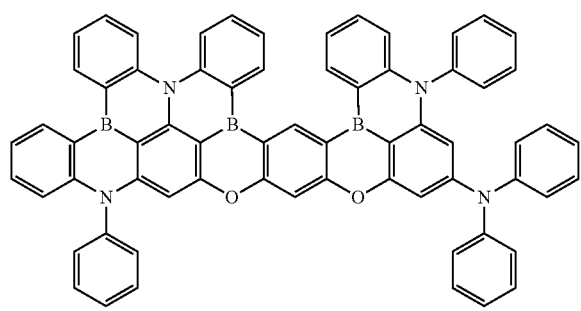

98

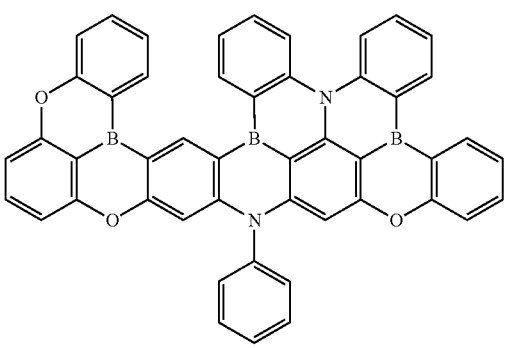

99

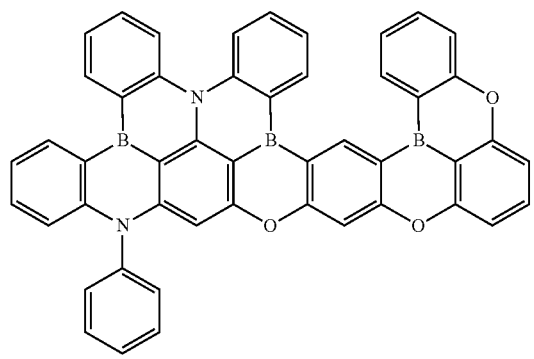

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION OF THE EMBODIMENTS

Figure 1:
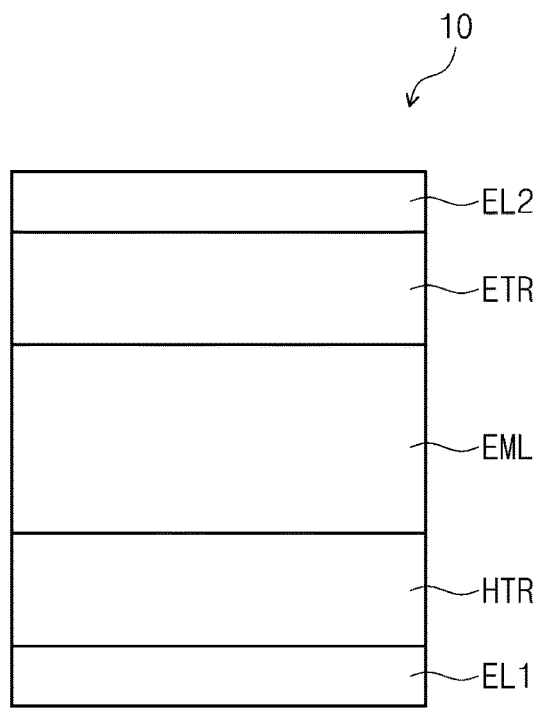
FIG. 1 is a schematic cross-sectional view illustrating an organic electroluminescence device according to an embodiment of the inventive concept.

The inventive concept may be modified in many alternate forms, and thus specific embodiments will be depicted in the drawings and described in detail. It should be understood, however, that it is not intended to limit the inventive concept to the particular forms disclosed, but rather, is intended to cover all modifications, equivalents, and alternatives falling within the spirit and scope of the invention.

In the disclosure, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals refer to like elements. In the drawings, the thickness, the ratio, and the dimensions of elements may be exaggerated for an effective description of technical contents.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or". Throughout the disclosure, the expression "at least one of A, B, and C" may indicate only A, only B, only C, both A and B, both A and C, both B and C, all of A, B, and C, or variations thereof.

The term "at least one of" is intended to include the meaning of "at least one selected from the group consisting of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concept. The terms of a singular form may include plural forms unless the context clearly indicates otherwise.

Terms such as "below," "lower," "above," "upper," and the like are used to describe the relationship of the configurations shown in the drawings. The terms are used as a relative concept and are described with reference to the direction indicated in the drawings.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±20%, 10%, or 5% of the stated value.

Unless otherwise defined, all terms (including technical and scientific terms) used herein have the same meaning as commonly understood by one of ordinary skill in the art to which the inventive concept pertains. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprises," "comprising," "includes," "including," "have," "having," "contains," and/or "containing" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, an organic electroluminescence device according to an embodiment of the inventive concept and a polycyclic compound of an embodiment included therein will be described with reference to the accompanying drawings.

FIGS. 1 to 4 are schematic cross-sectional views illustrating an organic electroluminescence device according to an embodiment of the inventive concept. Referring to FIGS. 1 to 4, in an organic electroluminescence device 10 according to an embodiment, a first electrode EL1 and a second electrode EL2 are disposed to face each other and an emission layer EML may be disposed between the first electrode EL1 and the second electrode EL2.

Also, the organic electroluminescence device 10 of an embodiment further includes organic layers between the first electrode EL1 and the second electrode EL2 in addition to the emission layer EML. The organic layers may include a hole transport region HTR and an electron transport region ETR. For example, the organic electroluminescence device 10 according to an embodiment may include the first electrode EL1, the hole transport region HTR, the emission layer EML, the electron transport region ETR, and the second electrode EL2 that are sequentially stacked. The organic electroluminescence device 10 of an embodiment may include a capping layer CPL disposed on the second electrode EL2.

The organic electroluminescence device 10 of an embodiment may include a polycyclic compound of an embodiment, which will be described later, in organic layers disposed between the first electrode EL1 and the second electrode EL2. For example, a polycyclic compound of an embodiment, which will be described later, may be included in the emission layer EML. However, the embodiment is not limited thereto, and the organic electroluminescence device 10 of an embodiment may include a polycyclic compound according to an embodiment, which will be described later, not only in the emission layer EML but also in the hole transport region HTR or electron transport region ETR, which may be part of the organic layers disposed between the first electrode EL1 and the second electrode EL2.

Figure 2:
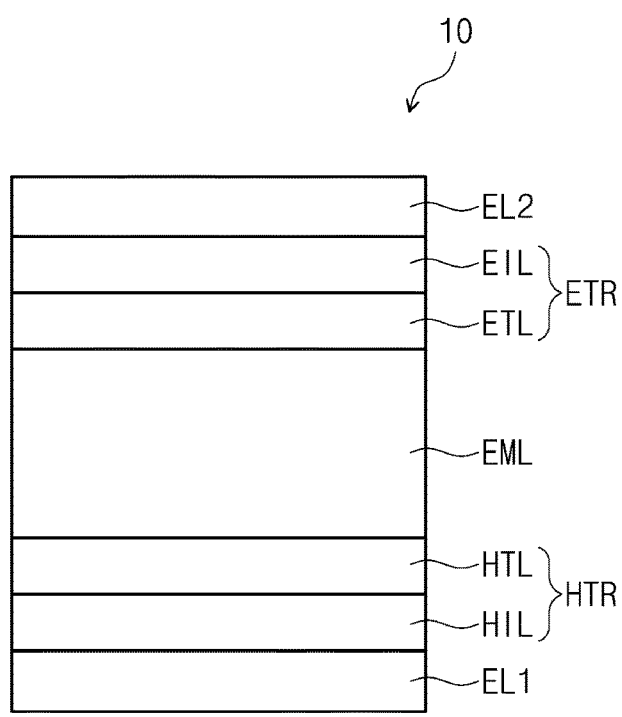
FIG. 2 is a schematic cross-sectional view illustrating an organic electroluminescence device according to an embodiment of the inventive concept.
Figure 3:
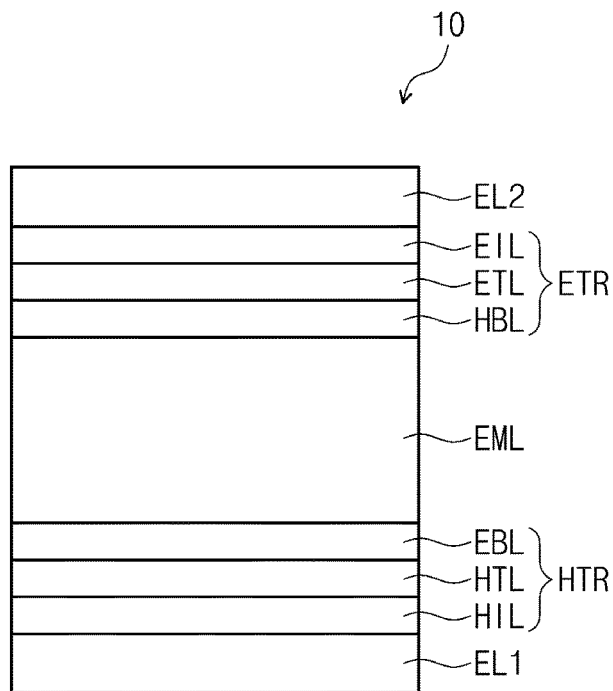
FIG. 3 is a schematic cross-sectional view illustrating an organic electroluminescence device according to an embodiment of the inventive concept.
Figure 4:
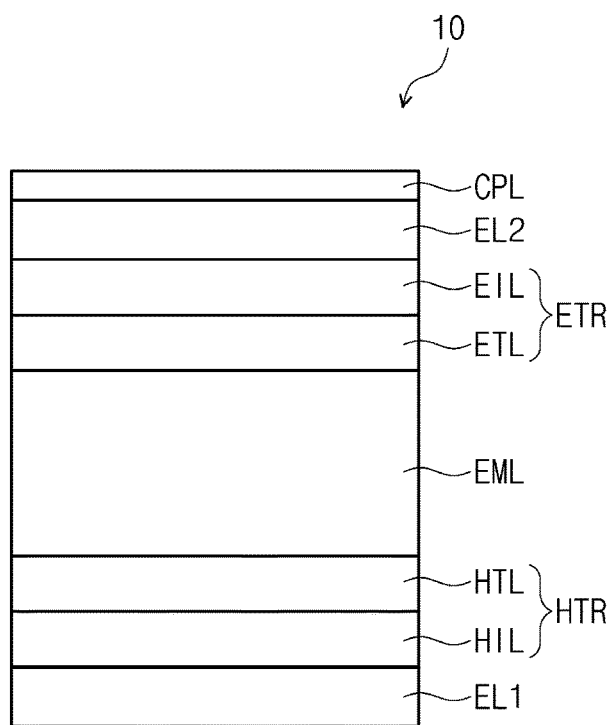
FIG. 4 is a schematic cross-sectional view illustrating an organic electroluminescence device according to an embodiment of the inventive concept.

Compared to FIG. 1, FIG. 2 illustrates a schematic cross-sectional view of an organic electroluminescence device 10 of an embodiment, in which a hole transport region HTR includes a hole injection layer HIL and a hole transport layer HTL, and an electron transport region ETR includes an electron injection layer EIL and an electron transport layer ETL. Compared to FIG. 1, FIG. 3 illustrates a schematic cross-sectional view of an organic electroluminescence device 10 of an embodiment, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. Compared to FIG. 2, FIG. 4 illustrates a schematic cross-sectional view of an organic electroluminescence device 10 of an embodiment including a capping layer CPL disposed on the second electrode EL2.

The first electrode EL1 has conductivity. The first electrode EL1 may be formed of a metal alloy or a conductive compound. The first electrode EL1 may be an anode. The first electrode EL1 may be a pixel electrode. The first electrode EL1 may be a transmissive electrode, a transflective electrode, or a reflective electrode. When the first electrode EL1 is a transmissive electrode, the first electrode EL1 may include a transparent metal oxide such as indium tin oxide (ITO), indium zinc oxide (IZO), zinc oxide (ZnO), and indium tin zinc oxide (ITZO). When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (e.g., a mixture of Ag and Mg).

The first electrode EL1 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the first electrode EL1 may have a three-layer structure of ITO/Ag/ITO, but is not limited thereto. The thickness of the first electrode EL1 may be in a range of about 1,000 Å to about 10,000 Å. For example, the thickness of the first electrode EL1 may be in a range of about 1,000 Å to about 3,000 Å.

The hole transport region HTR is provided on the first electrode EL1. The hole transport region HTR may include at least one of a hole injection layer HIL, a hole transport layer HTL, a hole buffer layer, or an electron blocking layer EBL. The thickness of the hole transport region HTR may be, for example, in a range of about 50 Å to about 15,000 Å.

The hole transport region HTR may have a single layer formed of a single material, a single layer formed of different materials, or a multilayer structure including multiple layers formed of different materials.

For example, the hole transport region HTR may have a single layer structure of a hole injection layer HIL or a hole transport layer HTL, and may have a single layer structure formed of a hole injection material and a hole transport material. The hole transport region HTR may have a single layer structure formed of a different materials, or a structure in which a hole injection layer HIL/hole transport layer HTL, a hole injection layer HIL/hole transport layer HTL/hole buffer layer (not shown), a hole injection layer HIL/hole buffer layer (not shown), a hole transport layer HTL/hole buffer layer, or a hole injection layer HIL/hole transport layer HTL/electron blocking layer EBL are stacked in order from the first electrode EL1, but embodiments are not limited thereto.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole injection layer HIL may include, for example, a phthalocyanine compound such as copper phthalocyanine, N,N'-diphenyl-N,N'-bis-[4-(phenyl-m-tolyl-amino)-phenyl]-biphenyl-4,4'-diamine (DNTPD), 4,4',4''-[tris(3-methylphenyl)phenylamino]triphenylamine](m-MTDATA), 4,4',4''-tris(N,N-diphenylamino)triphenylamine (TDATA), 4,4',4''-tris{N,-(2-naphthyl) —N-phenylamino)-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may include, for example, carbazole-based derivatives such as N-phenyl carbazole and polyvinyl carbazole, fluorine-based derivatives, N,N'-bis(3-methylphenyl)-N,N'-diphenyl-[1,1-biphenyl]-4,4'-diamine (TPD), triphenylamine-based derivatives such as 4,4',4''-tris(N-carbazolyl)triphenylamine (TCTA), N,N'-di(1-naphtalene-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis(N-carbazolyl)benzene (mCP), etc.

The thickness of the hole transport region HTR may be in a range of about 50 Å to about 10,000 Å. For example, the thickness of the hole transport region HTR may be in a range of about 100 Å to about 5,000 Å. The thickness of the hole injection region HIL may be, for example, in a range of about 30 Å to about 1,000 Å, and the thickness of the hole transport layer HTL may be in a range of about 30 Å to about 1,000 Å. For example, the thickness of the electron blocking layer EBL may be in a range of about 10 Å to about 1,000 Å. If the thicknesses of the hole transport region HTR, the hole injection layer HIL, the hole transport layer HTL and the electron blocking layer EBL satisfy the above-described ranges, satisfactory hole transport properties may be achieved without a substantial increase in driving voltage.

The hole transport region HTR may further include, in addition to the above-described materials, a charge generating material to increase conductivity. The charge generating material may be dispersed uniformly or non-uniformly in the hole transport region HTR. The charge generating material may be, for example, a p-dopant. The p-dopant may be one of quinone derivatives, metal oxides, or cyano group-containing compounds, but is not limited thereto. For example, non-limiting examples of the p-dopant may include quinone derivatives such as tetracyanoquinodimethane (TCNQ) and 2,3,5,6-tetrafluoro-7,7,8,8-tetracyanoquinodimethane (F4-TCNQ), metal oxides such as tungsten oxide and molybdenum oxide, etc., but is not limited thereto.

As described above, the hole transport region HTR may further include at least one of a hole buffer layer (not shown) or an electron blocking layer EBL in addition to the hole injection layer HIL and the hole transport layer HTL. The hole buffer layer (not shown) may compensate for a resonance distance according to the wavelength of light emitted from an emission layer EML to increase light emission efficiency. Materials which may be included in the hole transport region HTR may be used as materials which may be included in the hole buffer layer. The electron blocking layer EBL is a layer that serves to prevent electrons from being injected from the electron transport region ETR to the hole transport region HTR.

The emission layer EML may be provided on the hole transport region HTR. The thickness of the emission layer EML may be, for example, in a range of about 100 Å to about 1000 Å. For example, the thickness of the emission layer EML may be in a range of about 100 Å to about 300 Å. The emission layer EML may have a single layer formed of a single material, a single layer formed of different materials, or a multilayer structure having multiple layers formed of different materials.

In the description, the term "substituted or unsubstituted" may indicate that one is substituted or unsubstituted with at least one substituent selected from the group consisting of a deuterium atom, a halogen atom, a cyano group, a nitro group, an amine group, a silyl group, oxy group, thio group, sulfinyl group, sulfonyl group, carbonyl group, a boron group, a phosphine oxide group, a phosphine sulfide group, an alkyl group, an alkenyl group, an alkoxy group, a hydrocarbon ring group, an aryl group, and a heterocyclic group. Each of the substituents described above may be substituted or unsubstituted. For example, a biphenyl group may be interpreted as an aryl group or as a phenyl group substituted with a phenyl group.

In the description, the term "bonded to an adjacent group to form a ring" may indicate that one is bonded to an adjacent group to form a substituted or unsubstituted hydrocarbon ring, or a substituted or unsubstituted heterocycle. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocyclic or polycyclic. The rings formed by being bonded to each other may be connected to another ring to form a spiro structure.

In the description, the term "bonded to an adjacent group to form a ring" may indicate that two adjacent rings are bonded to form a substituted or unsubstituted hydrocarbon ring, or a substituted or unsubstituted heterocycle.

In the description, the term "an adjacent group" may mean a substituent substituted for an atom which is directly connected to an atom substituted with a corresponding substituent, another substituent substituted for an atom which is substituted with a corresponding substituent, or a substituent sterically positioned at the nearest position to a corresponding substituent. For example, two methyl groups in 1,2-dimethylbenzene may be interpreted as mutually "adjacent groups" and two ethyl groups in 1,1-diethylcyclopentane may be interpreted as mutually "adjacent groups".

In the description, examples of a halogen atom may include a fluorine atom, a chlorine atom, a bromine atom, and an iodine atom.

In the description, an alkyl group may be a linear, branched, or cyclic type. The number of carbon atoms in the alkyl group is 1 to 50, 1 to 30, 1 to 20, 1 to 10, or 1 to 6. Examples of the alkyl group may include a methyl group, an ethyl group, an n-propyl group, an isopropyl group, an n-butyl group, a s-butyl group, a t-butyl group, an i-butyl group, a 2-ethylbutyl group, a 3,3-a dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but are not limited thereto.

In the description, a hydrocarbon ring may indicate any functional group or substituent derived from an aliphatic hydrocarbon ring. The number of ring-forming carbon atoms in the hydrocarbon ring may be 5 to 20.

In the description, an aryl group means any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quingphenyl group, a sexiphenyl group, a triphenylenyl group, a pyrenyl group, a benzofluoranthenyl group, a chrysenyl group, etc., but are not limited thereto.

In the description, a heterocyclic group means any functional group or substituent derived from a ring containing at least one of B, O, N, P, Si, or S as a hetero atom. The heterocyclic group includes an aliphatic heterocyclic group and an aromatic heterocyclic group. The aromatic heterocyclic group may be a heteroaryl group. The aliphatic heterocycle and aromatic heterocycle may be monocyclic or polycyclic.

When the heterocyclic group contains two or more hetero atoms, the two or more hetero atoms may be the same as or different from each other. The heterocyclic group may be a monocyclic heterocyclic group or a polycyclic heterocyclic group, and include a heteroaryl group conceptually. The number of ring-forming carbon atoms in in the heterocyclic group may be 2 to 30, 2 to 20, or 2 to 10.

The number of ring-forming carbon atoms in the aliphatic heterocyclic group may be 2 to 30, 2 to 20, or 2 to 10. Examples of the aliphatic heterocyclic group include an oxirane group, a tyran group, a pyrrolidine group, a piperidine group, a tetrahydrofuran group, a tetrahydrothiophene group, a thian group, a tetrahydropyran group, a 1,4-dioxane group, etc., but are not limited to thereto.

When the heteroaryl group contains two or more hetero atoms, the two or more hetero atoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but are not limited thereto.

In the description, the number of carbon atoms in an amine group is not particularly limited, but may be 1 to 30. The amine group may include an alkyl amine group and an aryl amine group. Examples of the amine group include a methylamine group, a dimethylamine group, a phenylamine group, a diphenylamine group, a naphthylamine group, a 9-methyl-anthracenylamine group, a triphenylamine group, etc., but are not limited thereto.

In the description, the aryl group in the aryl amine group is the same as the above-described examples of the aryl group.

In the description, a direct linkage may refer to a single linkage.

In the description, "-•" refers to a position to be connected, and * indicates a binding site to a neighboring atom.

An emission layer EML of an organic electroluminescence device 10 of an embodiment may include a polycyclic compound of an embodiment represented by Formula 1 below.

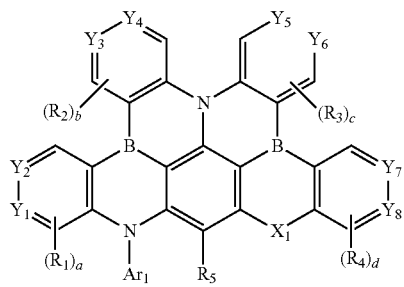

[Formula 1]

In Formula 1, $X_1$ may be $NAr_2$, O, or S.

In Formula 1, $Y_1$ to $Y_8$ may each independently be $CM_1$ or a carbon atom bonded to a group represented by Formula 2. Each $M_1$ may independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or bonded to an adjacent group to form a ring.

For example, $M_1$ may be a hydrogen atom or a deuterium atom. However, the embodiment is not limited thereto.

In Formula 1, $Ar_1$ and $Ar_2$ may be each independently a substituted or unsubstituted aryl group having 6 to 30 ring-forming carbon atoms or a substituted or unsubstituted heteroaryl group having 2 to 30 ring-forming carbon atoms. For example, $Ar_1$ and $Ar_2$ may be each independently a substituted or unsubstituted phenyl group. For example, $Ar_1$ and $Ar_2$ may be each independently an unsubstituted phenyl group or a phenyl group in which deuterium is substituted.

In Formula 1, $R_1$ to $R_5$ may be each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or bonded to an adjacent group to form a ring. For example, $R_1$ to $R_4$ may be each independently a hydrogen atom or a deuterium atom. For example, $R_5$ may be a hydrogen atom. However, the embodiment is not limited thereto.

In Formula 1, a, b, c, and d may each independently be an integer from 0 to 2. For example, a, b, c, and d may each be 0.

At least one group represented by Formula 2 may be bonded to at least one pair of substituents, wherein the at least one pair of substituents may be selected from the group consisting of $Y_1$ and $Y_2$, $Y_3$ and $Y_4$, $Y_5$ and $Y_6$, and $Y_7$ and $Y_8$. For example, one or two groups represented by Formula 2 below may be bonded to the polycyclic compound represented by Formula 1. However, the embodiment is not limited thereto.

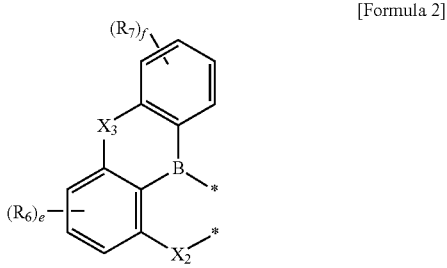

[Formula 2]

In Formula 2, each $X_2$ and each $X_3$ may independently be $NAr_3$, O, or S.

In Formula 2, each $Ar_3$ may independently be a substituted or unsubstituted aryl group having 6 to 30 ring-forming carbon atoms or a substituted or unsubstituted heteroaryl group having 2 to 30 ring-forming carbon atoms. For example, $Ar_3$ may be an unsubstituted phenyl group or a phenyl group in which deuterium is substituted.

In Formula 2, each $R_6$ and each $R_7$ may independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or bonded to an adjacent group to form a ring. For example, each $R_6$ and each $R_7$ may independently be a hydrogen atom, a deuterium atom, a substituted or unsubstituted arylamine group, or a substituted or unsubstituted alkyl group having 1 to 5 carbon atoms. For example, each $R_6$ and each $R_7$ may independently be an unsubstituted methyl group, an unsubstituted isopropyl group, an unsubstituted t-butyl group, a substituted or unsubstituted biphenyl amine group, or an unsubstituted phenyl group.

In Formula 2, each e may be an integer from 0 to 3. For example, e may be 0 or 1.

In Formula 2, each f may be an integer from 0 to 4. For example, f may be 0 or 1.

In an embodiment, the polycyclic compound represented by Formula 1 may be represented by one of Formulas 1-1a to 1-1c:

[Formula 1-1a]

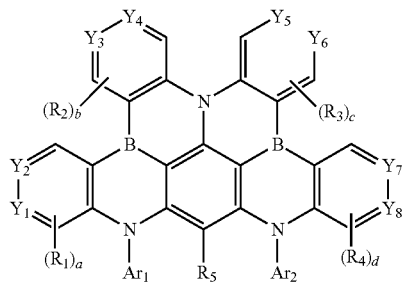

[Formula 1-1b]

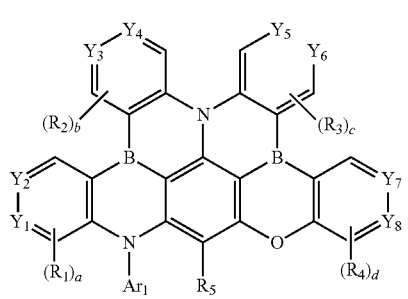

[Formula 1-1c]

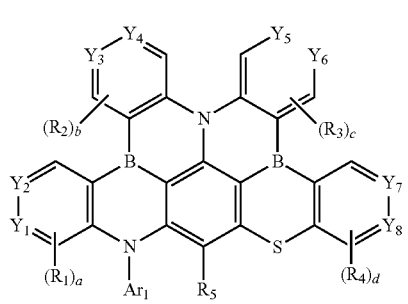

The case in which $X_1$ is $NAr_2$, O, and S in Formula 1 is embodied in Formulas 1-1a to 1-1c, respectively.

In Formulas 1-1a to 1-1c, the same description as mentioned above in Formulas 1 and 2 may be applied to $Y_1$ to $Y_8$, $Ar_1$, $Ar_2$, and $R_1$ to $R_5$.

In an embodiment, the polycyclic compound represented by Formula 1 may be represented by one of Formulas 1-2a to 1-2c:

[Formula 1-2a]

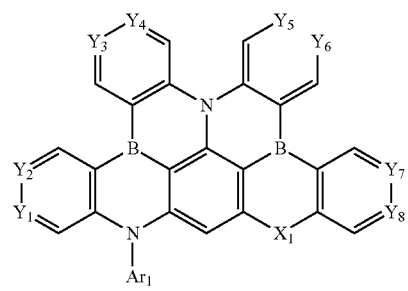

[Formula 1-2b]

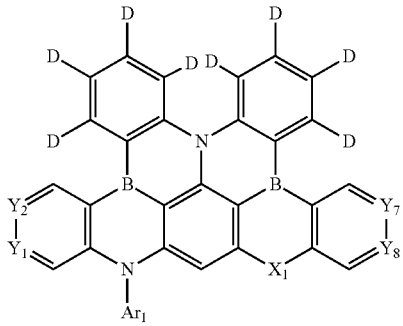

[Formula 1-2c]

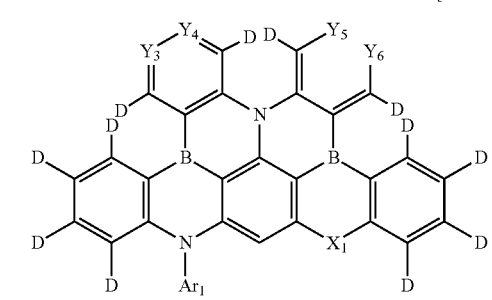

The case in which $R_1$ to $R_5$ are hydrogen atoms or deuterium atoms in the polycyclic compound represented by Formula 1 is embodied in Formulas 1-2a to 1-2c.

In Formulas 1-2a to 1-2c, positions where a group represented by Formula 2 is bonded to the polycyclic compound represented by Formula 1 are represented by $Y_1$ to $Y_6$.

In Formula 1-2a to Formula 1-2c, the same description as mentioned above in Formulas 1 and 2 may be applied to $X_1$, $Y_1$ to $Y_8$, and $Ar_1$.

In an embodiment, the polycyclic compound represented by Formula 1 may be represented by Formula 3-1 or Formula 3-2:

[Formula 3-1]

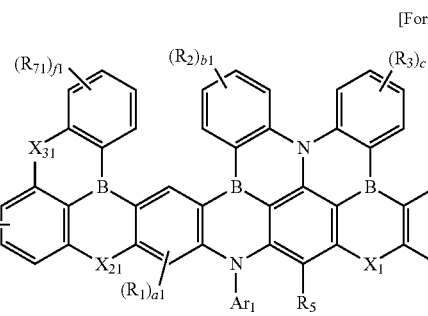

[Formula 3-2]

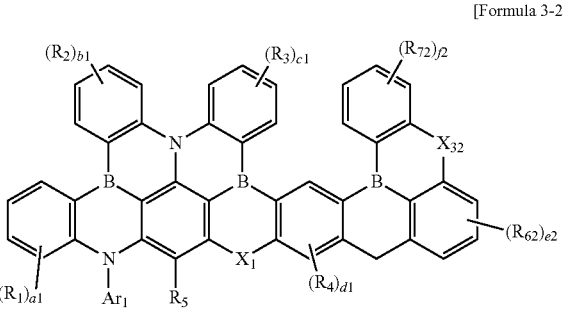

Positions where a group represented by Formula 2 is bonded to the compound represented by Formula 1 are embodied in Formulas 3-1 and 3-2.

The case in which a group represented by Formula 2 is bonded to $Y_1$ and $Y_2$ in Formula 1 is embodied in Formula 3-1. The case in which a group represented by Formula 2 is bonded to $Y_7$ and $Y_8$ in Formula 1 is embodied in Formula 3-2.

In Formulas 3-1 and 3-2, $X_{21}$, $X_{22}$, $X_{31}$, and $X_{32}$ may each independently be $NAr_4$, O, or S. For example, $X_{21}$, $X_{22}$, $X_{31}$, and $X_{32}$ may be each independently $NAr_4$ or O.

In Formulas 3-1 and 3-2, each $Ar_4$ may independently be a substituted or unsubstituted aryl group having 6 to 30 ring-forming carbon atoms or a substituted or unsubstituted heteroaryl group having 2 to 30 ring-forming carbon atoms. For example, $Ar_4$ may be an unsubstituted phenyl group. However, the embodiment is not limited thereto.

In Formulas 3-1 and 3-2, $R_{61}$, $R_{62}$, $R_{71}$, and $R_{72}$ may each independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 carbon atoms, or bonded to an adjacent group to form a ring. For example, $R_{61}$, $R_{62}$, $R_{71}$, and $R_{72}$ may be each independently a hydrogen atom, a methyl group, or an unsubstituted biphenyl amine group. However, the embodiment is not limited thereto.

In Formulas 3-1 and 3-2, a1 and d1 may each independently be an integer from 0 to 2. b1 and c1 may each independently be an integer from 0 to 4. e1 and e2 may each independently be an integer from 0 to 3. f1 and f2 may each independently be an integer from 0 to 4. For example, a1, b1, c1, d1, e1, e2, f1, and f2 each may be 0.

The same description as mentioned above in Formulas 1 and 2 may be applied to $X_1$, $Ar_1$, and $R_1$ to $R_5$.

In an embodiment, the polycyclic compound represented by Formula 1 may be represented by one of Formulas 4-1a to 4-1d:

[Formula 4-1a]

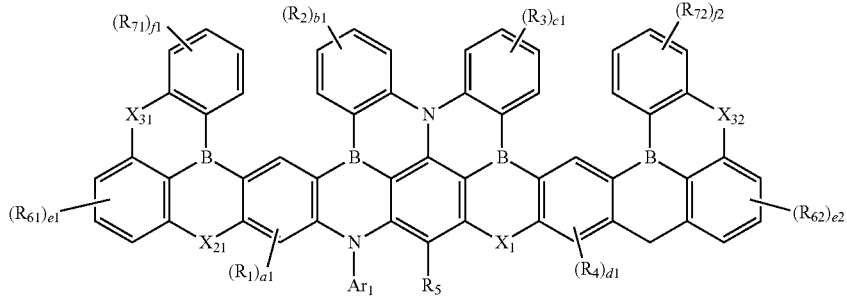

[Formula 4-1b]

[Formula 4-1c]

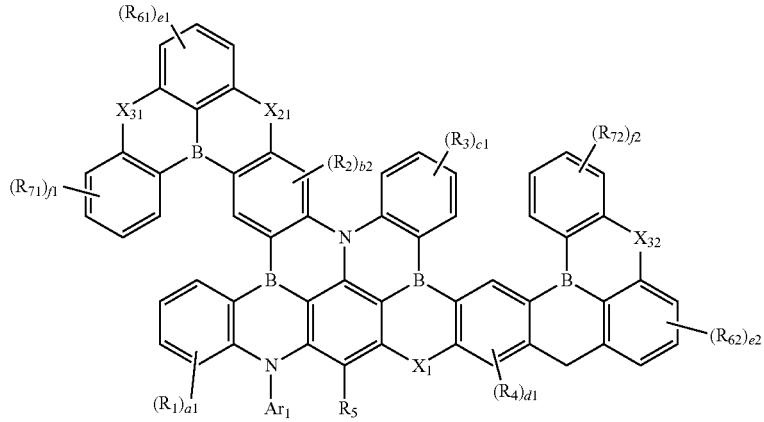

[Formula 4-1d]

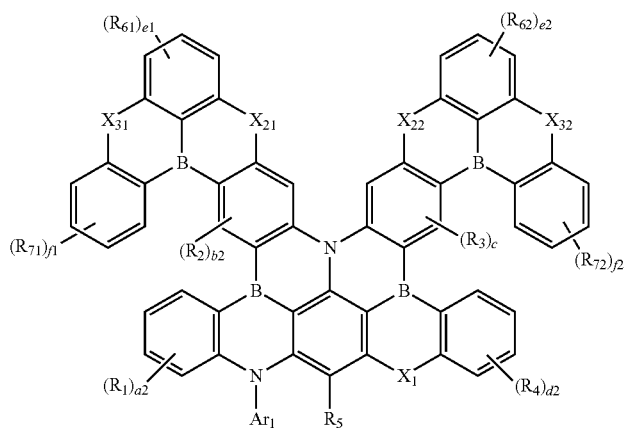

Positions where two groups represented by Formula 2 are bonded to the compound represented by Formula 1 are embodied in Formulas 4-1a to 4-1d.

In Formulas 4-1a to 4-1d, $X_{21}$, $X_{22}$, $X_{31}$, and $X_{32}$ may each independently be $NAr_4$, O, or S. In an embodiment, a polycyclic compound represented by Formula 4-1a may have a line-symmetrical structure with respect to an imaginary line passing through a central nitrogen atom and $R_5$. For example, in the polycyclic compound represented by Formula 4-1a, $X_1=NAr_1$, $X_{21}=X_{22}$, $X_{31}=X_{32}$, $R_1=R_4$, $R_2=R_3$, $R_{61}=R_{62}$, $R_{71}=R_{72}$, a1=d1, b1=c1, e1=e2, and f1=f2. However, the embodiment is not limited thereto.

In an embodiment, a polycyclic compound represented by Formula 4-1d may have a line-symmetrical structure with respect to an imaginary line passing through a central nitrogen atom and $R_5$. For example, in the polycyclic compound represented by Formula 4-1d, $X_1=NAr_1$, $X_{21}=X_{22}$, $X_{31}=X_{32}$, $R_1=R_4$, $R_2=R_3$, $R_{61}=R_{62}$, $R_{71}=R_{72}$, a1=d1, b1=c1, e1=e2, and f1=f2. However, the embodiment is not limited thereto.

In Formulas 4-1a to 4-1d, each $Ar_4$ may independently be a substituted or unsubstituted aryl group having 6 to 30 ring-forming carbon atoms or a substituted or unsubstituted heteroaryl group having 2 to 30 ring-forming carbon atoms. For example, $Ar_4$ may be an unsubstituted phenyl group or a phenyl group in which deuterium is substituted.

In Formulas 4-1a to 4-1d, $R_{61}$, $R_{62}$, $R_{71}$, and $R_{72}$ may be each independently a hydrogen atom, a deuterium atom, a halogen atom, a substituted or unsubstituted amine group, a substituted or unsubstituted alkyl group having 1 to 20 carbon atoms, a substituted or unsubstituted aryl group having ring-forming 6 to 30 carbon atoms, or a substituted or unsubstituted heteroaryl group having 2 to 30 ring-forming carbon atoms, or bonded to an adjacent group to form a ring. For example, $R_{61}$, $R_{62}$, $R_{71}$, and $R_{72}$ may each independently be a hydrogen atom, a deuterium atom, a substituted or unsubstituted arylamine group, or a substituted or unsubstituted alkyl group having 1 to 5 carbon atoms. For example, $R_{61}$, $R_{62}$, $R_{71}$, and $R_{72}$ may be each independently an unsubstituted methyl group, an unsubstituted isopropyl group, an unsubstituted t-butyl group, a substituted or unsubstituted biphenyl amine group, or an unsubstituted phenyl group.

In Formulas 4-1a to 4-1d, a1, b2, c2, and d1 may each independently be an integer from 0 to 2. a2, b1, c1, and d2 may each independently be an integer from 0 to 4. e1 and e2 may each independently an integer from 0 to 3. f1 and f2 may each independently be an integer from 0 to 4. For example, a1, a2, b1, b2, c1, c2, d1, d2, e1, e2, f1, and f2 each may be 0.

The same description as mentioned above in Formulas 1 and 2 may be applied to $X_1$, $Ar_1$, and $R_1$ to $R_5$.

In an embodiment, the polycyclic compound represented by Formula 1 may be represented by one of Formulas 4-2a to 4-2d:

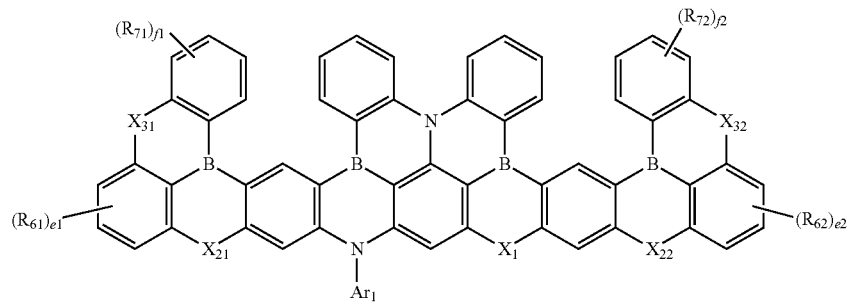
[Formula 4-2a]
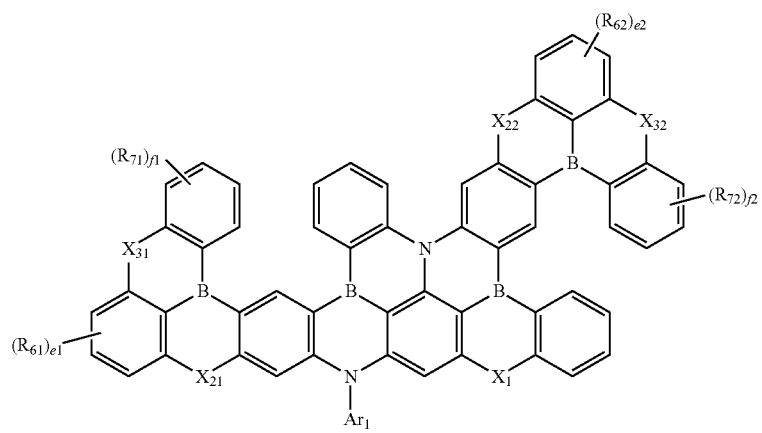
[Formula 4-2b]
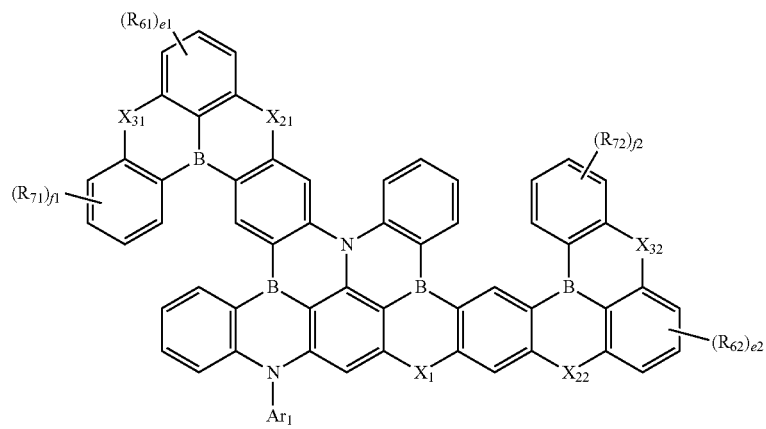
[Formula 4-2c]
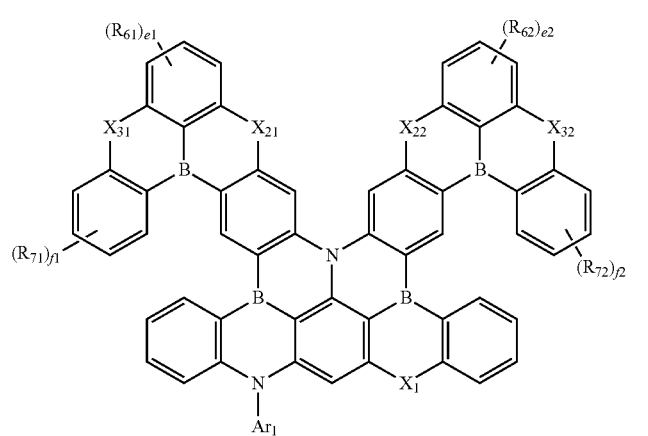
[Formula 4-2d]

The case in which $R_1$ to $R_5$ each are a hydrogen atom in Formulas 4-1a to 4-1d is embodied in Formulas 4-2a to 4-2d.

In Formulas 4-2a to 4-2d, the same description as mentioned above in Formulas 1, 2, and 4-1a to 4-1d may be applied to $X_1$, $X_{21}$, $X_{22}$, $X_{31}$, $X_{32}$, $R_{61}$, $R_{62}$, $R_{71}$, $R_{72}$, $Ar_1$, e1, e2, f1 and f2.

In an embodiment, the polycyclic compound represented by Formula 1 may be represented by Formula 5-1 or Formula 5-2.

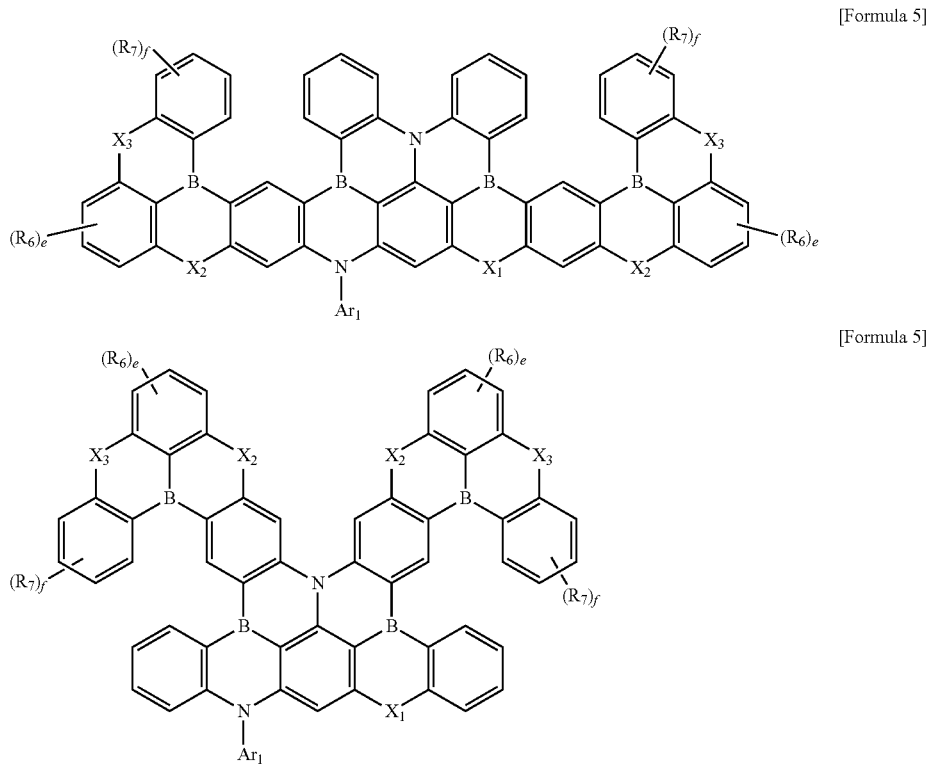

[Formula 5]

[Formula 5]

The case of having a partially symmetrical structure in Formulas 4-2a and 4-2d is embodied in Formulas 5-1 and 5-2 respectively. In an embodiment, in Formulas 5-1 and 5-2, $X_1$ may be $NAr_1$. However, the embodiment is not limited thereto, and in an embodiment, $X_1$ may be O or S. For example, $X_1$ may be O.

In Formulas 5-1 and 5-2, the same description as mentioned above in Formulas 1 and 2 may be applied to $X_1$, $X_2$, $X_3$, $Ar_1$, $R_6$, $R_7$, e, and f.

The polycyclic compound of an embodiment includes fused aromatic rings formed around a boron atom and a nitrogen atom, and thus has a multi-resonant molecular skeleton, and even in an excited state, changes in the molecular skeleton may be minimized.

Accordingly, the organic electroluminescence device of an embodiment includes the polycyclic compound of an embodiment in the emission layer EML, and may thus have high light emission efficiency.

In an embodiment, the polycyclic compound represented by Formula 1 may be one selected from one of the compounds represented by Compound Group 1. Compound Group 1 includes Compounds 1 to 99:

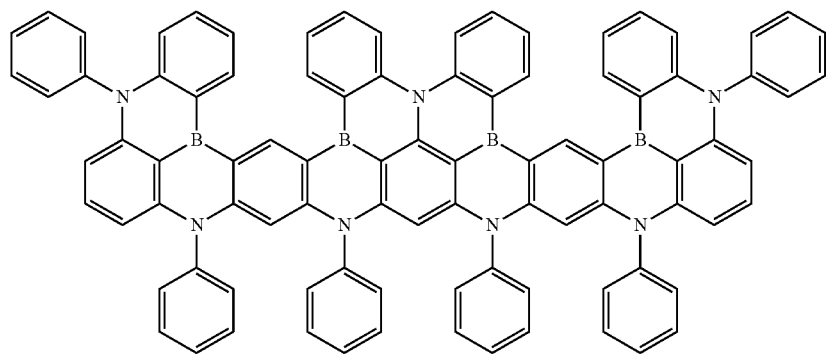
1
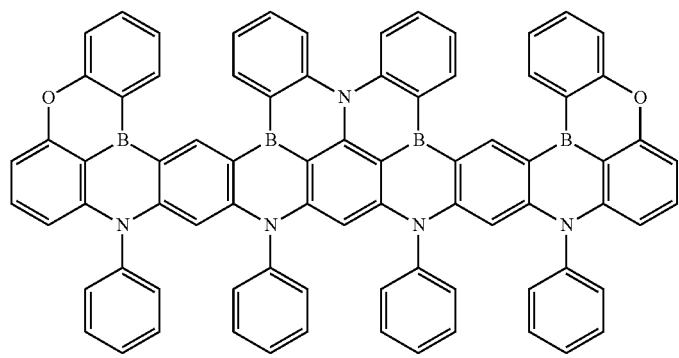
2
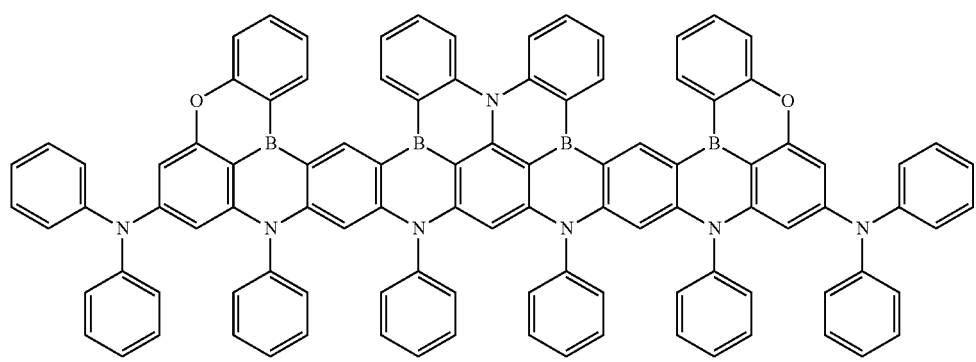
3
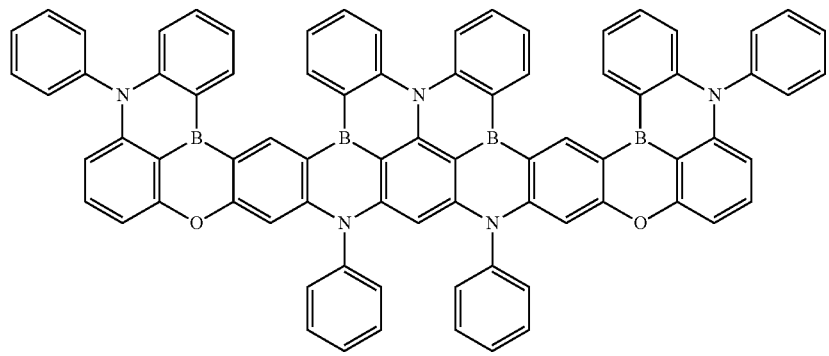
4

-continued
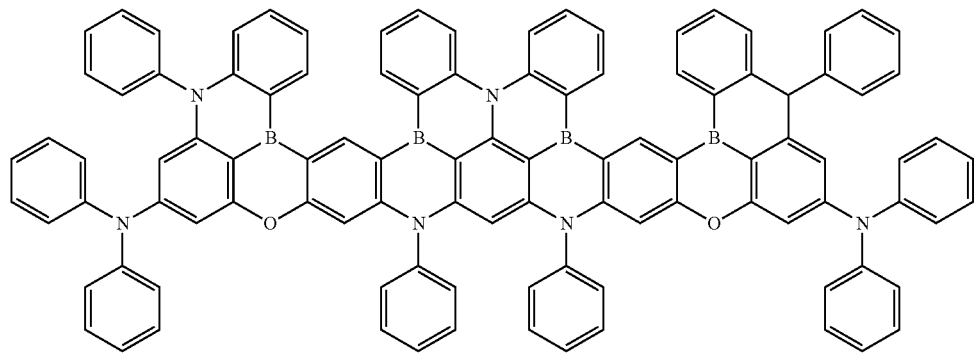
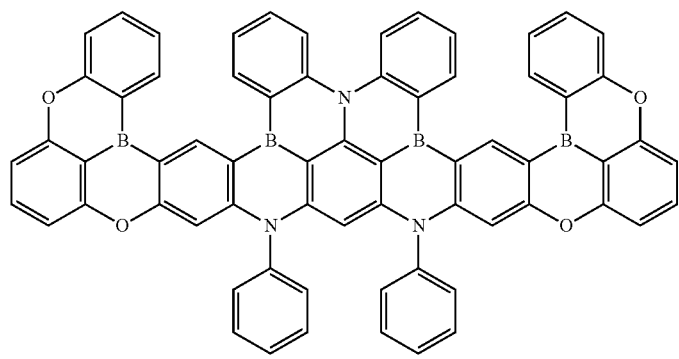
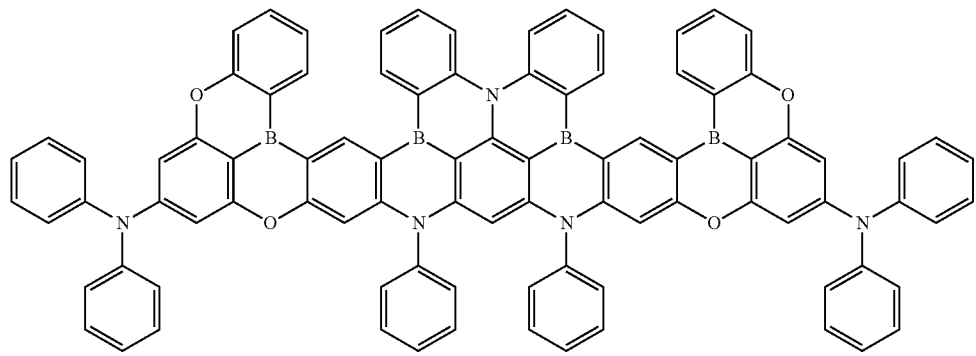
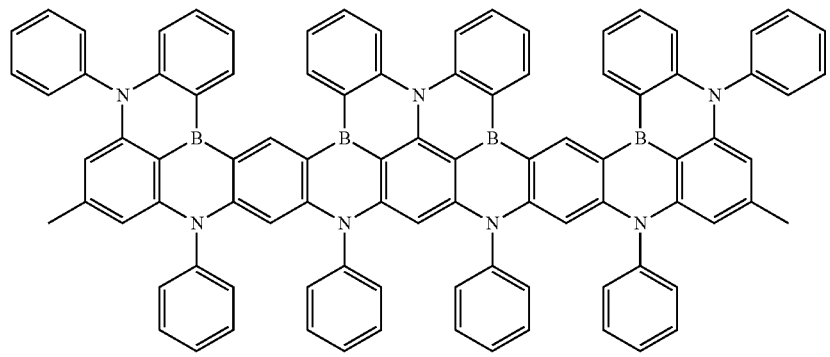

9
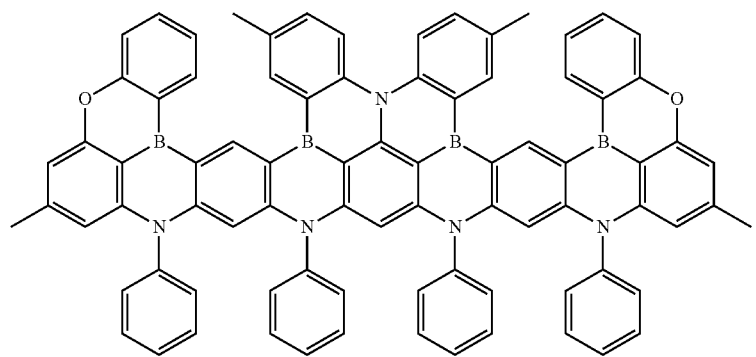
10
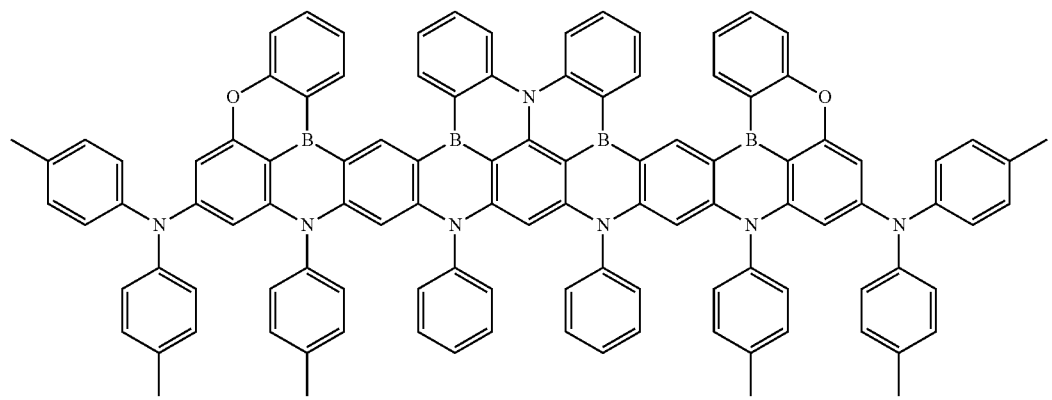
11
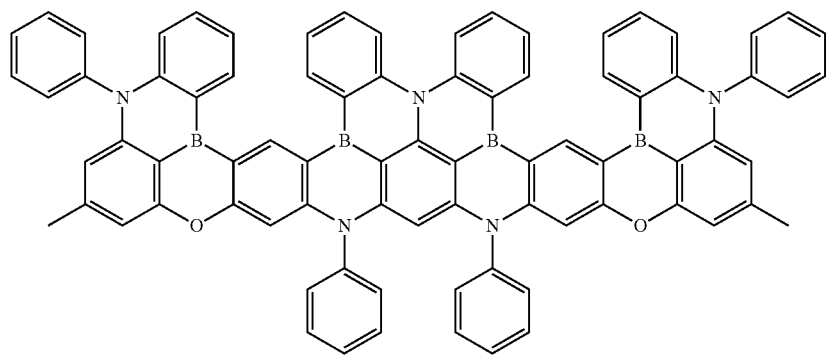
12
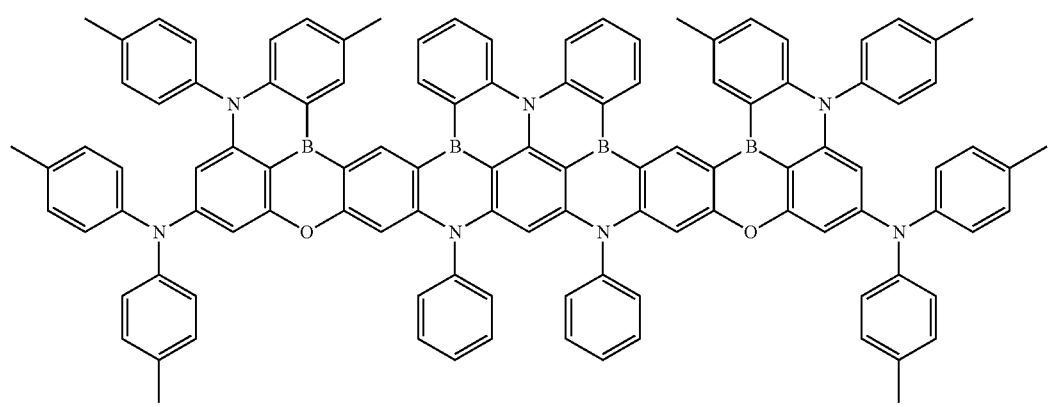

-continued
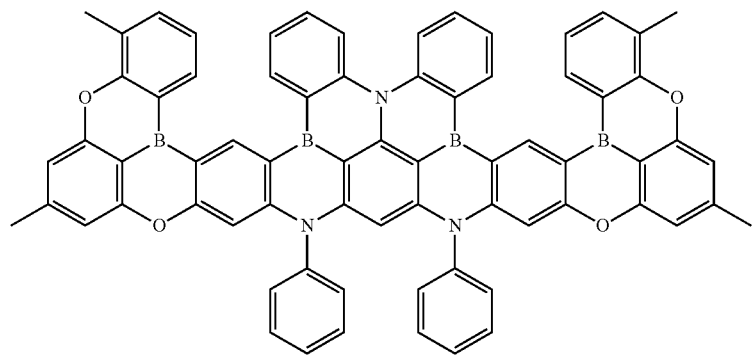
13
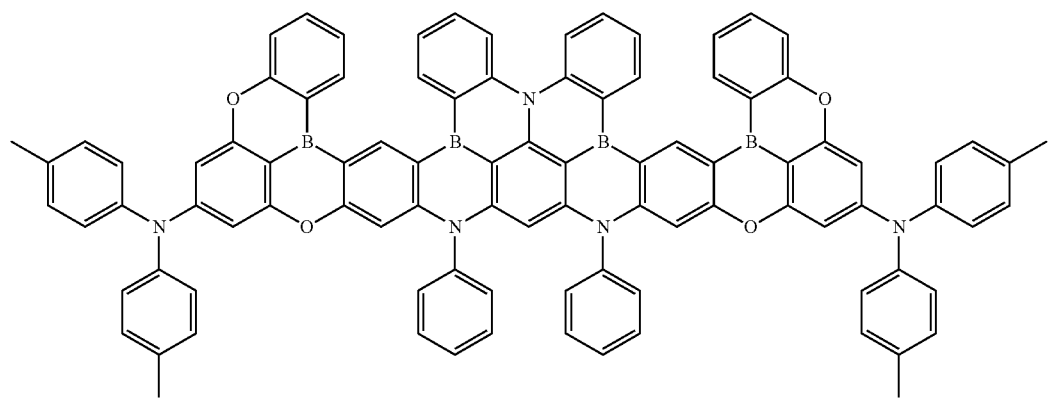
14
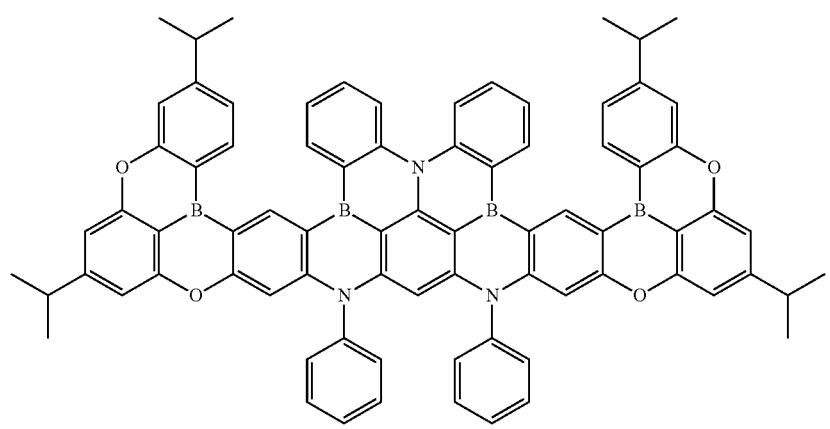
15
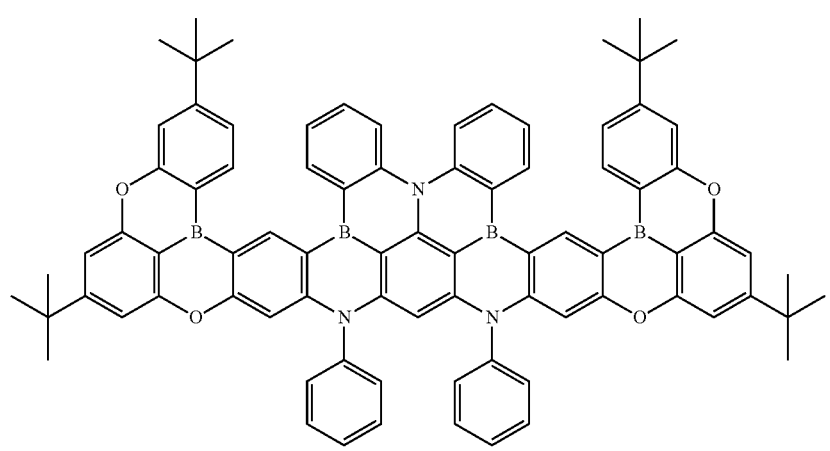
16

17
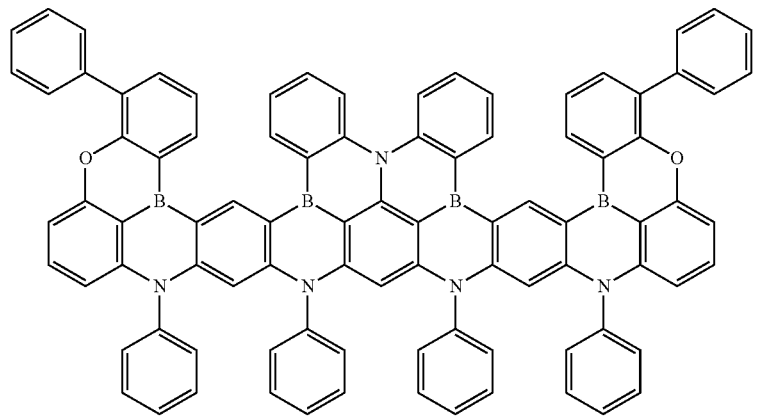
18
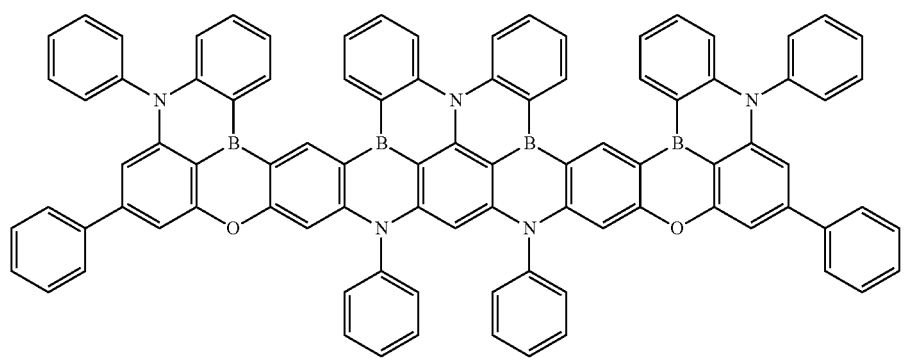
19
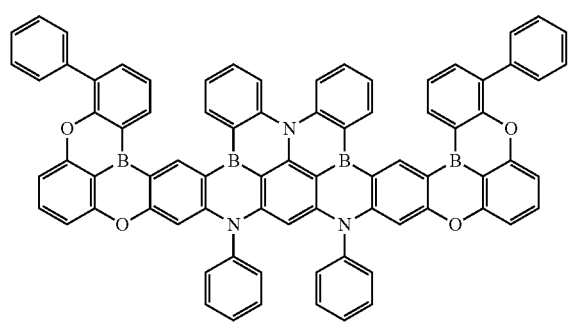
20
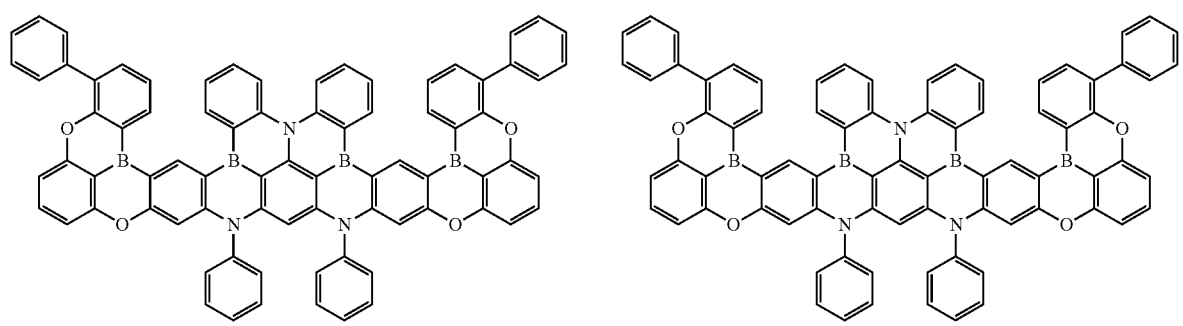
21
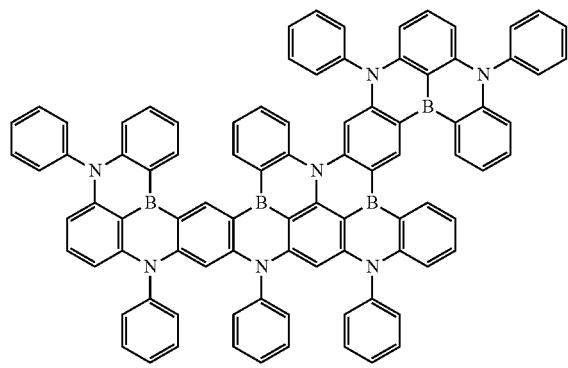
22
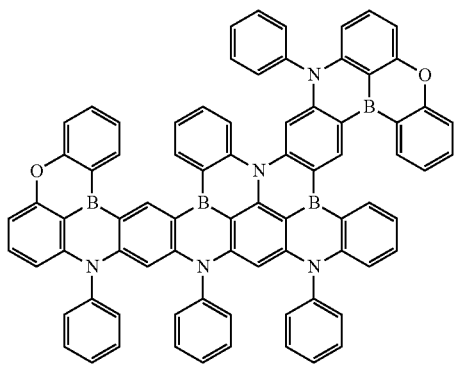

-continued
23
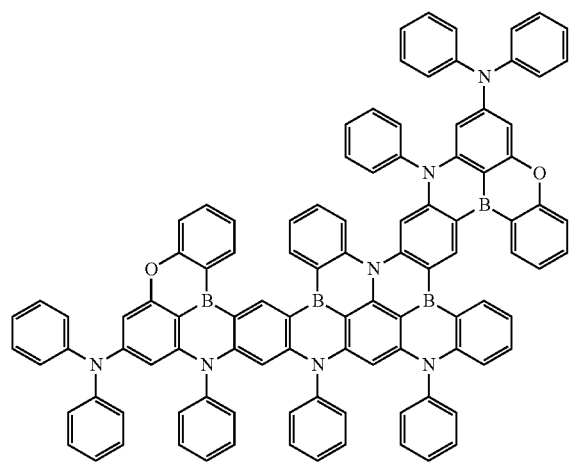
24
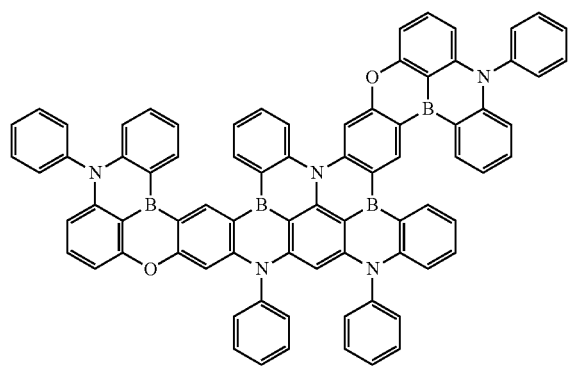
25
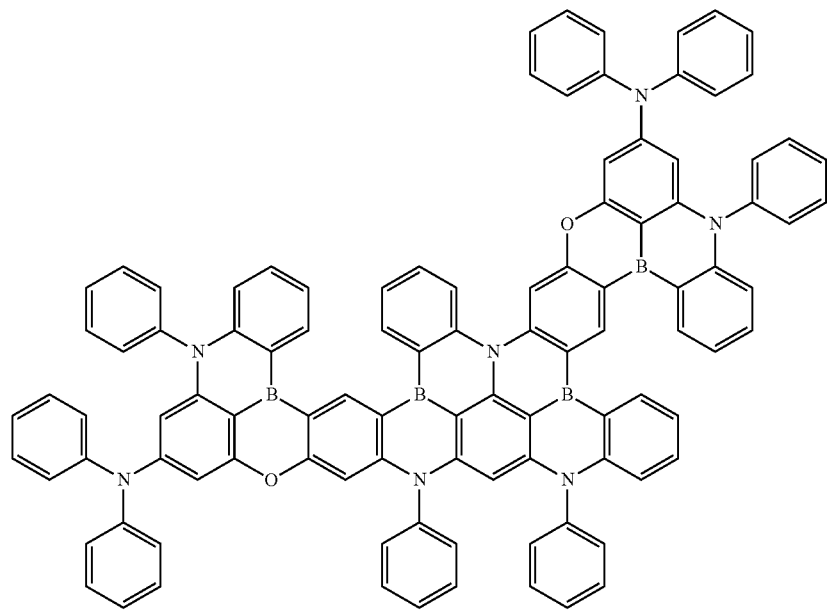
26
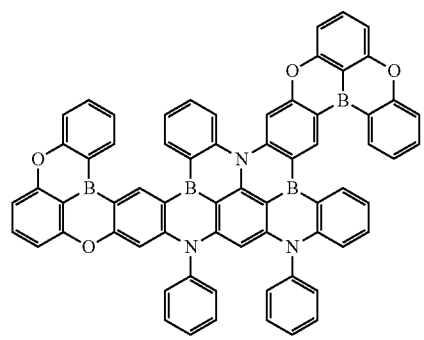
27
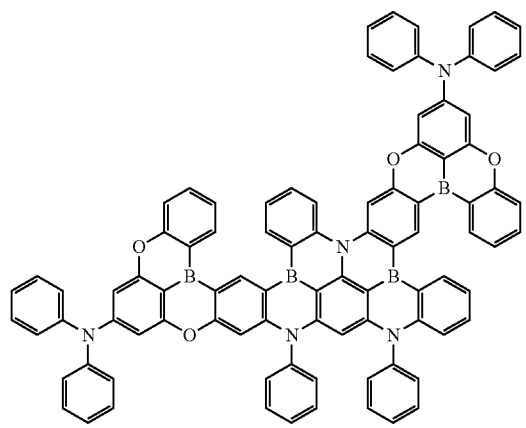

-continued
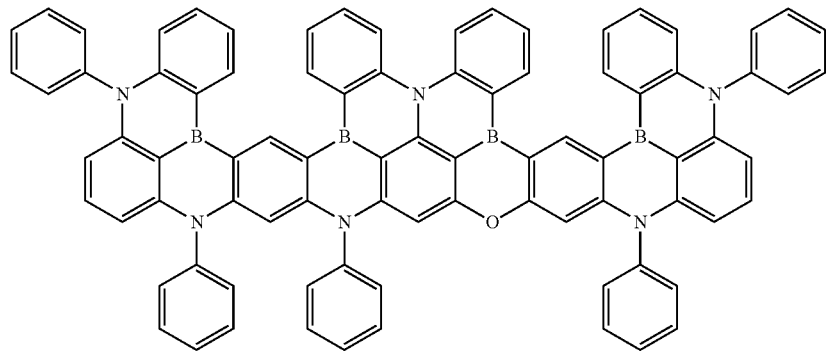
28
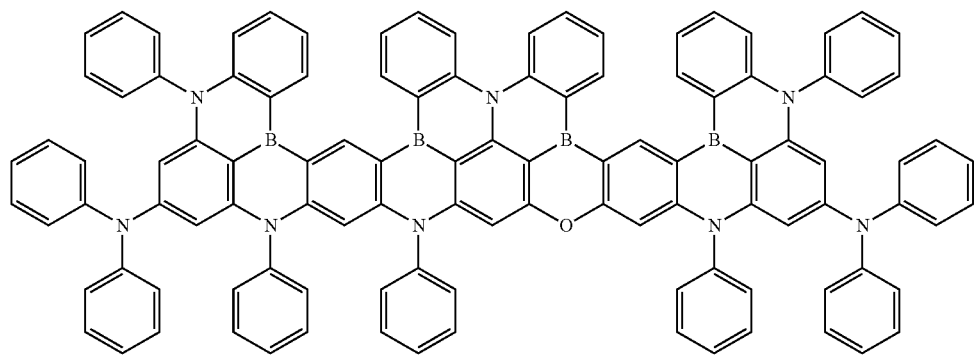
29
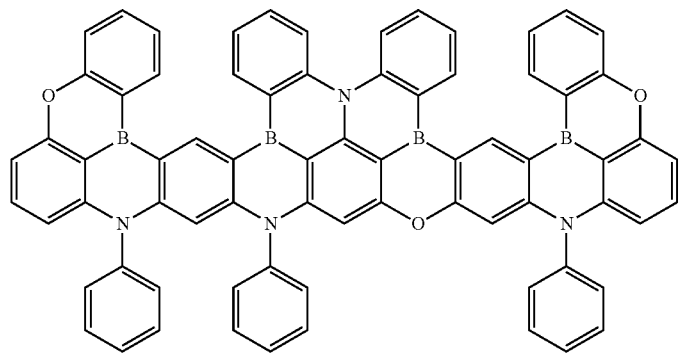
30
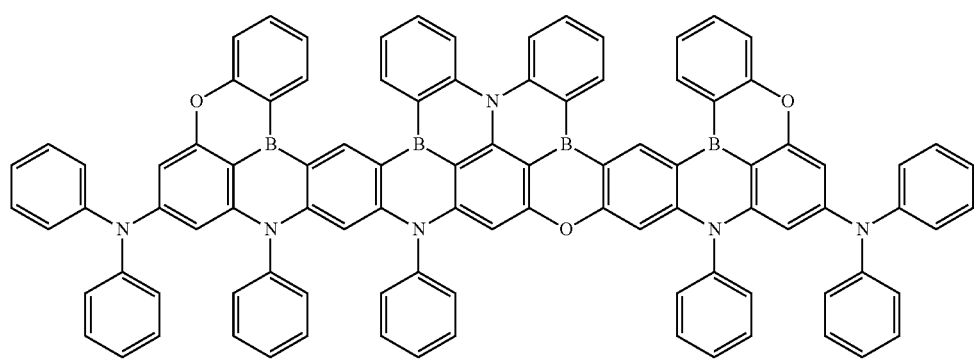
31

-continued
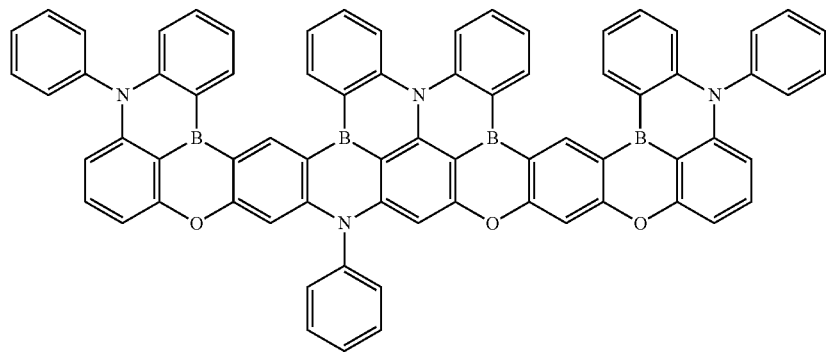
32
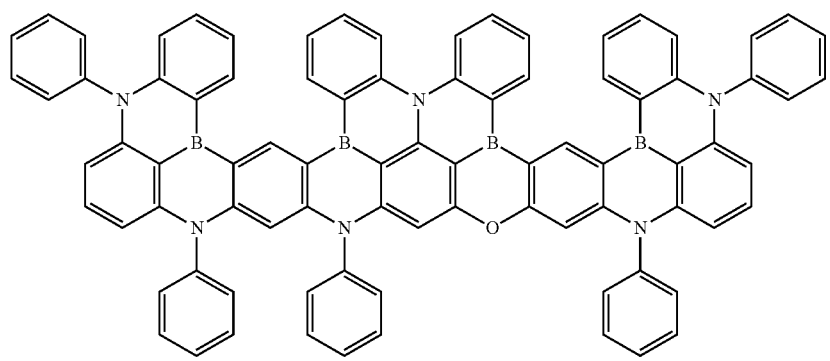
33
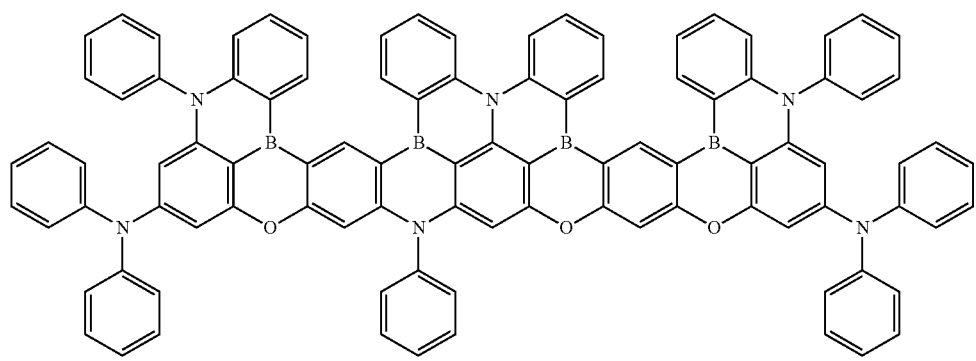
34
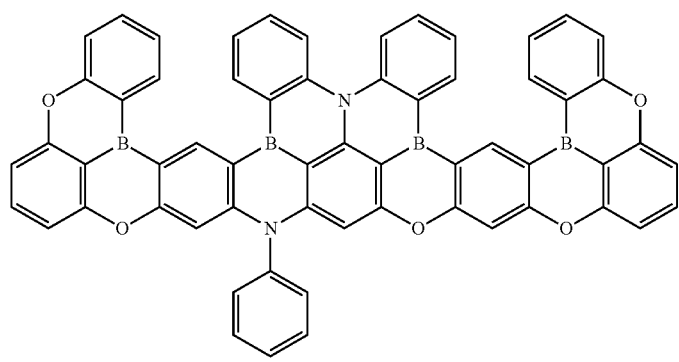
35

-continued
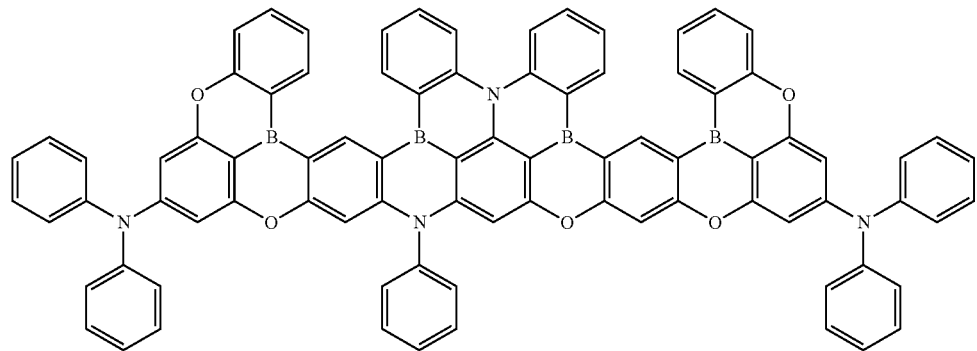
36
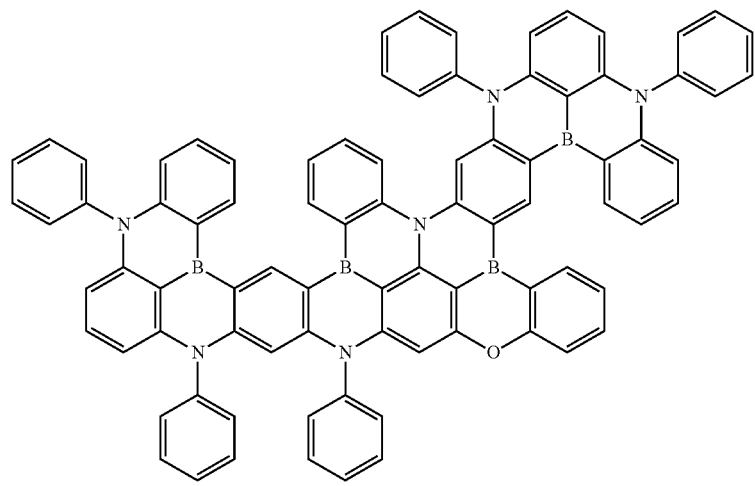
37
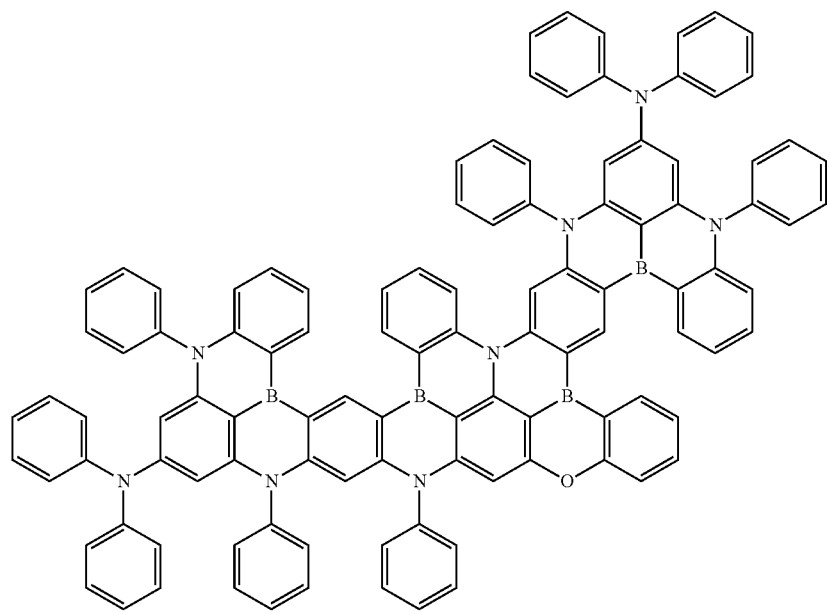
38

39
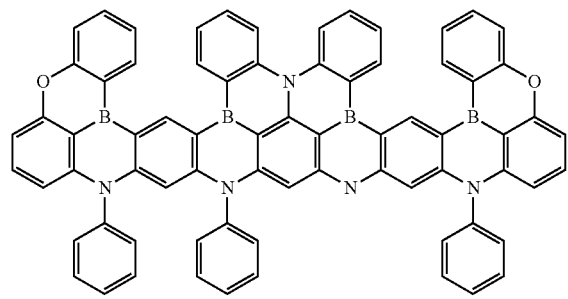
40
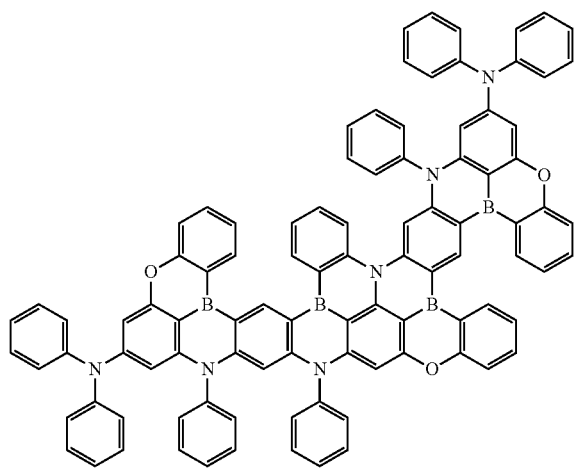
41
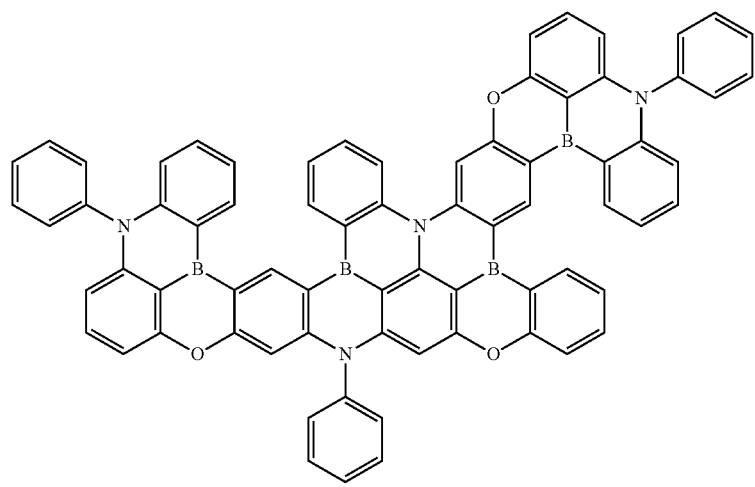
42
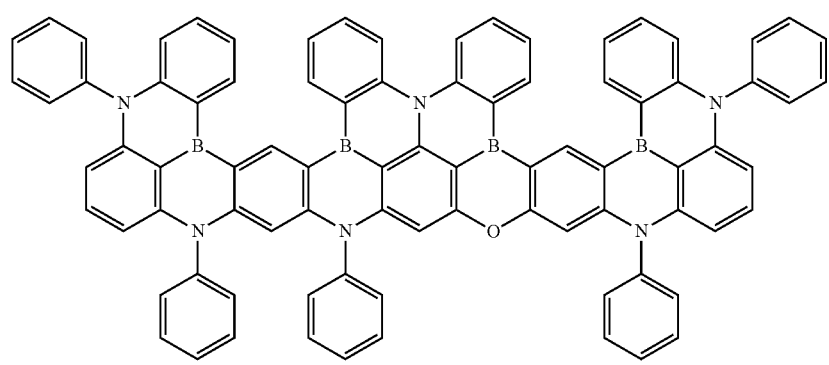

43
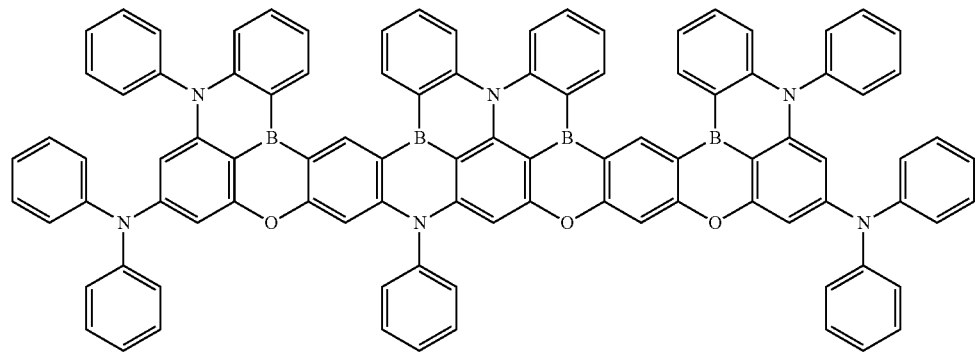
44
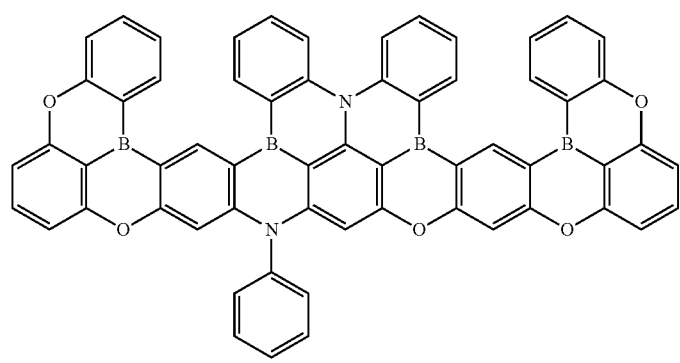
45
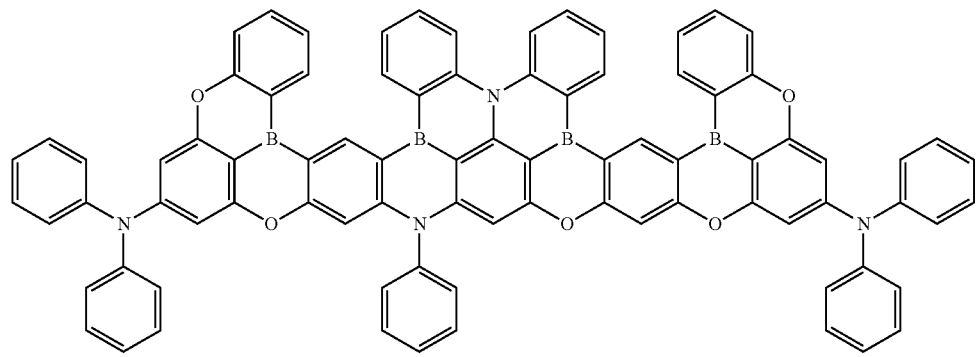
46
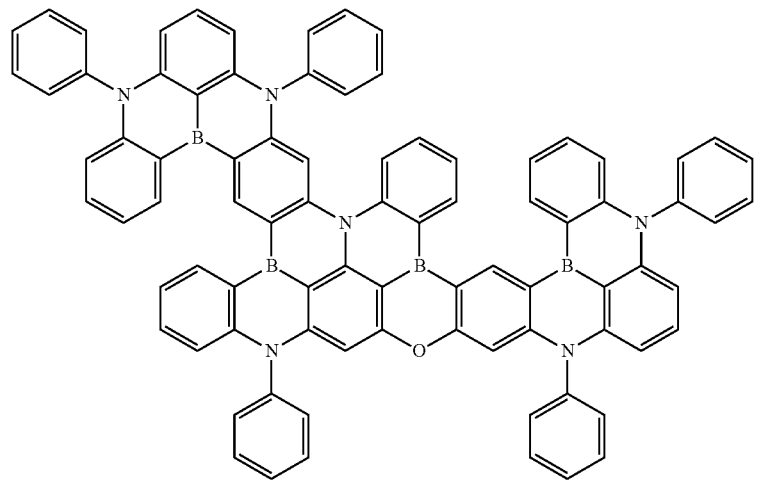

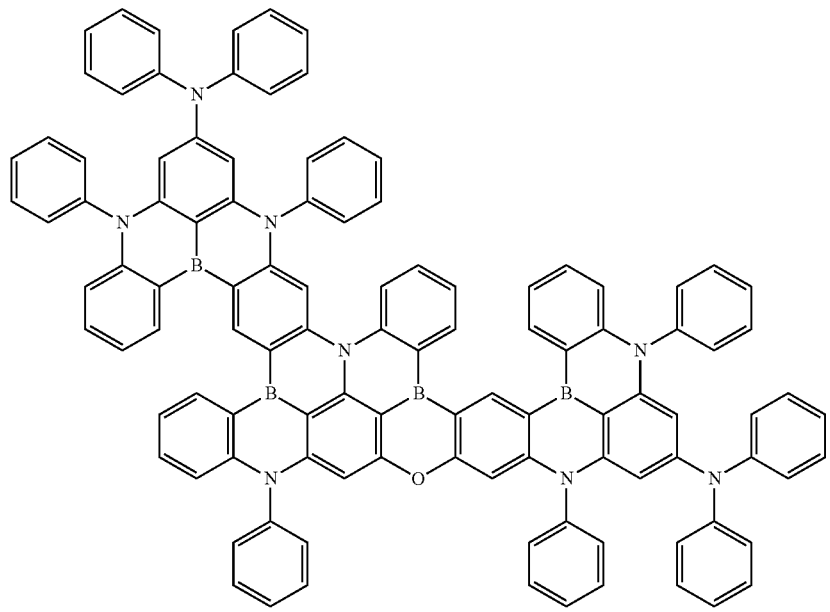
47
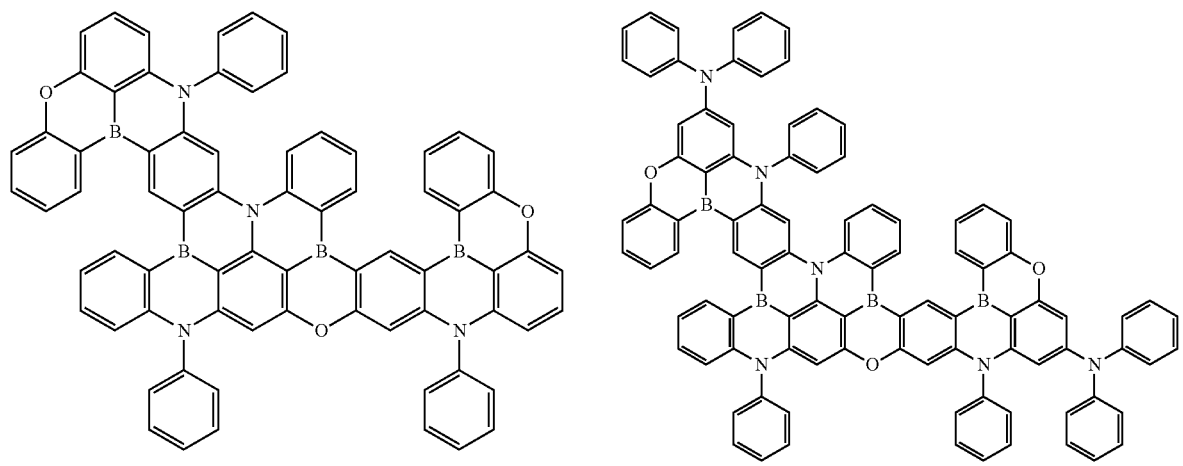
48
49
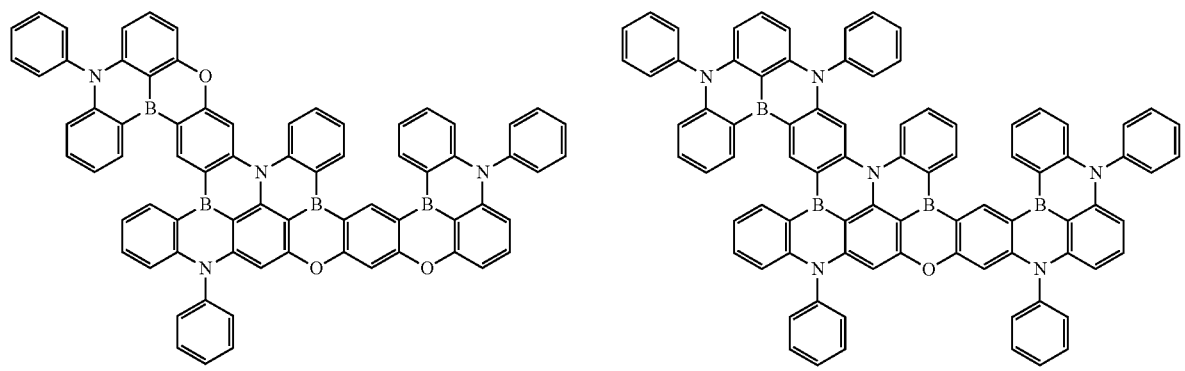
50
51

52
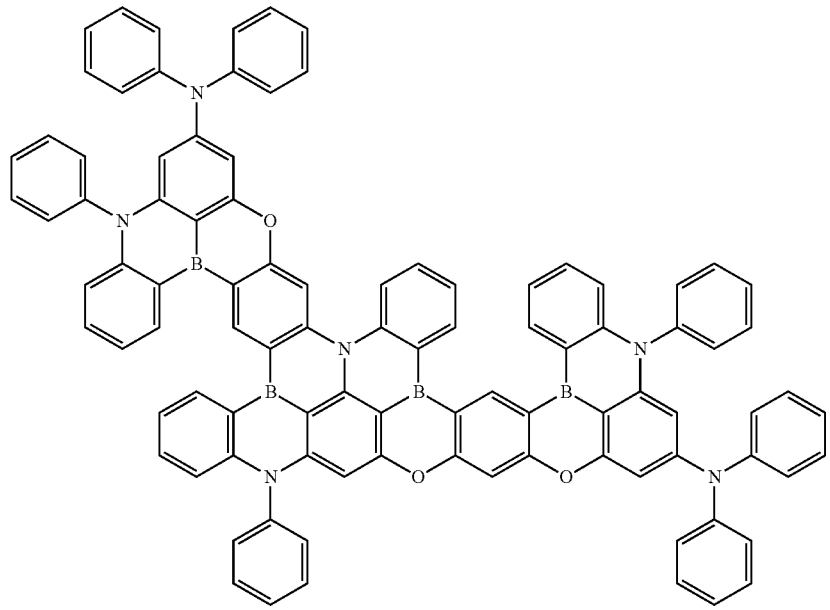
53
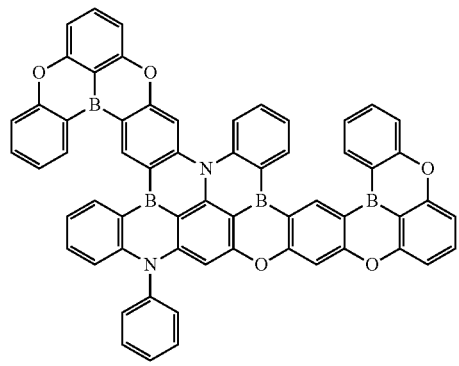
54
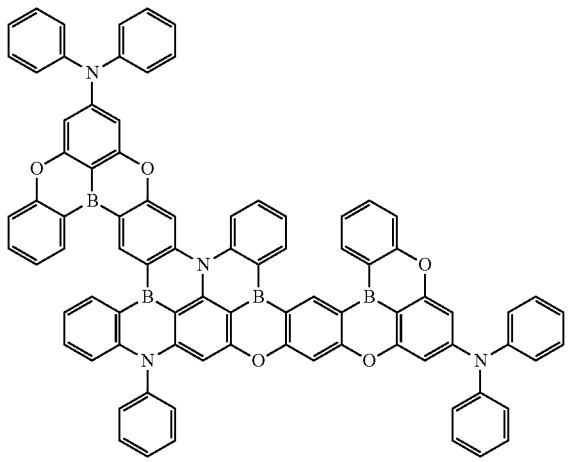
55
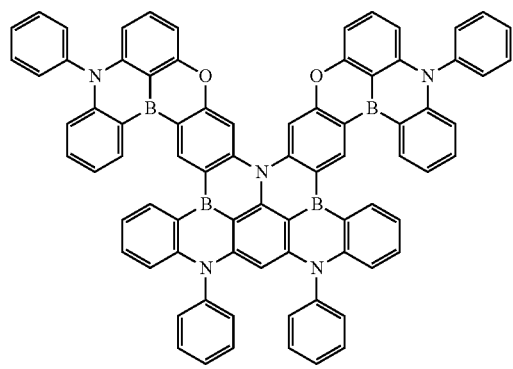
56
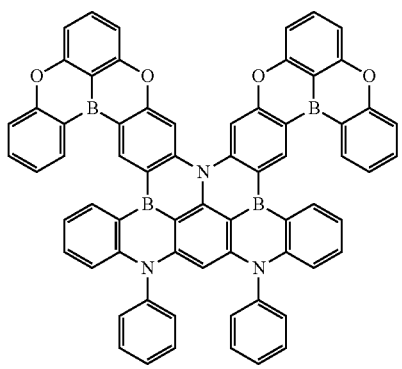

-continued
57
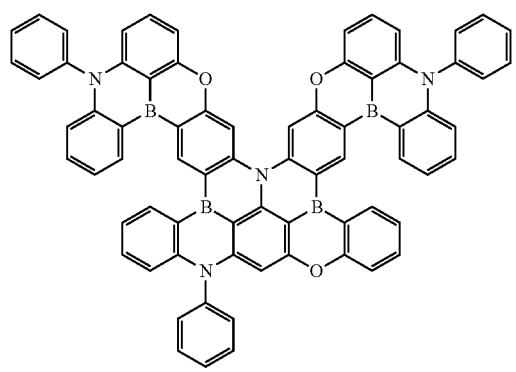
58
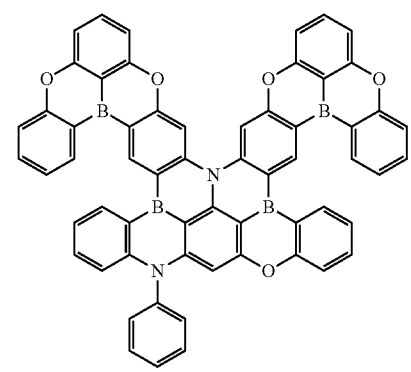
59
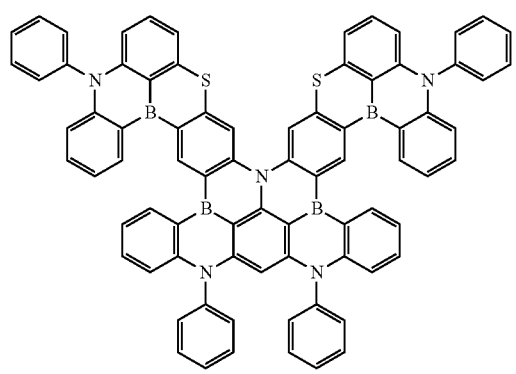
60
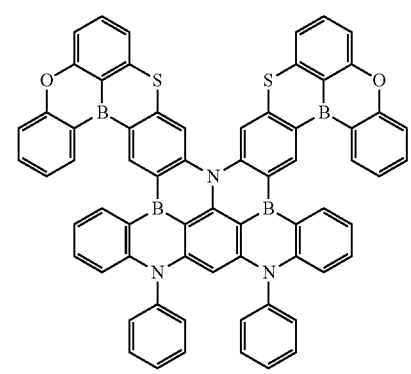
61
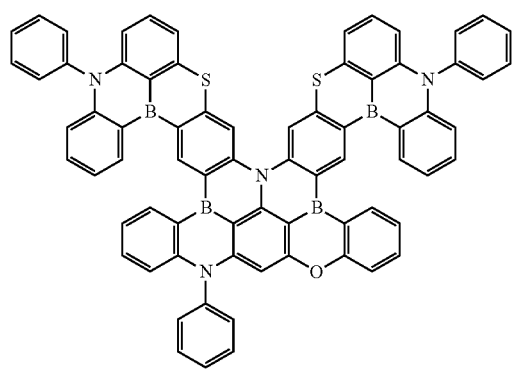
62
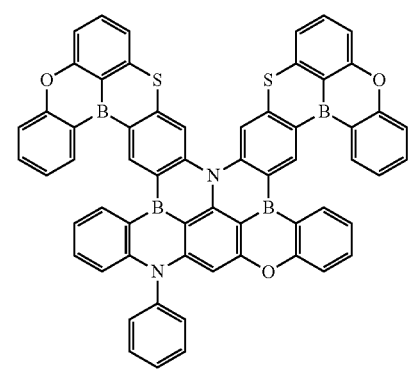
63
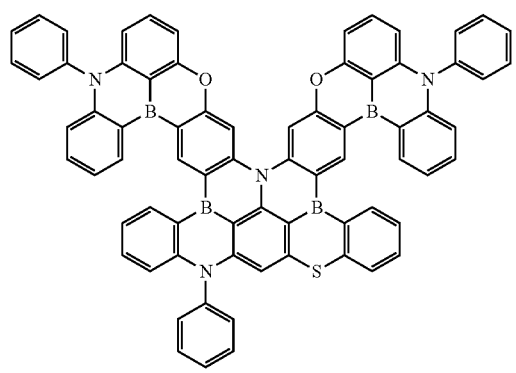
64
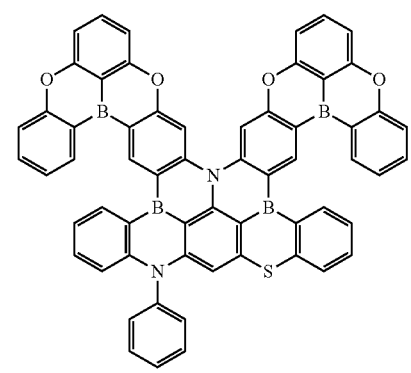

65
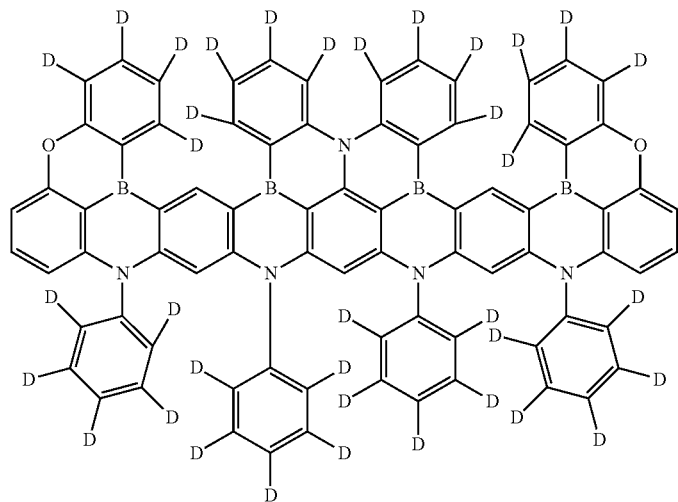
66
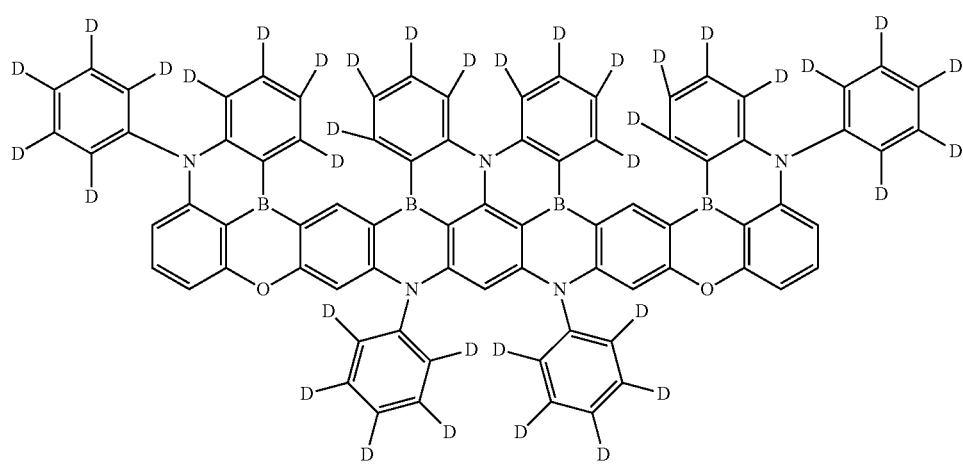
67
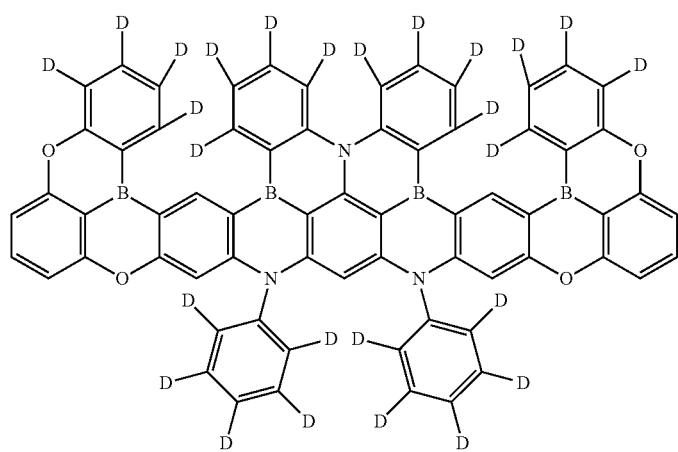

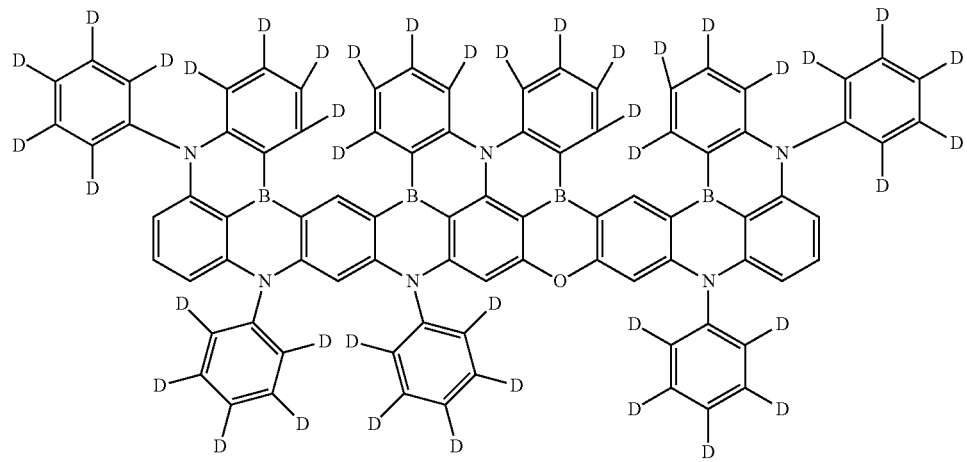
68
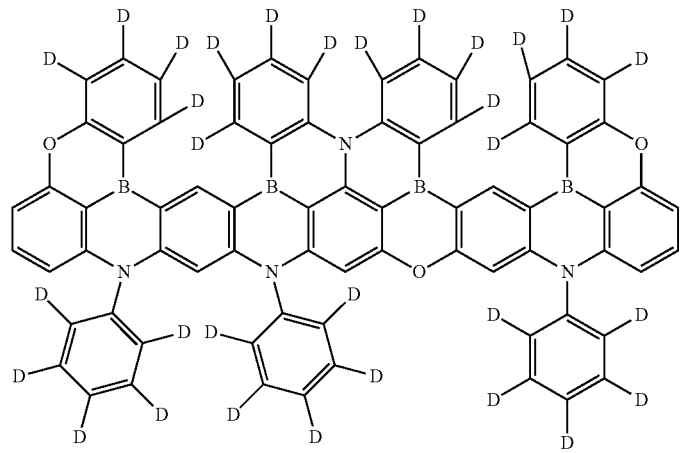
69
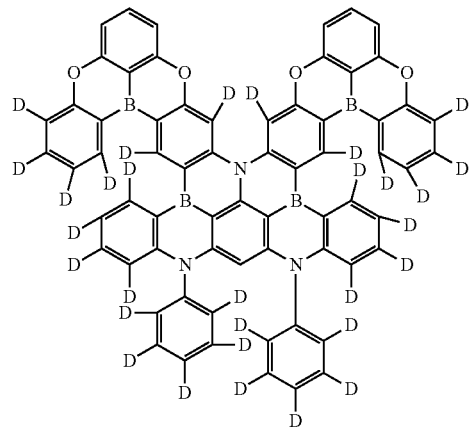
70
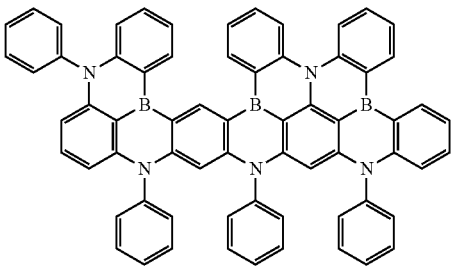
71
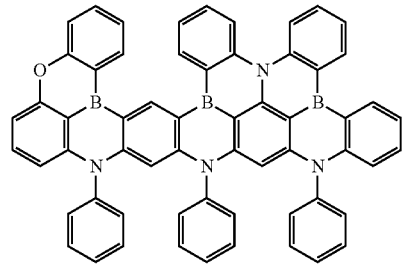
72
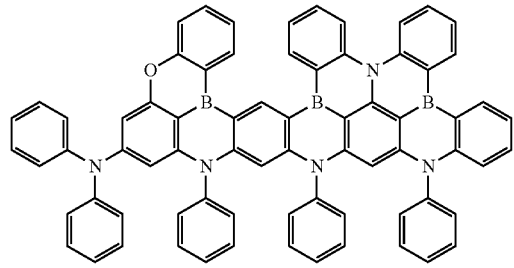
73

-continued
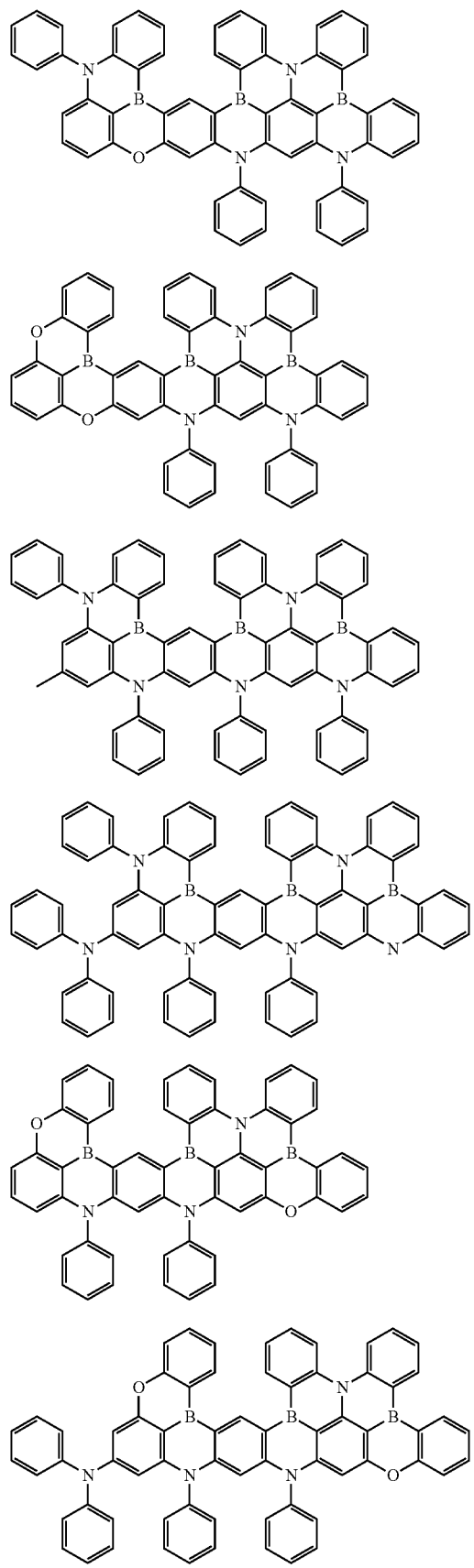
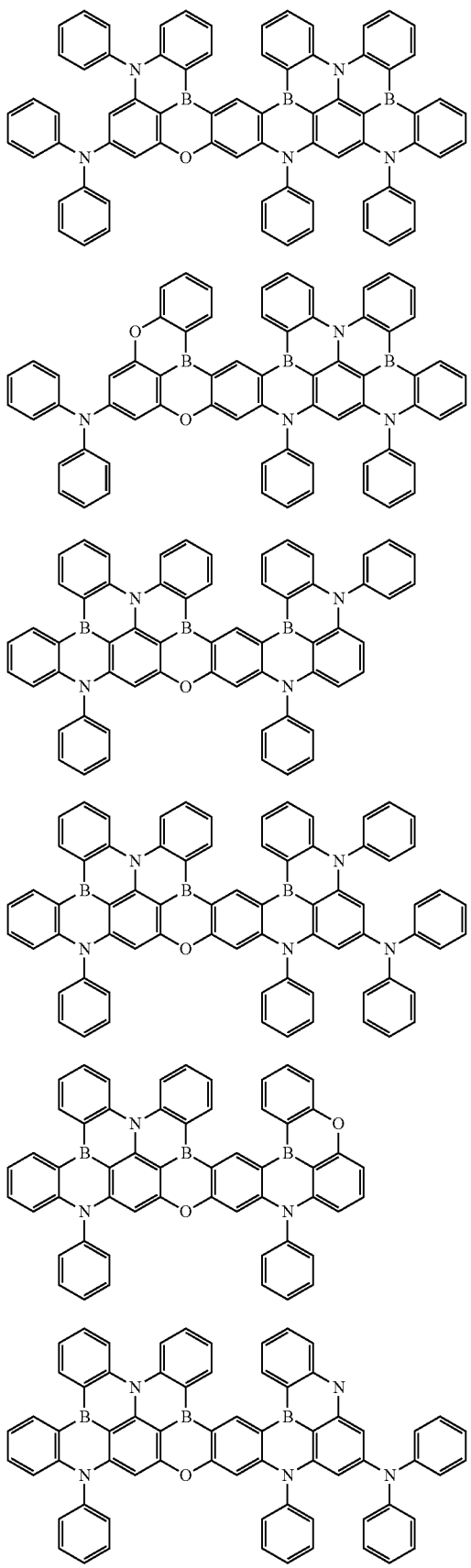

-continued
86
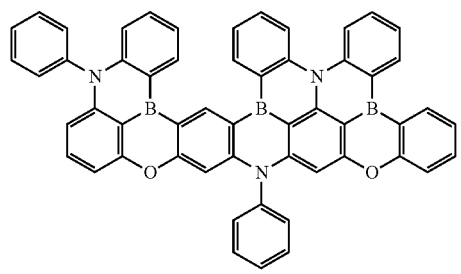
87
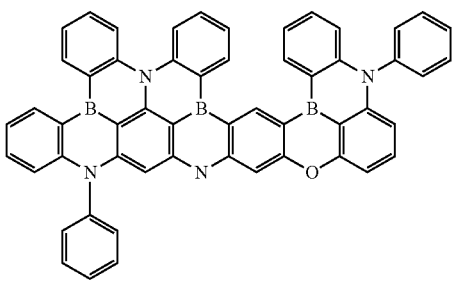
88
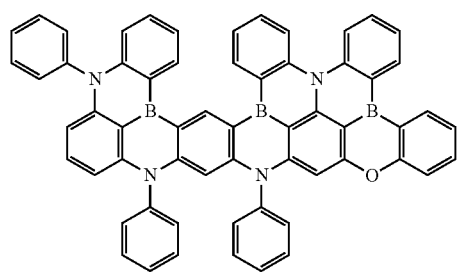
89
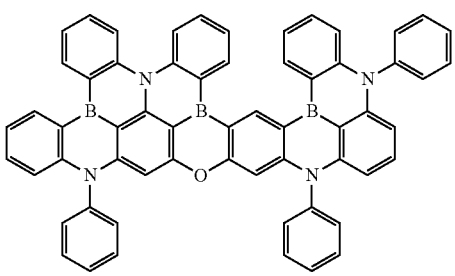
90
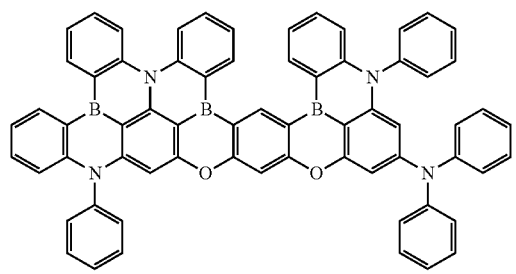
91
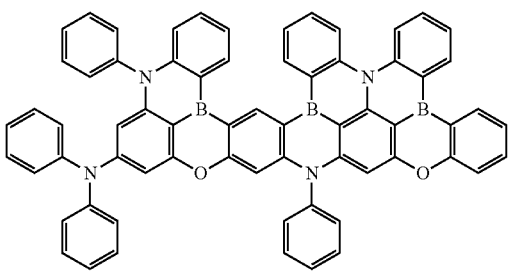
92
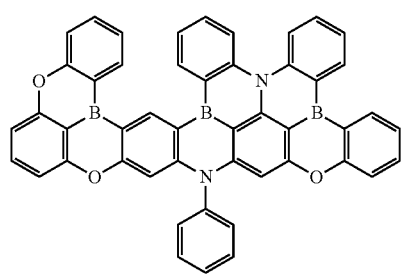
93
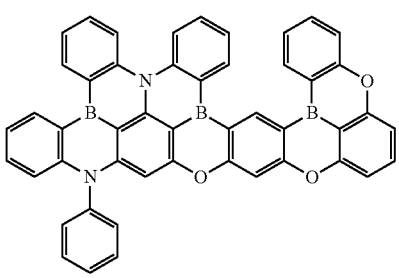
94
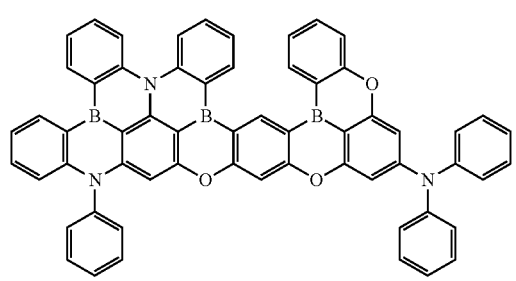
95
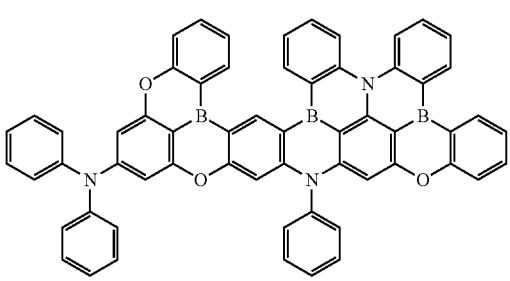

-continued

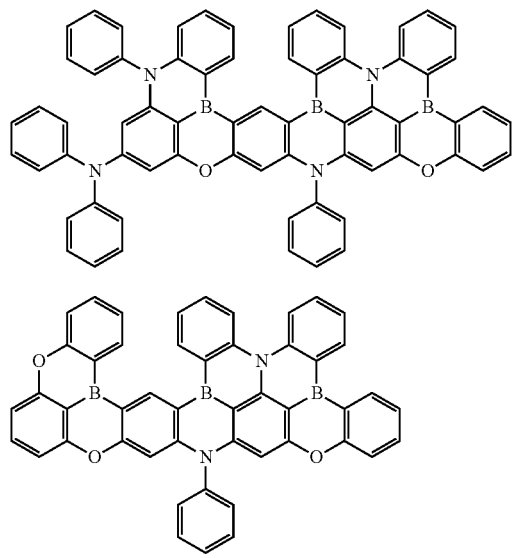

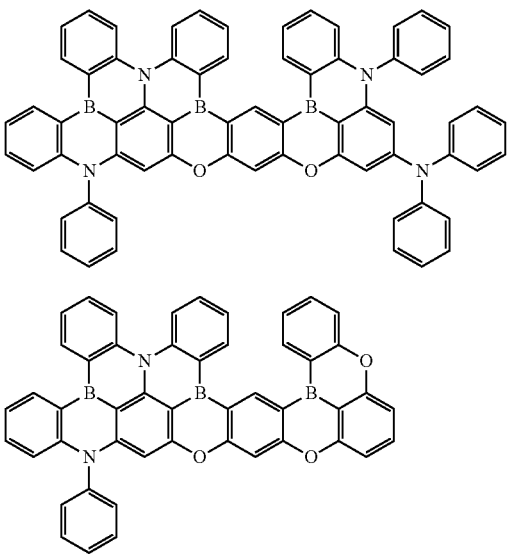

The polycyclic compound of an embodiment may be used as a blue light emitting material. For example, the polycyclic compound of an embodiment may be used as a light emitting material that emits blue light having a central emission wavelength in a wavelength range of less than or equal to about 470 nm. For example, the polycyclic compound of an embodiment may be a light emitting material having a central emission wavelength in a wavelength range of about 430 nm to about 470 nm. The polycyclic compound of an embodiment represented by Formula 1 may be a blue thermally activated delayed fluorescence dopant.

The polycyclic compound of an embodiment includes fused aromatic rings formed around a boron atom and a nitrogen atom, and may thus have a multi-resonant molecular skeleton. Accordingly, the polycyclic compound may be provided in a form in which aromatic rings are bonded to each other to maintain a stable molecular structure. The organic electroluminescence device of an embodiment includes the polycyclic compound of an embodiment described above in an emission layer, and may thus have excellent light emission efficiency.

In the organic electroluminescence device 10 of an embodiment, the emission layer EML may emit delayed fluorescence. For example, the emission layer EML may emit thermally activated delayed fluorescence (TADF).

Although not shown in the drawings, the organic electroluminescence device 10 of an embodiment may include emission layers. The emission layers may be sequentially stacked and provided, and for example, the organic electroluminescence device 10 including emission layers may emit white light. The organic electroluminescence device including emission layers may be an organic electroluminescence device having a tandem structure. When the organic electroluminescence device 10 includes emission layers, at least one emission layer EML may include the polycyclic compound of an embodiment described above.

The emission layer EML may include a first compound and a second compound different from the first compound, and the first compound may include a polycyclic compound of an embodiment. For example, the emission layer EML may include a host and a dopant, and may include the polycyclic compound of an embodiment described above as a dopant. For example, in the organic electroluminescence device 10 of an embodiment, the emission layer EML may include a host for delayed fluorescence emission and a dopant for delayed fluorescence emission, and may include the polycyclic compound of an embodiment described above as a dopant for delayed fluorescence emission. The emission layer EML may include at least one of the polycyclic compounds represented by Compound Group 1 described above as a thermally activated delayed fluorescence dopant.

In an embodiment, the emission layer EML may be a delayed fluorescence emission layer, and the emission layer EML may include a known host material and the polycyclic compound of an embodiment described above. For example, in an embodiment, the polycyclic compound may be used as a TADF dopant.

The polycyclic compound of an embodiment may be a thermally activated delayed fluorescence host, or a phosphorescence host. The emission layer EML including the polycyclic compound of an embodiment may be a phosphorescence emission layer or a thermally activated delayed fluorescence emission layer. For example, the emission layer EML may be a thermally activated delayed fluorescence emission layer.

The emission layer EML may include one or two or more polycyclic compounds of Compound Group 1 described above.

In the organic electroluminescence device 10 of an embodiment, the emission layer EML may include a known host material. For example, the emission layer EML may include, as a host material, at least one of bis[2-(diphenylphosphino)phenyl]ether oxide (DPEPO), 4,4'-bis(N-carbazolyl)-1,1'-biphenyl (CBP), 1,3-bis(carbazolyl-9-yl)benzene (mCP), tris(4-carbazoyl-9-ylphenyl)amine (TCTA), or 1,3,5-tris (1-phenyl-1H-benzo [d] imidazol-2-yl) benzene (TPBi). However, the embodiment is not limited thereto. For example, tris(8-hydroxyquinolino)aluminum ($Alq_3$), poly (N-vinylcarbazole) (PVK), 9,10-di(naphthalene-2-yl)anthracene (ADN), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH$_2$), hexaphenylcyclotrisiloxane (DPSiO$_3$), octaphenylcyclotetrasiloxane (DPSiO$_4$), etc. may be used as a host material.

In the organic electroluminescence device 10 of an embodiment, the emission layer EML may include an anthracene derivative, a pyrene derivative, a fluoranthene derivative, a chrysene derivative, a dihydrobenzanthracene derivative, or a triphenylene derivative. For example, the emission layer EML may include an anthracene derivative or a pyrene derivative.

The emission layer EML may include an anthracene derivative represented by Formula G below.

[Formula G]

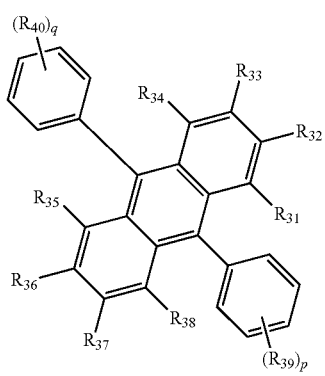

In Formula G, R$_{31}$ to R$_{40}$ may each independently be a hydrogen atom, a deuterium atom, a halogen atom, a substituted or unsubstituted silyl group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, or bonded to an adjacent group to form a ring. R$_{31}$ to R$_{40}$ may be bonded to an adjacent group to form a saturated hydrocarbon ring or unsaturated hydrocarbon ring.

In Formula G, p and q may each independently be an integer from 0 to 5.

Formula G may be represented by one of Compounds G-1 to G-16:

G-1

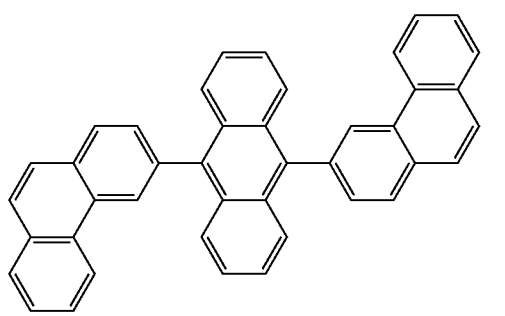

G-2

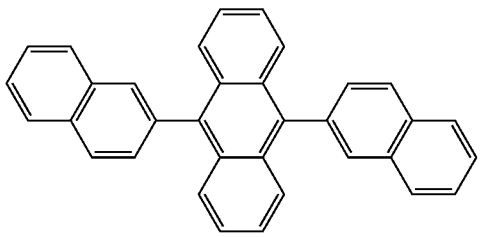

G-3

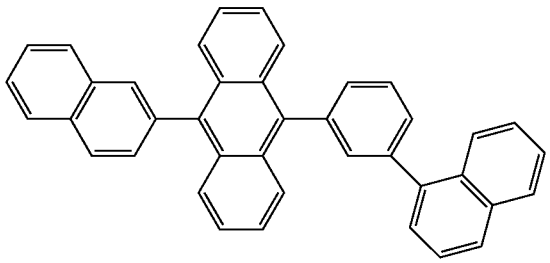

G-4

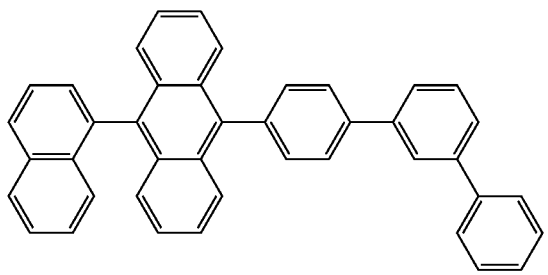

G-5

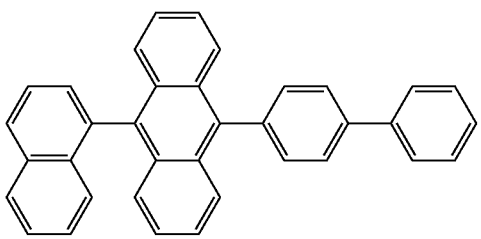

G-6

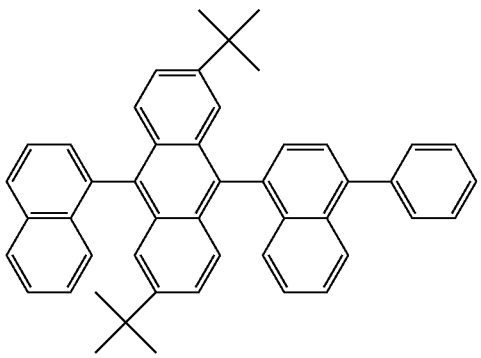

G-7
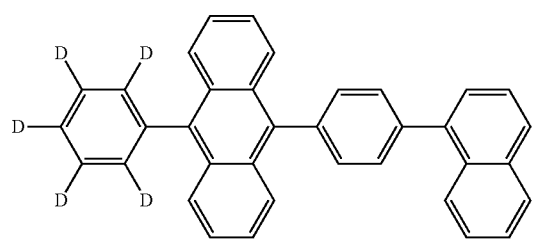
G-8
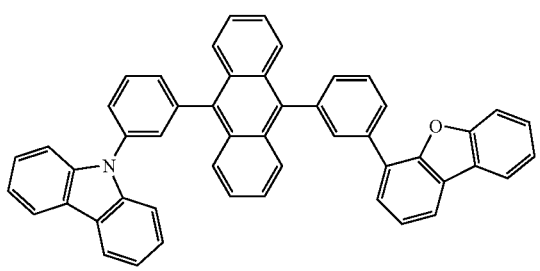
G-9
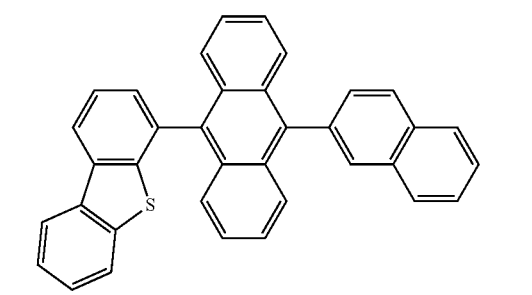
G-10
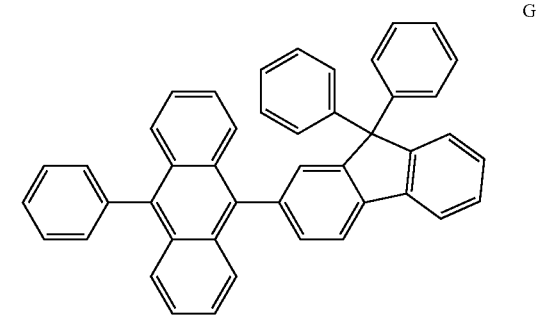
G-11
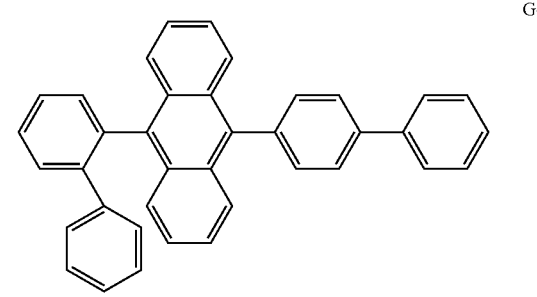
G-12
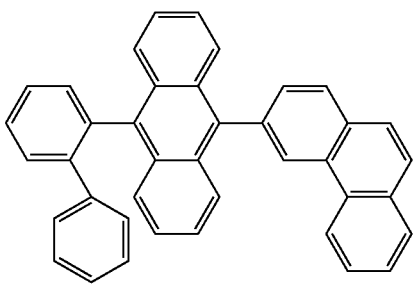
G-13
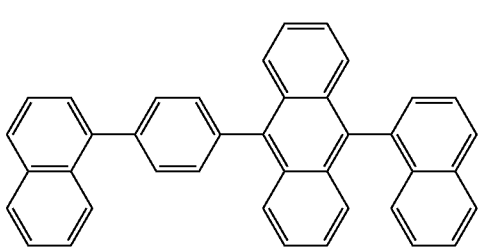
G-14
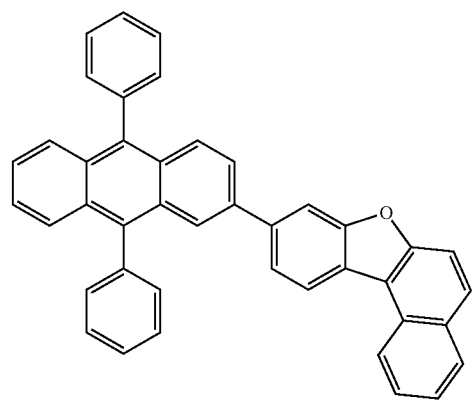
G-15
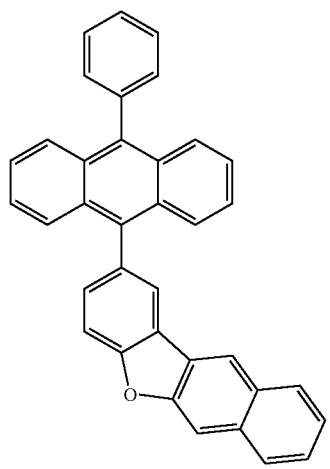

G-16

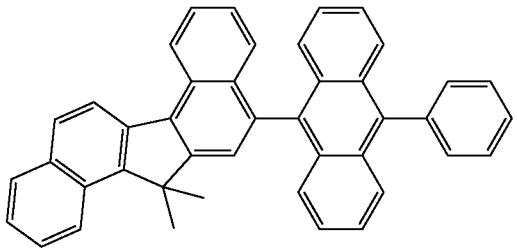

In an embodiment, the emission layer EML may further include a known dopant material. In an embodiment, the emission layer EML may further include, as a dopant, styryl derivatives (e.g., 1,4-bis[2-(3-N-ethylcarbazoryl)vinyl]benzene (BCzVB), 4-(di-p-tolylamino)-4''-[(di-p-tolylamino) styryl]stilbene (DPAVB), and N-(4-((E)-2-(6-((E)-4-(diphenylamino) styryl)naphthalen-2-yl)vinyl)phenyl)-N-phenylbenzenamine (N-BDAVBi), perylene and the derivatives thereof (e.g., 2,5,8,11-tetra-t-butylperylene (TBP), pyrene and the derivatives thereof (e.g., 1, 1-dipyrene, 1,4-dipyrenylbenzene, 1,4-bis(N,N-diphenylamino)pyrene, etc.

In the organic electroluminescence device 10 of an embodiment illustrated in FIGS. 1 to 4, an electron transport region ETR is provided on the emission layer EML. The electron transport region ETR may include at least one of a hole blocking layer HBL, an electron transport layer ETL, or an electron injection layer EIL, but the embodiment of the inventive concept is not limited thereto.

The electron transport region ETR may have a single layer formed of a single material, a single layer formed of different materials, or a multilayer structure including multiple layers formed of different materials.

For example, the electron transport region ETR may have a single layer structure of an electron injection layer EIL or an electron transport layer ETL, and may have a single layer structure formed of an electron injection material and an electron transport material. The electron transport region ETR may have a single layer structure formed of different materials, or may have a structure in which an electron transport layer ETL/electron injection layer EIL and a hole blocking layer HBL/electron transport layer ETL/electron injection layer EIL are stacked in order from the emission layer EML, but is not limited thereto. The thickness of the electron transport region ETR may be, for example, in a range of about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, a laser induced thermal imaging (LITI) method, etc.

When the electron transport region ETR includes the electron transport layer ETL, the electron transport region ETR may include an anthracene-based compound. However, the embodiment of the inventive concept is not limited thereto, and the electron transport region may include, for example, tris(8-hydroxyquinolinato)aluminum ($Alq_3$), 1,3, 5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebg2), 9,10-di(naphthalene-2-yl) anthracene (ADN), 1,3-bis[3,5-di(pyridin-3-yl)phenyl] benzene (BmPyPhB) or a mixture thereof. The thickness of the electron transport layer ETL may be in a range of about 100 Å to about 1,000 Å. For example, the thickness of the electron transport layer ETL may be in a range of about 150 Å to about 500 Å. If the thickness of the electron transport layer ETL satisfies the above-described range, satisfactory electron transport properties may be obtained without a substantial increase in driving voltage.

When the electron transport region ETR includes the electron injection layer EIL, the electron transport region ETR may be a halogenated metal such as LiF, NaCl, CsF, RbCl, RbI, and CuI, a lanthanide metal such as Yb, a metal oxide such as $Li_2O$ and BaO, or lithium quinolate (LiQ), but is not limited thereto. The electron injection layer EIL may also be formed of a mixed material of an electron transport material and an insulating organo-metal salt. The organo-metal salt may be a material having an energy band gap of about 4 eV or more. The organo-metal salt may include, for example, metal acetates, metal benzoates, metal acetoacetates, metal acetylacetonates, or metal stearates. The thickness of the electron injection layer EIL may be in a range of about 1 Å to about 100 Å. For example, the thickness of the electron injection layer EIL may be in a range of about 3 Å to about 90 Å. If the thickness of the electron injection layers EIL satisfies the above-described range, satisfactory electron injection properties may be obtained without a substantial increase in driving voltage.

As described above, the electron transport region ETR may include a hole blocking layer HBL. The hole blocking layer HBL may include, for example, at least one of 2,9-dimethyl-4,7-diphenyl-1,10-phenanthroline (BCP) and 4,7-diphenyl-1,10-phenanthroline (Bphen), but is not limited thereto.

The second electrode EL2 is provided on the electron transport region ETR. The second electrode EL2 may be a common electrode or a cathode. The second electrode EL2 may be a transmissive electrode, a transflective electrode, or a reflective electrode. If the second electrode EL2 is a transmissive electrode, the second electrode EL2 may include a transparent metal oxide, for example, indium tin oxide (ITO), indium zinc oxide (IZO), zinc oxide (ZnO), or indium tin zinc oxide (ITZO).

If the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (e.g., a mixture of Ag and Mg). The second electrode EL2 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc.

Although not shown, the second electrode EL2 may be connected to an auxiliary electrode. If the second electrode EL2 is connected to the auxiliary electrode, the resistance of the second electrode EL2 may decrease.

A capping layer CPL may be further disposed on the second electrode EL2 of the organic electroluminescence device 10 of an embodiment. The capping layer CPL may include a multilayer or a single layer.

In an embodiment, the capping layer CPL may be an organic layer or an inorganic layer. For example, when the capping layer CPL includes an inorganic material, the inorganic material may include an alkali metal compound such as LiF, an alkaline earth metal compound such as $MgF_2$, SiON, SiNX, SiOy, etc.

For example, when the capping layer CPL includes an organic material, the organic material may include α-NPD, NPB, TPD, m-MTDATA, $Alq_3$, CuPc, N4,N4,N4',N4'-tetra (biphenyl-4-yl) biphenyl-4,4'-diamine (TPD15), 4,4',4"-tris (carbazol sol-9-yl)triphenylamine (TCTA), etc., or may include epoxy resins or acrylates such as methacrylate. However, the embodiment is not limited thereto, and compounds P1 to P5 below may also be included.

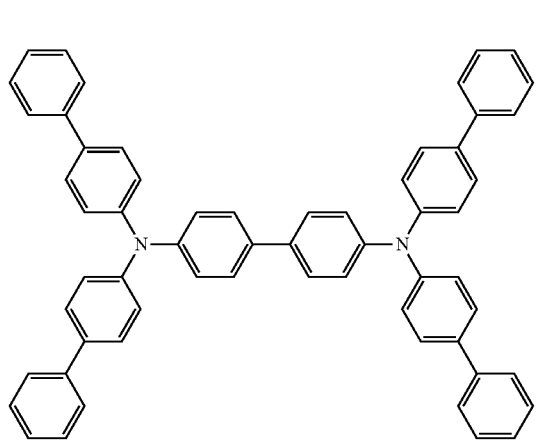

P1

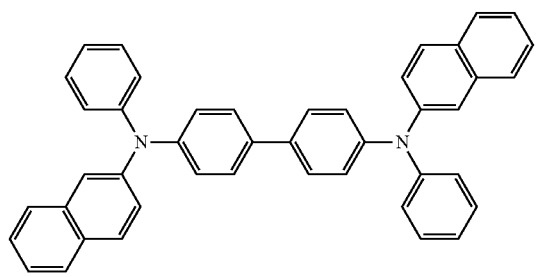

P2

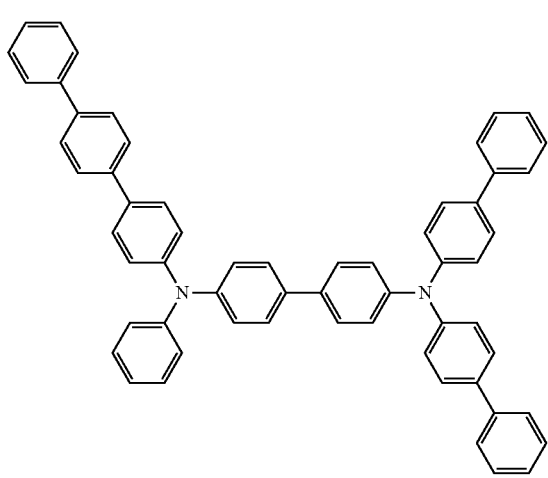

P3

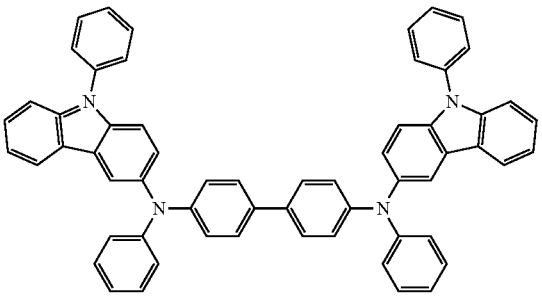

P4

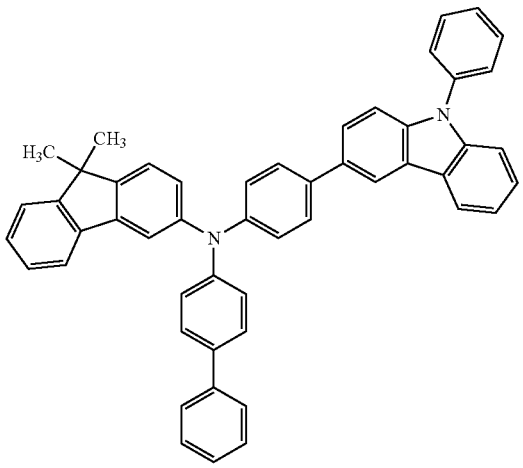

P5

The organic electroluminescence device 10 according to an embodiment of the inventive concept may include the polycyclic compound of an embodiment described above in the emission layer EML disposed between the first electrode EL1 and the second electrode EL2 to achieve excellent light emission efficiency. The polycyclic compound according to an embodiment may be a thermally activated delayed fluorescence dopant, and the emission layer EML may include the polycyclic compound of an embodiment to emit thermally activated delayed fluorescence, thereby achieving good light emission efficiency.

The polycyclic compound of an embodiment described above may be included as a material for the organic electroluminescence device 10 in an organic layer other than the emission layer EML. For example, the organic electroluminescence device 10 according to an embodiment of the inventive concept may include the polycyclic compound described above in at least one functional layer disposed between the first electrode EL1 and the second electrode EL2 or in the capping layer CPL disposed on the second electrode EL2.

The polycyclic compound of an embodiment described above may have a multi-resonant molecular skeleton where aromatic rings are fused around B, N, O, and S. Accordingly, the polycyclic compound according to an embodiment may maintain a stable molecular structure and exhibit a high lowest triplet excitation energy level, and may thus be used as a delayed fluorescence light emitting material. The organic electroluminescence device of an embodiment including the polycyclic compound of an embodiment in the emission layer may exhibit high light emission efficiency.

Hereinafter, with reference to Examples and Comparative Examples, a polycyclic compound according to an embodiment of the inventive concept and an organic electroluminescence device of an embodiment will be described in detail. The Examples shown below are illustrated only for the understanding of the inventive concept, and the scope of the inventive concept is not limited thereto.
[Example Compounds]
2
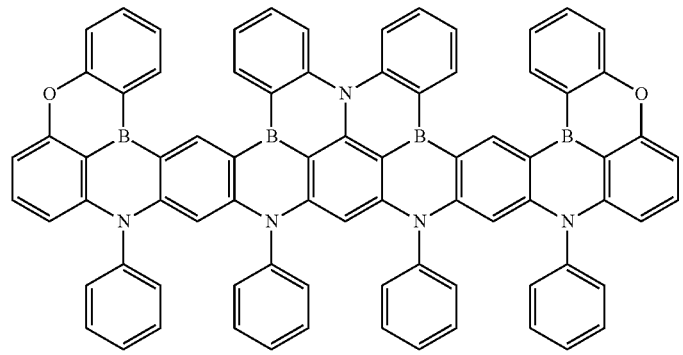
4
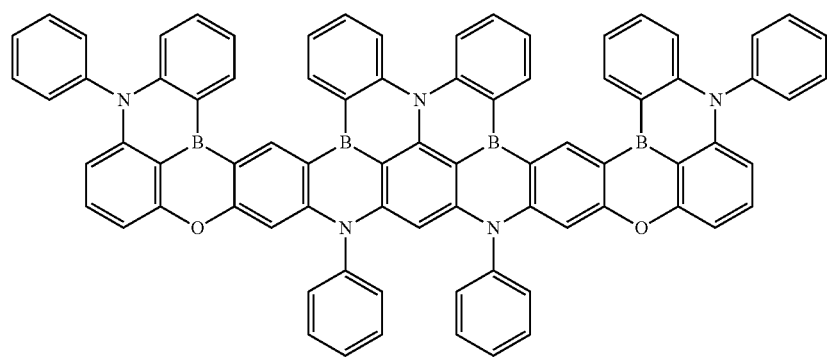
6
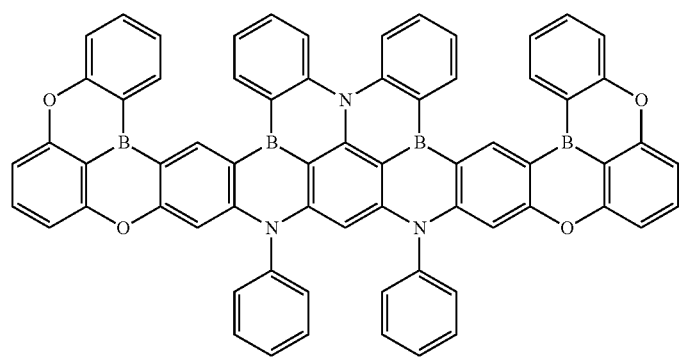
28
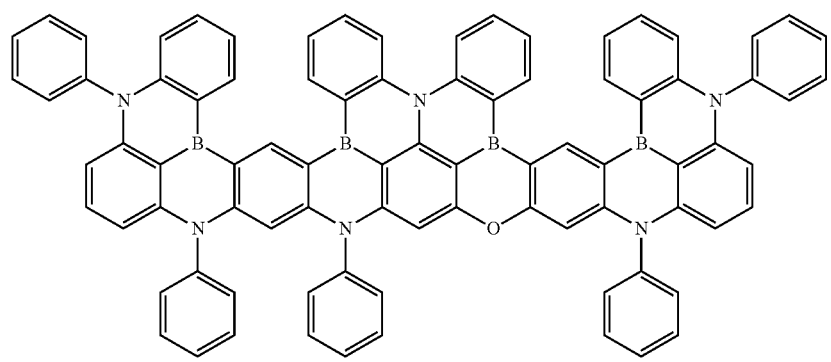

-continued

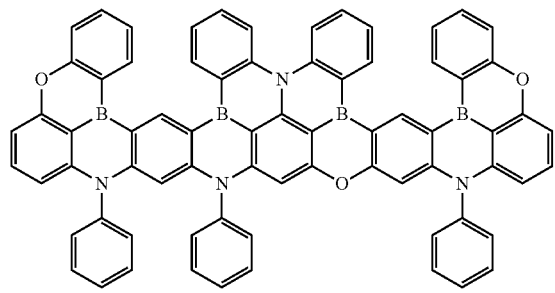
30

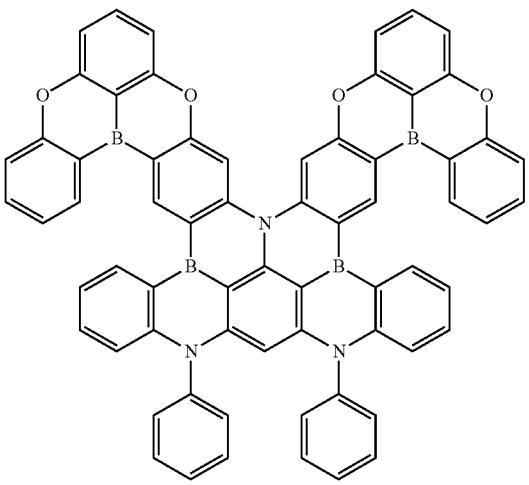
56

[Comparative Example Compounds]

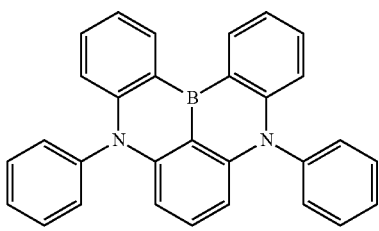
X1

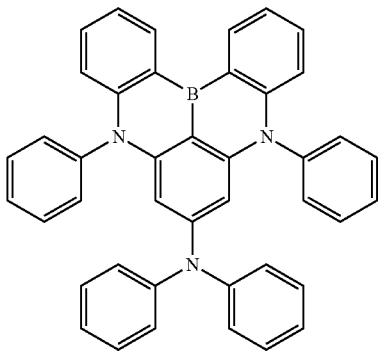
X2

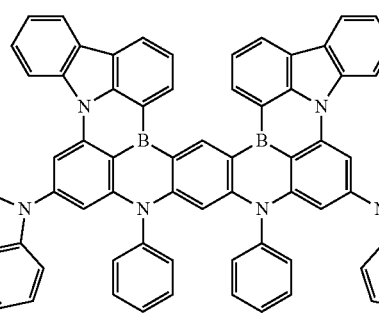
X3

1. Synthesis Examples

A polycyclic compound according to an embodiment may be synthesized, for example, as follows. However, a process of synthesizing a polycyclic compound, which will be described hereinafter, is provided as an example, and thus a process of synthesizing a polycyclic compound according to an embodiment of the inventive concept is not limited to Examples below.

1-1. Synthesis of Compound 2

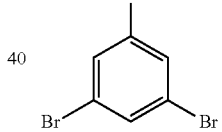

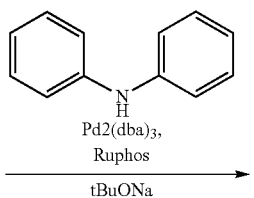

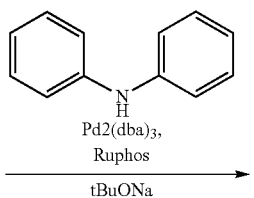
A

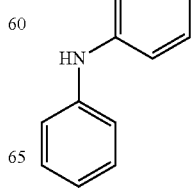

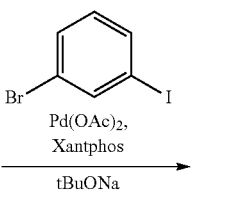

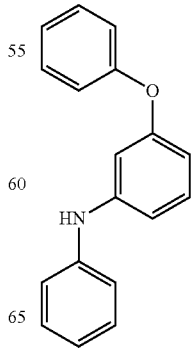

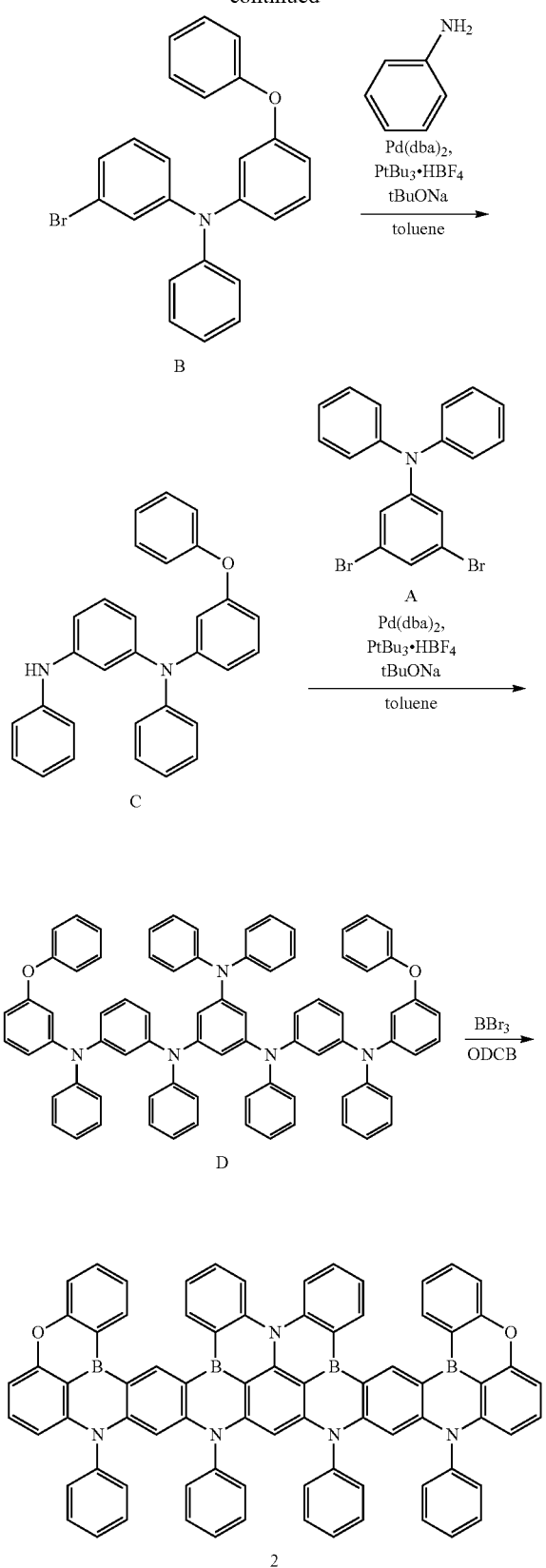

A. Synthesis of Compound A 1,3,5-tribromobenzene (25.0 g, 79 mmol), diphenylamine (11.2 g, 66 mmol), tris(dba)dipalladium(0) (Pd$_2$(dba)$_3$, 1.51 g, 1.7 mmol), 2-dicyclohexylphosphino-2', 6'-diisopropoxybiphenyl (ruphos, 1.3 g, 2.8 mmol), and sodium tert-butoxide ($^t$BuONa, 7.6 g, 79 mmol) were added to toluene (400 ml) and heated at 80° C. for 5 hours. After cooling, toluene and water were added and separated. An organic layer was concentrated, purified by column chromatography (silicagel), concentrated, filtered, and washed with hexane to obtain Compound A (18.1 g, yield 68%).

B. Synthesis of Compound B 3-phenoxy-N-phenylaniline (15.0 g, 57 mmol), 1-bromo-3-iodobenzene (17.9 g, 63 mmol), palladium(II) acetate (Pd(OAc)$_2$, 28 mg, 1.3 mmol), 4,5-bis(diphenylphosphino)-9,9-dimethylxanthene (xantphos, 1.46 g, 2.5 mmol) and $^t$BuONa (6.60 g, 69 mmol) were added to toluene (400 ml) and heated at 80° C. for 5 hours. After cooling, toluene and water were added and separated. An organic layer was concentrated, purified by column chromatography (silicagel), concentrated, filtered, and washed with hexane to obtain Compound B (16.7 g, yield 70%).

C. Synthesis of Compound C

Compound B (16.0 g, 38 mmol), aniline (3.60 g, 38 mmol), palladium (0)bis(dibenzylideneacetone) (Pd(dba)$_2$, 1.10 g, 2 mmol), tri-tert-butylphosphonium tetrafluoroborate (PtBu$_3$·HBF$_4$, 0.42 g, 2.3 mmol), $^t$BuONa (4.43 g, 46 mmol) were added to toluene (400 ml), and heated at 80° C. for 5 hours. After cooling, toluene and water were added and separated. An organic layer was concentrated, purified by column chromatography (silicagel), concentrated, filtered, and washed with hexane to obtain Compound C (12.4 g, yield 75%).

D. Synthesis of Compound D

Using Compound B (12.3 g, 27 mmol) and Compound A (5.50 g, 13.6 mmol), Compound D (13.2 g, yield 88%) was obtained in the same manner as the synthesis of Compound C.

E. Synthesis of Compound 2

Compound D (13.2 g, 12 mmol) was added to 1,2-dichlorobenzene (ODCB, 127 ml), BBr$_3$ (12.0 g) was added, and the mixture was heated at 150° C. for 20 hours. After cooling, triethylamine (TEA, 36 g, 0.36 mol) was added, toluene was added to dissolve, water was added and separated, and an organic layer was concentrated and purified by column chromatography (silicagel) to obtain Compound 2 (2.90 g, yield 22%). After performing sublimation purification (410° C., 3.7×10$^{-3}$ Pa), device evaluation was conducted. FAB-MS referred to m/z=1130 (M$^+$+1)

1-2. Synthesis of Compound 4
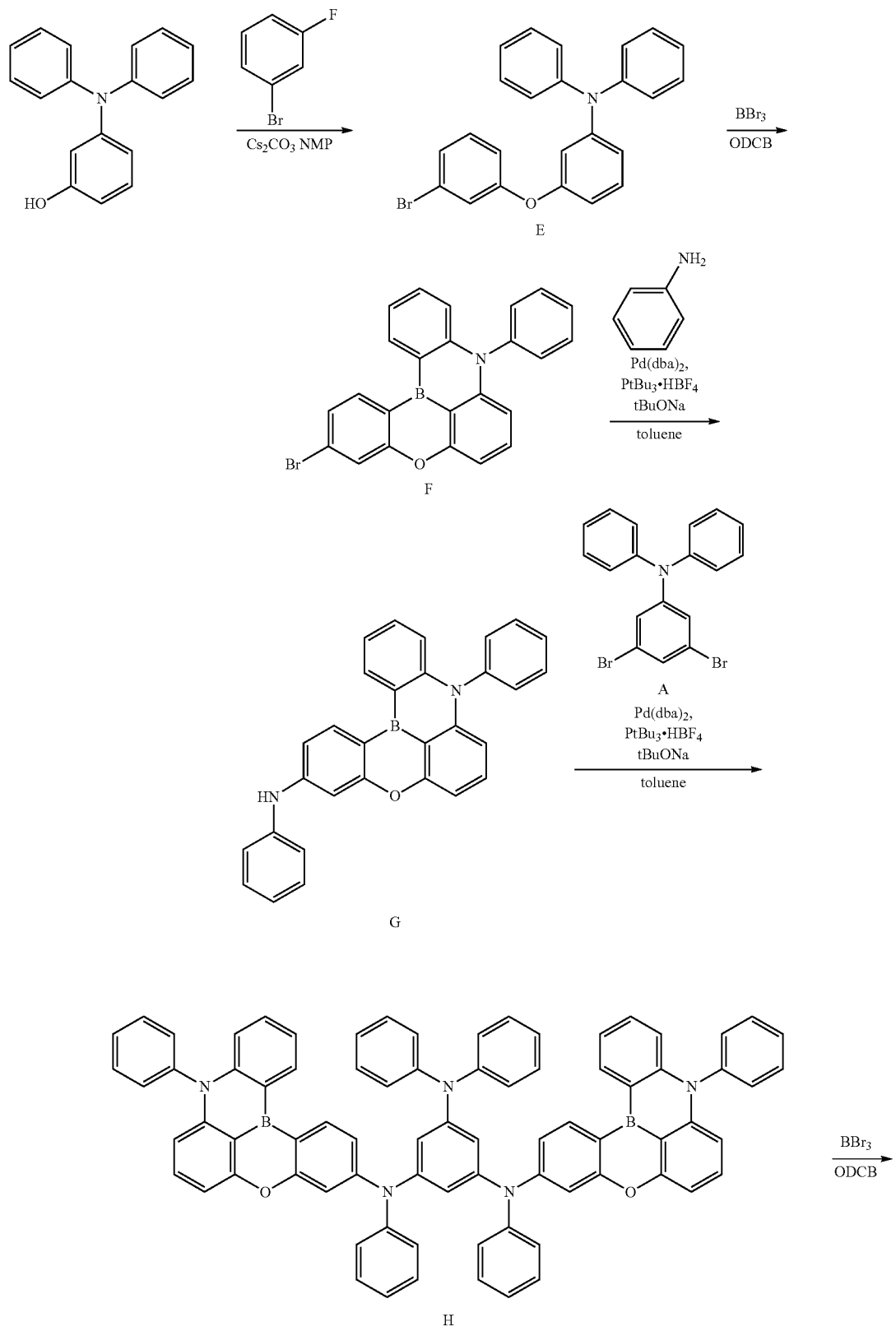

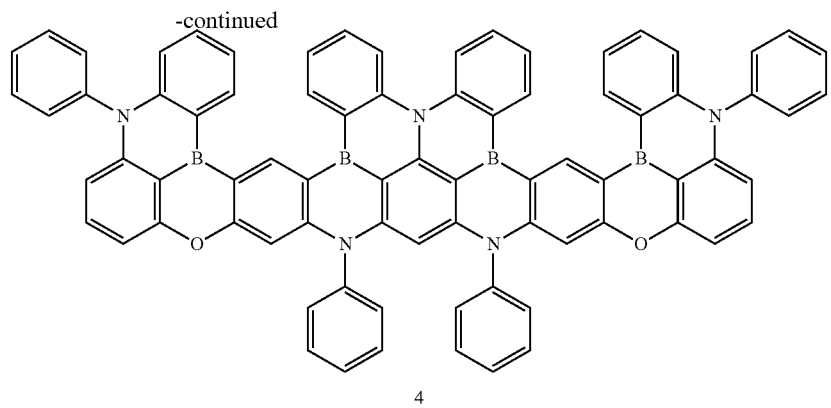

4

A. Synthesis of Compound E 3-(diphenylamino)phenol (10.0 g, 57 mmol), 1-bromo-3-fluorobenzene (19.4 g, 74 mmol), and $Cs_2CO_3$ (37.2 g, 0.11 mol) were added to 1-methyl-2-pyrrolidinone (NMP, 100 ml) and stirred at 150° C. for 20 hours. Water and toluene were added and separated. An organic layer was concentrated, purified by column chromatography (silicagel), concentrated, filtered, and washed with hexane to obtain Compound E (16.7 g, yield 70%).

B. Synthesis of Compound F

In Compound E, Compound F was obtained in the same manner as the synthesis of Compound 2 (16.0 g, 38 mmol) (10.4 g, yield 65%).

C. Synthesis of Compound G

In Compound F and aniline (3.5 g, 38 mmol), Compound G (12.8 g, yield 78%) was obtained in the same manner as the synthesis of Compound C.

D. Synthesis of Compound H

In Compound G (15.5 g, 36 mmol) and Compound A (7.5 g, 17 mmol), Compound H (14.1 g, yield 74%) was obtained in the same manner as the synthesis of Compound D.

E. Synthesis of Compound 4

In Compound H (13.0 g, 12 mmol), Compound 4 (2.60 g, yield 20%) was obtained in the same manner as the synthesis of Compound 2. After performing sublimation purification (415° C., $3.8 \times 10^{-3}$ Pa), device evaluation was conducted. FAB-MS referred to m/z=1130 ($M^+$+1)

1-3. Synthesis of Compound 6

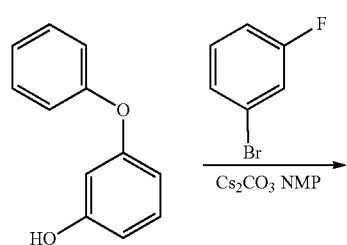

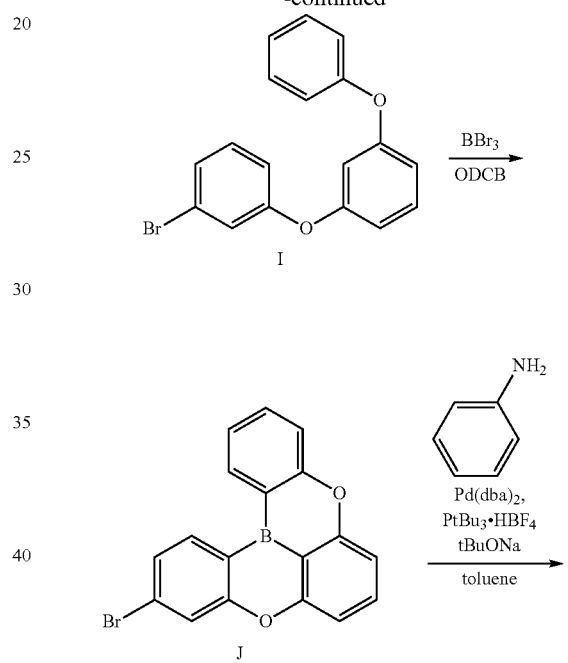

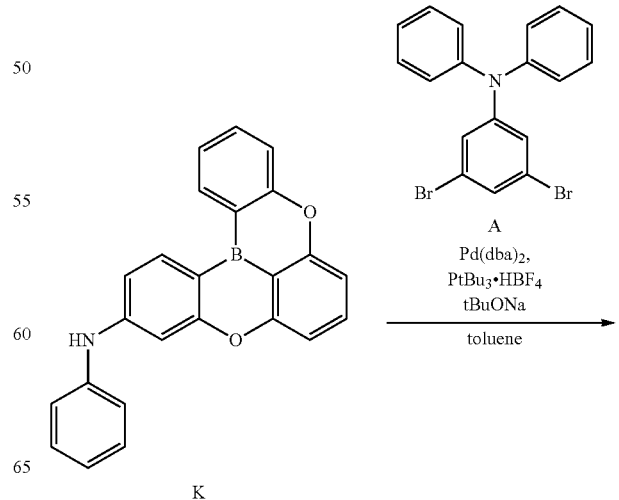

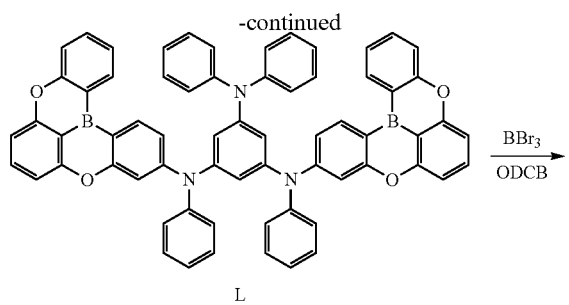

L

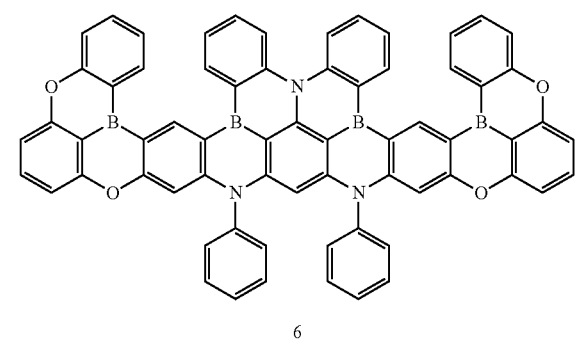

6

A. Synthesis of Compound I

Compound I (13.6 g, yield 77%) was synthesized under the same conditions as the synthesis of Compound E in 3-phenoxyphenol (13.8 g, 74 mmol) and 1-bromo-3-fluorobenzene (10.0 g, 57 mmol).

B. Synthesis of Compound J

Compound J (11.5 g, yield 87%) was synthesized in the same manner as the synthesis of Compound 2 in Compound I (13.2 g, 39 mmol).

C. Synthesis of Compound K

Compound K (10.5 g, yield 92%) was obtained in the same manner as the synthesis of Compound C in Compound J (11.0 g, 32 mmol) and aniline (2.90 g, 32 mmol).

D. Synthesis of Compound L

Compound L (11.2 g, yield 85%) was obtained in the same manner as the synthesis of Compound D in Compound K (10.3 g, 29 mmol) and Compound A (5.5 g, 14 mmol).

E. Synthesis of Compound 6

Compound 6 (2.0 g, yield 18%) was obtained in the same manner as the synthesis of Compound 2 in Compound L (11.0 g, 11 mmol). After performing sublimation purification (390° C., 3.5×10$^{-3}$ Pa), device evaluation was conducted. FAB-MS referred to m/z=980 (M$^+$+1)

1-4. Synthesis of Compound 28

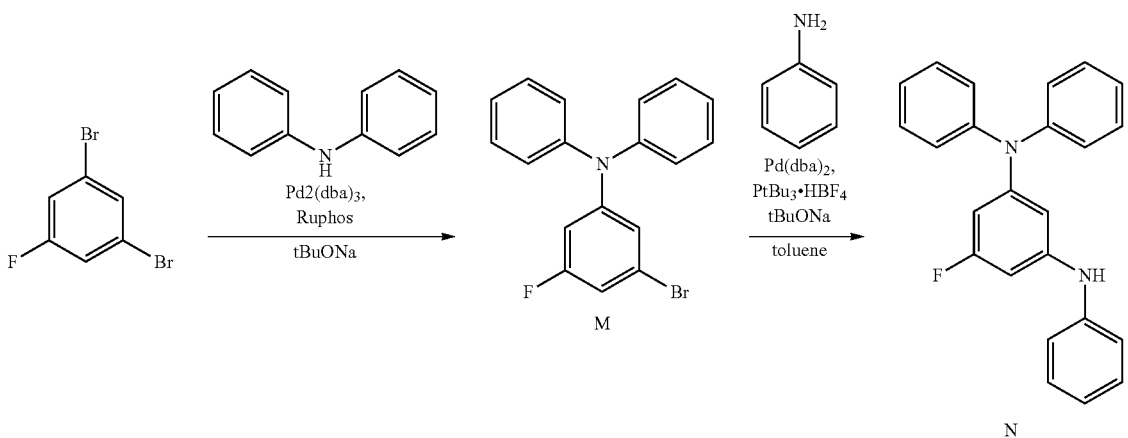

-continued
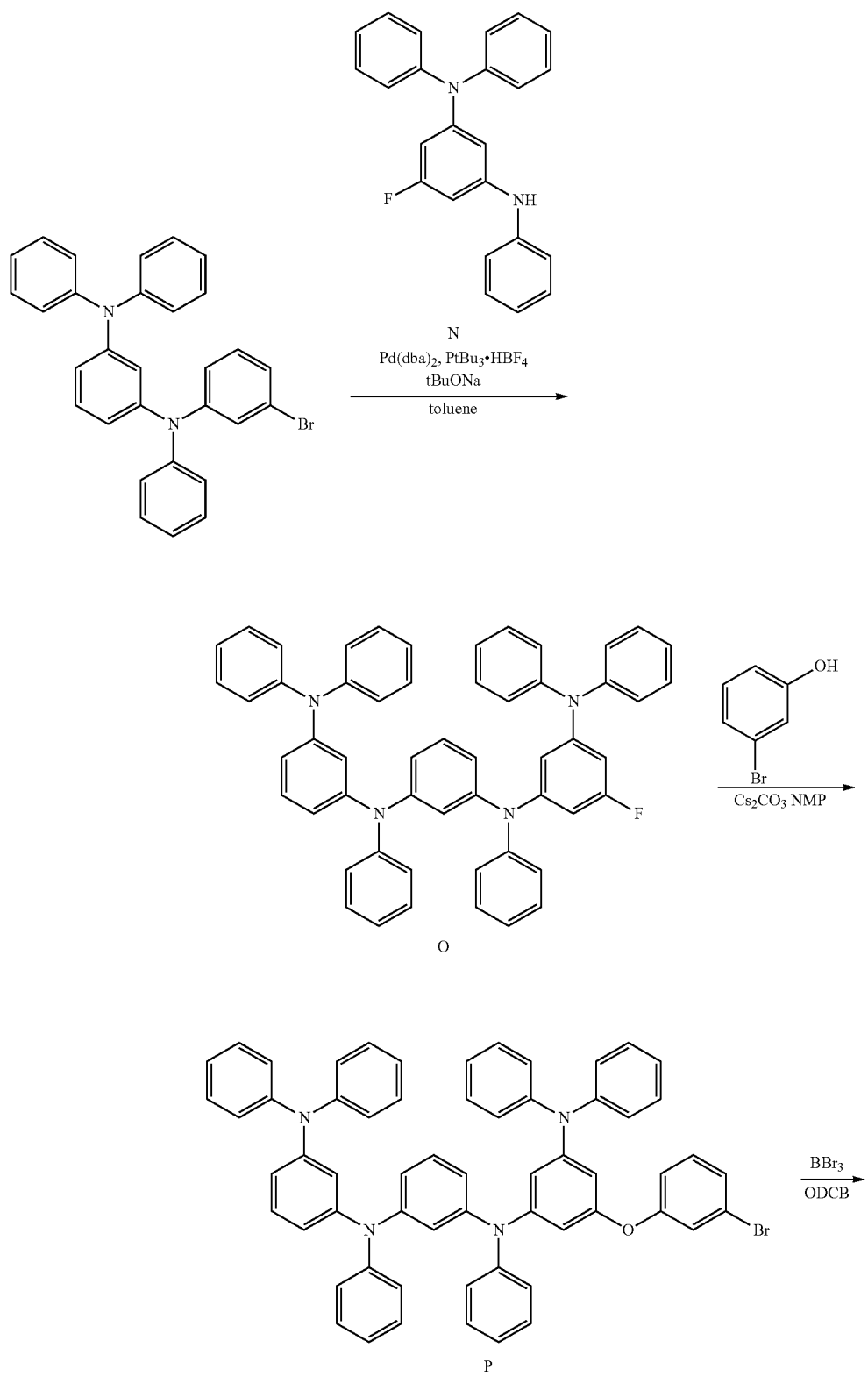

-continued
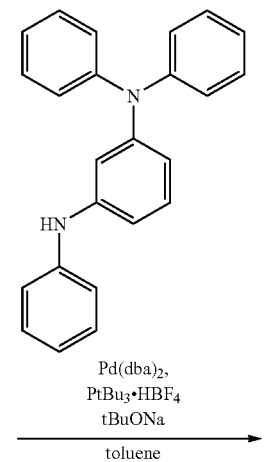
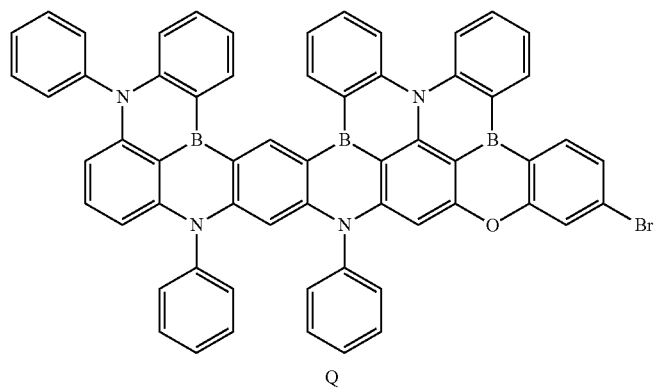
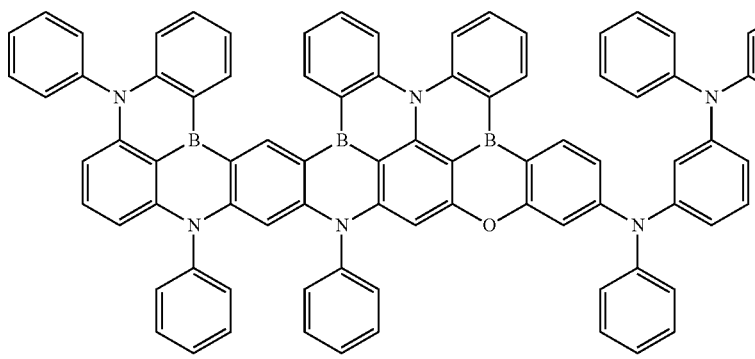
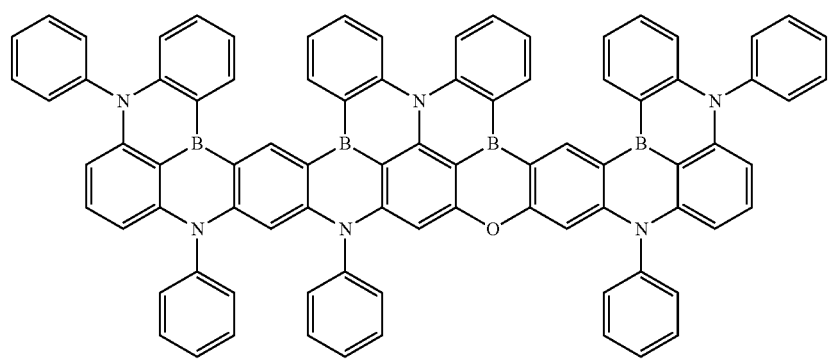
28

A. Synthesis of Compound M

Compound M (17.7 g, yield 79%) was synthesized in the same manner as the synthesis of Compound A in 1,3-dibromo-5-fluorobenzene (20.0 g, 79 mmol) and diphenylamine (11.1 g, 66 mmol).

B. Synthesis of Compound N

Compound N (15.1 g, yield 85%) was synthesized in the same manner as the synthesis of Compound C in Compound M (17.2 g, 50 mmol) and aniline (4.7 g, 50 mmol).

C. Synthesis of Compound O $N^1$-(3-bromophenyl)-N1, N3,N3-triphenylbenzene-1,3-diamine (18.5 g, 38 mmol), Compound N (14.7 g, 41 mmol), Pd(dba)$_2$ (1.08 g, 1.88 mmol), PtBu$_3$ HBF$_4$ (0.41 g, 2.2 mmol), and $^t$BuONa (4.34 g, 46 mmol) were added to toluene (400 ml) and heated at 80° C. for 5 hours. After cooling, toluene and water were added and separated. An organic layer was concentrated, purified by column chromatography (silicagel), concentrated, filtered, and washed with hexane to obtain Compound O (24.8 g, yield 86%).

D. Synthesis of Compound P

Compound P (20.2 g, yield 70%) was synthesized under the same conditions as the synthesis of Compound E in 3-bromophenol (16.3 g, 94 mmol) and Compound O (24.0 g, 31 mmol).

E. Synthesis of Compound Q

Compound Q (7.0 g, yield 35%) was synthesized in the same manner as the synthesis of Compound 2 in Compound P (20.0 g, 22 mmol).

F. Synthesis of Compound R

Compound R (7.1 g, yield 86%) was synthesized in the same manner as the synthesis of Compound O in Compound Q (6.5 g, 7 mmol) and N1,N1,N3-triphenylbenzene-1,3-diamine (2.55 g, 8 mmol).

G. Synthesis of Compound 28

Compound 28 (2.24 g, yield 33%) was obtained in the same manner as the synthesis of Compound 2 in Compound R (7.0 g, 6 mmol). After performing sublimation purification (410° C., 3.3×10$^{-3}$ Pa), device evaluation was conducted. FAB-MS referred to m/z=1205 (M$^+$+1)

1-5. Synthesis of Compound 30

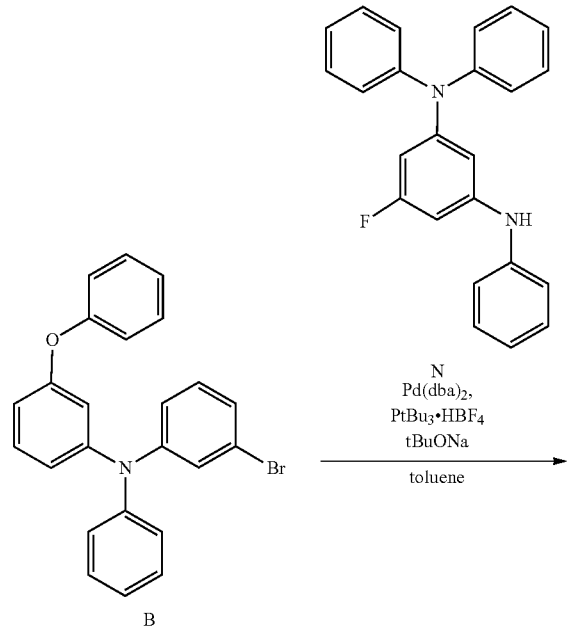

-continued
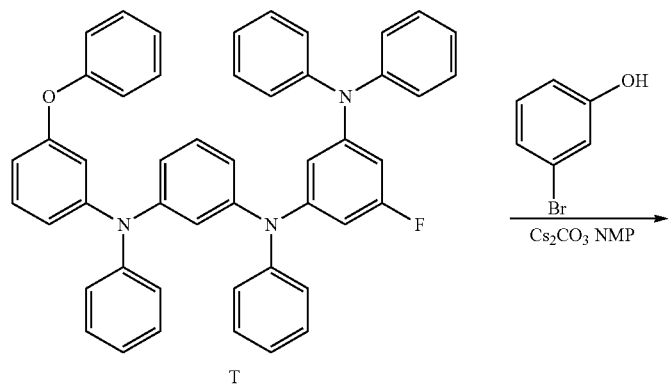
T
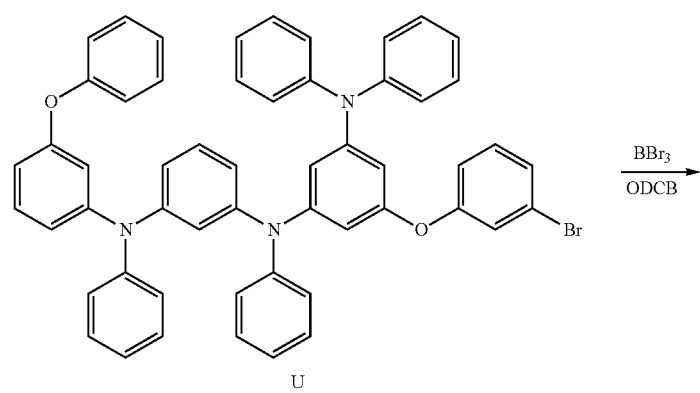
U
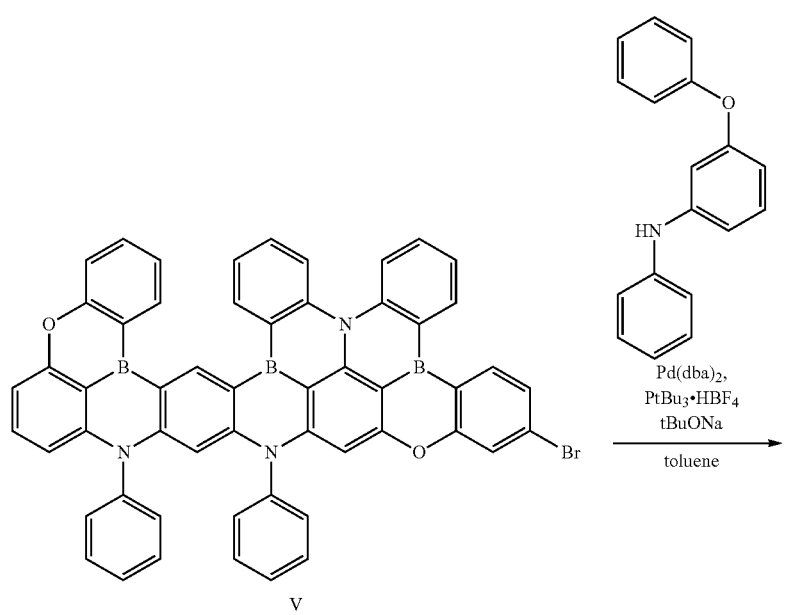
V

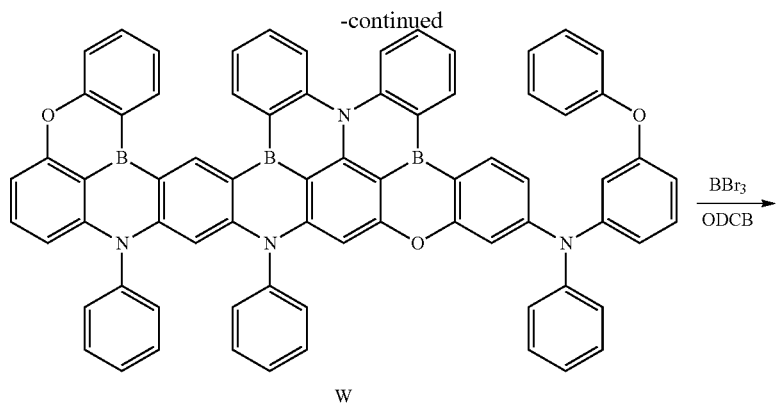

W

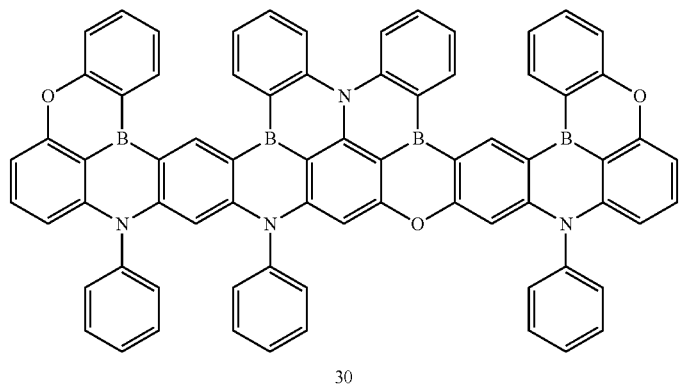

30

A. Synthesis of Compound T

Compound T (19.9 g, yield 80%) was synthesized in the same manner as the synthesis of Compound O in Compound B (15.0 g, 36 mmol) and Compound N (14.0 g, 40 mmol).

B. Synthesis of Compound U

Compound U (16.3 g, yield 75%) was synthesized under the same conditions as the synthesis of Compound E in Compound T (19.0 g, 28 mmol) and 1-bromo-3-fluorobenzene (14.3 g, 83 mmol).

C. Synthesis of Compound V

Compound V (6.4 g, yield 40%) was synthesized in the same manner as the synthesis of Compound 2 in Compound U (16.0 g, 19 mmol).

D. Synthesis of Compound W

Compound W (6.7 g, yield 92%) was obtained in the same manner as the synthesis of Compound O in Compound V (6.0 g, 7 mmol) and 3-phenoxy-N-phenylaniline (2.60 g, 8 mmol).

E. Synthesis of Compound 30

Compound 30 (1.26 g, yield 21%) was obtained in the same manner as the synthesis of Compound 2 in Compound W (6.0 g, 6 mmol). After performing sublimation purification (410° C., $3.2 \times 10^{-3}$ Pa), device evaluation was conducted. FAB-MS referred to m/z=1055 (M$^+$+1).

1-6. Synthesis of Compound 56

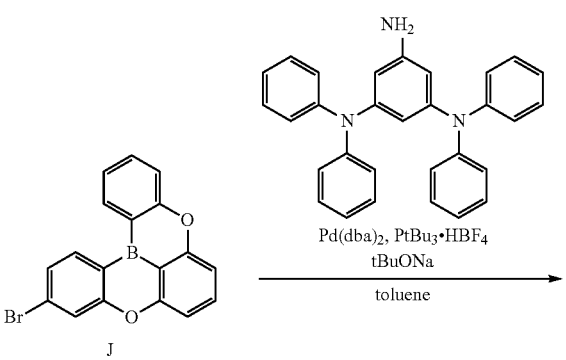

J

-continued

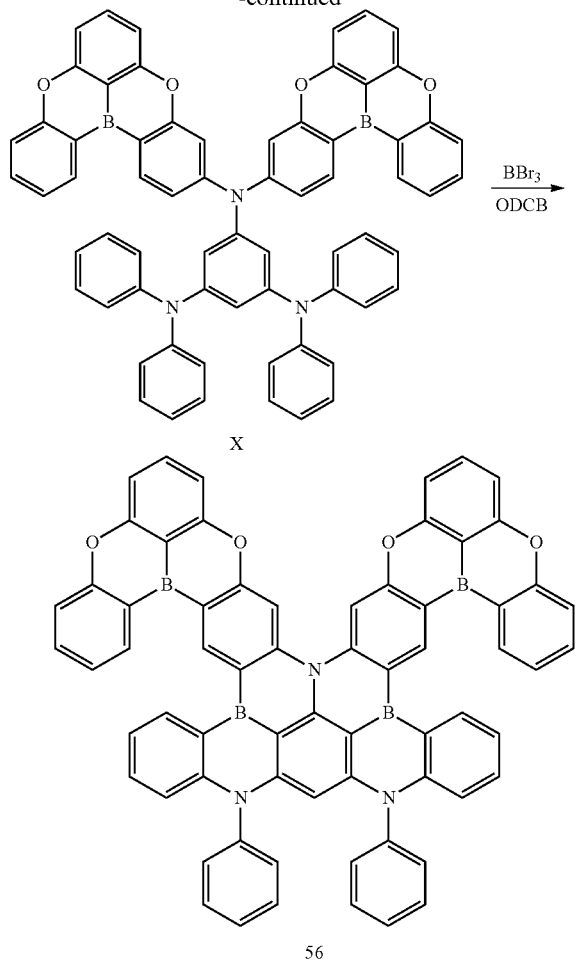

A. Synthesis of Compound X

Compound J (10.0 g, 29 mmol), N1,N1,N3,N3-tetraphenylbenzene-1,3,5-triamine (6.1 g, 14 mmol), Pd(dba)$_2$ (0.82 g, 1.43 mmol), PtBu$_3$ HBF$_4$ (0.31 g, 1.7 mmol), and $^t$BuONa (3.3 g, 34 mmol) were added to toluene (200 ml), and heated at 80° C. for 5 hours. After cooling, toluene and water were added and separated. An organic layer was concentrated, purified by column chromatography (silicagel), concentrated, filtered, and washed with hexane to obtain Compound X (11.0 g, yield 80%).

B. Synthesis of Compound 56

Compound 56 (1.3 g, yield 12%) was obtained in the same manner as the synthesis of Compound 2 in Compound X (10.8 g, 11 mmol). After performing sublimation purification (400° C., 3.8×10$^3$ Pa), device evaluation was conducted. FAB-MS referred to m/z=980 (M$^+$+1).

1. Evaluation of the Energy Level of Compounds

The light emission characteristics of a polycyclic compound of an embodiment and organic electroluminescence devices of an embodiment including a polycyclic compound of an embodiment in an emission layer were evaluated as follows. A method of manufacturing an organic electroluminescence device for evaluation is described below.

Organic electroluminescence devices of Examples 1 to 6 were manufactured using Compounds 2, 4, 6, 28, 30, and 56 described above as a dopant material for an emission layer. Comparative Examples 1 to 3 are organic electroluminescence devices manufactured using Comparative Example Compounds X1 to X3 as a dopant material for an emission layer, respectively.

(Manufacture of Organic Electroluminescence Devices)

On a glass substrate, ITO was patterned to a thickness of about 1500 Å, washed with ultra-pure water, cleaned with ultrasonic waves, irradiated with UV for 30 minutes, and then ozone-treated. Thereafter, HAT-CN was deposited to a thickness of 100 Å, α-NPD was deposited to a thickness of 800 Å, and mCP was deposited to a thickness of 50 Å to form a hole transport region.

In the forming of each emission layer, polycyclic compounds of an embodiment or Comparative Example Compounds and host materials were co-deposited at 1:99 to form a layer having a thickness of 200 Å. The emission layers formed by co-deposition in Examples 1 to 6 were deposited by mixing Compounds 2, 4, 6, 28, 30, and 56 with the host materials respectively, and in Comparative Examples 1 to 3, Comparative Example Compounds X1 to X3 each were mixed with host materials and deposited. In the forming of the emission layers, mCP was used as a host material.

Thereafter, on the emission layers, sequentially a layer having a thickness of 300 Å was formed of TPBi and a layer having a thickness of 50 Å was formed of LiF to form an electron transport region. A second electrode having a thickness of 1000 Å was formed of aluminum (Al).

In Examples, the hole transport region, the emission layer, the electron transport region, and the second electrode were formed using a vacuum deposition apparatus.

[Functional Compounds]

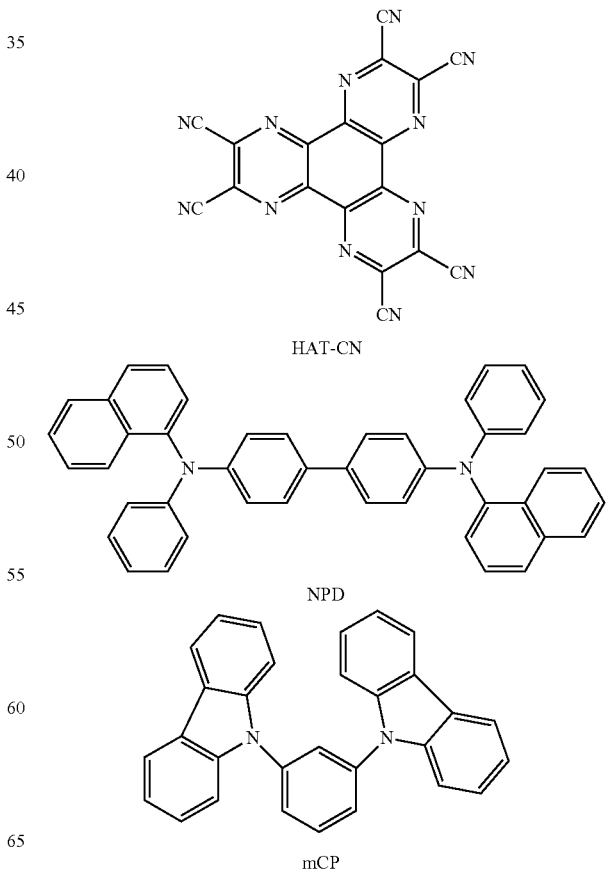

-continued

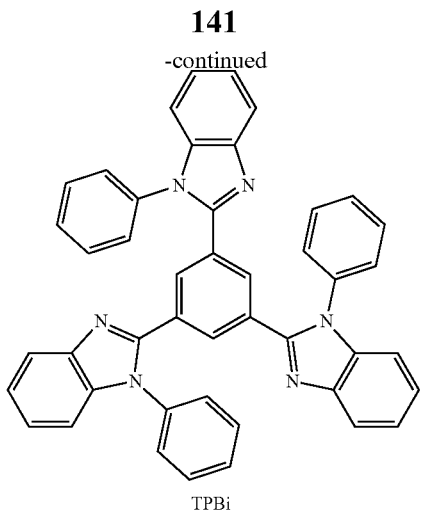

TPBi (Evaluation of Organic Electroluminescence Device Characteristics)

Table 1 shows the evaluation results of the organic electroluminescence devices of Examples 1 to 6 and Comparative Examples 1 to 3. Table 1 shows maximum emission wavelength (X max), $EQE_{max}$, and $EQE_{max1000\ nit}$ of the manufactured organic electroluminescence devices by comparison. In the characteristic evaluation results of Examples and Comparative Examples shown in Table 1, maximum emission wavelength (X max) refers to the wavelength representing the maximum value in the emission spectrum, $EQE_{max}$ (external quantum efficiency) refers to the maximum value of the external quantum efficiency, and $EQE_{max1000\ nit}$ refers to the maximum value of the external quantum efficiency at 1000 cd/m².

TABLE 2

| Type | Dopant material | $\lambda_{max}$ (nm) | $EQE_{max}$ (%) | $EQE_{max1000\ nit}$ (%) |
| --- | --- | --- | --- | --- |
| Example 1 | Compound 2 | 467 | 25.0 | 23.3 |
| Example 2 | Compound 4 | 463 | 27.3 | 24.5 |
| Example 3 | Compound 6 | 460 | 28.1 | 26.3 |
| Example 4 | Compound 28 | 464 | 25.4 | 23.4 |
| Example 5 | Compound 30 | 470 | 26.1 | 24.4 |
| Example 6 | Compound 56 | 460 | 20.1 | 18.9 |
| Comparative Example 1 | Comparative Example Compound X1 | 459 | 13.2 | 5.4 |
| Comparative Example 2 | Comparative Example Compound X2 | 467 | 14.2 | 6.4 |
| Comparative Example 3 | Comparative Example Compound X3 | 474 | 15.6 | 13.2 |

Referring to the results in Table 1, it can be confirmed that the organic electroluminescence devices of Examples 1 to 6 emit light in a blue wavelength range of about 460 nm to about 470 nm. The organic electroluminescence devices of Examples 1 to 6 show excellent external quantum efficiency with an $EQE_{max}$ value of 200% or more and an $EQE_{max1000\ nit}$ value of 18.900 or more. It can be seen that the organic electroluminescence devices of Examples 1 to 6 including the polycyclic compounds according to an embodiment have improved light emission efficiency.

In comparison, the organic electroluminescence devices of Comparative Examples 1 to 3 emit blue light but have an $EQE_{max}$ value of 15.6% or less and an $EQE_{max1000\ nit}$ value of 13.200 or less, which show low external quantum efficiency.

Comparative Example Compounds X1 and X2 have a multi-resonant structure in which aromatic rings are linked to a boron atom and a nitrogen atom, but do not have a structure in which the aromatic rings are fused.

Comparative Example Compound X3 includes a number of aromatic rings fused to a boron atom and a nitrogen atom, and thus has a basic structure of Formula 1 of the inventive concept. However, it does not have a structure containing a group represented by Formula 2 of the inventive concept.

In the polycyclic compound of an embodiment according to the inventive concept, a number of aromatic rings are fused around B and N, and a conjugated system may be extended. Accordingly, the polycyclic compound of an embodiment has a stabilized molecular structure and a multi-resonant molecular skeleton to be included in an emission layer of an organic electroluminescence device, thereby exhibiting excellent light emission efficiency.

An organic electroluminescence device according to an embodiment of the inventive concept may achieve excellent light emission efficiency.

A polycyclic compound according to an embodiment of the inventive concept may be applied to an organic electroluminescence device to achieve excellent light emission efficiency.

Although the inventive concept has been described with reference to a preferred embodiment of the inventive concept, it will be understood that the inventive concept should not be limited to these preferred embodiments but various changes and modifications can be made by those skilled in the art without departing from the spirit and scope of the inventive concept.

Accordingly, the technical scope of the inventive concept is not intended to be limited to the contents set forth in the detailed description of the specification, but is intended to be defined by the appended claims.

What is claimed is:

1. An organic electroluminescence device, comprising:
a first electrode;
a second electrode facing the first electrode; and
an emission layer disposed between the first electrode and the second electrode,
wherein the first electrode and the second electrode each independently include at a least one material selected from the group consisting of Ag, Mg, Cu, Al, Pt, Pd, Au, Ni, Nd, Ir, Cr, Li, Ca, LiF/Ca, LiF/Al, Mo, Ti, oxides thereof, compounds thereof, and mixtures thereof;
wherein the emission layer includes a polycyclic compound represented by Formula 1:

[Formula 1]

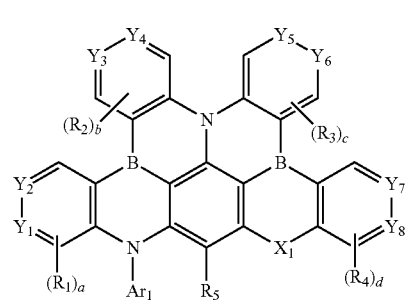

wherein in Formula 1, $X_1$ is $NAr_2$, O, or S, $Y_1$ to $Y_8$ are each independently $CM_1$ or a carbon atom bonded to a group represented by Formula 2, each $M_1$ is independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or bonded to an adjacent group to form a ring, $Ar_1$ and $Ar_2$ are each independently a substituted or unsubstituted aryl group having 6 to 30 ring-forming carbon atoms or a substituted or unsubstituted heteroaryl group having 2 to 30 ring-forming carbon atoms, $R_1$ to $R_5$ are each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or bonded to an adjacent group to form a ring, a, b, c, and d are each independently an integer from 0 to 2, at least one group represented by Formula 2 is bonded to at least one pair of substituents, the at least one pair of substituents selected from the group consisting of $Y_1$ and $Y_2$, $Y_3$ and $Y_4$, $Y_5$ and $Y_6$, and $Y_7$ and $Y_8$,

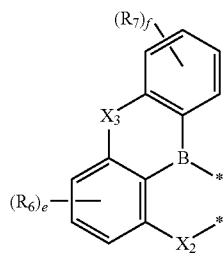

[Formula 2]

wherein in Formula 2, each $X_2$ and each $X_3$ are independently $NAr_3$, O, or S, each $Ar_3$ is independently a substituted or unsubstituted aryl group having 6 to 30 ring-forming carbon atoms or a substituted or unsubstituted heteroaryl group having 2 to 30 ring-forming carbon atoms, each $R_6$ and each $R_7$ are independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or bonded to an adjacent group to form a ring, each e is independently an integer from 0 to 3, each f is independently an integer from 0 to 4, and

* indicates a binding site to a neighboring atom.

2. The organic electroluminescence device of claim 1, wherein the polycyclic compound represented by Formula 1 is represented by one of Formulas 1-1a to 1-1c:

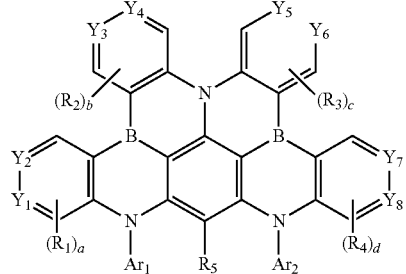

[Formula 1-1a]

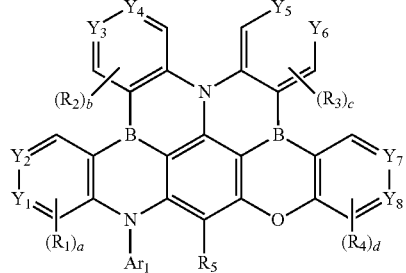

[Formula 1-1b]

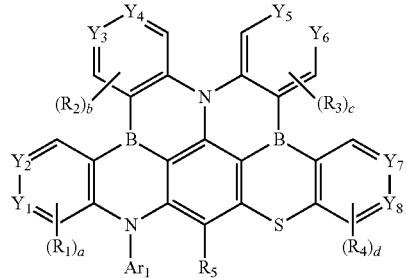

[Formula 1-1c]

wherein in Formulas 1-1a to 1-1c, $Y_1$ to $Y_8$, $Ar_1$, $Ar_2$, and $R_1$ to $R_5$ are the same as defined in Formulas 1 and 2.

3. The organic electroluminescence device of claim 1, wherein the polycyclic compound represented by Formula 1 is represented by Formula 3-1 or Formula 3-2:

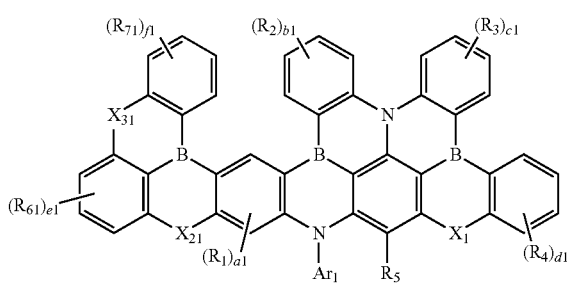

[Formula 3-1]

-continued

[Formula 3-2]

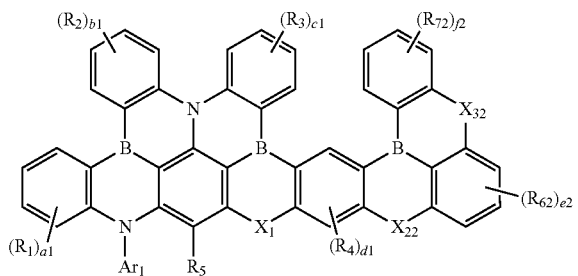

wherein in Formulas 3-1 and 3-2, $X_{21}$, $X_{22}$, $X_{31}$, and $X_{32}$ are each independently $NAr_4$, O, or S, each $Ar_4$ is independently a substituted or unsubstituted aryl group having 6 to 30 ring-forming carbon atoms or a substituted or unsubstituted heteroaryl group having 2 to 30 ring-forming carbon atoms, $R_{61}$, $R_{62}$, $R_{71}$, and $R_{72}$ are each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 carbon atoms, or bonded to an adjacent group to form a ring, a1 and d1 are each independently an integer from 0 to 2,
b1 and c1 are each independently an integer from 0 to 4,
e1 and e2 are each independently an integer from 0 to 3,
f1 and f2 are each independently an integer from 0 to 4, and $X_1$, $Ar_1$, and $R_1$ to $R_5$ are the same as defined in Formulas 1 and 2.

4. The organic electroluminescence device of claim 1, wherein the polycyclic compound represented by Formula 1 is represented by one of Formulas 4-1a to 4-1d:

[Formula 4-1a]

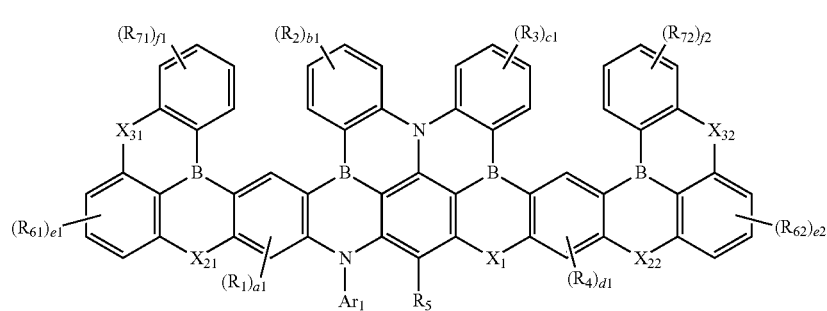

[Formula 4-1b]

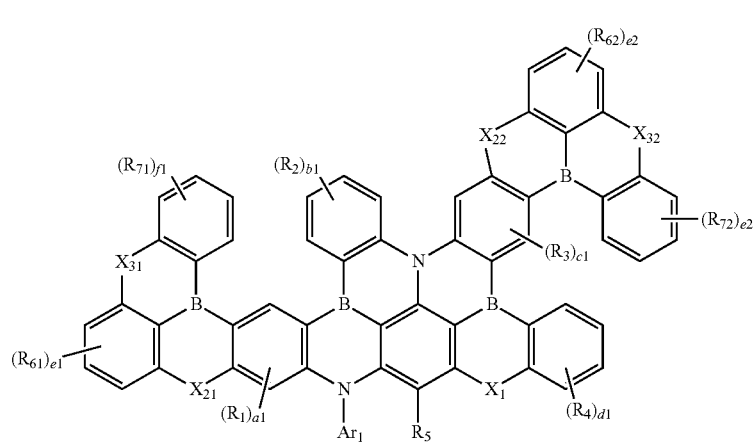

[Formula 4-1c]

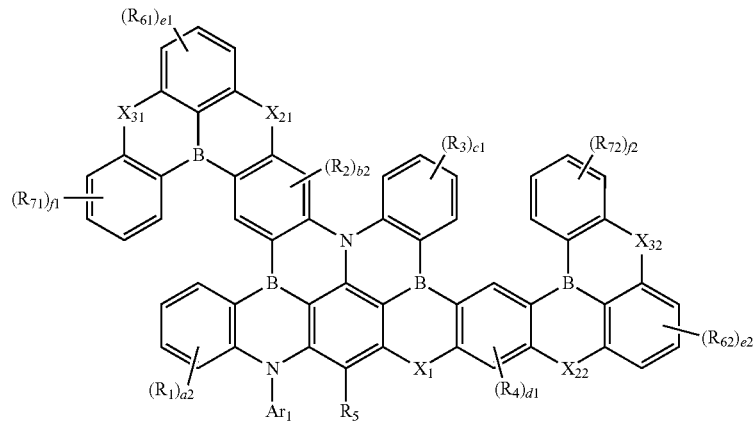

[Formula 4-1d]

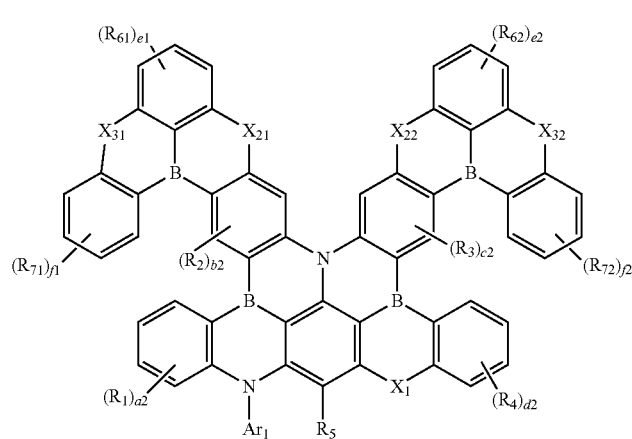

wherein in Formulas 4-1a to 4-1d, $X_{21}$, $X_{22}$, $X_{31}$, and $X_{32}$ are each independently $NAr_4$, O, or S, each $Ar_4$ is independently a substituted or unsubstituted aryl group having 6 to 30 ring-forming carbon atoms or a substituted or unsubstituted heteroaryl group having 2 to 30 ring-forming carbon atoms, $R_{61}$, $R_{62}$, $R_{71}$, and $R_{72}$ are each independently a hydrogen atom, a deuterium atom, a halogen atom, a substituted or unsubstituted amine group, a substituted or unsubstituted alkyl group having 1 to 20 carbon atoms, a substituted or unsubstituted aryl group having ring-forming 6 to 30 carbon atoms, or a substituted or unsubstituted heteroaryl group having 2 to 30 ring-forming carbon atoms, or bonded to an adjacent group to form a ring, a1, b2, c2, and d1 are each independently an integer from 0 to 2, a2, b1, c1, and d2 are each independently an integer from 0 to 4, e1 and e2 are each independently an integer from 0 to 3, f1 and f2 are each independently an integer from 0 to 4, and $X_1$, $Ar_1$, and $R_1$ to $R_5$ are the same as defined in Formulas 1 and 2.

5. The organic electroluminescence device of claim 4, wherein the polycyclic compound represented by Formula 4-1a has a line-symmetrical structure with respect to an imaginary line passing through a central nitrogen atom and $R_5$.

6. The organic electroluminescence device of claim 4, wherein the polycyclic compound represented by Formula 4-1d has a line-symmetrical structure with respect to an imaginary line passing through a central nitrogen atom and $R_5$.

7. The organic electroluminescence device of claim 1, wherein the polycyclic compound represented by Formula 1 is represented by one of Formulas 4-2a to 4-2d:

[Formula 4-2a]
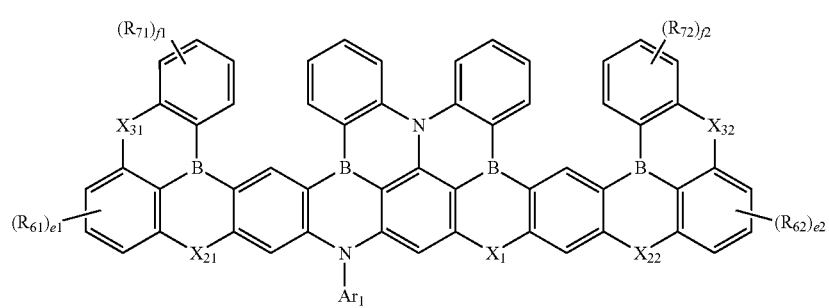
[Formula 4-2b]
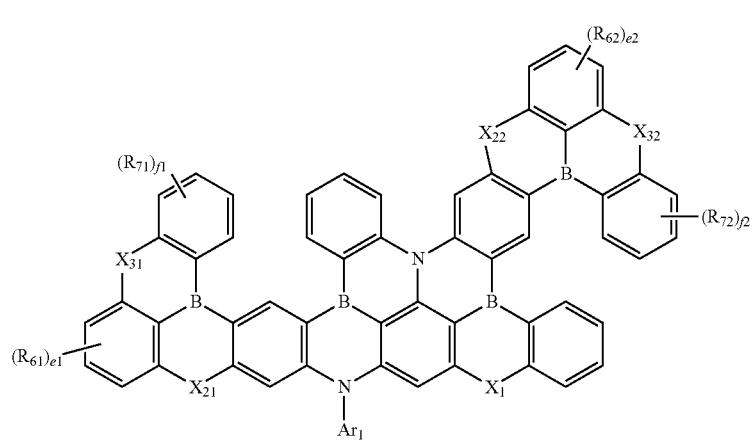
[Formula 4-2c]
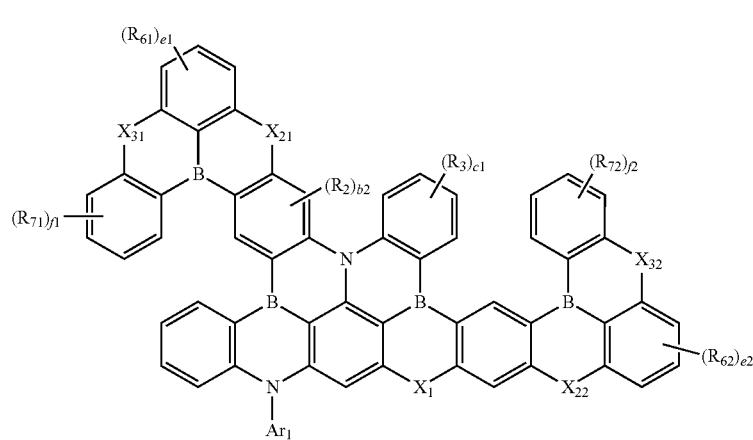
[Formula 4-2d]
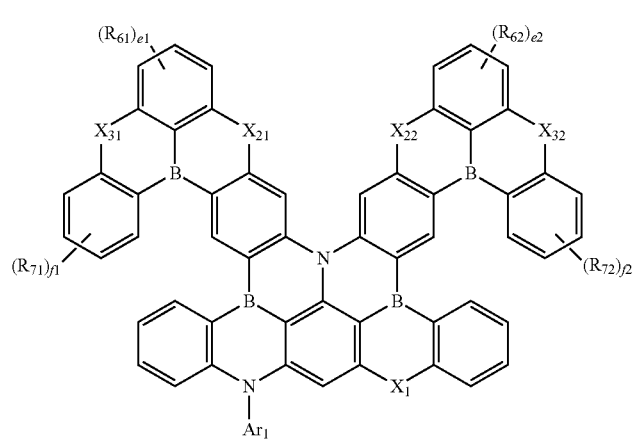

wherein in Formulas 4-2a to 4-2d, $X_{21}$, $X_{22}$, $X_{31}$, and $X_{32}$ are each independently $NAr_4$, O, or S, each $Ar_4$ is independently a substituted or unsubstituted aryl group having 6 to 30 ring-forming carbon atoms or a substituted or unsubstituted heteroaryl group having 2 to 30 ring-forming carbon atoms, $R_{61}$, $R_{62}$, $R_{71}$, and $R_{72}$ are each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or bonded to an adjacent group to form a ring, e1 and e2 are each independently an integer from 0 to 3, f1 and f2 are each independently an integer from 0 to 4, and $X_1$ and $Ar_1$ are the same as defined in Formulas 1 and 2.

8. The organic electroluminescence device of claim 1, wherein the polycyclic compound represented by Formula 1 is represented by Formula 5-1 or Formula 5-2:

[Formula 5-1]

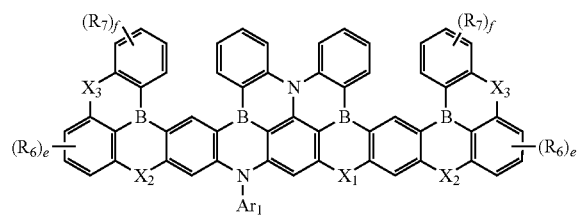

[Formula 5-2]

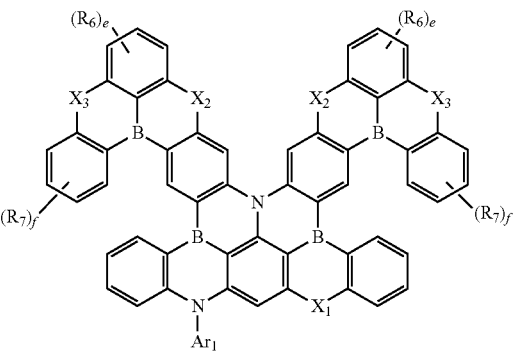

wherein in Formulas 5-1 and 5-2, each of $X_1$, $X_2$, $X_3$, $Ar_1$, $R_6$, $R_7$, e, and f are independently the same as defined in Formulas 1 and 2.

9. The organic electroluminescence device of claim 1, wherein $Ar_1$ and $Ar_2$ are each independently a substituted or unsubstituted phenyl group.

10. The organic electroluminescence device of claim 1, wherein $R_6$ and $R_7$ are each independently an unsubstituted methyl group, an unsubstituted isopropyl group, an unsubstituted t-butyl group, a substituted or unsubstituted biphenyl amine group, or an unsubstituted phenyl group.

11. The organic electroluminescence device of claim 1, wherein the emission layer emits delayed fluorescence.

12. The organic electroluminescence device of claim 1, wherein the emission layer emits light in a blue wavelength range.

13. The organic electroluminescence device of claim 1, wherein the emission layer comprises a first compound and a second compound, and the first compound includes the polycyclic compound.

14. The organic electroluminescence device of claim 1, wherein the polycyclic compound represented by Formula 1 is selected from one of the compounds represented by Compound Group 1:

[Compound Group 1]

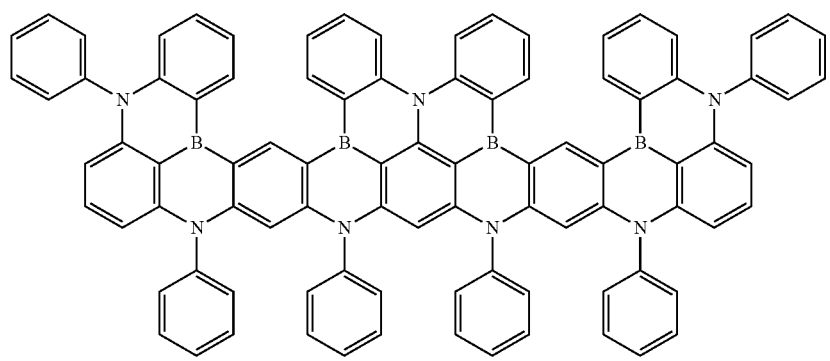

1

-continued
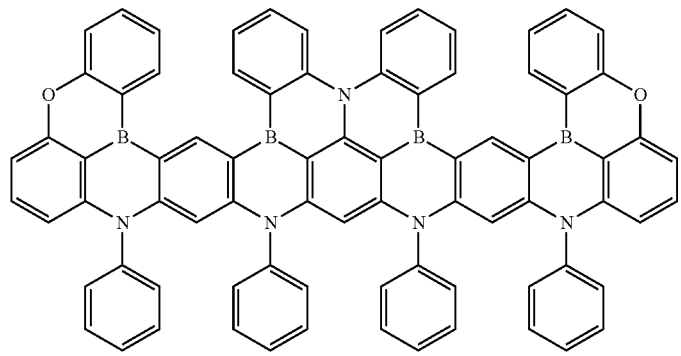
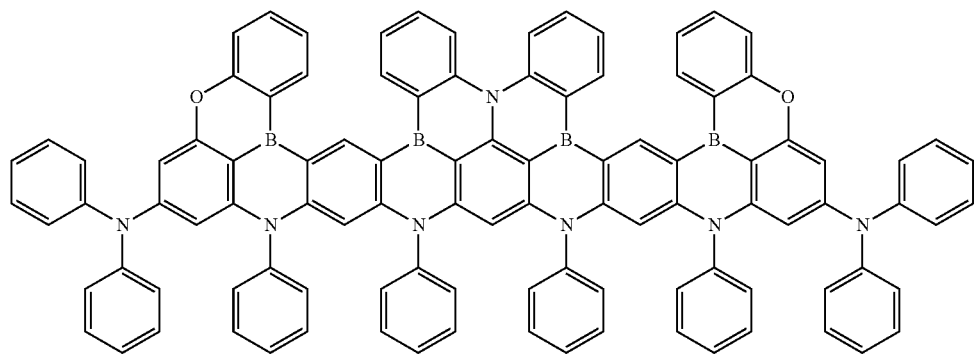
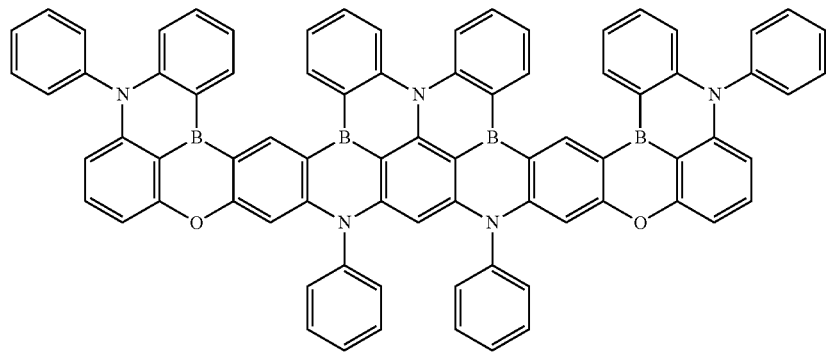
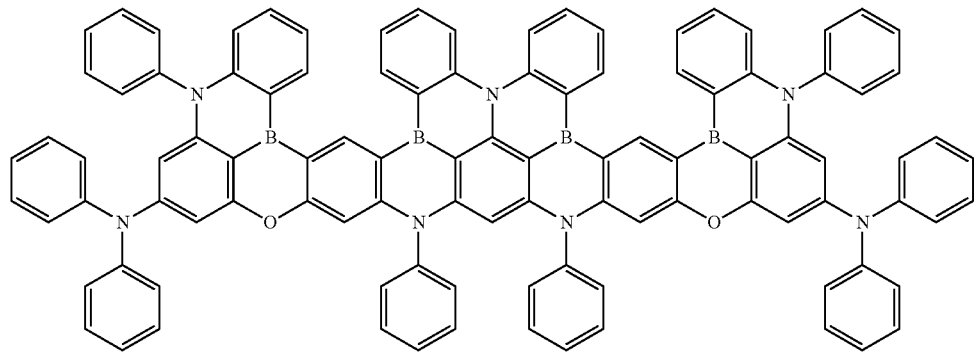

-continued
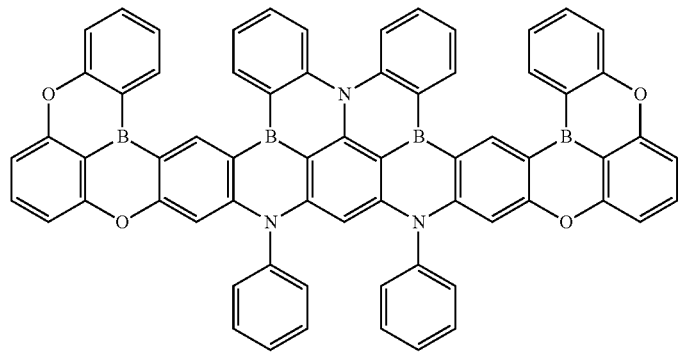
6
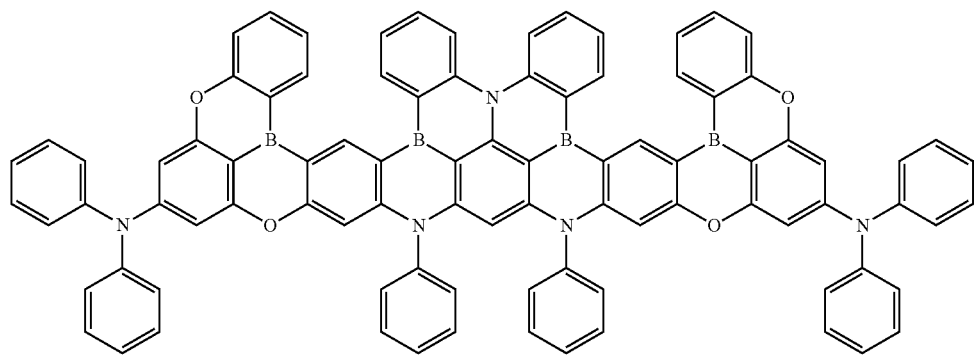
7
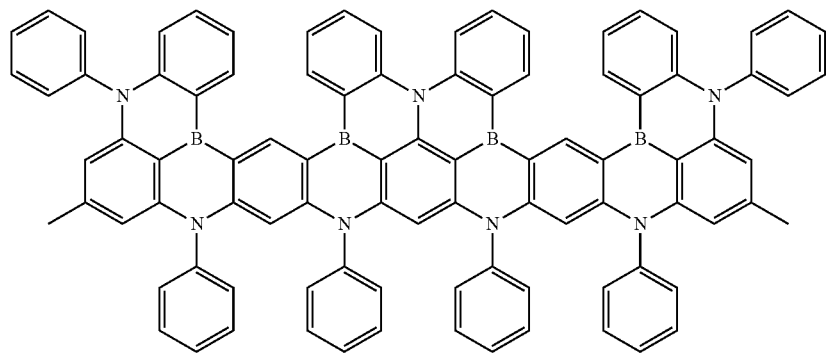
8
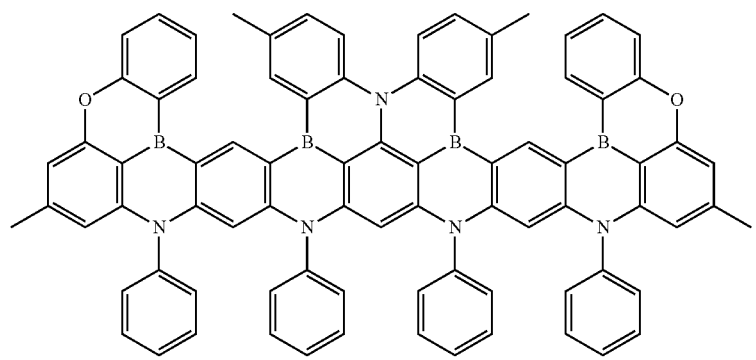
9

10
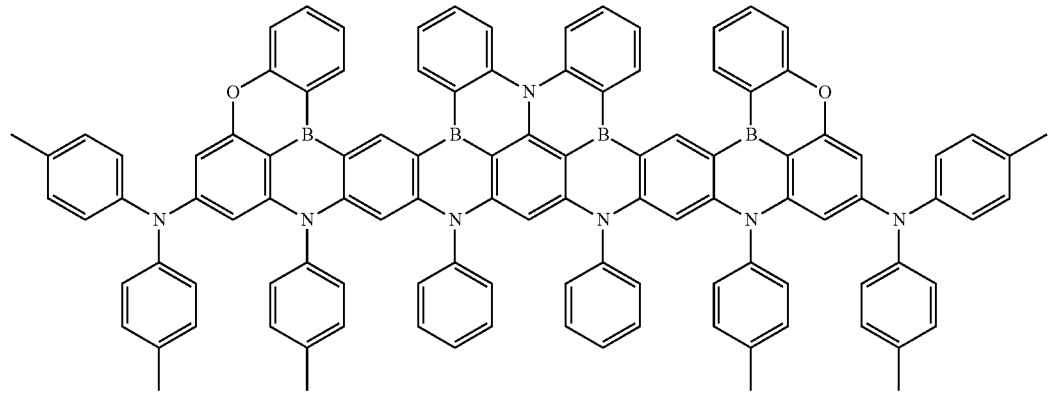
11
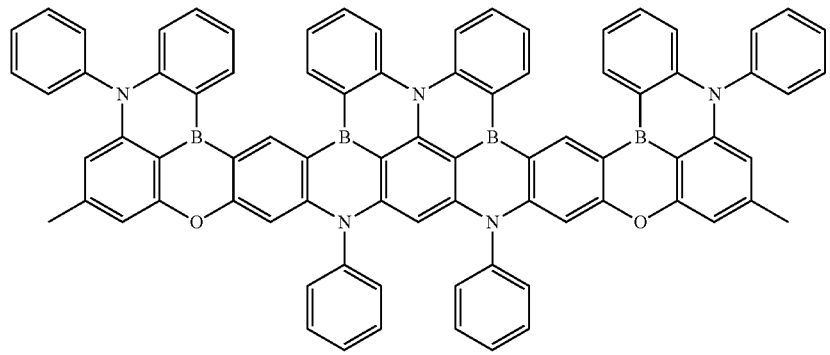
12
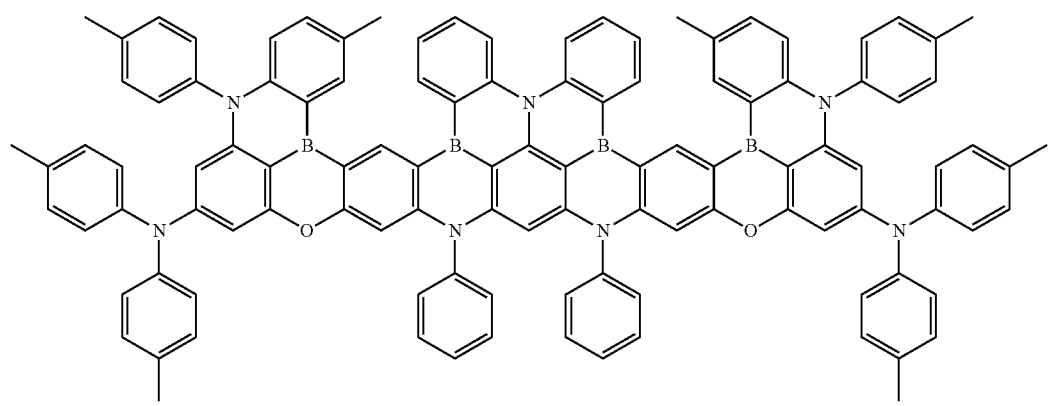
13
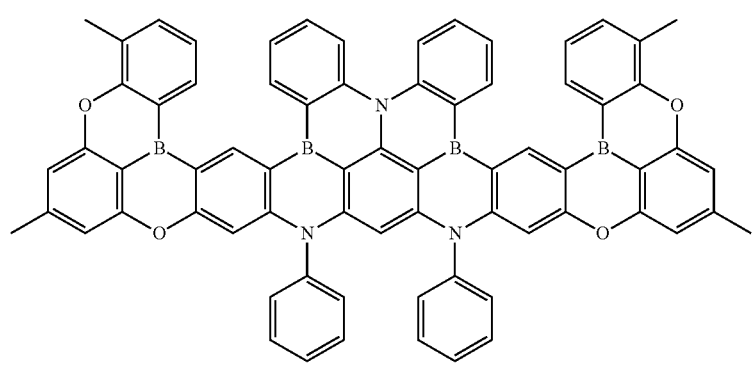

-continued
14
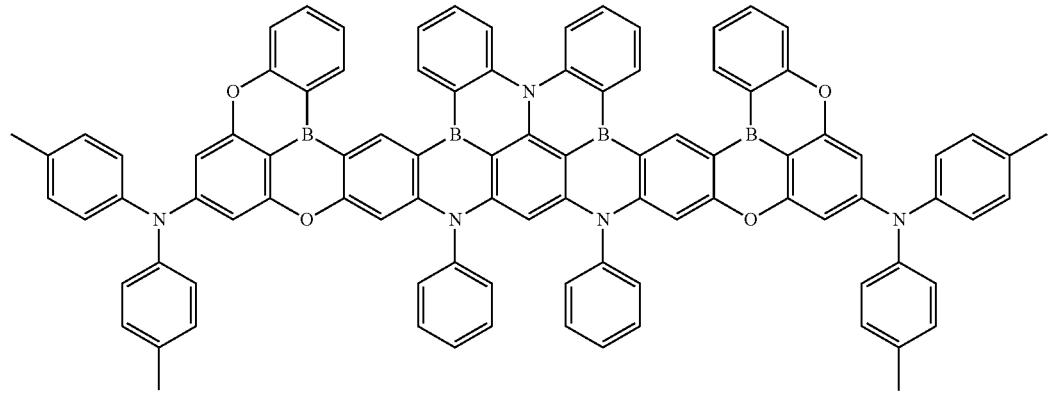
15
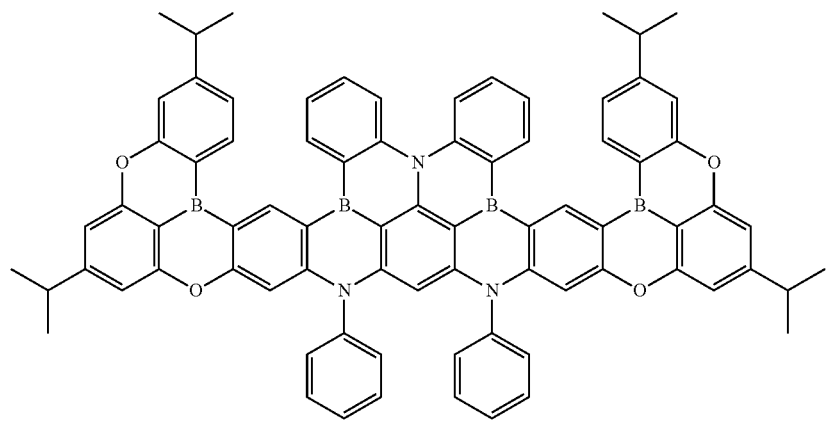
16
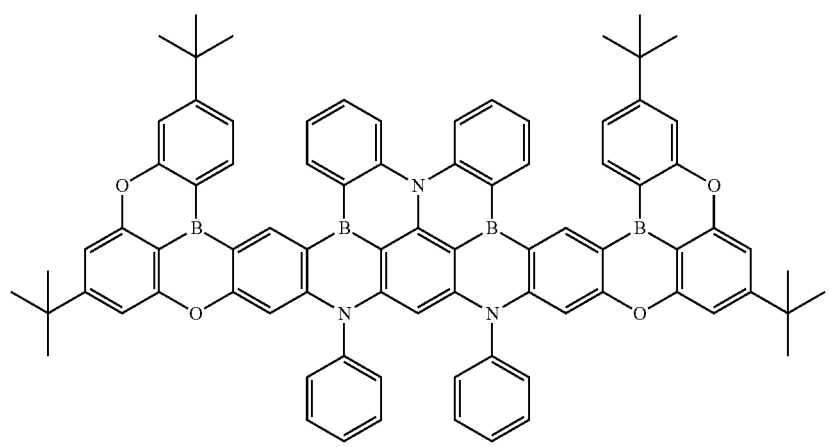

17
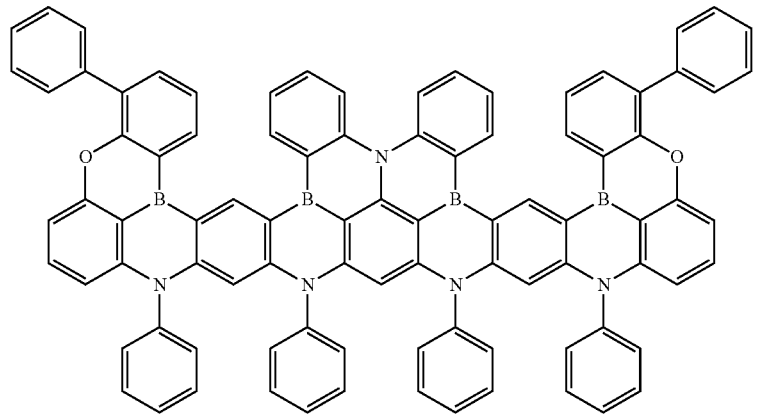
18
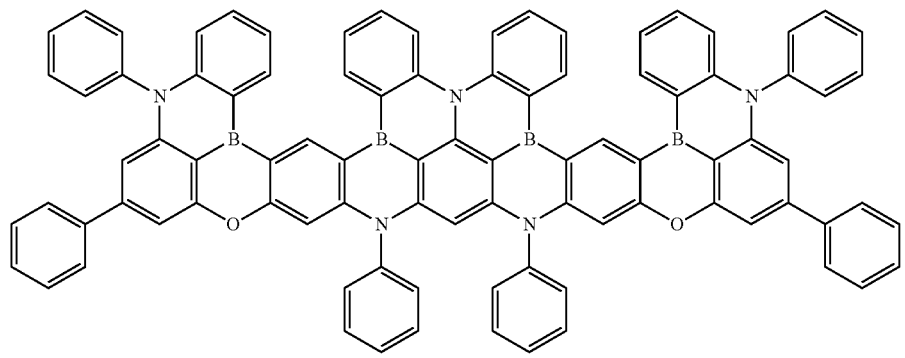
19
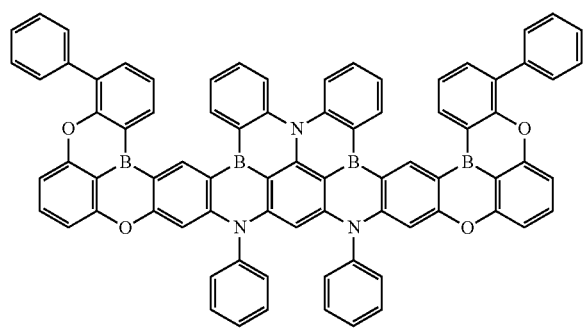
20
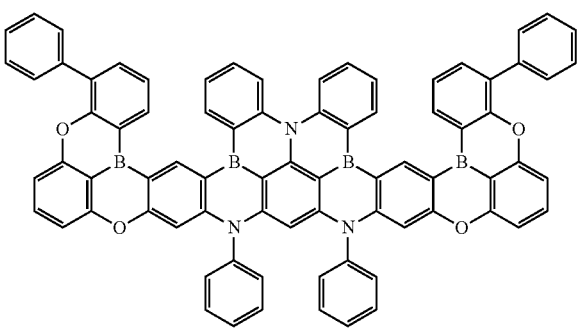
21
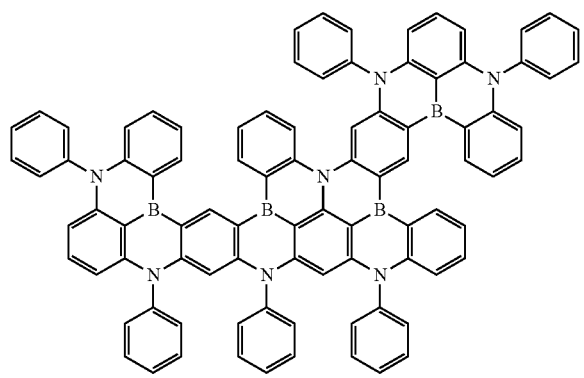
22
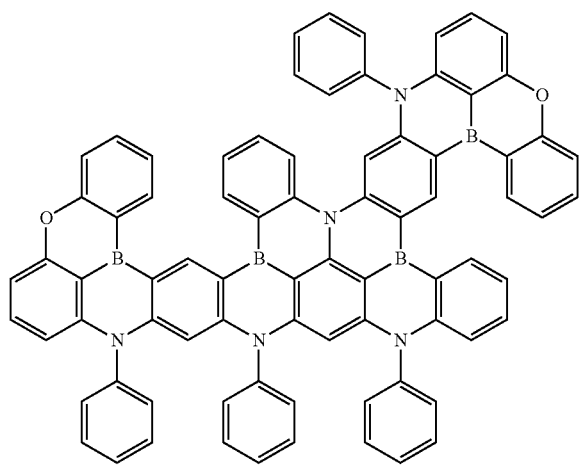

-continued
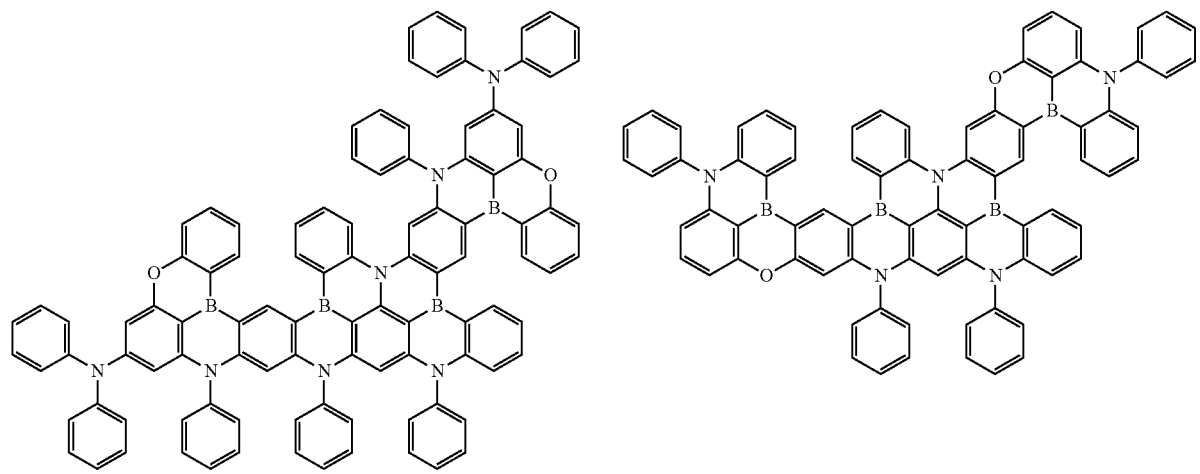
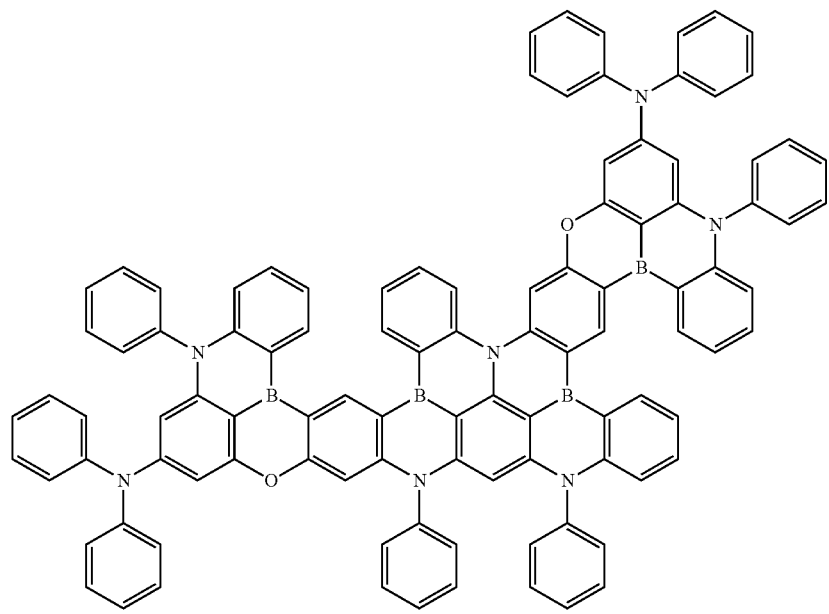
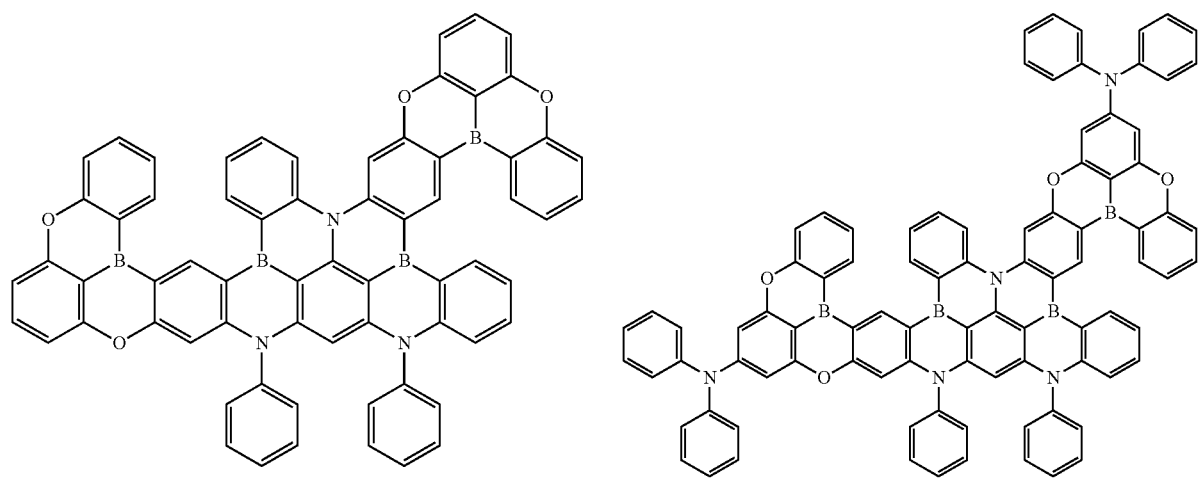

-continued
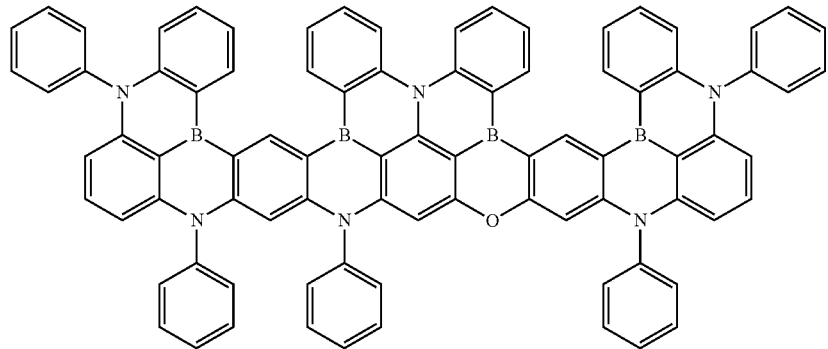
28
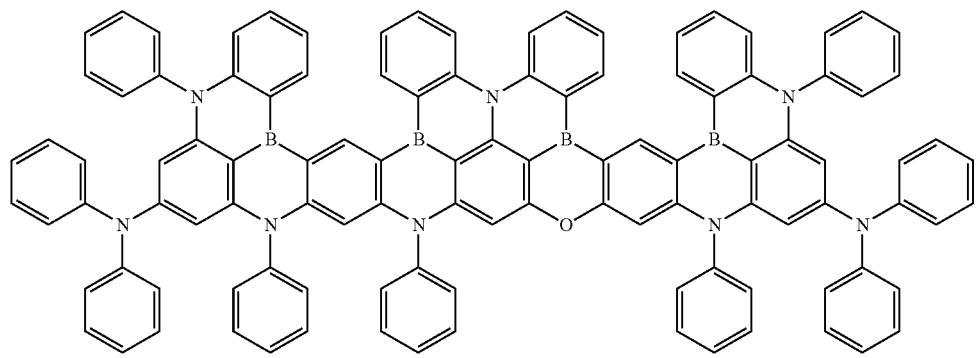
29
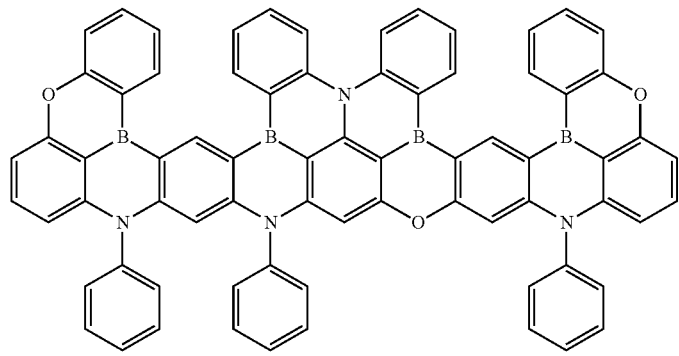
30
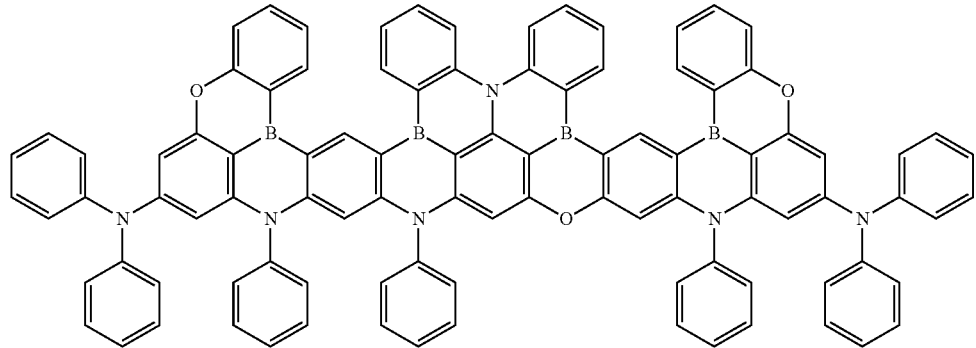
31

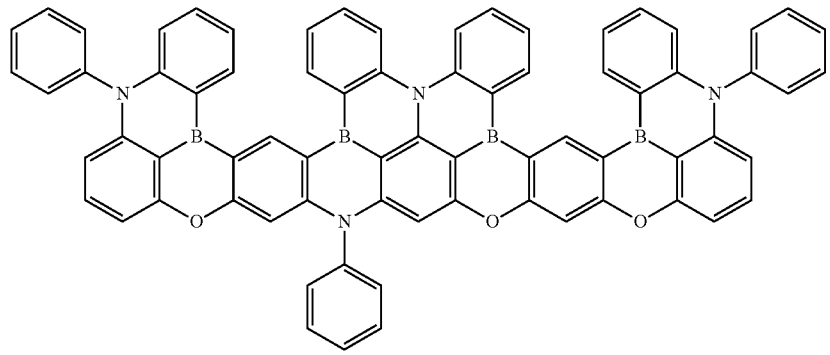
32
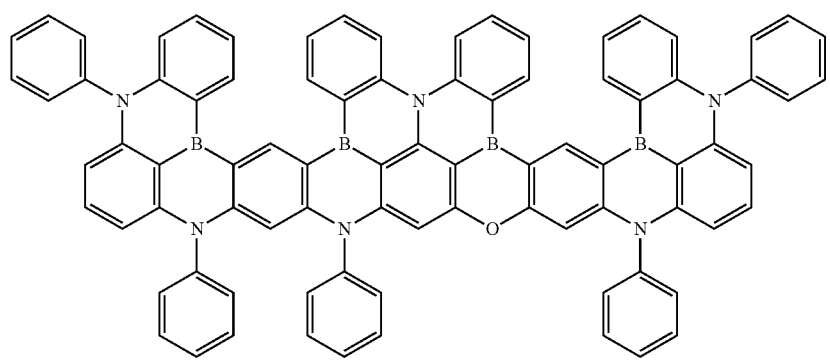
33
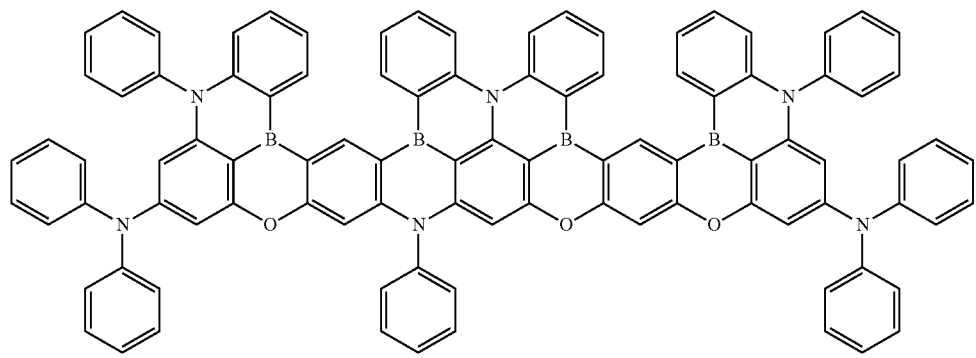
34
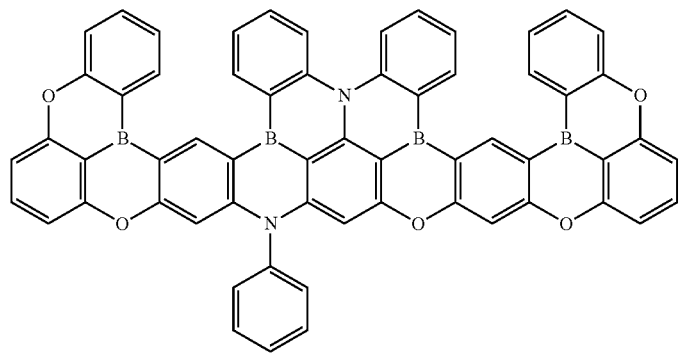
35

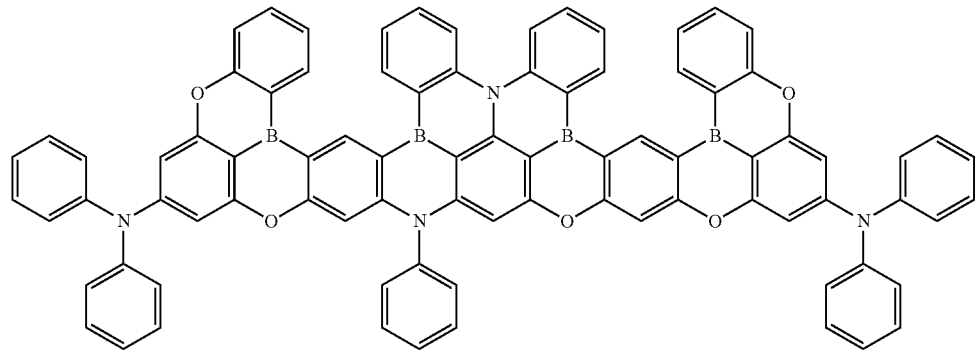
36
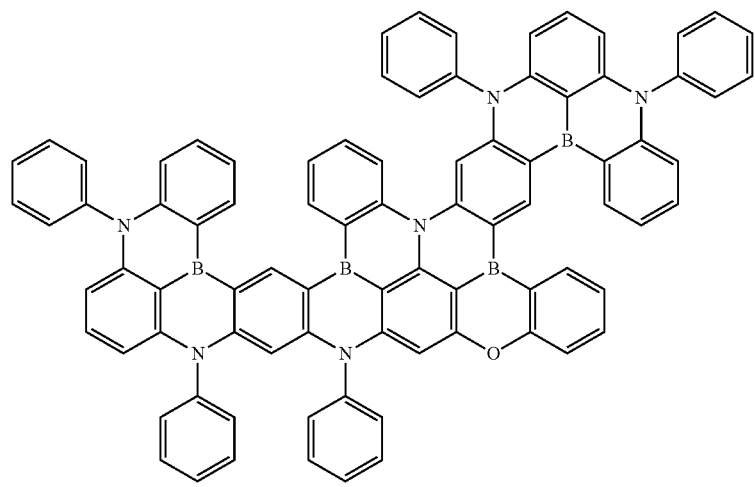
37
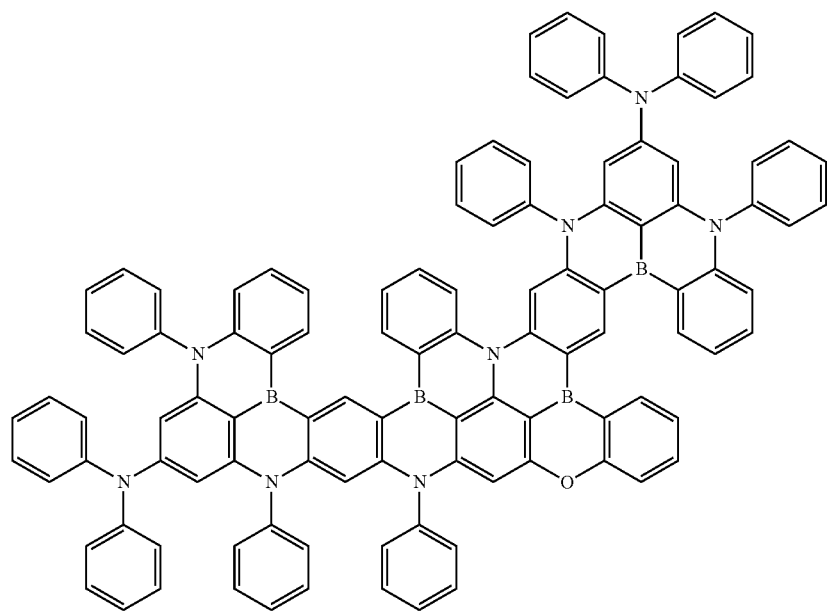
38

-continued
39
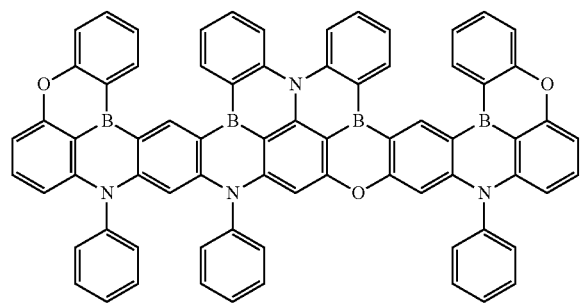
40
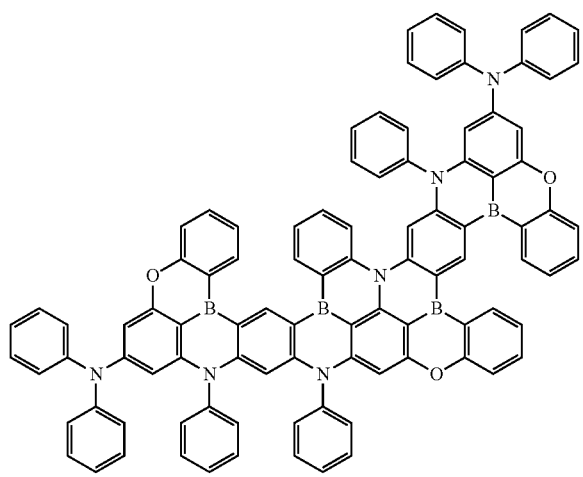
41
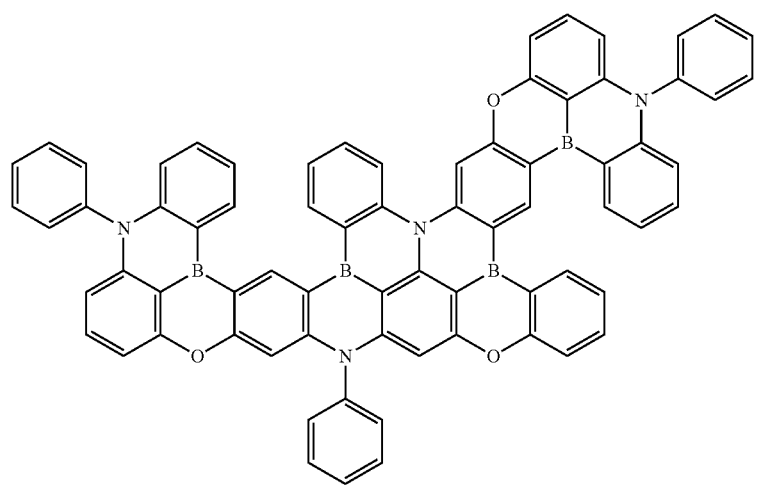
42
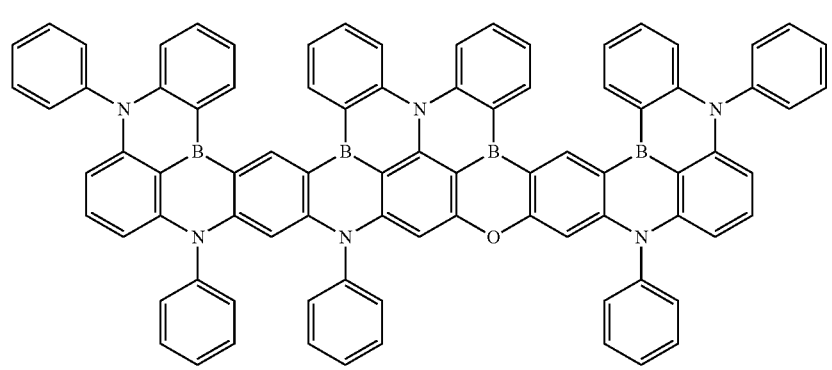

-continued
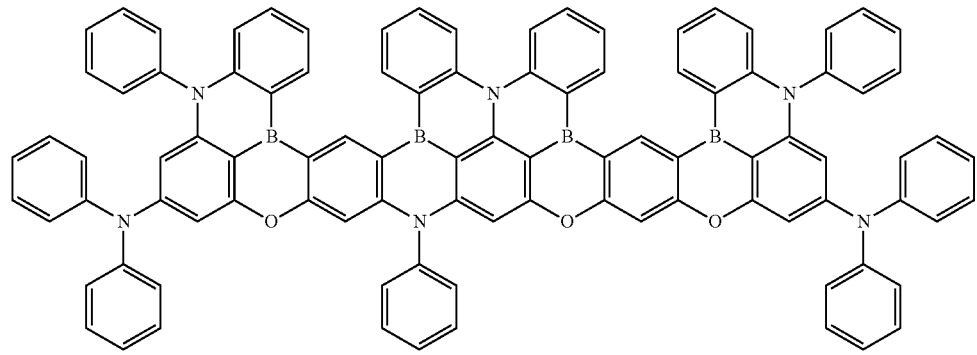
43
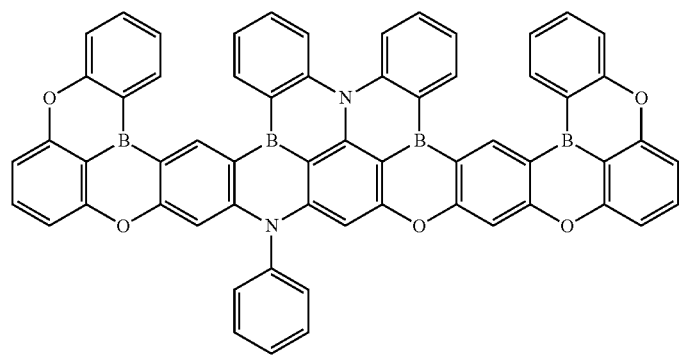
44
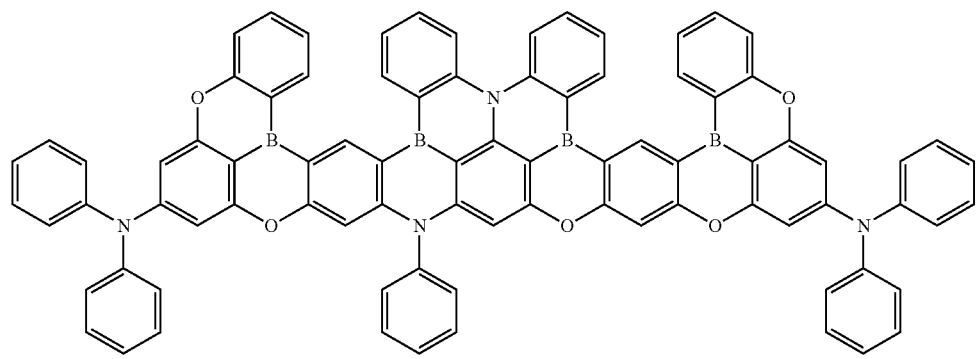
45
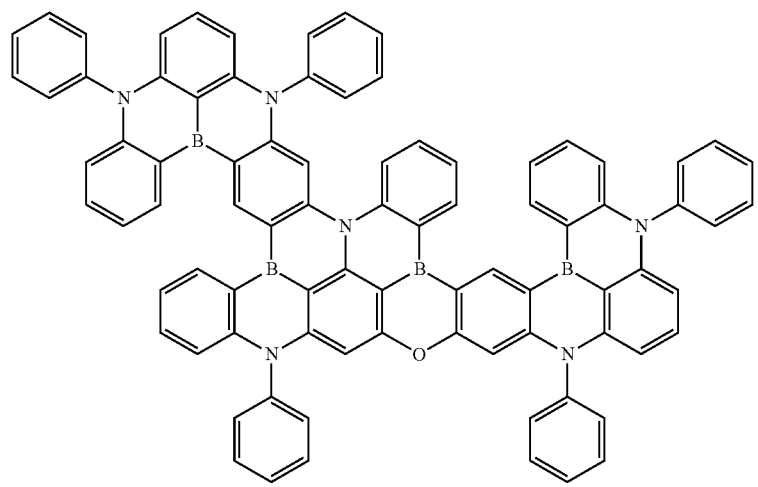
46

47
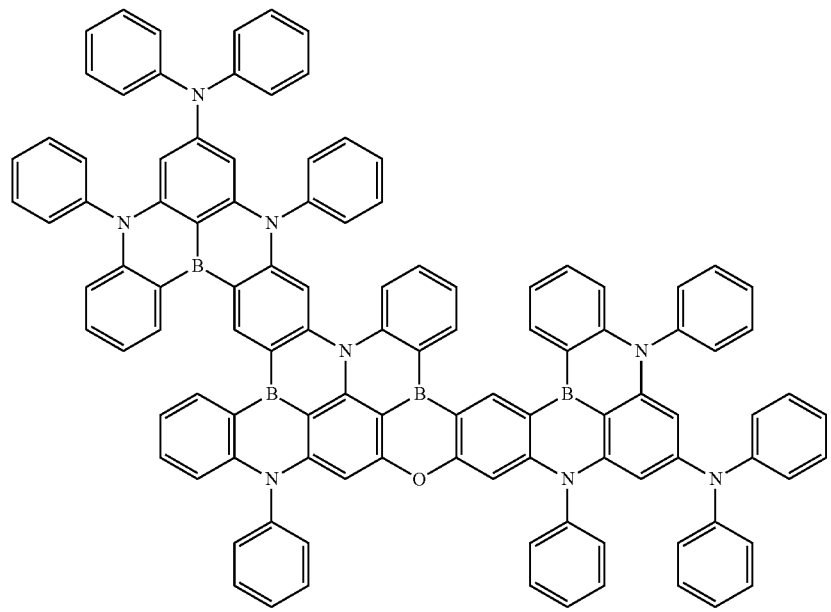
48
49
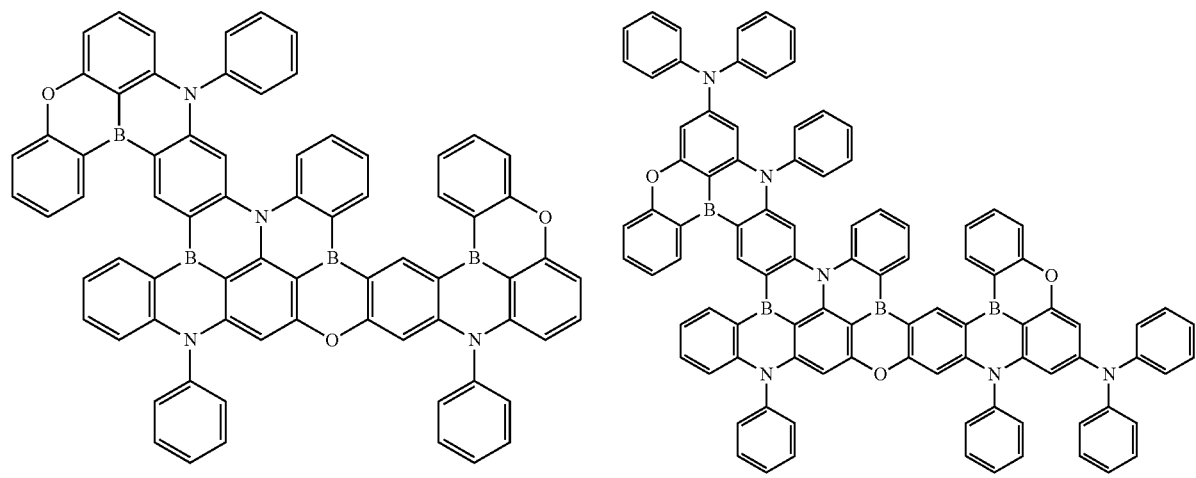
50
51
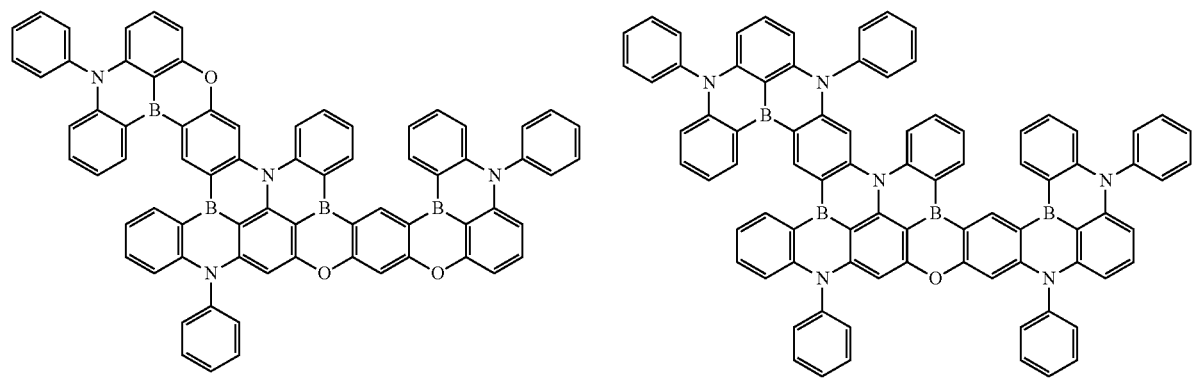

52
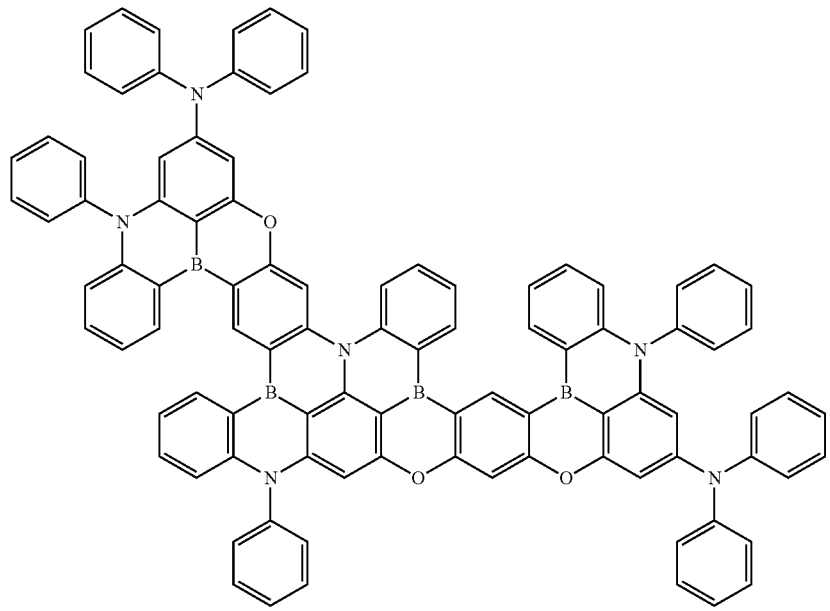
53
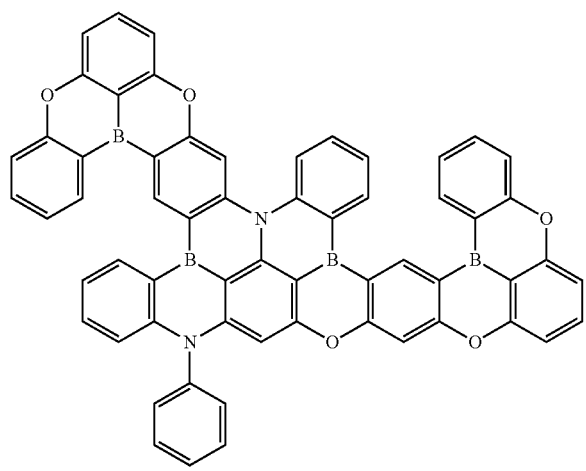
54
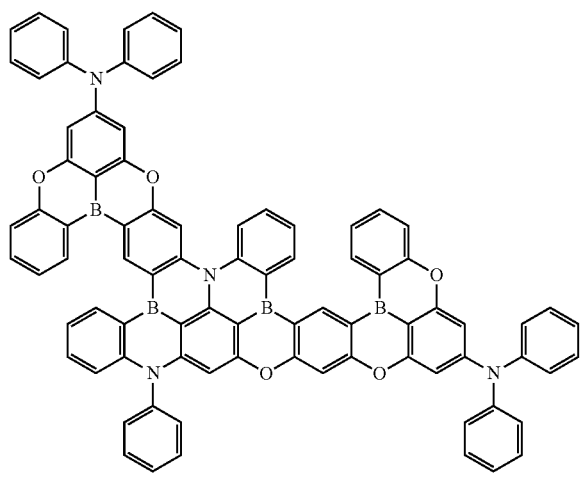
55
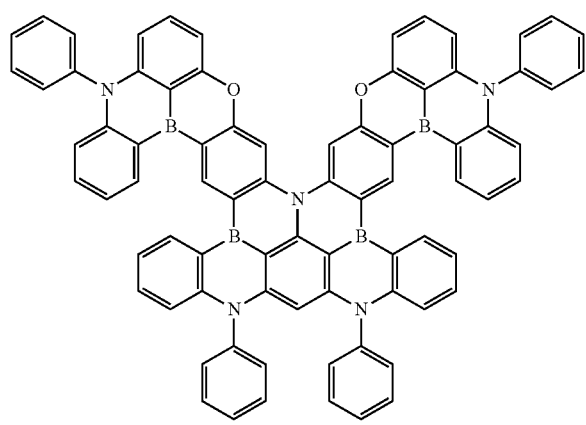
56
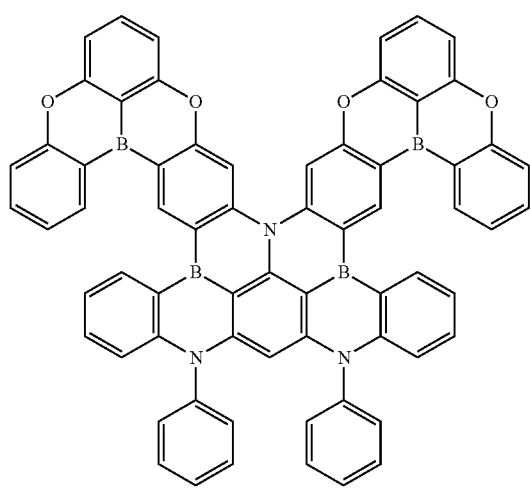

-continued
57
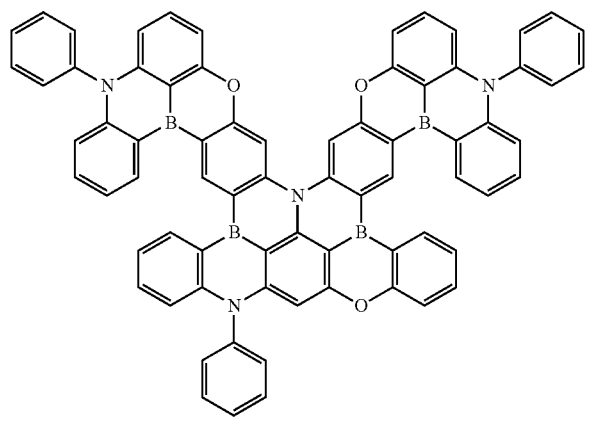
58
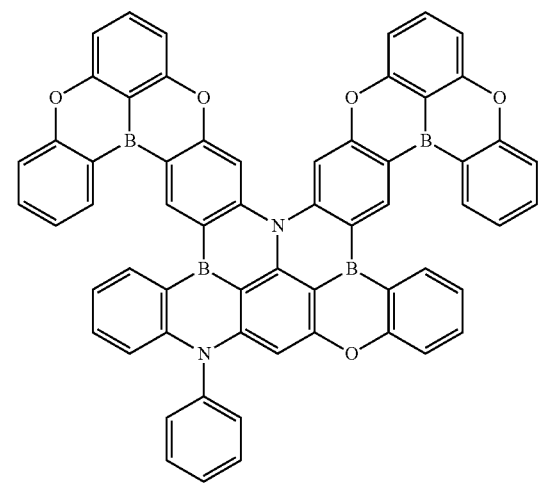
59
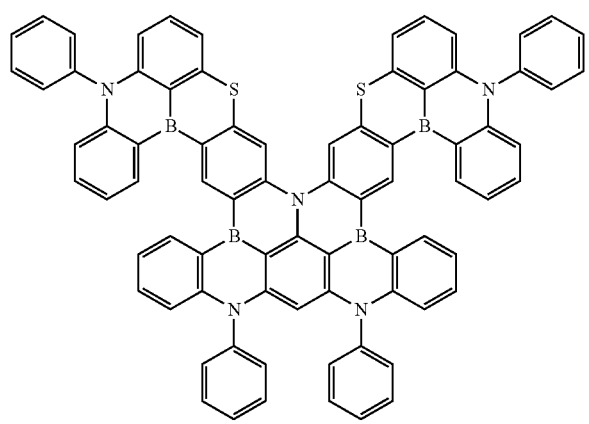
60
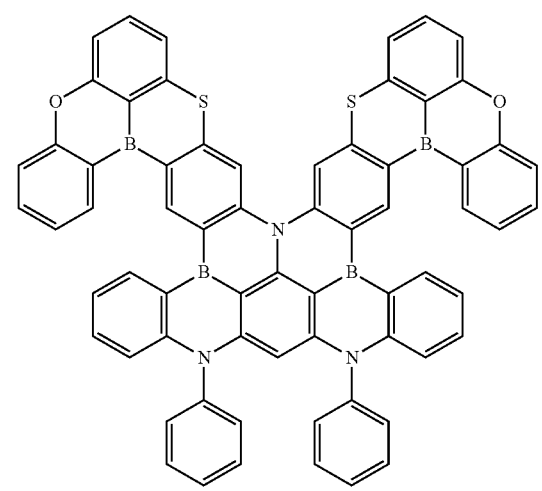
61
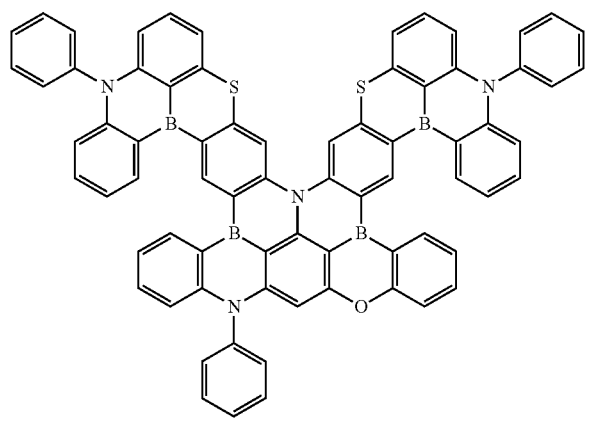
62
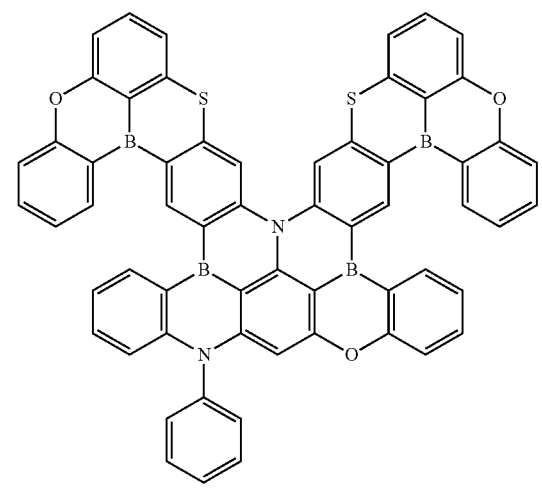

63
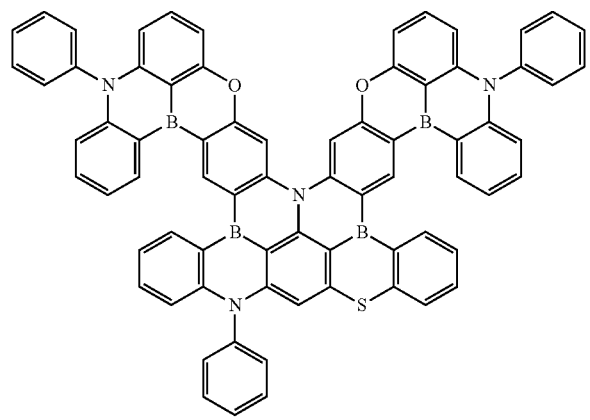
64
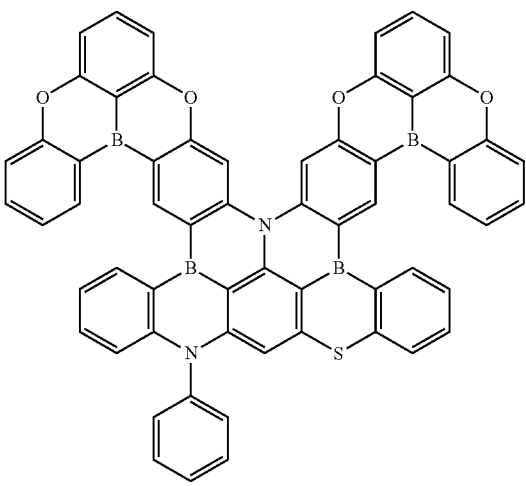
65
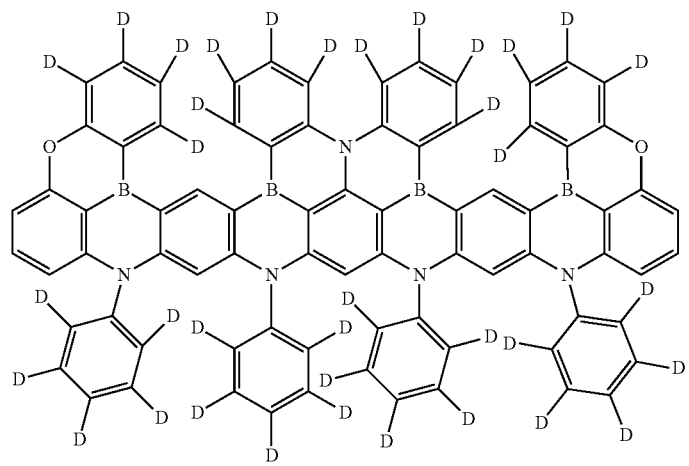
66
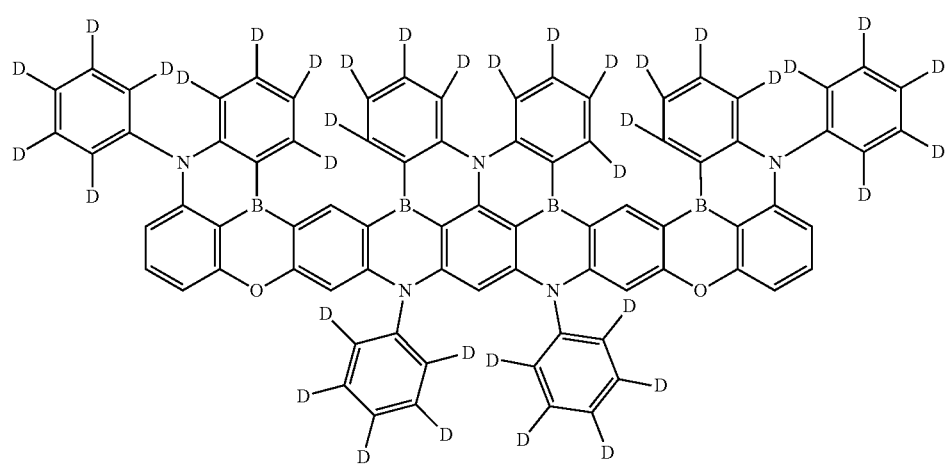

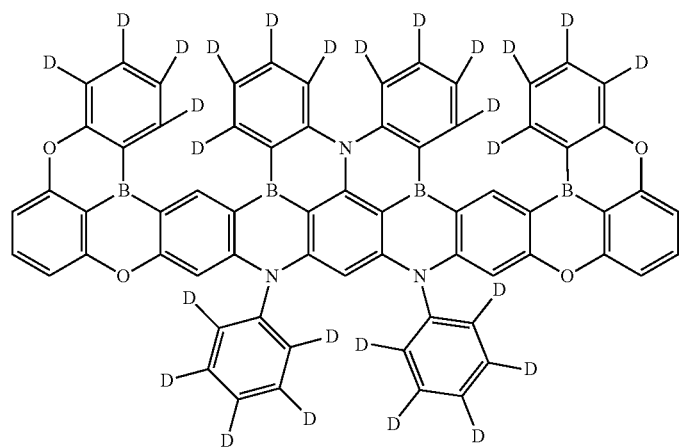
67
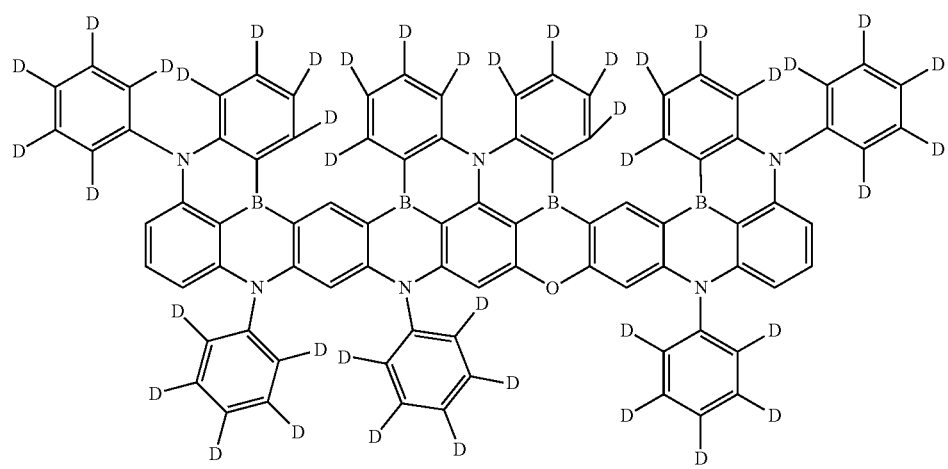
68
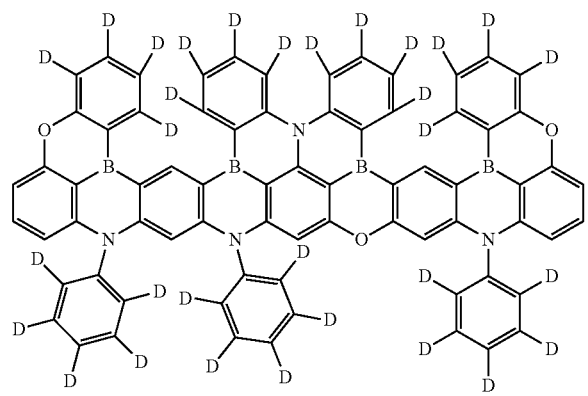
69
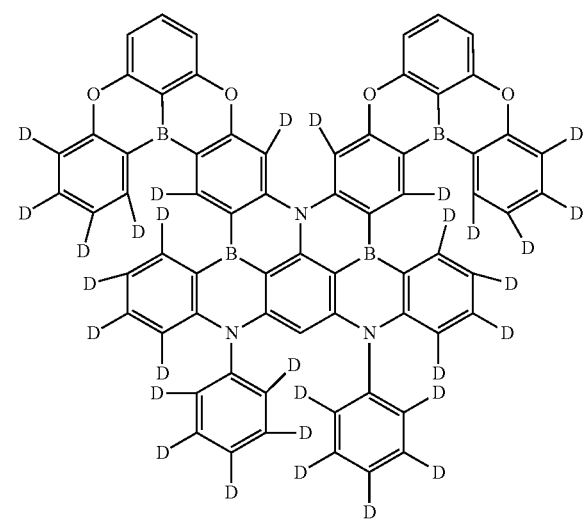
70

71
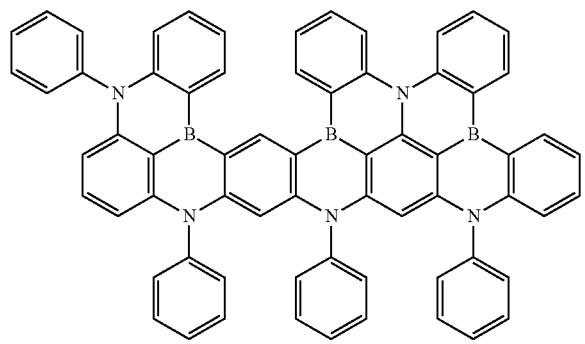
72
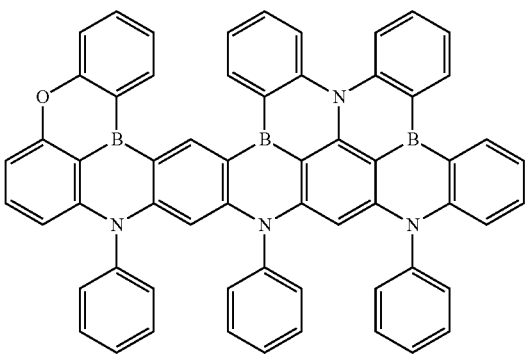
73
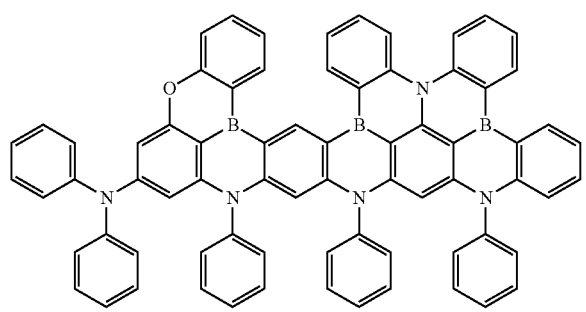
74
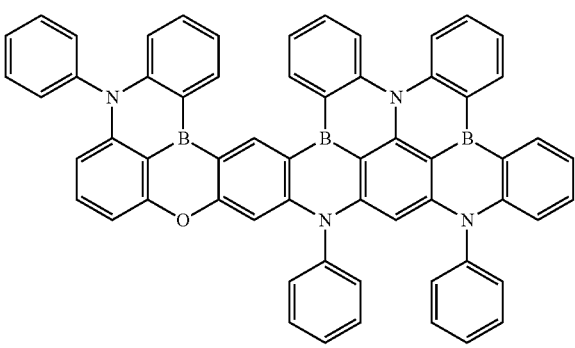
75
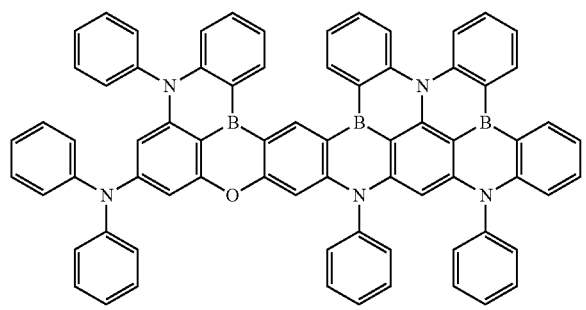
76
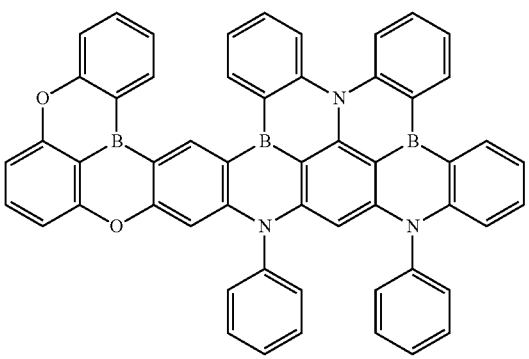
77
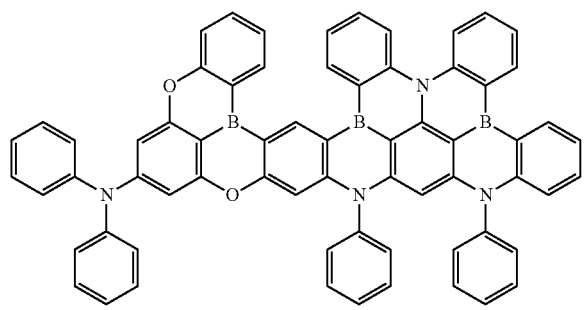
78
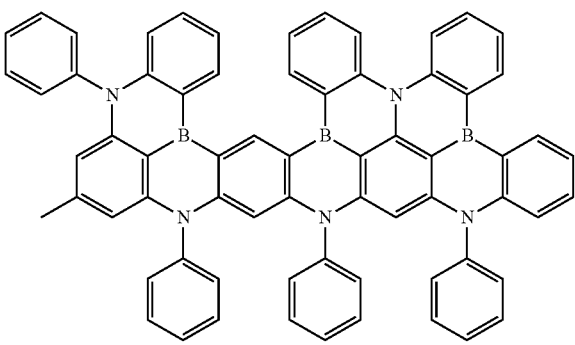

79
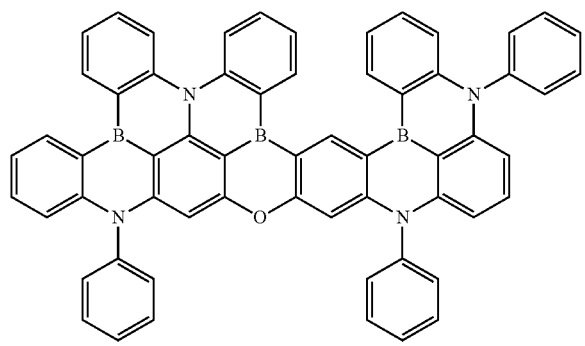
80
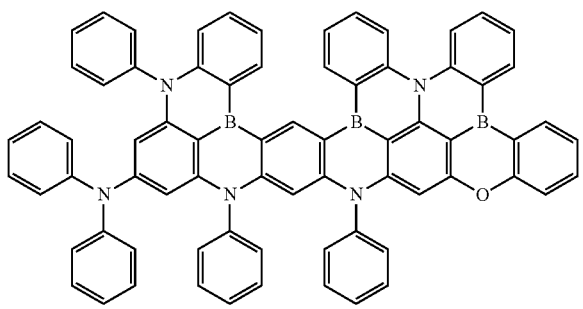
81
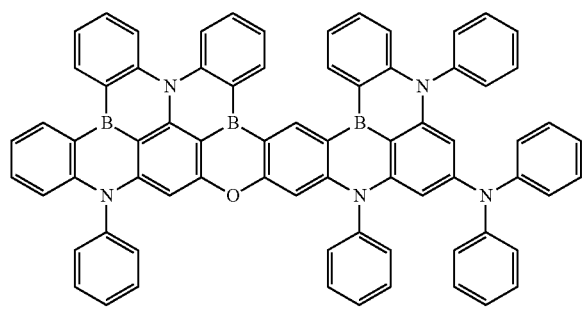
82
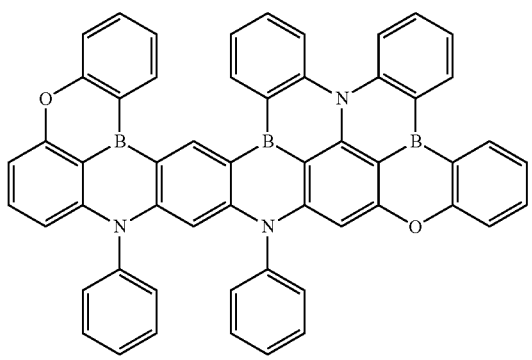
83
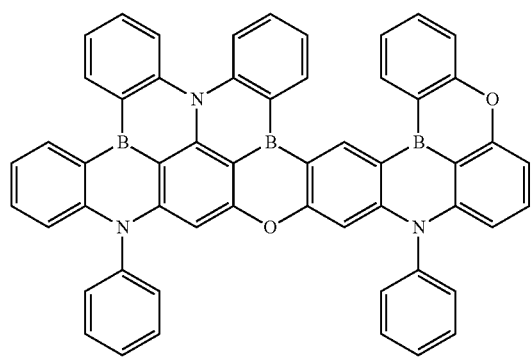
84
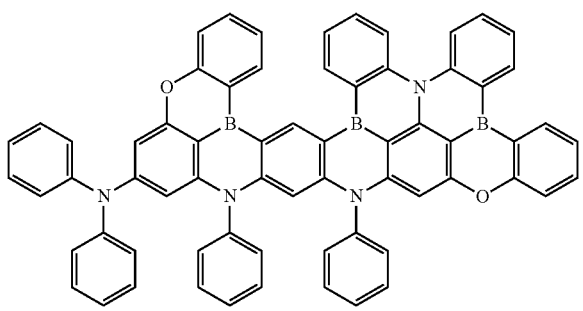
85
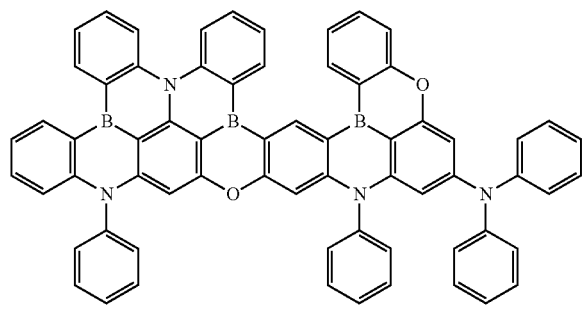
86
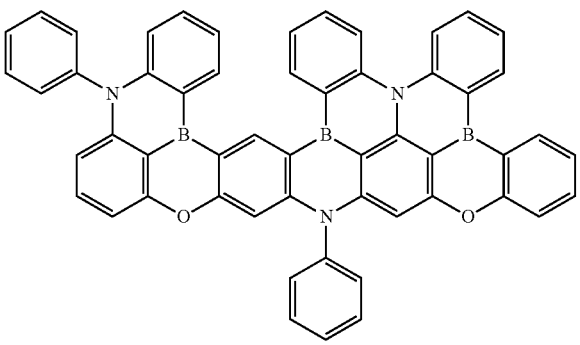

87
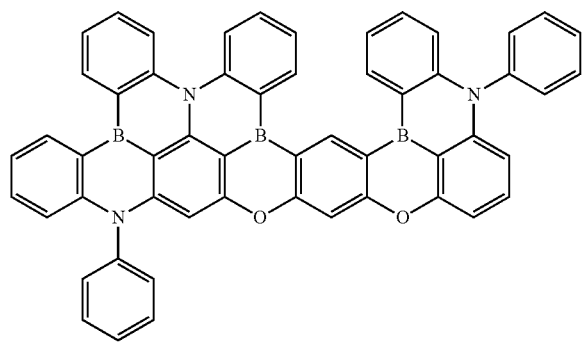
88
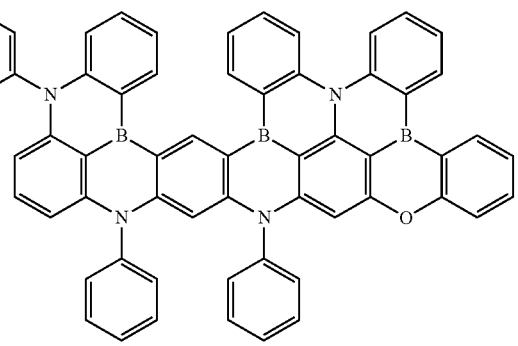
89
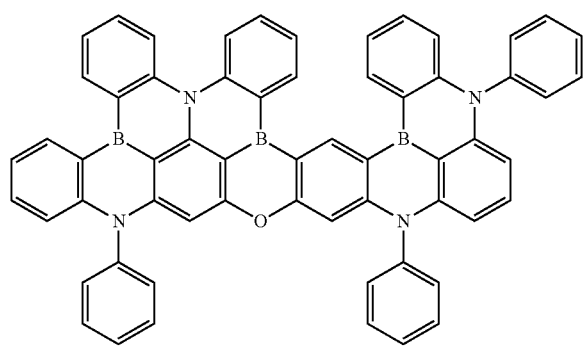
90
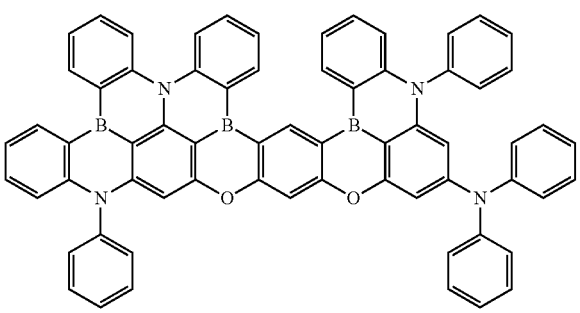
91
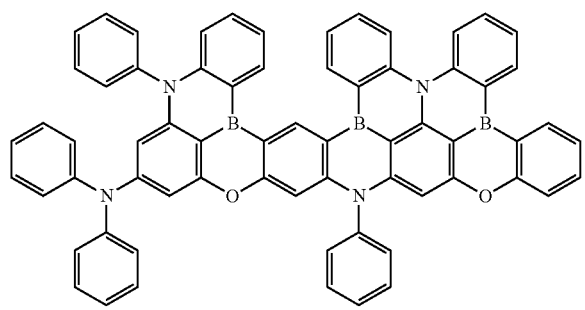
92
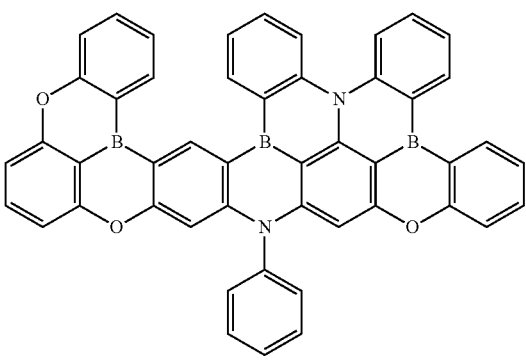
93
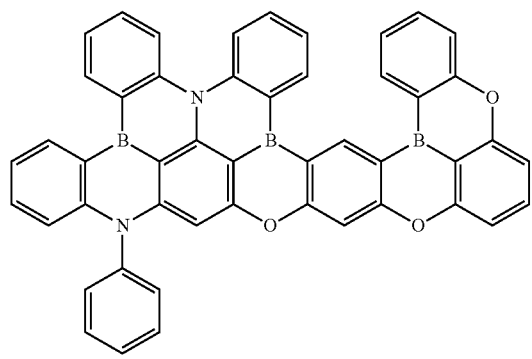
94
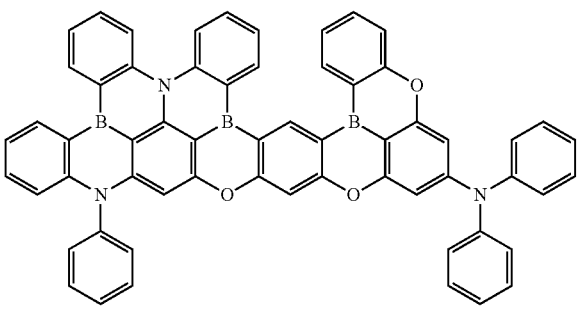

-continued

95

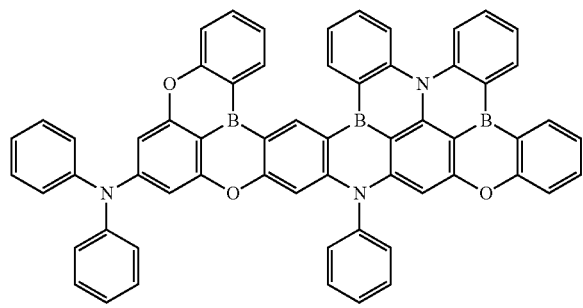

96

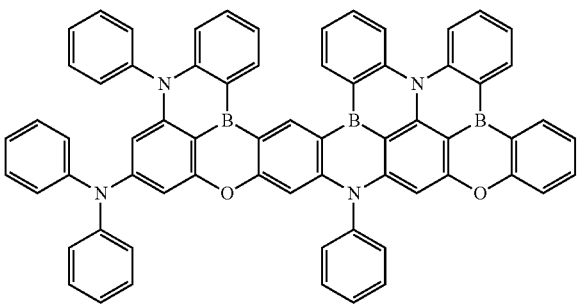

97

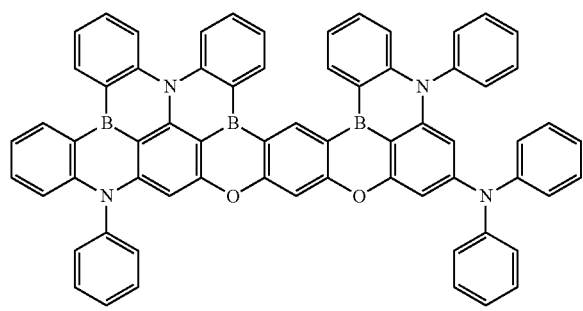

98

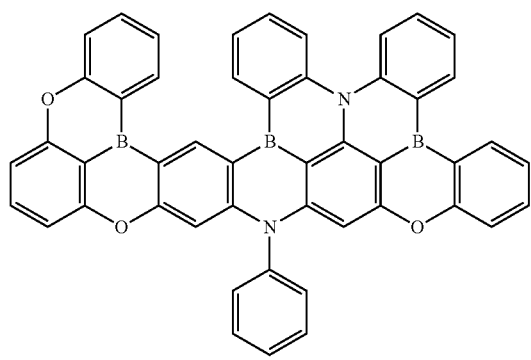

99

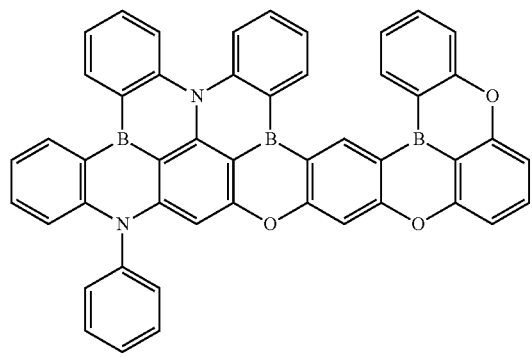

15. A polycyclic compound represented by Formula 1:

[Formula 1]

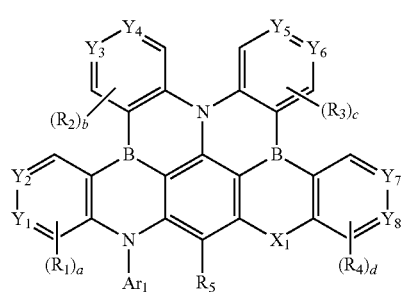

wherein in Formula 1, $X_1$ is $NAr_2$, O, or S, $Y_1$ to $Y_8$ are each independently $CM_1$ or a carbon atom bonded to a group represented by Formula 2, each $M_1$ is independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or bonded to an adjacent group to form a ring, $Ar_1$ and $Ar_2$ are each independently a substituted or unsubstituted aryl group having 6 to 30 ring-forming carbon atoms or a substituted or unsubstituted heteroaryl group having 2 to 30 ring-forming carbon atoms, $R_1$ to $R_5$ are each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or bonded to an adjacent group to form a ring, a, b, c, and d are each independently an integer of 0 to 2, at least one group represented by Formula 2 is bonded to at least one pair of substituents, the at least one pair of substituents selected from the group consisting of $Y_1$ and $Y_2$, $Y_3$ and $Y_4$, $Y_5$ and $Y_6$, and $Y_7$ and $Y_8$,

[Formula 2]

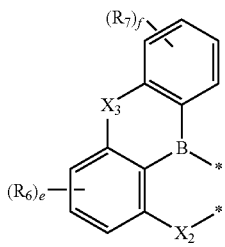

wherein in Formula 2, each $X_2$ and each $X_3$ are independently $NAr_3$, O, or S, each $Ar_3$ is independently a substituted or unsubstituted aryl group having 6 to 30 ring-forming carbon atoms or a substituted or unsubstituted heteroaryl group having 2 to 30 ring-forming carbon atoms, each $R_6$ and each $R_7$ are independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or bonded to an adjacent group to form a ring, each e is independently an integer from 0 to 3, each f is independently an integer from 0 to 4, and

* indicates a binding site to a neighboring atom.

16. The polycyclic compound of claim 15, wherein the polycyclic compound represented by Formula 1 is represented by one of Formulas 1-1a to 1-1c:

[Formula 1-1a]

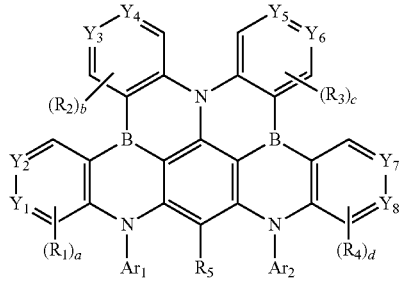

[Formula 1-1b]

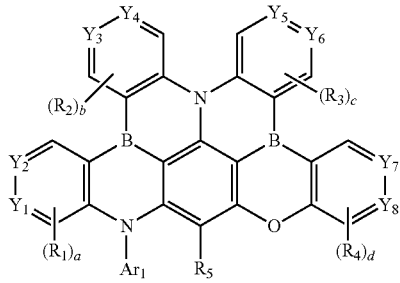

[Formula 1-1c]

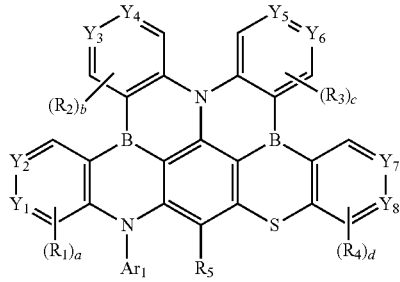

wherein in Formulas 1-1a to 1-1c, $Y_1$ to $Y_8$, $Ar_1$, $Ar_2$, and $R_1$ to $R_5$ are the same as defined in Formulas 1 and 2.

17. The polycyclic compound of claim 15, wherein the polycyclic compound represented by Formula 1 is represented by one of Formulas 4-1a to 4-1d:

[Formula 4-1a]

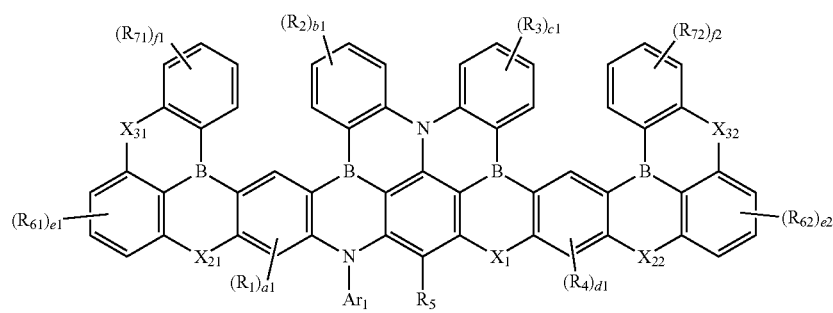

-continued

[Formula 4-1b]

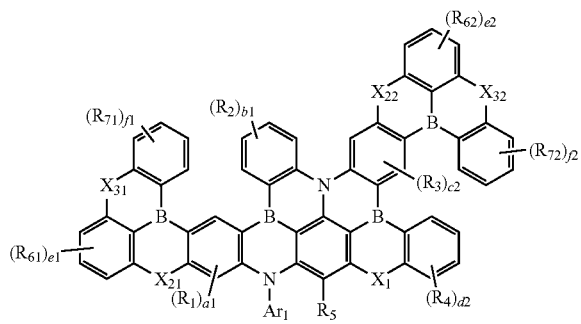

[Formula 4-1c]

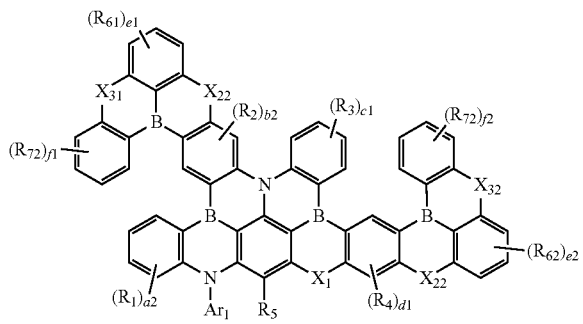

[Formula 4-1d]

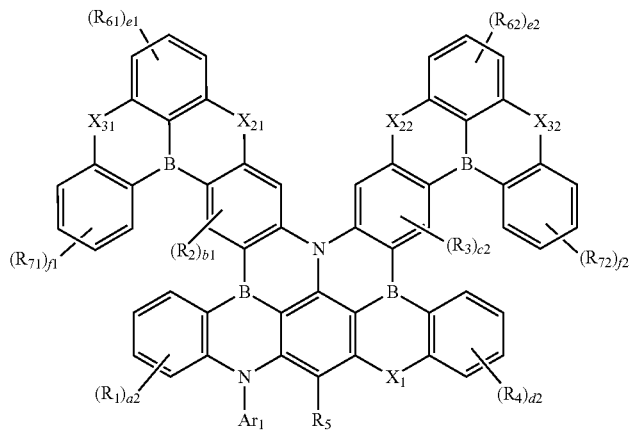

wherein in Formulas 4-1a to 4-1d, $X_{21}$, $X_{22}$, $X_{31}$, and $X_{32}$ are each independently $NAr_4$, O, or S, each $Ar_4$ is independently a substituted or unsubstituted aryl group having 6 to 30 ring-forming carbon atoms or a substituted or unsubstituted heteroaryl group having 2 to 30 ring-forming carbon atoms, $R_{61}$, $R_{62}$, $R_{71}$, and $R_{72}$ are each independently a hydrogen atom, a deuterium atom, a halogen atom, a substituted or unsubstituted amine group, a substituted or unsubstituted alkyl group having 1 to 20 carbon atoms, a substituted or unsubstituted aryl group having ring-forming 6 to 30 carbon atoms, or a substituted or unsubstituted heteroaryl group having 2 to 30 ring-forming carbon atoms, or bonded to an adjacent group to form a ring, a1, b2, c2, and d1 are each independently an integer from 0 to 2, a2, b1, c1, and d2 are each independently an integer from 0 to 4, e1 and e2 are each independently an integer from 0 to 3, f1 and f2 are each independently an integer from 0 to 4, and $X_1$, $Ar_1$, and $R_1$ to $R_5$ are the same as defined in Formulas 1 and 2.

18. The polycyclic compound of claim 15, wherein the polycyclic compound represented by Formula 1 is represented by one of Formulas 4-2a to 4-2d:

[Formula 4-2a]

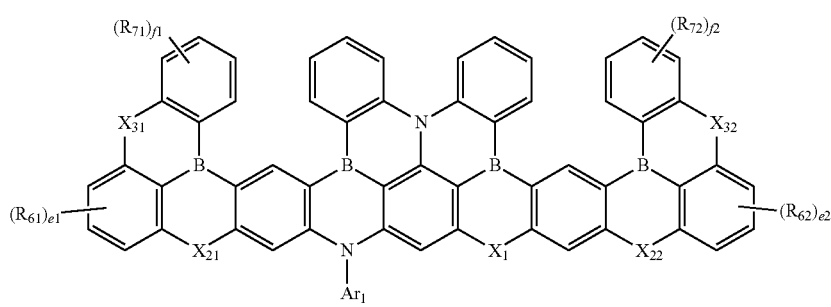

-continued

[Formula 4-2b]

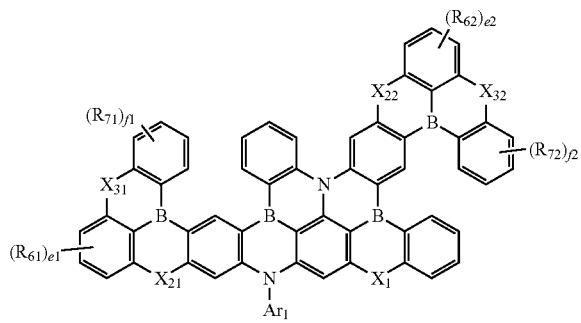

[Formula 4-2c]

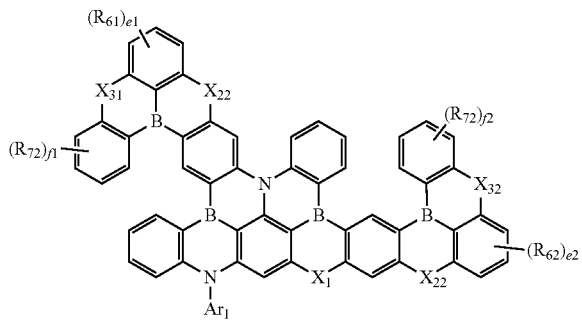

[Formula 4-2d]

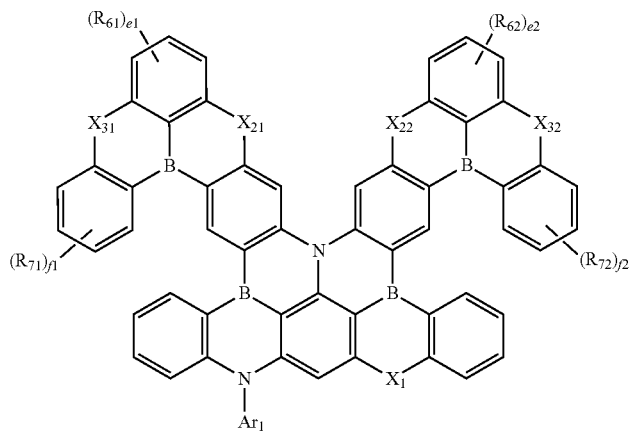

wherein in Formulas 4-2a to 4-2d, $X_{21}$, $X_{22}$, $X_{31}$, and $X_{32}$ are each independently $NAr_4$, O, or S, each $Ar_4$ is independently a substituted or unsubstituted aryl group having 6 to 30 ring-forming carbon atoms or a substituted or unsubstituted heteroaryl group having 2 to 30 ring-forming carbon atoms, $R_{61}$, $R_{62}$, $R_{71}$, and $R_{72}$ are each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or bonded to an adjacent group to form a ring, e1 and e2 are each independently an integer from 0 to 3, f1 and f2 are each independently an integer from 0 to 4, and $X_1$ and $Ar_1$ are the same as defined in Formulas 1 and 2.

19. The polycyclic compound of claim 15, wherein the polycyclic compound represented by Formula 1 is represented by Formula 5-1 or Formula 5-2:

[Formula 5-1]

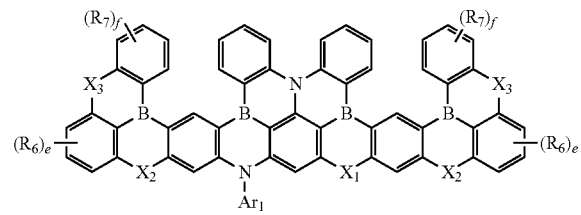

-continued

[Formula 5-2]

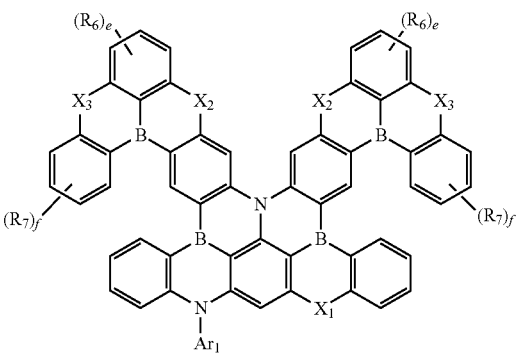

wherein in Formulas 5-1 and 5-2, each of $X_1$, $X_2$, $X_3$, $Ar_1$, $R_6$, $R_7$, e, and f are independently the same as defined in Formulas 1 and 2.

20. The polycyclic compound of claim 15, wherein the polycyclic compound represented by Formula 1 is selected from one of the compounds represented by Compound Group 1:

[Compound Group 1]
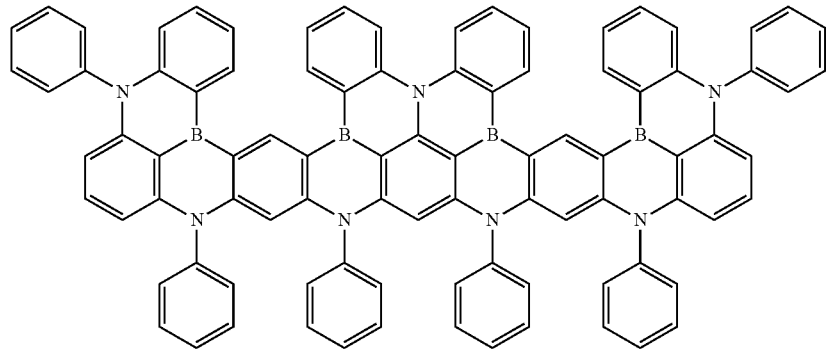
1
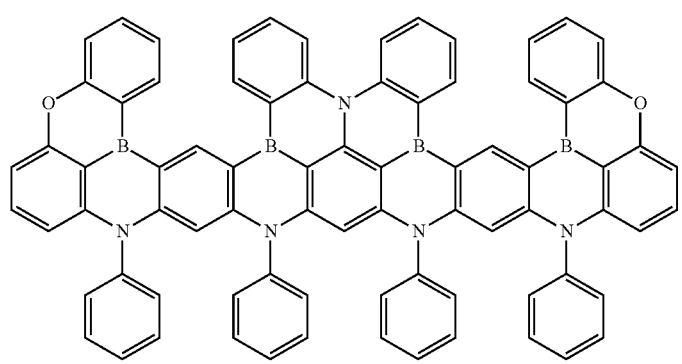
2
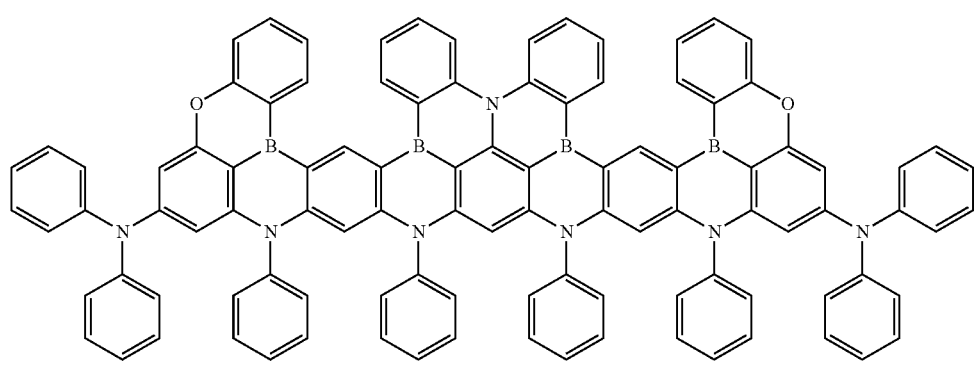
3
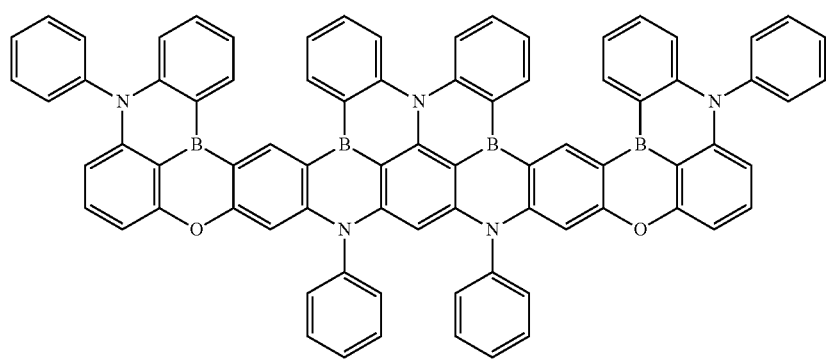
4

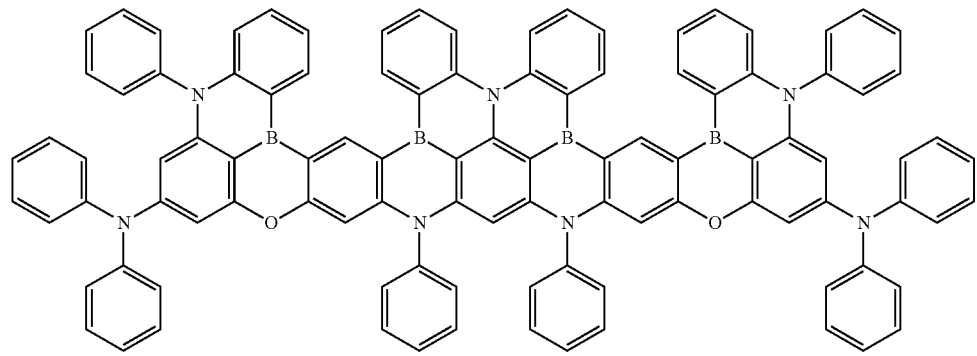
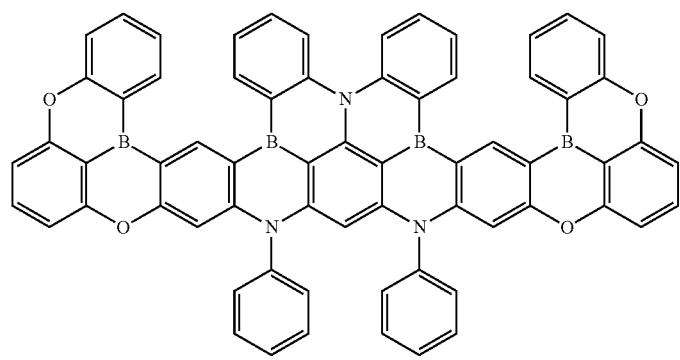
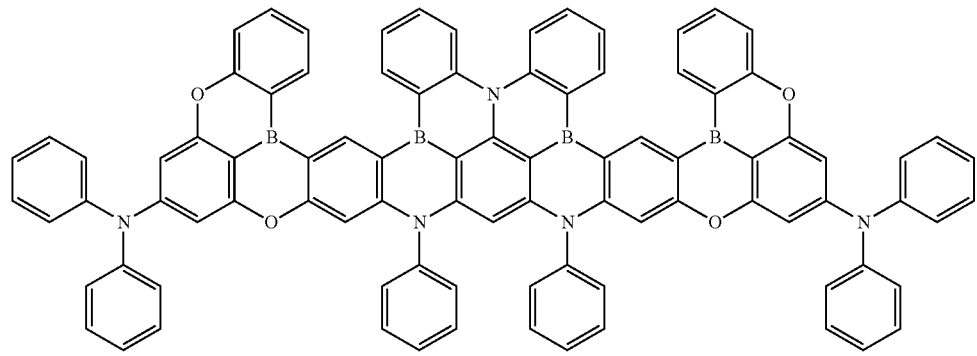
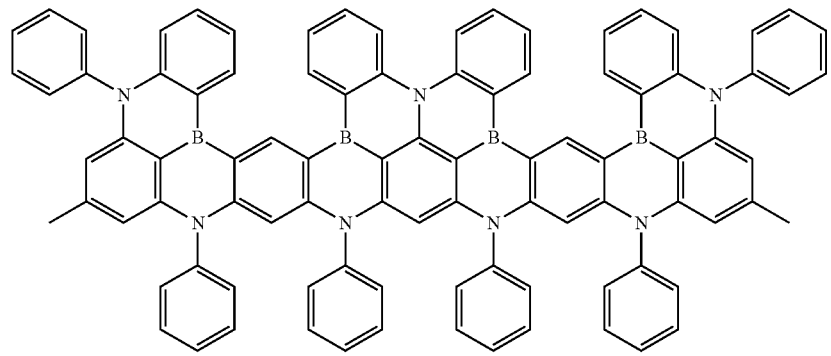

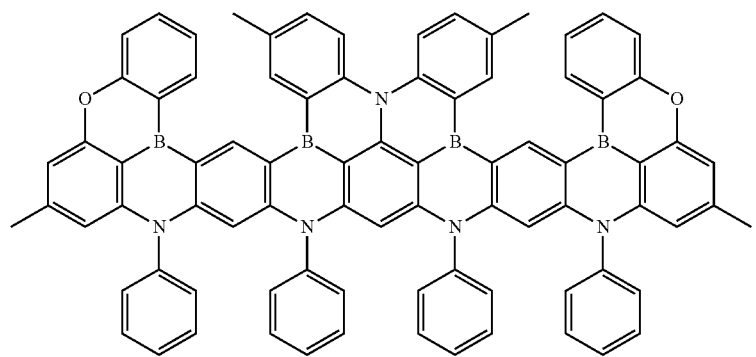
9
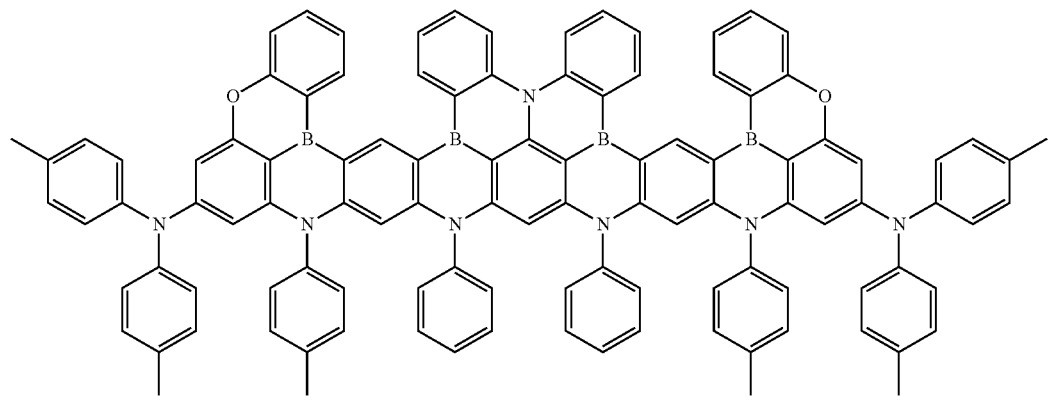
10
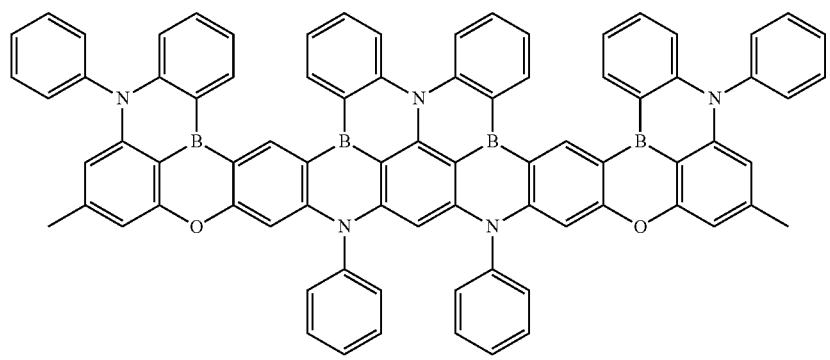
11
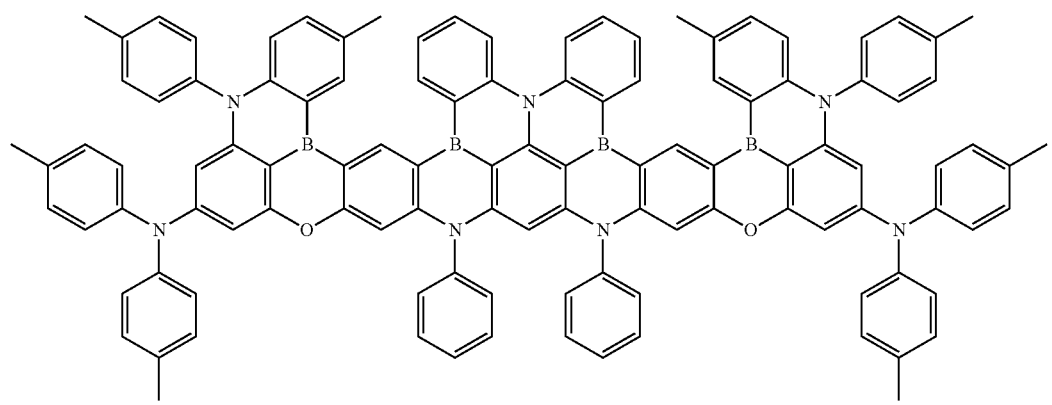
12

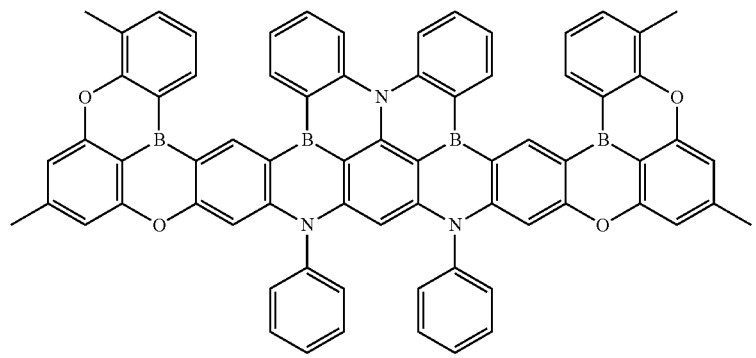
13
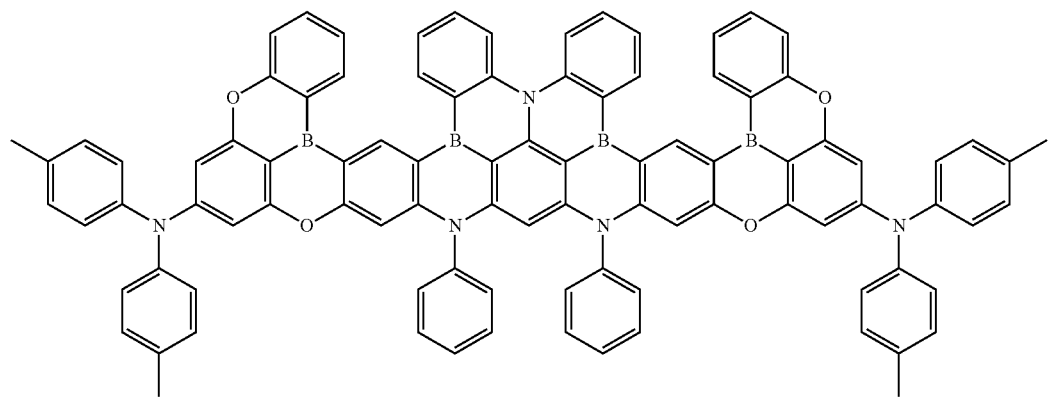
14
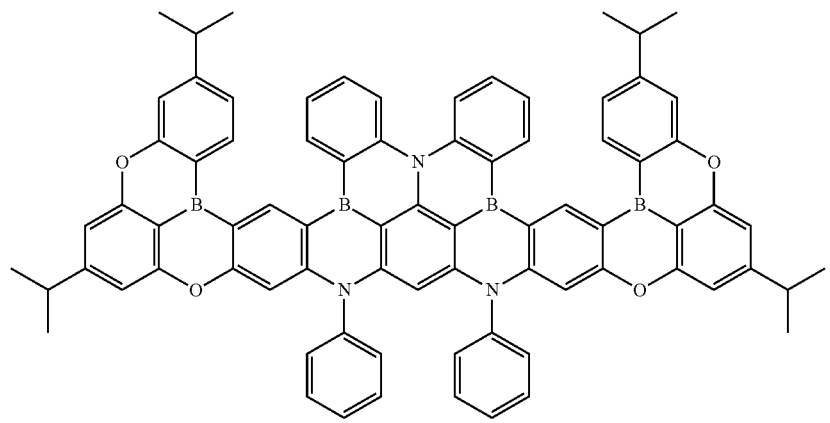
15
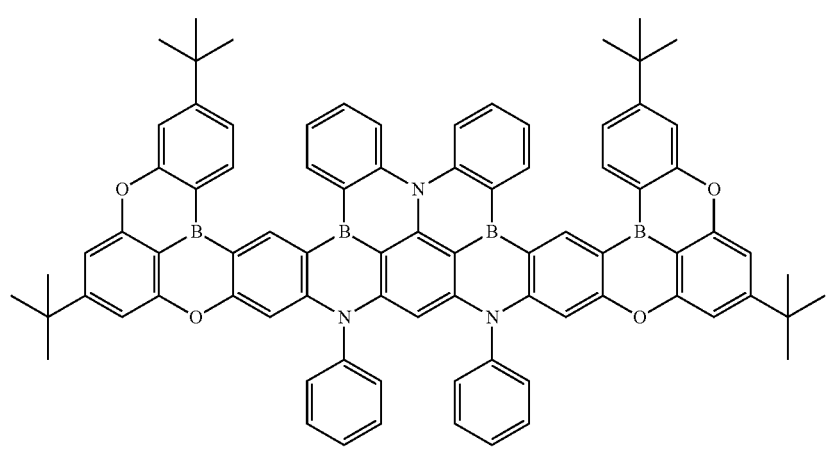
16

-continued
17
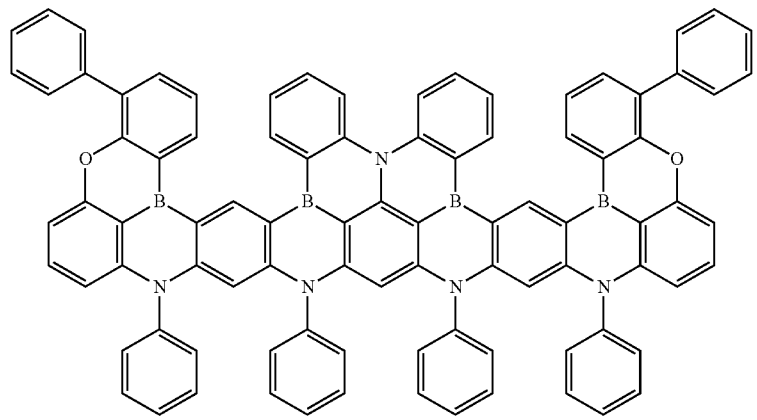
18
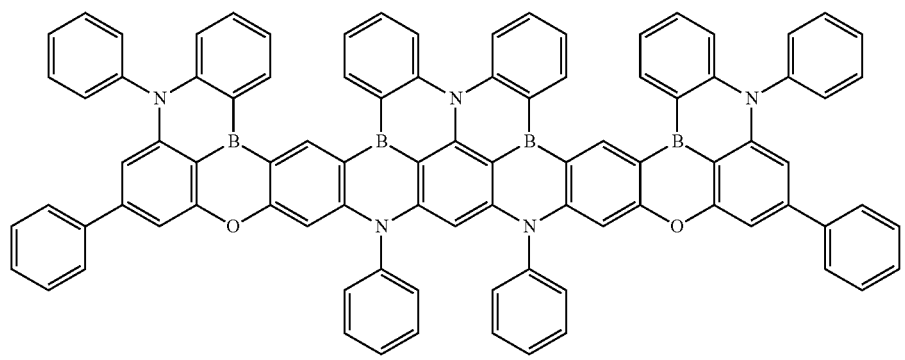
19
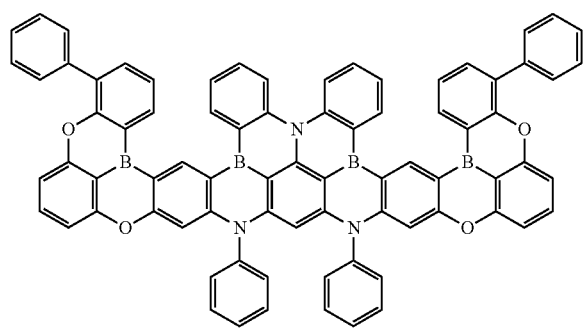
20
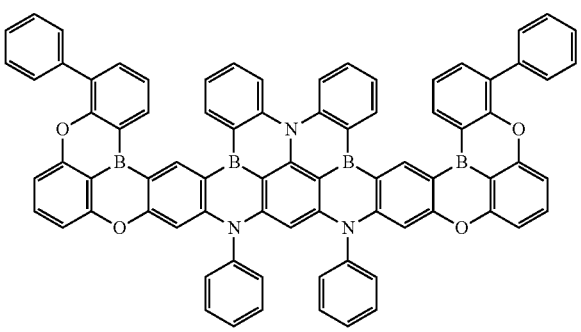
21
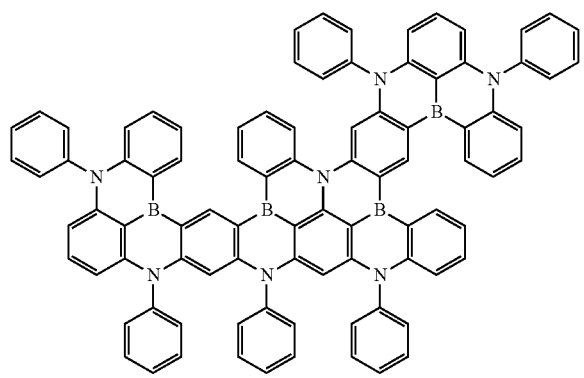
22
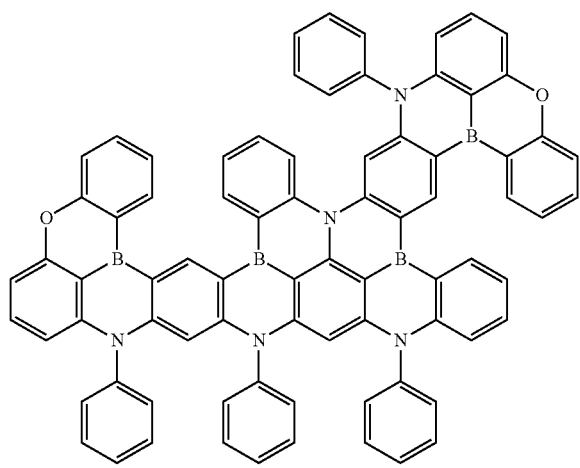

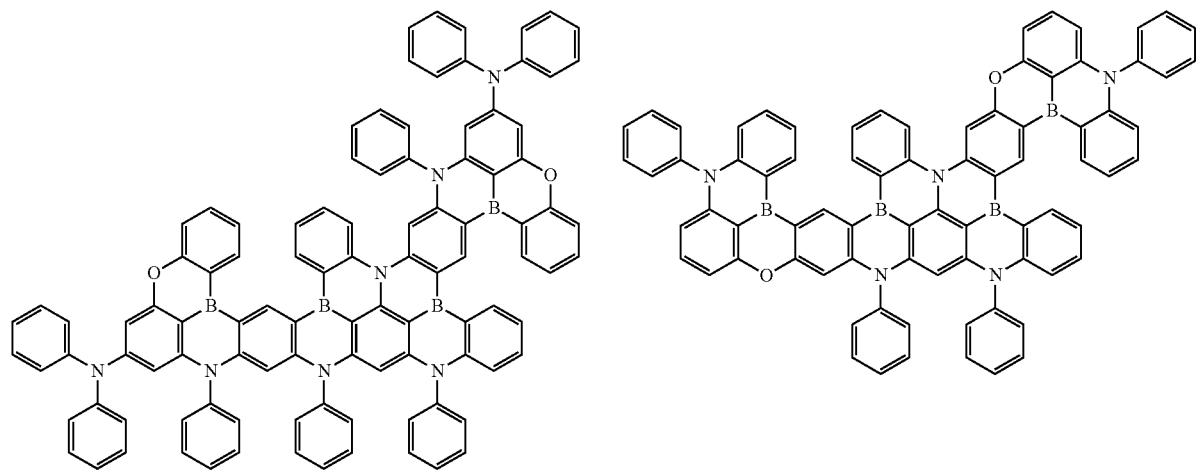
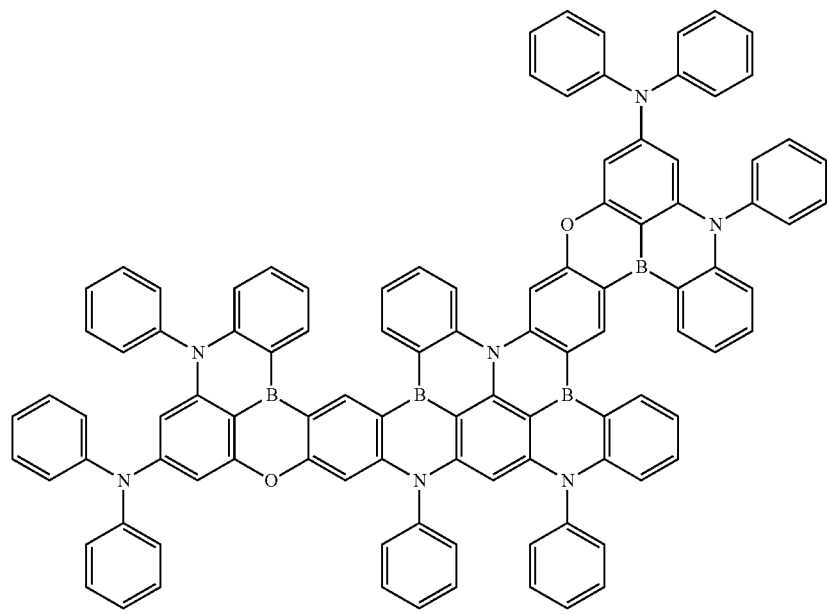
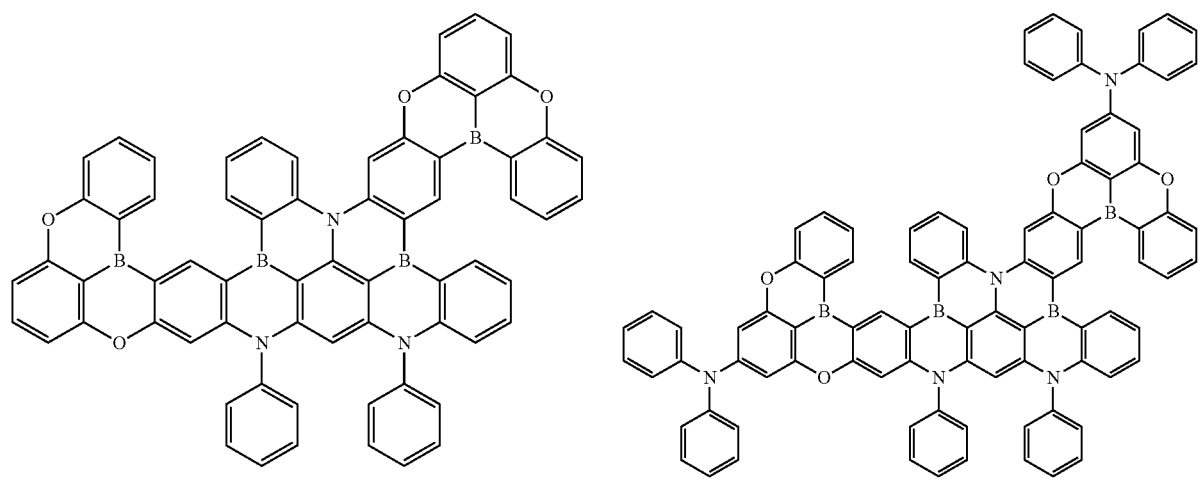

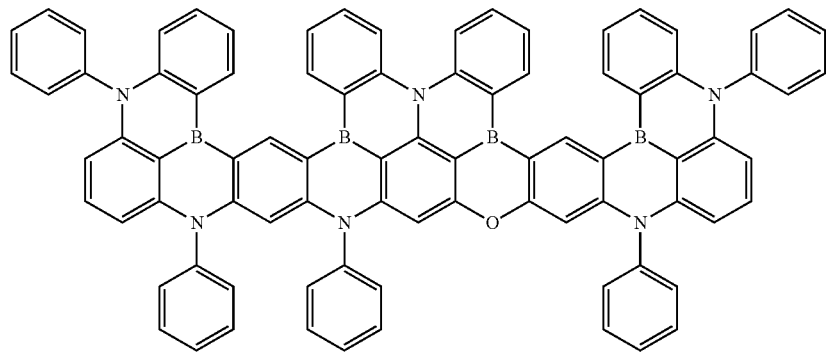
28
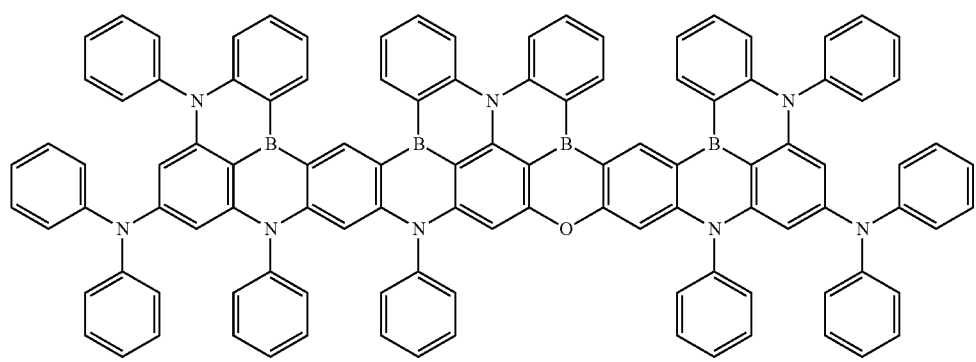
29
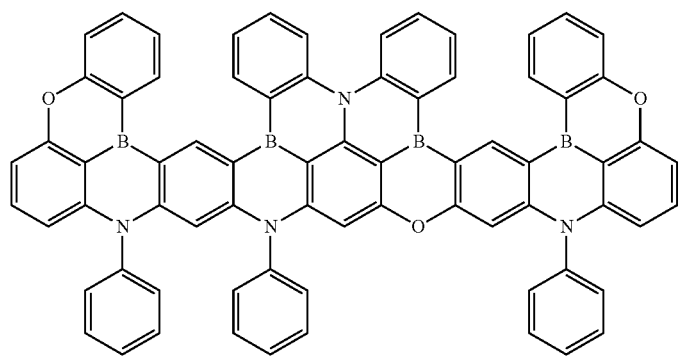
30
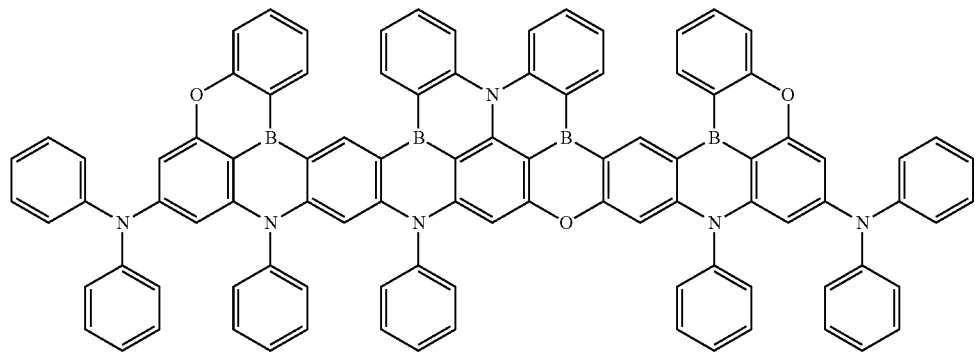
31

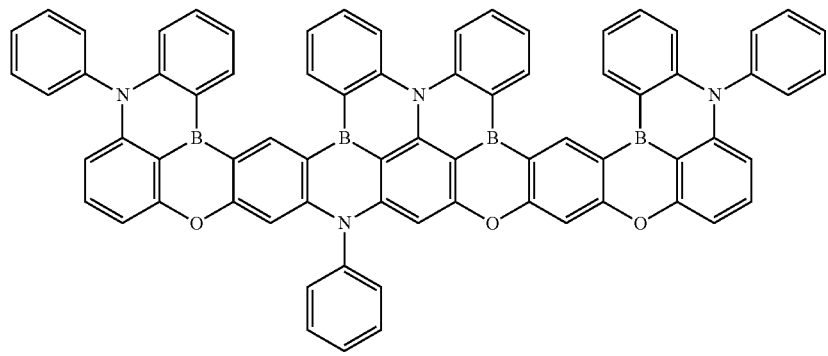
32
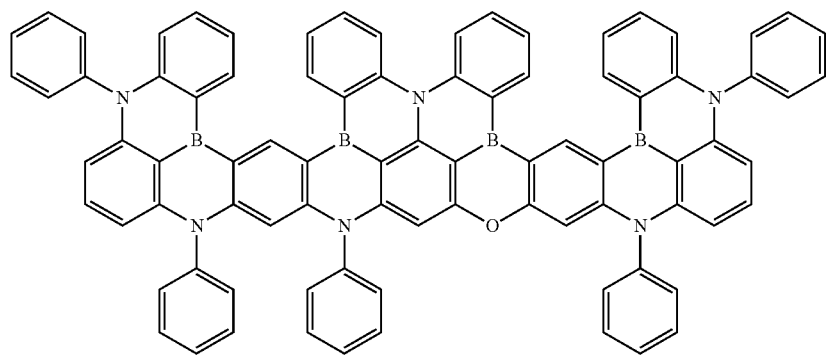
33
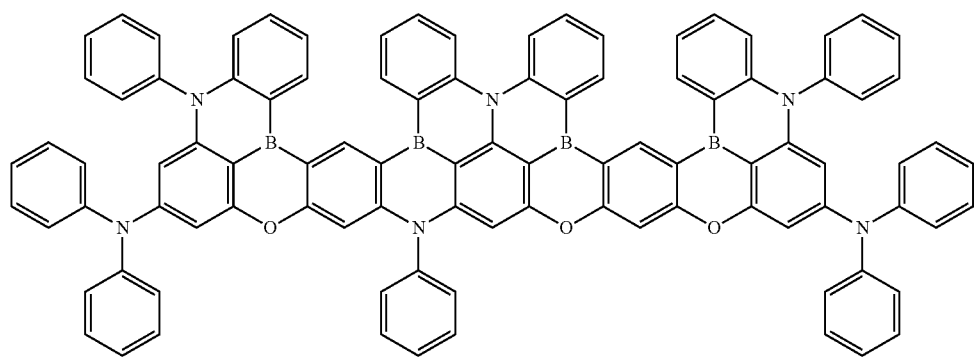
34
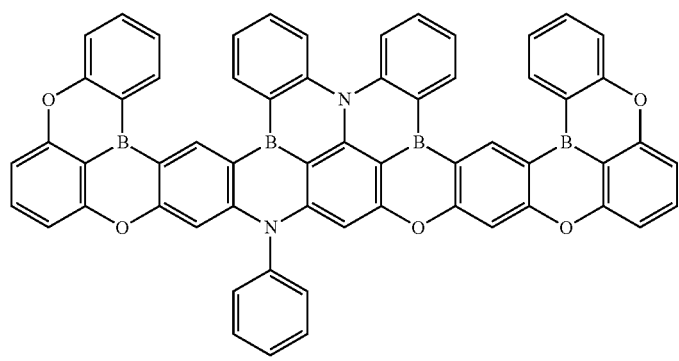
35

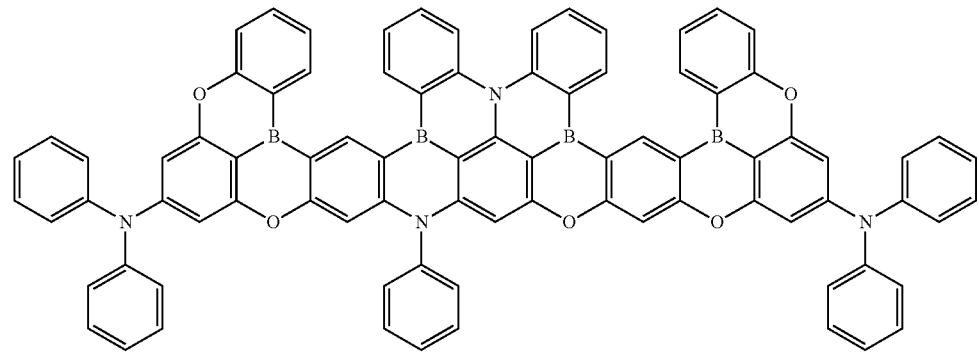
36
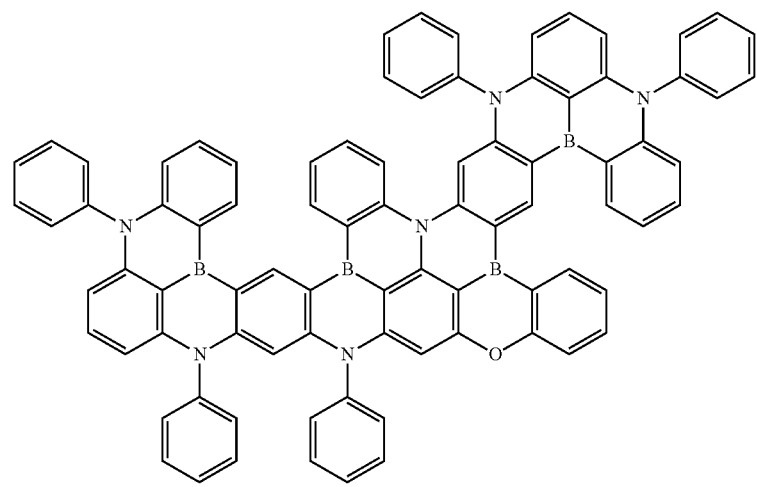
37
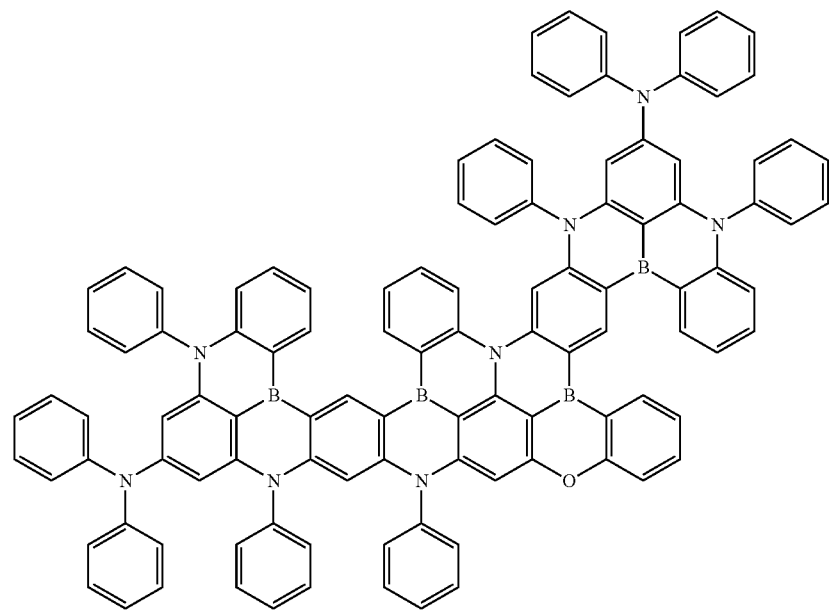
38

39
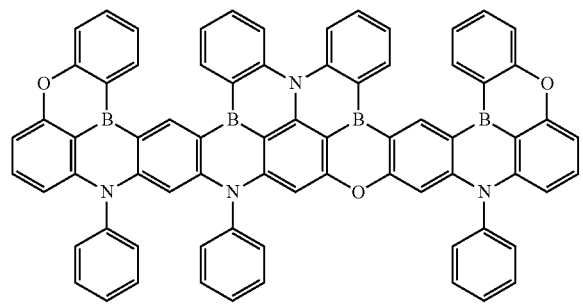
40
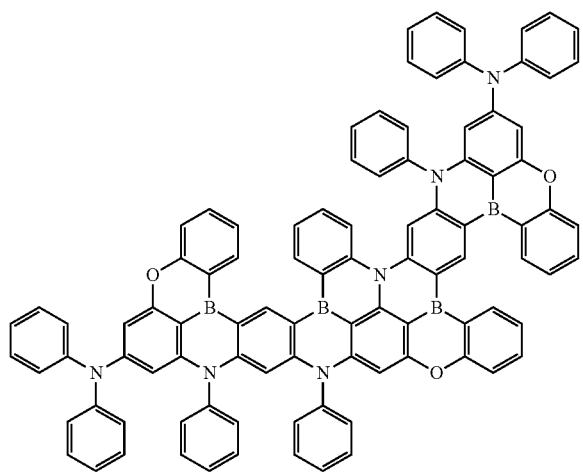
41
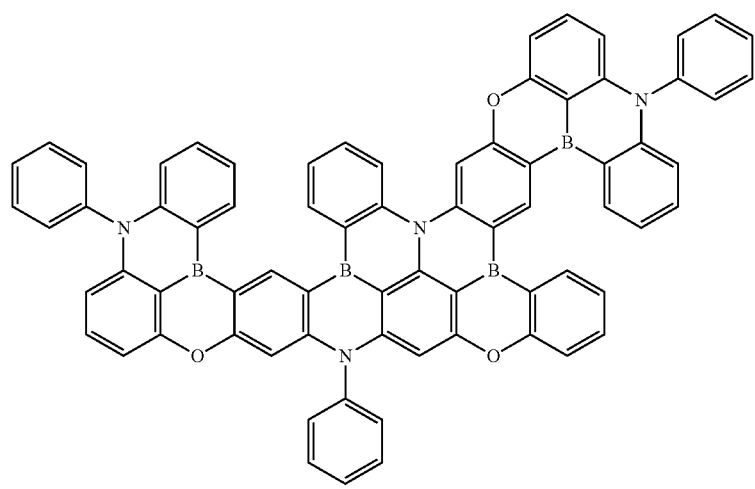
42
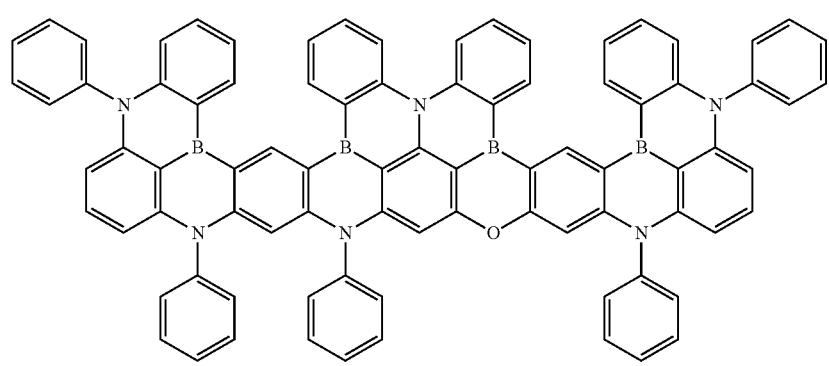

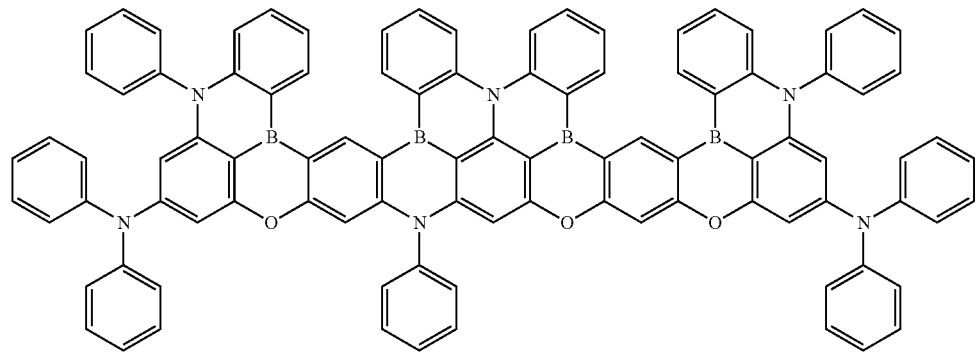
43
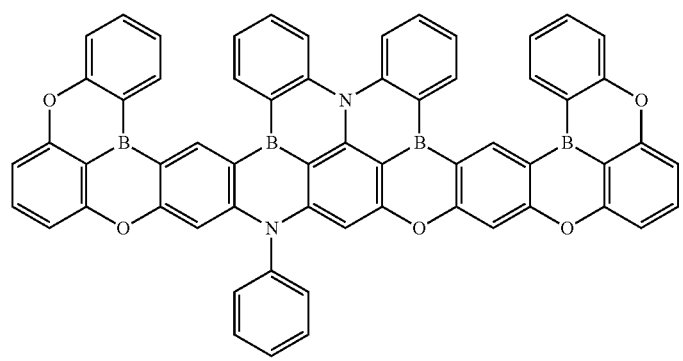
44
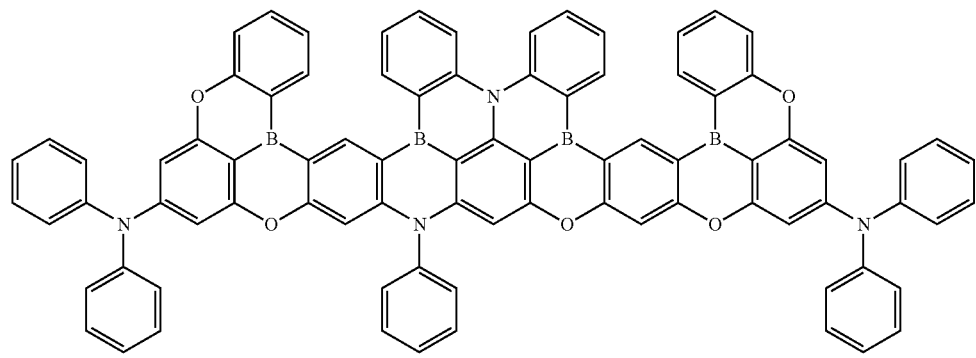
45
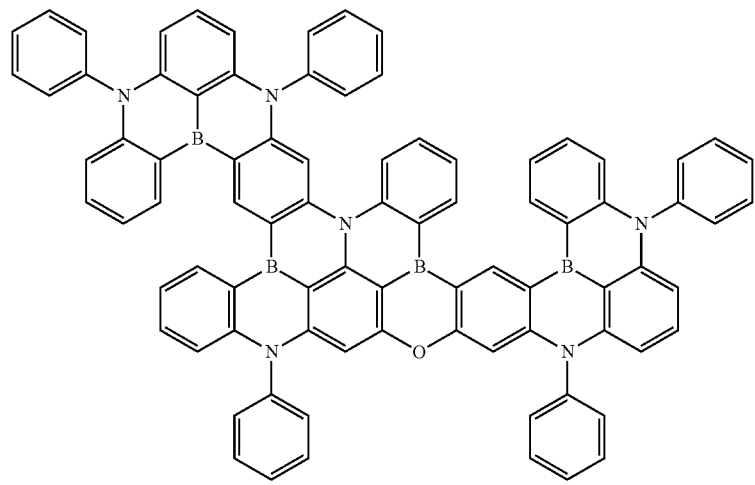
46

-continued
47
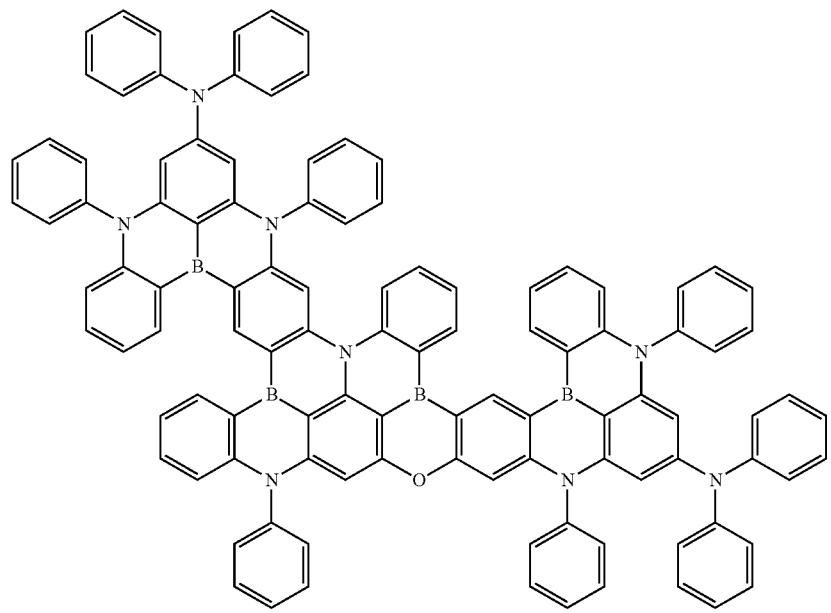
48 49
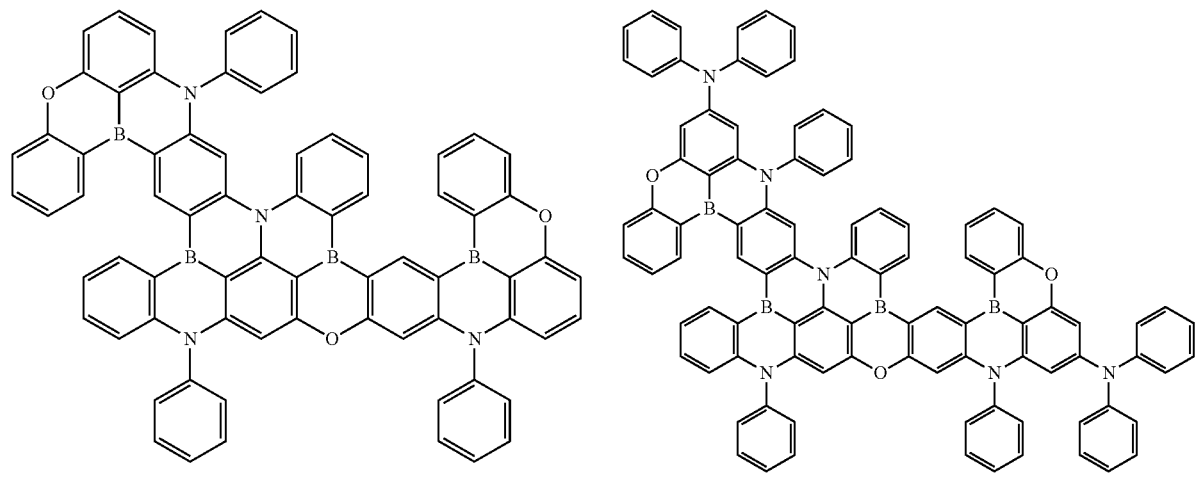
50 51
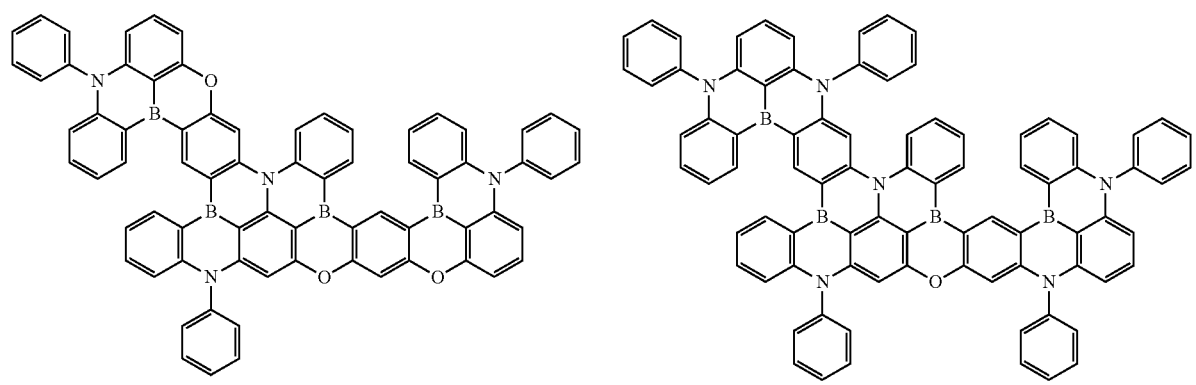

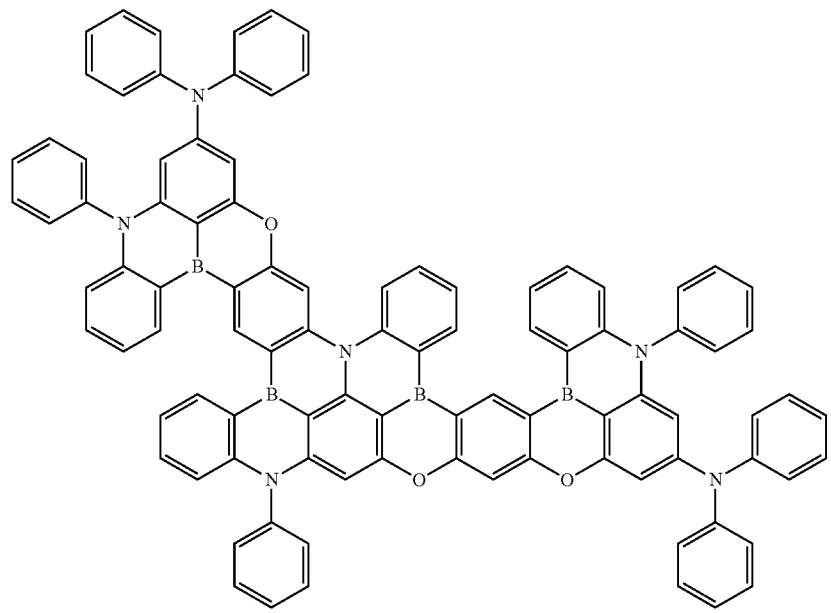
52
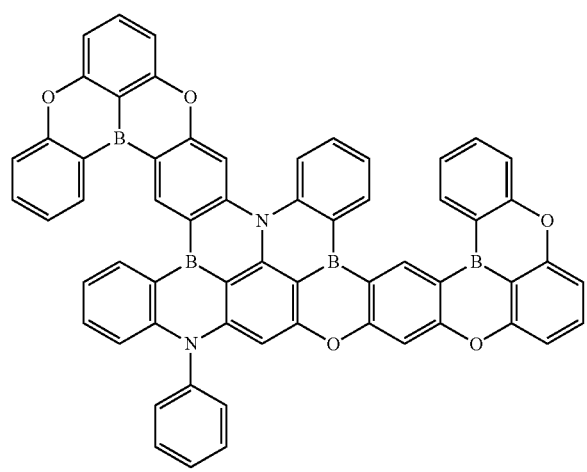
53
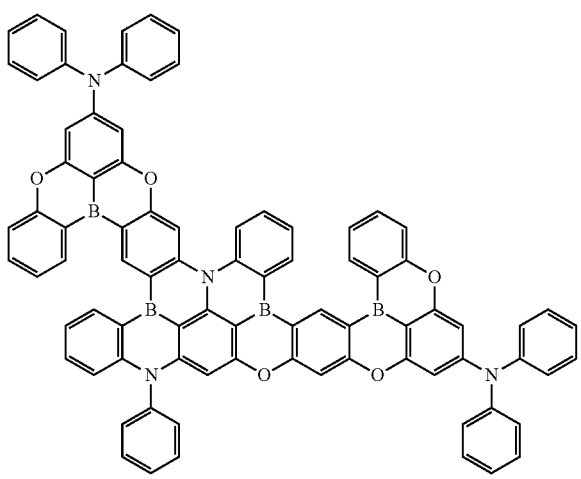
54
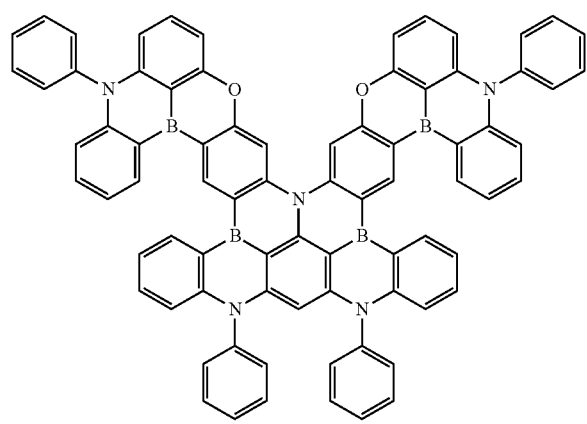
55
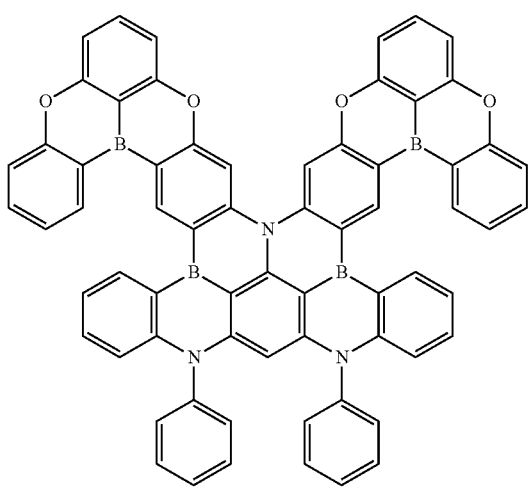
56

57
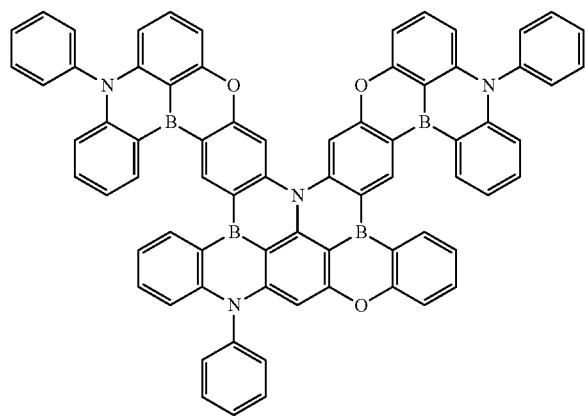
58
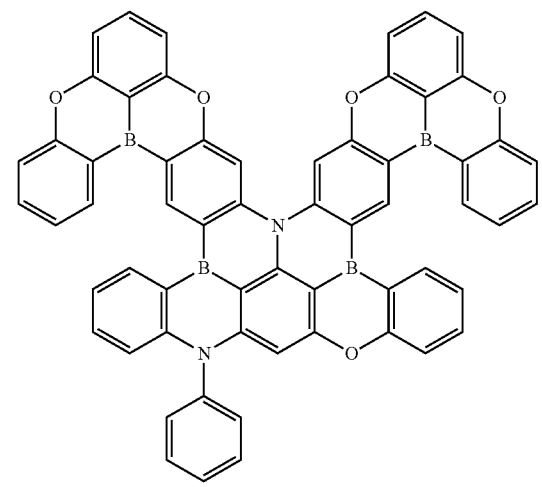
59
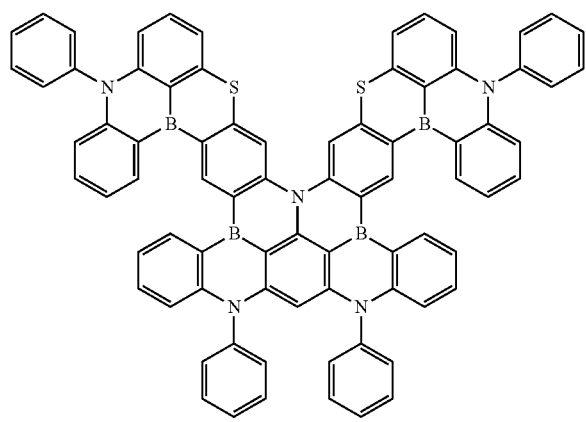
60
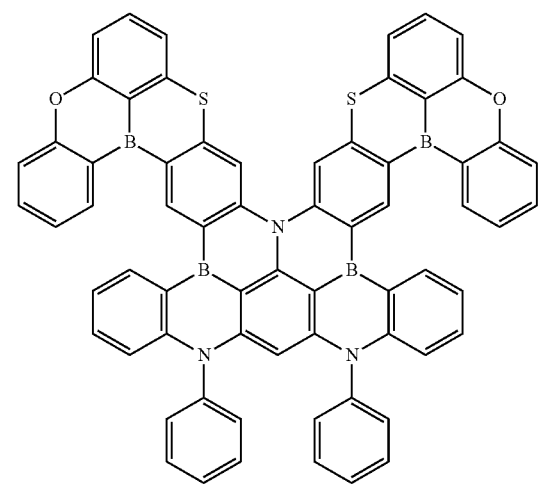
61
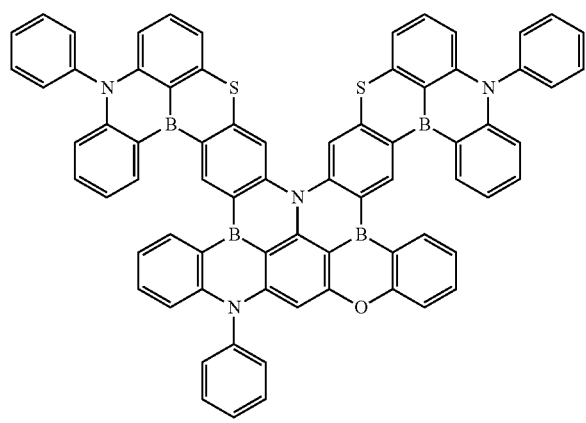
62
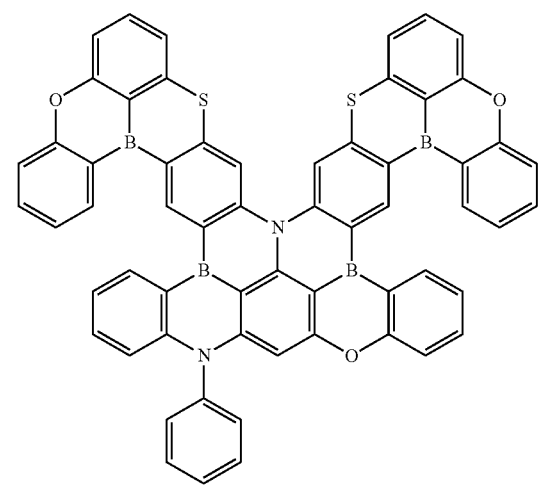

227 228
-continued
63
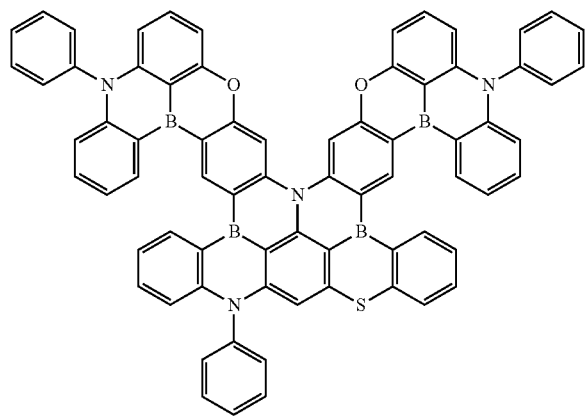
64
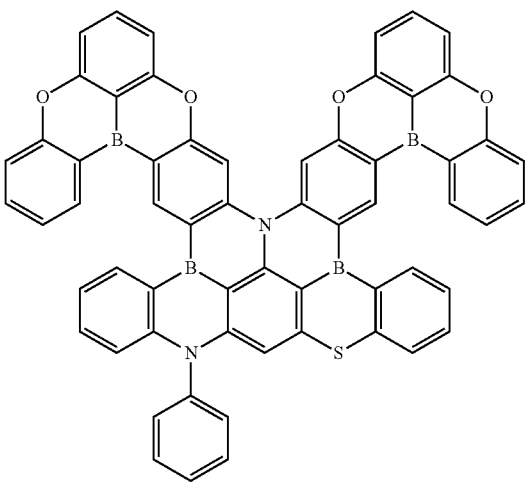
65
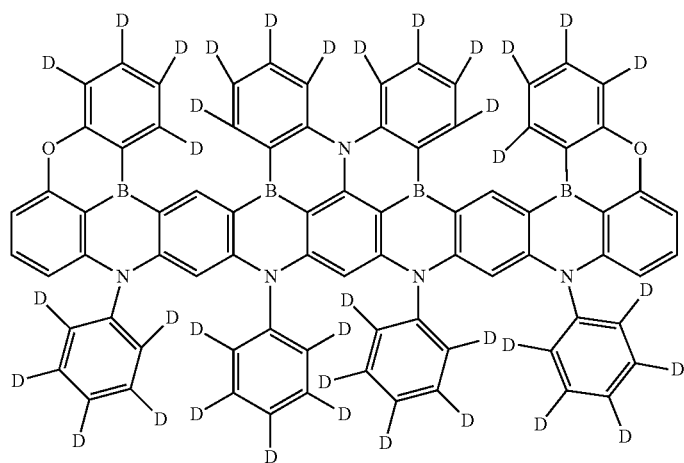
66
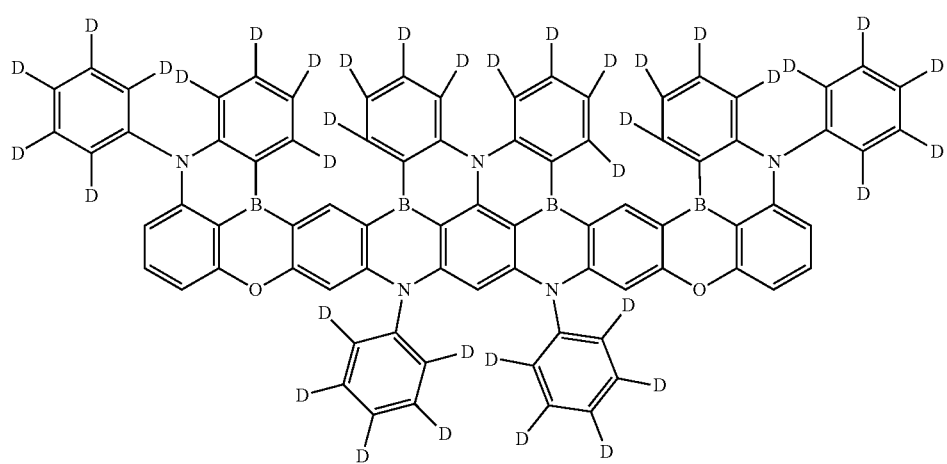

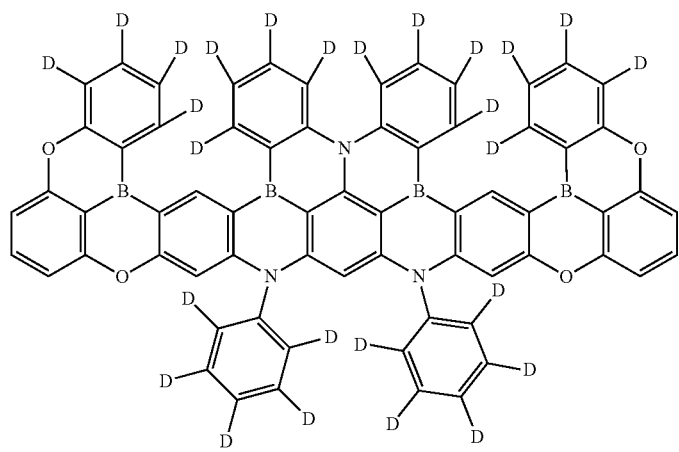
67
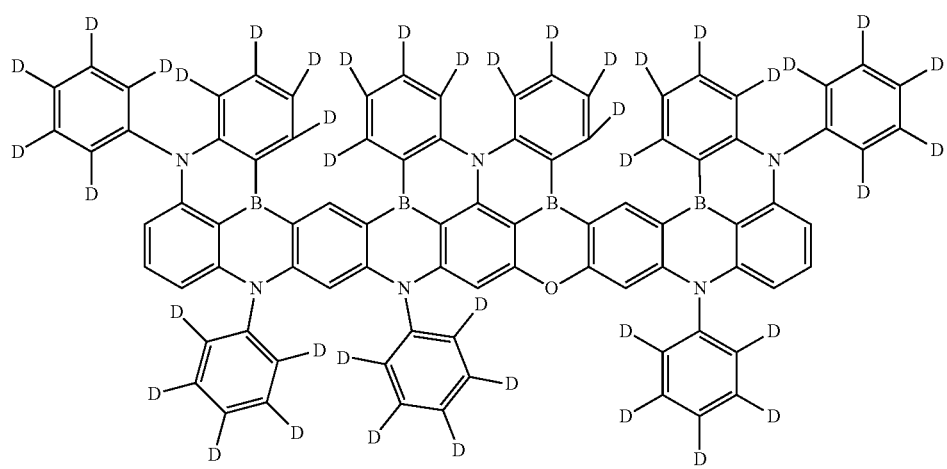
68
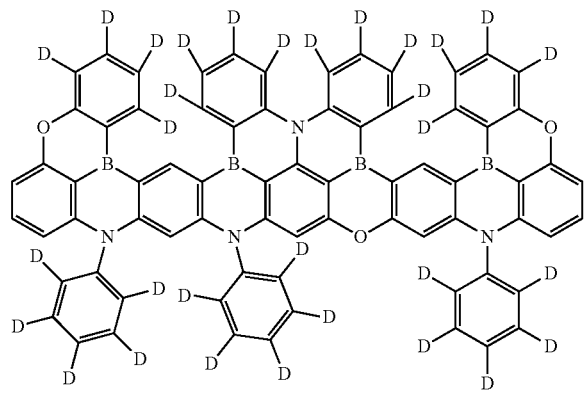
69
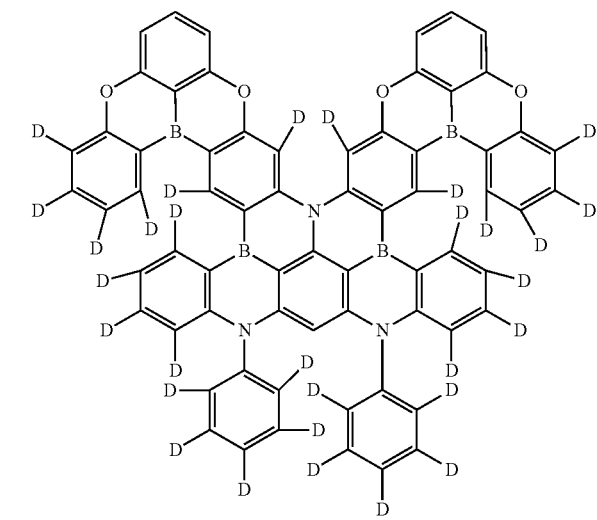
70

-continued
71
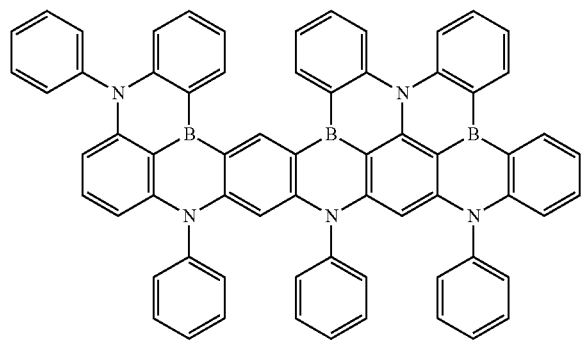
72
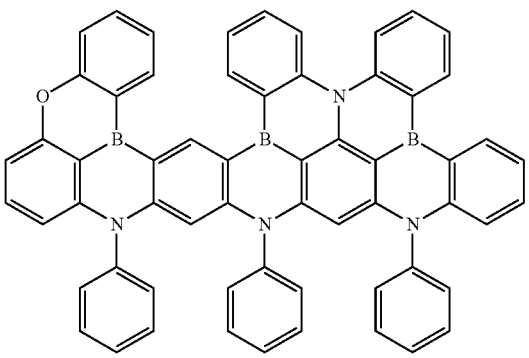
73
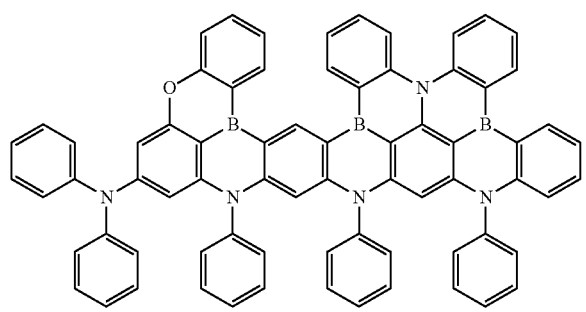
74
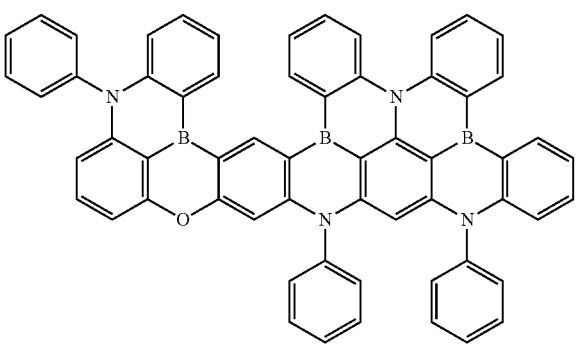
75
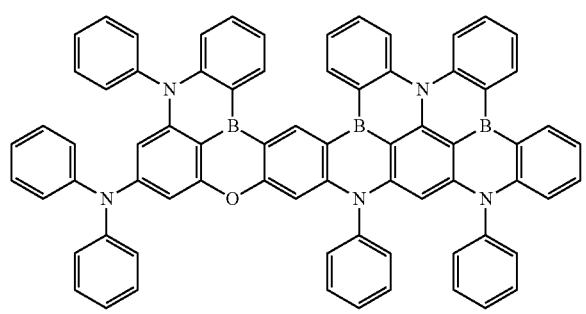
76
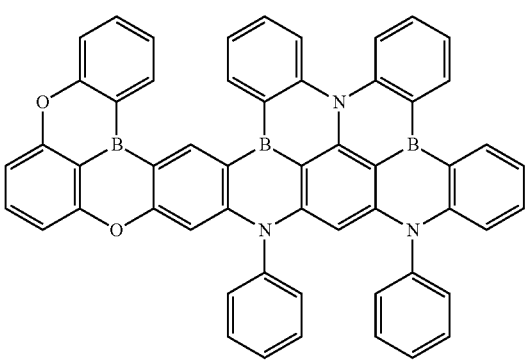
77
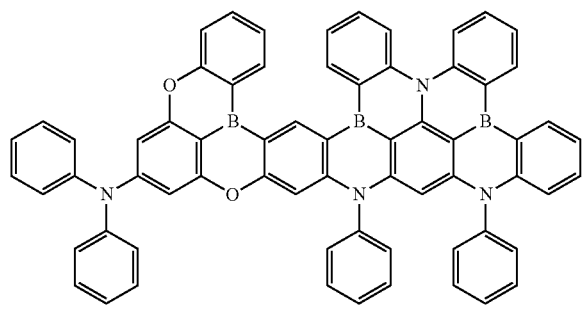
78
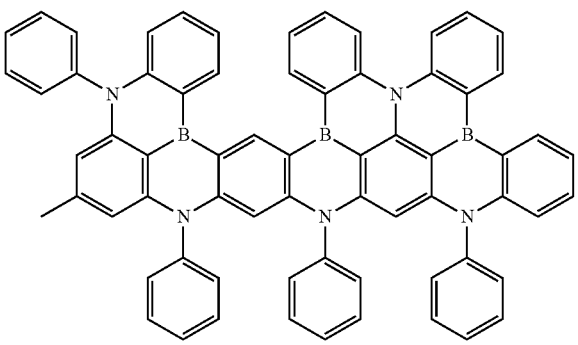

79
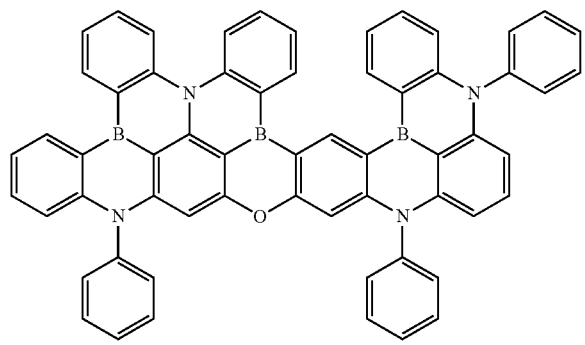
80
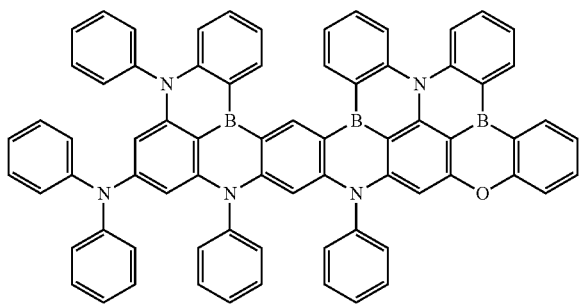
81
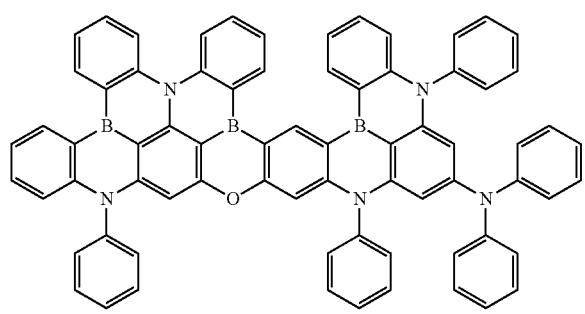
82
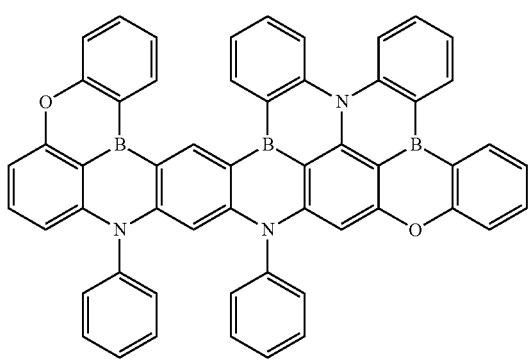
83
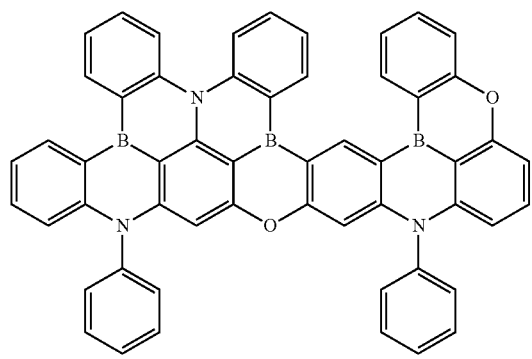
84
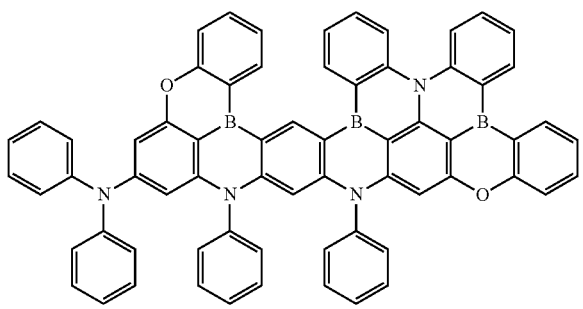
85
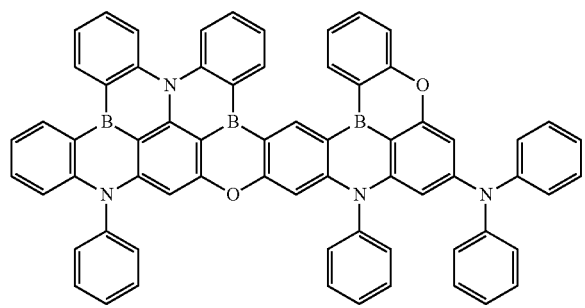
86
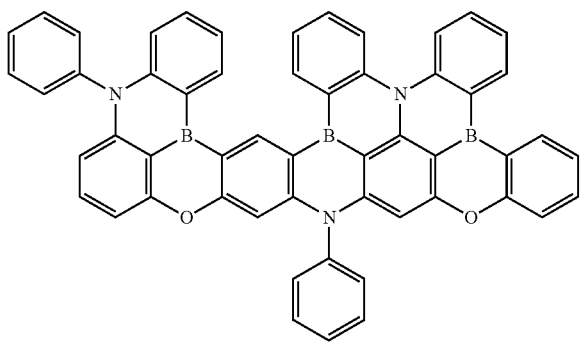

87
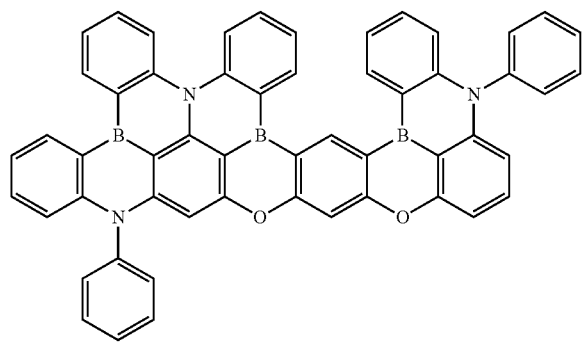
88
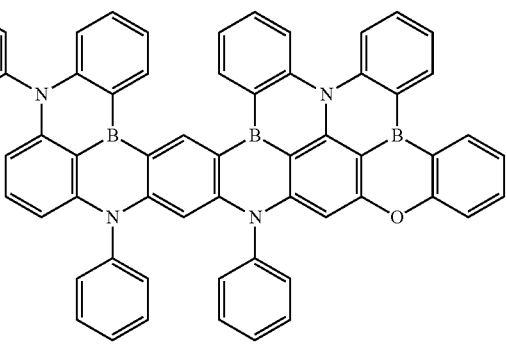
89
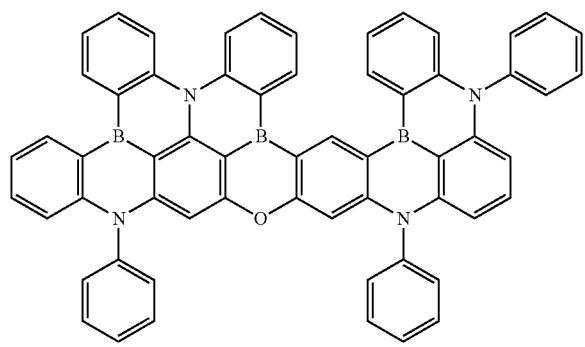
90
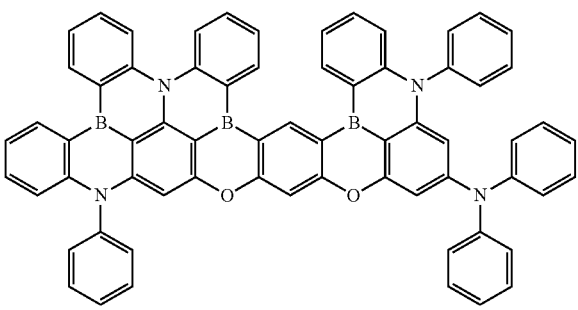
91
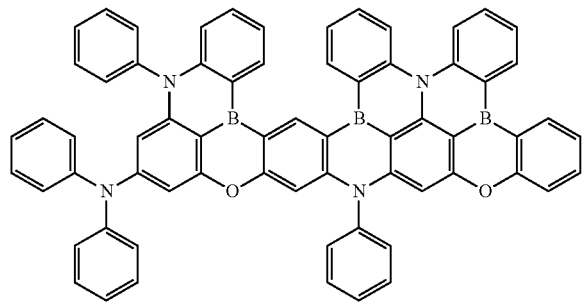
92
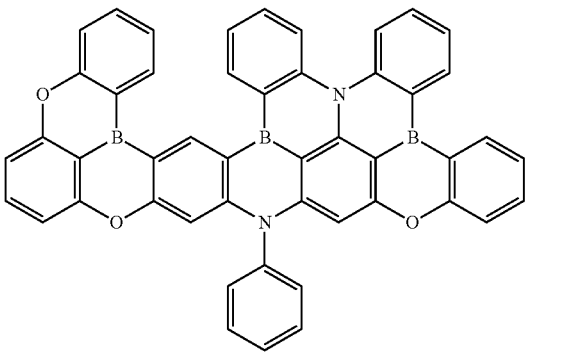
93
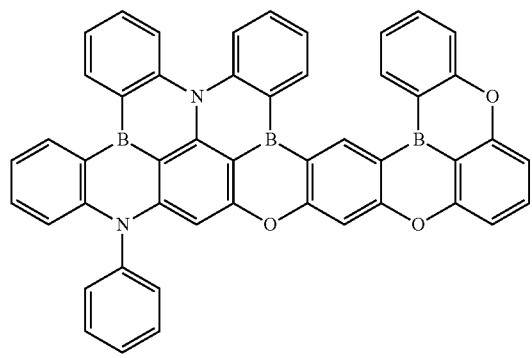
94
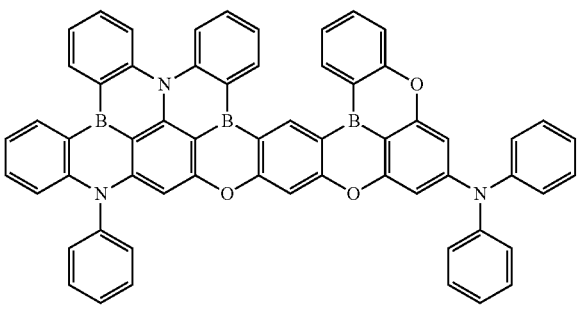

-continued
95
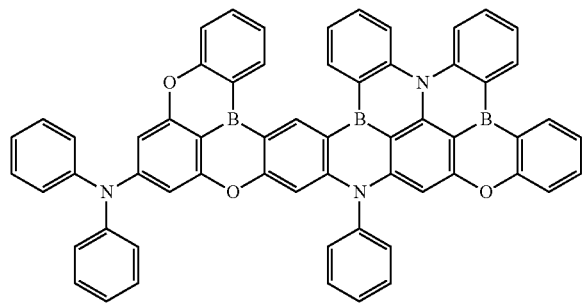
96
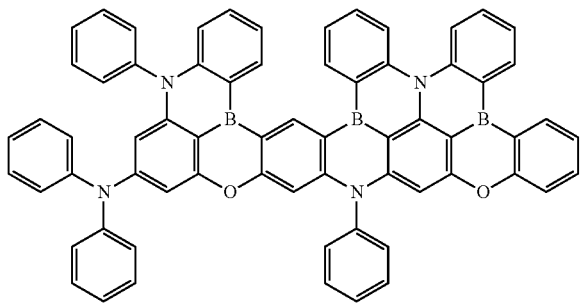
97
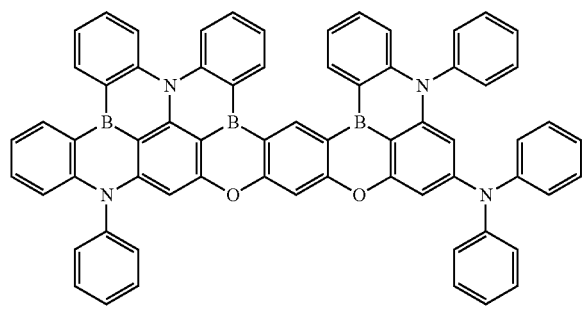
98
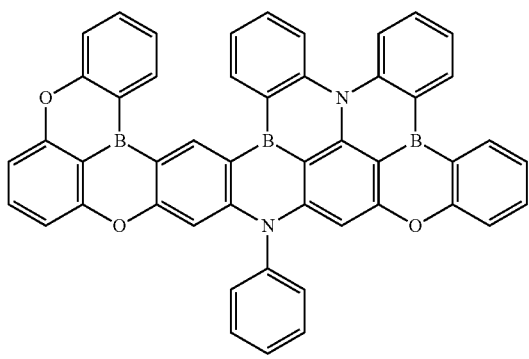
99
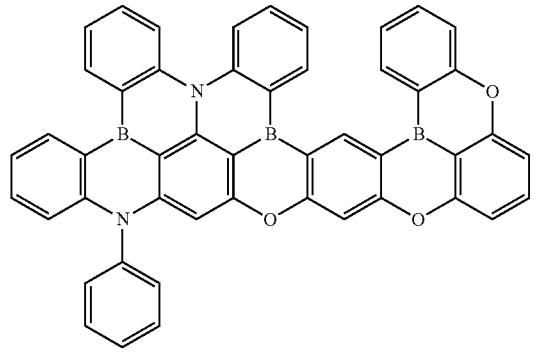
* * * * *